US011972830B2

(12) United States Patent
Luo

(10) Patent No.: US 11,972,830 B2
(45) Date of Patent: Apr. 30, 2024

(54) METHODS FOR ACCESSING RESISTIVE CHANGE ELEMENTS OPERABLE AS ANTIFUSES

(71) Applicant: Nantero, Inc., Woburn, MA (US)

(72) Inventor: Jia Luo, Fremont, CA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 17/865,303

(22) Filed: Jul. 14, 2022

(65) Prior Publication Data

US 2022/0358970 A1 Nov. 10, 2022

Related U.S. Application Data

(63) Continuation of application No. 16/409,611, filed on May 10, 2019, now Pat. No. 11,393,508, which is a (Continued)

(51) Int. Cl.
*G11C 5/06* (2006.01)
*G11C 5/14* (2006.01)
(Continued)

(52) U.S. Cl.
CPC .............. *G11C 5/06* (2013.01); *G11C 5/147* (2013.01); *G11C 11/5614* (2013.01);
(Continued)

(58) Field of Classification Search
CPC ..... G11C 5/06; G11C 13/0026; G11C 13/003; G11C 13/004; G11C 5/147;
(Continued)

(56) References Cited

U.S. PATENT DOCUMENTS 4,442,507 A 4/1984 Roesner
6,750,530 B1 * 6/2004 Klaasen .............. H01L 23/5252
257/530
(Continued)

FOREIGN PATENT DOCUMENTS

CN 105931664 A 9/2016
EP 2784818 A2 * 10/2014 ............. G11C 17/16
(Continued)

OTHER PUBLICATIONS

Gokce et al., Toward Multiple-Bit-Per-Cell Memory Operation With Stable Resistance Levels in Phase Change Nanodevices, 2016, IEEE. All pages. (Year: 2016).*

*Primary Examiner* — Michael T Tran
(74) *Attorney, Agent, or Firm* — Nantero, Inc.

(57) ABSTRACT

Devices and methods for accessing resistive change elements in a resistive change element array to determine resistive states of the resistive change elements are disclosed. According to some aspects of the present disclosure the devices and methods access resistive change elements in a resistive change element array through a variety of operations. According to some aspects of the present disclosure the devices and methods supply an amount of current tailored for a particular operation. According to some aspects of the present disclosure the devices and methods compensate for circuit conditions of a resistive change element array by adjusting an amount of current tailored for a particular operation to compensate for circuit conditions of the resistive change element array.

15 Claims, 32 Drawing Sheets

Related U.S. Application Data continuation of application No. 15/783,622, filed on Oct. 13, 2017, now Pat. No. 10,290,327.

(51) Int. Cl.
*G11C 11/56* (2006.01)
*G11C 13/00* (2006.01)
*G11C 13/02* (2006.01)

(52) U.S. Cl.
CPC ...... *G11C 11/5678* (2013.01); *G11C 11/5685* (2013.01); *G11C 13/0004* (2013.01); *G11C 13/0007* (2013.01); *G11C 13/0026* (2013.01); *G11C 13/003* (2013.01); *G11C 13/004* (2013.01); *G11C 13/0064* (2013.01); *G11C 13/0011* (2013.01); *G11C 2013/0045* (2013.01); *G11C 2013/0054* (2013.01); *G11C 13/0069* (2013.01); *G11C 2013/0078* (2013.01); *G11C 13/0097* (2013.01); *G11C 13/025* (2013.01); *G11C 2213/77* (2013.01)

(58) Field of Classification Search
CPC ............ G11C 11/5614; G11C 11/5678; G11C 11/5685; G11C 13/0004; G11C 13/0007; G11C 13/0064; G11C 13/0011; G11C 13/0069; G11C 13/0097; G11C 13/025; G11C 2013/0045; G11C 2013/0054; G11C 2013/0078; G11C 2213/77; G11C 13/0009; G11C 2213/71
USPC .................................................. 365/148, 158
See application file for complete search history.

(56) References Cited

U.S. PATENT DOCUMENTS

| | | | |
|---|---|---|---|
| 7,781,862 B2 | 8/2010 | Bertin et al. | |
| 8,000,127 B2 | 8/2011 | Hamilton et al. | |
| 8,008,745 B2 | 8/2011 | Bertin et al. | |
| 8,102,018 B2 | 1/2012 | Bertin et al. | |
| 9,478,308 B1 * | 10/2016 | Boujamaa | G11C 17/18 |
| 9,947,400 B2 * | 4/2018 | Viviani | G11C 13/0004 |
| 10,355,206 B2 | 7/2019 | Cleavelin et al. | |
| 10,654,718 B2 * | 5/2020 | Sen | D21H 15/02 |
| 11,393,508 B2 | 7/2022 | Luo | |
| 2004/0042318 A1 * | 3/2004 | Porter | G11C 17/18 365/225.7 |
| 2004/0179414 A1 | 9/2004 | Hsu | |
| 2006/0291267 A1 * | 12/2006 | Jenne | G11C 29/021 365/102 |
| 2006/0291316 A1 * | 12/2006 | Jenne | G11C 17/18 365/225.7 |
| 2008/0170429 A1 * | 7/2008 | Bertin | H01L 27/1021 365/151 |
| 2009/0108400 A1 * | 4/2009 | Cestero | H01L 23/5252 257/E21.477 |
| 2009/0184389 A1 * | 7/2009 | Bertin | H01L 29/068 257/E29.022 |
| 2011/0026303 A1 | 2/2011 | Choi et al. | |
| 2011/0080775 A1 | 4/2011 | Bae et al. | |
| 2013/0077381 A1 * | 3/2013 | Kwon | H10N 70/231 257/E47.001 |
| 2013/0292634 A1 * | 11/2013 | Chen | H01L 27/2409 257/5 |
| 2014/0022855 A1 * | 1/2014 | Jang | G11C 17/18 365/189.09 |
| 2014/0204649 A1 * | 7/2014 | Kanda | G11C 17/165 365/96 |
| 2015/0236026 A1 * | 8/2015 | Lunt | H10N 70/8845 365/96 |
| 2016/0351498 A1 * | 12/2016 | Chang | H10B 20/20 |
| 2017/0294234 A1 * | 10/2017 | Milani | G11C 17/16 |
| 2018/0336014 A1 * | 11/2018 | Bandiera | G06F 7/588 |
| 2018/0358093 A1 * | 12/2018 | Lesartre | G11C 13/004 |

FOREIGN PATENT DOCUMENTS

| | | | |
|---|---|---|---|
| JP | 201079974 A | 4/2010 | |
| JP | 201154259 A | 3/2011 | |
| JP | 2016139453 A | 8/2016 | |
| WO | WO-2005043547 A1 * | 5/2005 | ............ G11C 11/15 |
| WO | 2013145733 A1 | 10/2013 | |

* cited by examiner

400

Selecting at least one resistive change element from a plurality of resistive change elements in a resistive change element array, where each resistive change element is electrically connected to a bit line of a plurality of bit lines in the resistive change element array and a word line of a plurality of word lines in the resistive change element array — 402

Selecting a resistance for an operation of the at least one resistive change element — 404

Supplying an amount of current for the operation based on the resistance for the operation — 406

Determining a resistive state of the at least one resistive change element based on a resistance of the at least one resistive change element and the resistance for the operation — 408

FIG. 4

METHODS FOR ACCESSING RESISTIVE CHANGE ELEMENTS OPERABLE AS ANTIFUSES

CROSS-REFERENCE OF RELATED CASES

This application is related to the following U.S. patents, which are assigned to the assignee of the present application, and are hereby incorporated by reference in their entirety:
U.S. Pat. No. 7,781,862, filed on Nov. 15, 2005, entitled Two-Terminal Nanotube Devices and Systems and Methods of Making Same;
U.S. Pat. No. 8,000,127, filed on Nov. 13, 2009, entitled Method for Resetting a Resistive Change Memory Element;
U.S. Pat. No. 8,619,450, filed on Sep. 1, 2010, entitled Method for Adjusting a Resistive Change Element Using a Reference;
U.S. Pat. No. 9,390,790, filed on Dec. 17, 2012, entitled Carbon Based Nonvolatile Cross Point Memory Incorporating Carbon Based Diode Select Devices and MOSFET Select Devices for Memory and Logic Applications;
U.S. Pat. No. 9,412,447, filed on Jul. 29, 2015, entitled DDR Compatible Memory Circuit Architecture for Resistive Change Element Arrays;
U.S. Pat. No. 9,666,272, filed on Jan. 12, 2016, entitled Resistive Change Element Arrays Using Resistive Reference Elements; and
U.S. Pat. No. 9,715,927, filed on Mar. 24, 2016, entitled 1-R Resistive Change Element Arrays Using Resistive Reference Elements.

This application is related to the following U.S. patent application, which is assigned to the assignee of the present application, and is hereby incorporated by reference in its entirety:
U.S. patent application Ser. No. 15/136,414, filed on Apr. 22, 2016, entitled Methods for Enhanced State Retention Within a Resistive Change Cell. U.S. patent application Ser. No. 15/136,414 is now U.S. Pat. No. 9,947,400.

BACKGROUND

Technical Field

The present disclosure generally relates to arrays of resistive change elements and generally relates to devices and methods for accessing resistive change elements in such arrays.

Discussion of Related Art

Any discussion of the related art throughout this specification should in no way be considered as an admission that such art is widely known or forms part of the common general knowledge in the field.

Resistive change devices and arrays, often referred to as resistance RAMs by those skilled in the art, are well known in the semiconductor industry. Such devices and arrays, for example, include, but are not limited to, phase change memory, solid electrolyte memory, metal oxide resistance memory, and carbon nanotube memory such as NRAM®.

Resistive change devices and arrays store information by adjusting a resistive change element, typically comprising some material that can be adjusted between a number of non-volatile resistive states in response to some applied stimuli, within each individual array cell between two or more resistive states. For example, each resistive state within a resistive change element cell can correspond to a data value which can be programmed and read back by supporting circuitry within the device or array.

For example, a resistive change element might be arranged to switch between two resistive states: a low resistive state (which might correspond to a logic "1") and a high resistive state (which might correspond to a logic "0"). In this way, a resistive change element can be used to store one binary digit (bit) of data.

Or, as another example, a resistive change element might be arranged to switch between four resistive states, so as to store two bits of data. Or a resistive change element might be arranged to switch between eight resistive states, so as to store three bits of data. Or a resistive change element might be arranged to switch between 2n resistive states, so as to store n bits of data.

Within the current state of the art, there is an increasing need to provide higher speed and lower power operation of memory devices and arrays. Additionally, within the current state of the art, there is an increasing need to provide reduced error operation of memory devices and arrays.

SUMMARY

The present disclosure provides a device comprising a resistive change element array, where the resistive change element array comprises a plurality of bit lines, a plurality of word lines, and a plurality of resistive change elements, where each resistive change element has a first terminal and a second terminal, and where the first terminal of each resistive change element is electrically connected to a bit line of the plurality of bit lines and the second terminal of each resistive change element is electrically connected to a word line of the plurality of word lines. The device further comprises a plurality of resistive reference elements, where each resistive reference element has a first terminal and a second terminal, and where the first terminal of each resistive reference element is electrically connected to a bit line of the plurality of bit lines and the second terminal of each resistive reference element is electrically connected to a word line of the plurality of word lines, a circuit configured to sink an amount of current for an operation of at least one resistive change element in the plurality of resistive change elements based on a resistance selected by current flow between the circuit and the plurality of resistive reference elements, where the circuit is electrically connected to the plurality of resistive change elements and the plurality of resistive reference elements, and a plurality of sense devices electrically connected to the resistive change element array.

According to another aspect of the present disclosure, the resistance is selected from resistances of resistive reference elements in the plurality of resistive reference elements.

According to another aspect of the present disclosure, the resistance is selected from a number of different resistances greater than a number of different resistances among resistive reference elements in said plurality of resistive reference elements. Further, the number of different resistances is three and said number of different resistances among resistive reference elements in said plurality of resistive reference elements is two.

According to another aspect of the present disclosure, the plurality of resistive reference elements comprises a plurality of low resistive reference elements and a plurality of high resistive reference elements, and the plurality of low resistive reference elements have resistances less than resistances of the plurality of high resistive reference elements.

According to another aspect of the present disclosure, the plurality of resistive reference elements comprises a plurality of low resistive reference elements, a plurality of intermediate resistive reference elements, and a plurality of high resistive reference elements, and the plurality of low resistive reference elements have resistances less than resistances of the plurality of intermediate resistive reference elements and the plurality of intermediate resistive reference elements have resistances less than resistances of the plurality of high resistive reference elements.

According to another aspect of the present disclosure, the circuit is further configured to receive at least one control signal and adjust current flow between the circuit and the plurality of resistive reference elements based on the at least one control signal.

According to another aspect of the present disclosure, the circuit is further configured to adjust the amount of current for an operation of at least one resistive change element to compensate for circuit conditions of the resistive change element array.

According to another aspect of the present disclosure, resistive change elements in the plurality of resistive change elements are selected from the group consisting of two-terminal nanotube switching elements, phase change memory elements, metal oxide memory elements, and conductive bridge memory elements.

According to another aspect of the present disclosure, resistive reference elements in the plurality of resistive reference elements are selected from the group consisting of resistors, two-terminal nanotube switching elements, phase change memory elements, metal oxide memory elements, and conductive bridge memory elements.

According to another aspect of the present disclosure, the device comprises a plurality of amplifiers electrically connected between the resistive change element array and the plurality of sense devices such that the plurality of amplifiers are electrically connected to the resistive change element array and the plurality of sense devices are electrically connected to the plurality of amplifiers.

According to another aspect of the present disclosure, the plurality of resistive reference elements are located in the resistive change element array.

The present disclosure provides a device comprising a resistive change element array, where the resistive change element array comprises a plurality of bit lines, a plurality of word lines, and a plurality of resistive change elements, wherein each resistive change element has a first terminal and a second terminal, and wherein the first terminal of each resistive change element is electrically connected to a bit line of the plurality of bit lines and the second terminal of each resistive change element is electrically connected to a word line of the plurality of word lines. The device further comprises a plurality of resistive reference elements, wherein each resistive reference element has a first terminal and a second terminal, and wherein the first terminal of each resistive reference element is electrically connected to a bit line of the plurality of bit lines and the second terminal of each resistive reference element is electrically connected to a word line of the plurality of word lines, a circuit configured to source an amount of current for an operation of at least one resistive change element in the plurality of resistive change elements based on a resistance selected by current flow between the circuit and the plurality of resistive reference elements, where the circuit is electrically connected to the plurality of resistive change elements and the plurality of resistive reference elements, and a plurality of sense devices electrically connected to the resistive change element array.

According to another aspect of the present disclosure, the resistance is selected from resistances of resistive reference elements in the plurality of resistive reference elements.

According to another aspect of the present disclosure, the resistance is selected from a number of different resistances greater than a number of different resistances among resistive reference elements in the plurality of resistive reference elements. Further, the number of different resistances is three and the number of different resistances among resistive reference elements in said plurality of resistive reference elements is two.

According to another aspect of the present disclosure, the plurality of resistive reference elements comprises a plurality of low resistive reference elements and a plurality of high resistive reference elements, and the plurality of low resistive reference elements have resistances less than resistances of the plurality of high resistive reference elements.

According to another aspect of the present disclosure, the plurality of resistive reference elements comprises a plurality of low resistive reference elements, a plurality of intermediate resistive reference elements, and a plurality of high resistive reference elements, and the plurality of low resistive reference elements have resistances less than resistances of the plurality of intermediate resistive reference elements and the plurality of intermediate resistive reference elements have resistances less than resistances of the plurality of high resistive reference elements.

According to another aspect of the present disclosure, the circuit is further configured to receive at least one control signal and adjust current flow between the circuit and the plurality of resistive reference elements based on the at least one control signal.

According to another aspect of the present disclosure, the circuit is further configured to adjust the amount of current for an operation of at least one resistive change element to compensate for circuit conditions of the resistive change element array.

According to another aspect of the present disclosure, the resistive change elements in the plurality of resistive change elements are selected from the group consisting of two-terminal nanotube switching elements, phase change memory elements, metal oxide memory elements, and conductive bridge memory elements.

According to another aspect of the present disclosure, the resistive reference elements in the plurality of resistive reference elements are selected from the group consisting of resistors, two-terminal nanotube switching elements, phase change memory elements, metal oxide memory elements, and conductive bridge memory elements.

According to another aspect of the present disclosure, the device further comprises a plurality of amplifiers electrically connected between the resistive change element array and the plurality of sense devices such that the plurality of amplifiers are electrically connected to the resistive change element array and the plurality of sense devices are electrically connected to the plurality of amplifiers.

According to another aspect of the present disclosure, the plurality of resistive reference elements are located in the resistive change element array.

The present disclosure provides a method for accessing at least one resistive change element in a resistive change element array, the method comprising selecting at least one resistive change element from a plurality of resistive change elements in a resistive change element array, where each resistive change element is electrically connected to a bit line of a plurality of bit lines in the resistive change element array and a word line of a plurality of word lines in the resistive change element array, selecting a resistance for an operation of the at least one resistive change element, supplying an amount of current for the operation based on the resistance for the operation, and determining a resistive state of the at least one resistive change element based on a resistance of the at least one resistive change element and the resistance for the operation.

According to another aspect of the present disclosure, within the method for accessing at least one resistive change element in a resistive change element array, the resistance for the operation is a resistance of a resistive reference element.

According to another aspect of the present disclosure, within the method for accessing at least one resistive change element in a resistive change element array, the resistance for the operation is a resistance of a resistive reference element in the resistive change element array.

According to another aspect of the present disclosure, within the method for accessing at least one resistive change element in a resistive change element array, the resistance for the operation is selected from resistances of resistive reference elements in a plurality of resistive reference elements.

According to another aspect of the present disclosure, within the method for accessing at least one resistive change element in a resistive change element array, the resistance for the operation is selected from resistances of resistive reference elements in a plurality of resistive reference elements in said resistive change element array.

According to another aspect of the present disclosure, within the method for accessing at least one resistive change element in a resistive change element array, the resistance for the operation is selected from a number of different resistances greater than a number of different resistances among resistive reference elements in a plurality of resistive reference elements. Further, the number of different resistances is three and the number of different resistances among resistive reference elements in the plurality of resistive reference elements is two.

According to another aspect of the present disclosure, within the method for accessing at least one resistive change element in a resistive change element array, the resistance for the operation is selected from a number of different resistances greater than a number of different resistances among resistive reference elements in a plurality of resistive reference elements in the resistive change element array. Further, the number of different resistances is three and the number of different resistances among resistive reference elements in the plurality of resistive reference elements is two.

According to another aspect of the present disclosure, within the method for accessing at least one resistive change element in a resistive change element array, the supplying an amount of current for the operation based on the resistance for the operation is responsive to the selecting a resistance for an operation of the at least one resistive change element.

According to another aspect of the present disclosure the method for accessing at least one resistive change element in a resistive change element array further comprises adjusting the amount of current for the operation to compensate for circuit conditions of the resistive change element array.

According to another aspect of the present disclosure the method for accessing at least one resistive change element in a resistive change element array further comprises initializing to 0 volts the plurality of bit lines and the plurality of word lines before the selecting at least one resistive change element from a plurality of resistive change elements in a resistive change element array.

According to another aspect of the present disclosure, within the method for accessing at least one resistive change element in a resistive change element array, the operation is a read operation, the resistive state of the at least one resistive change element is determined to be a low resistive state when the resistance of the at least one resistive change element is less than or equal to the resistance for the read operation and the resistive state of the at least one resistive change element is determined to be a high resistive state when the resistance of the at least one resistive change element is greater than the resistance for the read operation. Further, the low resistive state corresponds to a logic 1 and the high resistive state corresponds to a logic 0.

According to another aspect of the present disclosure, within the method for accessing at least one resistive change element in a resistive change element array, the operation is a read operation, the resistive state of the at least one resistive change element is determined to be a low resistive state when the resistance of the at least one resistive change element is less than the resistance for the read operation and the resistive state of the at least one resistive change element is determined to be a high resistive state when the resistance of the at least one resistive change element is greater than or equal to the resistance for the read operation. Further, the low resistive state corresponds to a logic 1 and the high resistive state corresponds to a logic 0.

According to another aspect of the present disclosure, within the method for accessing at least one resistive change element in a resistive change element array, the operation is a set verify operation, the resistive state of the at least one resistive change element is determined to be a low resistive state when the resistance of the at least one resistive change element is less than or equal to the resistance for the set verify operation and the resistive state of the at least one resistive change element is determined to be a resistive state other than a low resistive state when the resistance of the at least one resistive change element is greater than the resistance for the set verify operation.

According to another aspect of the present disclosure, within the method for accessing at least one resistive change element in a resistive change element array, the operation is a set verify operation, the resistive state of the at least one resistive change element is determined to be a low resistive state when the resistance of the at least one resistive change element is less than the resistance for the set verify operation and the resistive state of the at least one resistive change element is determined to be a resistive state other than a low resistive state when the resistance of the at least one resistive change element is greater than or equal to the resistance for the set verify operation.

According to another aspect of the present disclosure, within the method for accessing at least one resistive change element in a resistive change element array, the operation is a reset verify operation, the resistive state of the at least one resistive change element is determined to be a high resistive state when the resistance of the at least one resistive change element is greater than the resistance for the reset verify operation and the resistive state of the at least one resistive change element is determined to be a resistive state other than a high resistive state when the resistance of the at least one resistive change element is less than or equal to the resistance for the reset verify operation.

According to another aspect of the present disclosure, within the method for accessing at least one resistive change element in a resistive change element array, the operation is a reset verify operation, the resistive state of the at least one resistive change element is determined to be a high resistive state when the resistance of the at least one resistive change element is greater than or equal to the resistance for the reset verify operation and the resistive state of the at least one resistive change element is determined to be a resistive state other than a high resistive state when the resistance of the at least one resistive change element is less than the resistance for the reset verify operation.

Other features and advantages of the present disclosure will become apparent from the following description, which is provided below in relation to the accompanying drawings.

BRIEF DESCRIPTION OF THE DRAWINGS

FIG. 4 illustrates a flow chart showing a method for accessing at least one resistive change element in a resistive change element array.

DETAILED DESCRIPTION

Figure 1:
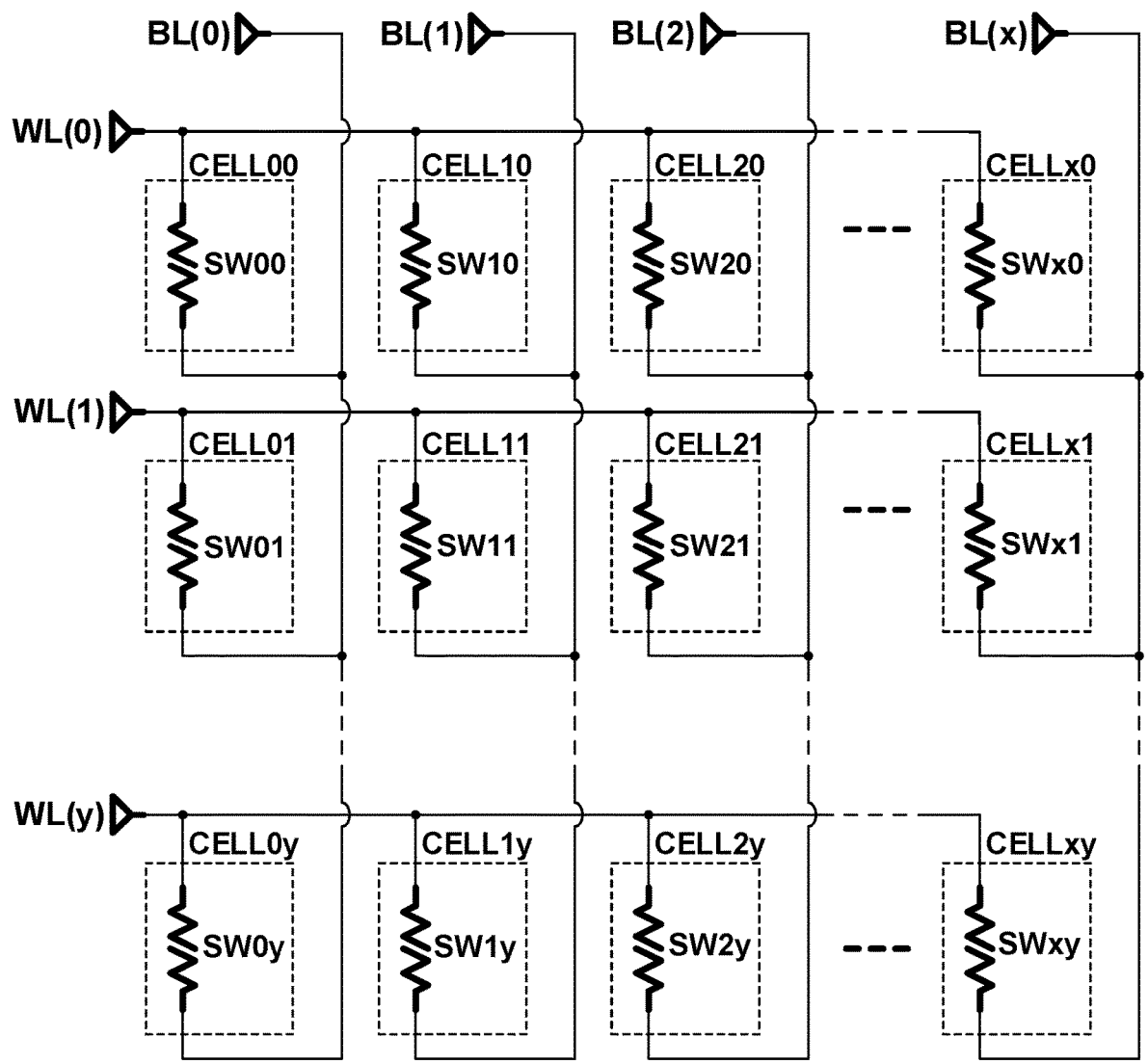
FIG. 1 illustrates a simplified schematic diagram of an exemplary architecture for an array of 1-R resistive change element cells.

The present disclosure provides devices and methods for accessing resistive change elements in a resistive change element array to determine resistive states of the resistive change elements. The devices and methods of the present disclosure access resistive change elements through a variety of operations, such as read operations, set verify operations, reset verify operations, test operations, and other types of operations. For a particular operation, at least one resistive change element in a resistive change element array is selected, a resistance for the particular operation is selected, an amount of current for the particular operation is supplied, and a resistive state of the at least one resistive change element is determined. The resistance for the particular operation is selected from resistances of resistive reference elements located in the same resistive change element array as the at least one resistive change element or is selected from a number of resistances that can be generated using resistive reference elements located in the same resistive change element array as the at least one resistive change element. The amount of current for the particular operation is based on the resistance for the particular operation. Further, the circuit conditions of the resistive change element array are compensated for by adjusting the amount of current supplied for the particular operation. Supplying an amount of current tailored for a particular operation, can permit the use of lower voltage, lower current, can increase the speed of the particular operation, and can reduce errors when determining a resistive state of a resistive change element. Additionally, adjusting an amount of current tailored for a particular operation to compensate for circuit conditions of a resistive change element array can permit the use of lower voltage, lower current, can increase the speed of the particular operation, and can reduce errors when determining a resistive state of a resistive change element.

A READ operation of a resistive change element that is programmable into two non-volatile resistive states is an operation to determine whether the resistive change element has a low resistive state (corresponding, typically, to a logic 1, a SET state) or a high resistive state (corresponding, typically, to a logic 0, a RESET state). Additionally, a READ operation is used to describe an operation where a resistive state of a resistive change element is determined without significantly altering the resistive state. A SET VERIFY operation of a resistive change element that is programmable into two non-volatile resistive states is an operation to determine whether the resistive change element has a low resistive state (corresponding, typically, to a logic 1, a SET state) or a resistive state other than a low resistive state. A SET VERIFY operation requires a correspondence between a resistance of a resistive change element and a model resistance for a low resistive state to determine the resistive change element has a low resistive state closer than a correspondence between a resistance of a resistive change element and a model resistance for a low resistive state to determine the resistive change element has a low resistive state for a READ operation. Additionally, a SET VERIFY operation is used to describe an operation where it is determined whether a resistive state of at least one resistive change element is a low resistive state without significantly altering the resistive state. A RESET VERIFY operation of a resistive change element that is programmable into two non-volatile resistive states is an operation to determine whether the resistive change element has a high resistive state (corresponding, typically, to a logic 0, a RESET state) or a resistive state other than a high resistive state. A RESET VERIFY operation requires a correspondence between a resistance of a resistive change element and a model resistance for a high resistive state to determine the resistive change element has a high resistive state closer than a correspondence between a resistance of a resistive change element and a model resistance for a high resistive state to determine the resistive change element has a high resistive state for a READ operation. Additionally, a RESET VERIFY operation is used to describe an operation where it is determined whether a resistive state of at least one resistive change element is a high resistive state without significantly altering the resistive state.

Within the present disclosure, supplying current is used to describe current flow to a point and current flow from a point. Supplying current to a point can also be referred to as sourcing current and supplying current from a point can also be referred to as sinking current because sourcing current and sinking current denote the direction of current flow relative to a point. The terms connected, coupled, electrically connected, electrically coupled, and in electrical communication are used interchangeably in this disclosure and the terms refer to a connection that allows electrical signals to flow either directly or indirectly from one component to another. The direct flow of electrical signals from one component to another does not preclude intervening passive devices that do not generate electric energy such as resistors, capacitors, and inductors. The indirect flow of electrical signals from one component to another does not preclude intervening active devices such as transistors or flow of electrical signals by electromagnetic induction. Additionally, the terms terminal, contact, and conductor are used interchangeably in this disclosure. Further, the terms bit line and word line are not limited to referring to the array lines designated below, but rather, the terms bit line and word line can be used to refer to array lines that differ from the designations below.

Resistive change element cells store information through the use of a resistive change element within the cell. Responsive to electrical stimulus, this resistive change element can be adjusted between at least two non-volatile resistive states. Typically, two resistive states are used: a low resistive state (corresponding, typically, to a logic 1, a SET state) and a high resistive state (corresponding, typically, to a logic 0, a RESET state). In this way, the resistance value of the resistive change element within the resistive change element cell can be used to store a bit of information (functioning, for example, as a 1-bit memory element). According to other aspects of the present disclosure, more than two resistive states are used, allowing a single cell to store more than one bit of information. For example, a resistive change element cell might adjust its resistive change element between four non-volatile resistive states, allowing for the storage of two bits of information in a single cell.

Resistive change elements (and arrays thereof) are well suited for use as non-volatile memory devices for storing digital data (storing logic values as resistive states) within electronic devices (such as, but not limited to, cell phones, digital cameras, solid state hard drives, and computers). However, the use of resistive change elements is not limited to memory applications. For example, resistive change elements (and arrays thereof) are also well suited for use as switches, reprogrammable fuses, and antifuses. Indeed, arrays of resistive change elements as well as the advanced architectures taught by the present disclosure could also be used within logic devices or within analog circuitry.

Typically, a resistive change element is adjusted (programmed) between different resistive states by applying an electrical stimulus across the element. For example, one or more programming pulses of specific voltages, currents, and pulse widths (as required by the needs of a specific application) can be applied across a resistive change element to adjust the resistance of a resistive change element from an initial resistance to a new desired resistance. In the above example, another one or more programming pulses of specific voltages, currents, and pulse widths (as required by the needs of a specific application) can be applied across the resistive change element to adjust the resistive change element back to the initial resistance or, depending on the specific application, a third resistance. Further, as described in U.S. patent application Ser. No. 15/136,414, pulse trains can be applied across a resistive change element to adjust a resistance of the resistive change element.

Referring now to FIG. 1, an exemplary architecture for a resistive change element array 100 is illustrated in a simplified schematic diagram. The resistive change element array 100 includes a plurality of resistive change element cells CELL00-CELLxy, and each resistive change element cell includes a resistive change element SW00-SWxy that is accessed via two array lines (a bit line and a word line) and does not include an in situ selection device or other current limiting element. The resistive change element cells CELL00-CELLxy are referred to as 1-R resistive change element cells or nR resistive change element cells because the resistive change element cells include a resistive change element and do not include an in situ selection device or other current limiting element. Additionally, the resistive change element array 100 can be referred to as a 1-R resistive change element array on an nR resistive change element array because the resistive change element array 100 includes resistive change element cells that include a resistive change element and do not include an in situ selection device or other current limiting element.

The resistive change elements SW00-SWxy can be two-terminal nanotube switching elements, phase change memory elements, metal oxide memory elements, or conductive bridge memory elements as well as other materials and designs. The resistive change elements SW00-SWxy can be formed from a plurality of materials, such as, but not limited to, metal oxide, solid electrolyte, phase change material such as a chalcogenide glass, graphene fabrics, and carbon nanotube fabrics. For example, U.S. Pat. No. 7,781,862 to Bertin et al., discloses a two-terminal nanotube switching device comprising first and second conductive terminals and a nanotube fabric article. Bertin teaches methods for adjusting the resistivity of the nanotube fabric article between a plurality of nonvolatile resistive states. In at least one embodiment, electrical stimulus is applied to at least one of the first and second conductive elements such as to pass an electric current through the nanotube fabric layer. By carefully controlling this electrical stimulus within a certain set of predetermined parameters (as described by Bertin in U.S. Pat. No. 7,781,862) the resistivity of the nanotube article can be repeatedly switched between a relatively high resistive state and relatively low resistive state. In certain embodiments, these high and low resistive states can be used to store a bit of information.

While some examples of resistive change element cells and resistive change elements within the present disclosure specifically reference carbon nanotube based resistive change element cells and resistive change elements, the devices and methods of the present disclosure are not limited in this regard. Indeed, it will be clear to those skilled in the art that the devices and methods of the present disclosure are applicable to any type of resistive change element cell or resistive change element (such as, but not limited to, phase change and metal oxide).

Each resistive change element SW00-SWxy is programmable into a low resistive state, for example a resistance on the order of 1 M$\Omega$ (corresponding, typically, to a logic '1,' a SET state), and a high resistive state, for example a resistance on the order of 10 M$\Omega$ (corresponding, typically, to a logic '0,' a RESET state). Each resistive change element SW00-SWxy has a first terminal and a second terminal. The first terminals of the resistive change elements SW00-SWxy are electrically connected to bit lines BL(0)-BL(x) and the second terminals of the resistive change elements SW00-SWxy are electrically connected to word lines WL(0)-WL(y). The resistive change element array 100 can address individual resistive change element cells within the array by driving voltages on the bit lines BL(0)-BL(x) and voltages on the word lines WL(0)-WL(y) with a sufficient electrical stimulus as required for reading, verifying, testing, or programming a selected resistive change element cell and, at the same time, prevent the other cells in the array from experiencing any electrical stimuli that would alter their stored resistive state.

As discussed above, the array architecture 100 detailed in FIG. 1 provides a circuit structure that requires each cell be responsive to only two separate array lines. Further, the array architecture 100 as detailed in FIG. 1 does not require an in situ selection device or other current limiting device with each resistive change element, and thus, the array architecture 100 allows for bipolar operation (that is, reading, verifying, testing, or programming currents can flow from word line to bit line or bit line to word line, as befits the needs of a specific application or a specific resistive change element technology). U.S. Pat. No. 9,390,790 to Bertin et al., teaches this type of architecture for a resistive change element array and describes some methods for programming and reading cells within such an array.

This 1-R resistive change element array architecture 100 detailed in FIG. 1 (and discussed within U.S. Pat. No. 9,390,790 to Bertin et al.) represents a further significant improvement and simplification with respect to circuit architecture and layout for certain applications. For example, scaling of cell size within array architecture 100 is limited only by the physical dimension requirements of the resistive change elements themselves. Further, as each resistive change element cell only includes one device (the resistive change element itself) and two interconnections (a bit line electrically connected to the first terminal of the resistive change element and a word line electrically connected to the second terminal of the resistive change element), the complexity of the resistive change element array is significantly reduced, providing—within certain applications—numerous benefits with respect to ease of fabrication, cost, increased ability for scaling, and circuit integration. As such, the simplified array architecture 100 as detailed in FIG. 1 (or a similar variation, such as, for example, the array structure shown in FIGS. 2A-2I, 3A-3F, 5A-5I, and 6A-6F) is highly desirable as the state of the art continues to demand higher density resistive change element arrays.

Figure 2A:
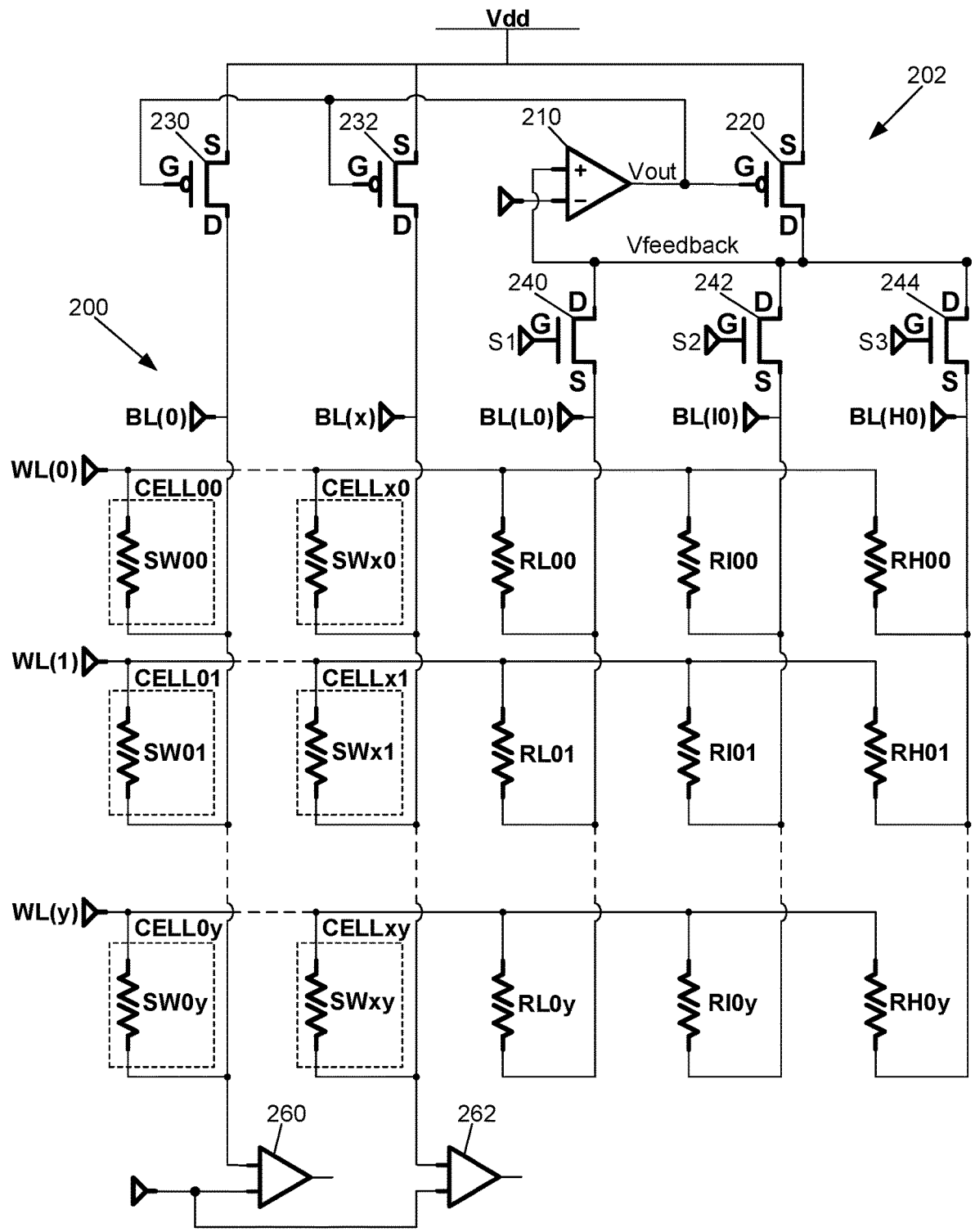
FIG. 2A illustrates a simplified schematic diagram of an exemplary architecture for accessing at least one resistive change element in a resistive change element array using a resistance of a resistive reference element to source an amount of current.

Referring now to FIG. 2A, an exemplary architecture for accessing at least one resistive change element in a resistive change element array using a resistance of a resistive reference element to source an amount of current is illustrated in a simplified schematic diagram. The exemplary architecture is operable to select from a low resistance of a low resistive reference element, an intermediate resistance of an intermediate resistive reference element, and a high resistance of a high resistive reference element, and as discussed below, for SET VERIFY operations the low resistance is selected, for READ operations the intermediate resistance is selected, and for RESET VERIFY operations the high resistance is selected. Additionally, the exemplary architecture can select from additional resistances by including additional resistive reference elements with different resistances in the exemplary architecture. The exemplary architecture, as shown in FIG. 2A, includes a resistive change element array 200, a circuit for sourcing an adjustable amount of current 202, and a plurality of sense devices 260, 262. However, the exemplary architecture is not limited to FIG. 2A and the exemplary architecture can include additional components not shown in FIG. 2A, such as resistors, amplifiers, and inverters, and can omit components shown in FIG. 2A, such as sense amplifiers. Further, the exemplary architecture is not limited to FIGS. 2B-2D and the exemplary architecture can include additional components not shown in FIGS. 2B-2D and can omit components shown in FIGS. 2B-2D.

The resistive change element array 200 includes a plurality of resistive change element cells CELL00-CELLxy and each resistive change element cell includes a resistive change element SW00-SWxy that is accessed via two array lines (a bit line and a word line) and does not include an in situ selection device or other current limiting element. The resistive change element array 200 also includes a plurality of low resistive reference elements RL00-RL0y with each low resistive reference element accessed via two array lines (a bit line and a word line), a plurality of intermediate resistive reference elements RI00-RI0y with each intermediate resistive reference element accessed via two array lines (a bit line and a word line), and a plurality of high resistive reference elements RH00-RH0y with each high resistive reference element accessed via two array lines (a bit line and a word line). Alternatively, at least one of the plurality of low resistive reference elements RL00-RL0y, the plurality of intermediate resistive reference elements RI00-RI0y, and the plurality of high resistive reference elements RH00-RH0y can be located outside the resistive change element array 200.

The resistive change element cells CELL00-CELLxy are referred to as 1-R resistive change element cells or nR resistive change element cells because the resistive change element cells CELL00-CELLxy include a resistive change element and do not include an in situ selection device or other current limiting element. The resistive change element cells CELL00-CELLxy can have the same or similar structure to the resistive change element cells CELL00-CELLxy in the resistive change element array 100 discussed above with respect to FIG. 1. Additionally, the resistive change element array 200 can be referred to as a 1-R resistive change element array or an nR resistive change element array because the resistive change element array 200 includes resistive change element cells that include a resistive change element and do not include an in situ selection device or other current limiting element.

The location of the low resistive reference elements RL00-RL0y, the intermediate resistive reference elements RI00-RI0y, the high resistive reference elements RH00-RH0y, and the resistive change elements SW00-SWxy in the resistive change element array 200 causes the low resistive reference elements RL00-RL0y, the intermediate resistive reference elements RI00-RI0y, the high resistive reference elements RH00-RH0y, and the resistive change elements SW00-SWxy to be subject to essentially the same circuit conditions, such as temperature, array line capacitance and impedance, electrical resistance of unselected cells, and leakage paths within the array. Locating the low resistive reference elements RL00-RL0y, the intermediate resistive reference elements RI00-RI0y, the high resistive reference elements RH00-RH0y, and the resistive change elements SW00-SWxy in the resistive change element array 200 can reduce the impact of circuit conditions of the resistive change element array 200 because the low resistive reference elements RL00-RL0y, the intermediate resistive reference elements RI00-RI0y, the high resistive reference elements RH00-RH0y, and the resistive change elements SW00-SWxy are subject to essentially the same circuit conditions. Additionally, constructing the low resistive reference elements RL00-RL0y, the intermediate resistive reference elements RI00-RI0y, the high resistive reference elements RH00-RH0y, and the resistive change elements SW00-SWxy from the same materials can reduce the impact of variations in electrical characteristics caused by the low resistive reference elements RL00-RL0y, the intermediate resistive reference elements RI00-RI00y, the high resistive reference elements RH00-RH0y, and the resistive change elements SW00-SWxy being constructed from different materials.

The resistive change elements SW00-SWxy, as discussed above, can be two-terminal nanotube switching elements, phase change memory elements, metal oxide memory elements, or conductive bridge memory elements as well as other materials and designs. The resistive change elements SW00-SWxy can formed from a plurality of materials, such as, but not limited to, metal oxide, solid electrolyte, phase change material such as a chalcogenide glass, graphene fabrics, and carbon nanotube fabrics. The resistive change elements SW00-SWxy are programmable into a low resistive state, for example a resistance on the order of 1 MΩ (corresponding, typically, to a logic '1,' a SET state), and a high resistive state, for example a resistance on the order of 10 MΩ (corresponding, typically, to a logic '0,' a RESET state).

The low resistive reference elements RL00-RL0y can be resistors, two-terminal nanotube switching elements, phase change memory elements, metal oxide memory elements, or conductive bridge memory elements as well as other materials and designs. The low resistive reference elements RL00-RL0y can be formed from a plurality of materials, such as, but not limited to, metal oxide, solid electrolyte, phase change material such as a chalcogenide glass, graphene fabrics, and carbon nanotube fabrics. The resistances of the low resistive reference elements RL00-RL0y are design variables selected by a circuit designer. The resistances of the low resistive reference elements RL00-RL0y set an upper boundary for resistance values that correspond with a low resistive state during SET VERIFY operations. The circuit designer typically selects resistances for the low resistive reference elements RL00-RL0y greater than a model resistance for a low resistive state of the resistive change elements SW00-SWxy so that the resistive change elements SW00-SWxy can have resistances greater than the model resistance for the low resistive state and be determined to have a low resistive state during SET VERIFY operations.

For example, when a model resistance for a low resistive state of the resistive change elements SW00-SWxy is 1 MΩ, a circuit designer can select the resistances of the low resistive reference elements RL00-RL0y to be 2 MΩ, and thus, resistive change elements having a resistance less than or equal to approximately 2 MΩ are determined to have a low resistive state during SET VERIFY operations. It is noted that the circuit designer typically selects resistances for the low resistive reference elements RL00-RL0y that are greater than a model resistance for a low resistive state of the resistive change elements SW00-SWxy and less than resistances of the intermediate resistive reference elements RI00-RI0y. It is further noted that the low resistive reference elements RL00-RL0y are not limited to having approximately the same resistance. For example, the low resistive reference elements located closer to the circuit for sourcing an adjustable amount of current 202 can have resistances greater than resistances of the low resistive reference elements located further from the circuit for sourcing an adjustable amount of current 202.

The intermediate resistive reference elements RI00-RI0y can be resistors, two-terminal nanotube switching elements, phase change memory elements, metal oxide memory elements, or conductive bridge memory elements as well as other materials and designs. The intermediate resistive reference elements RI00-RI0y can be formed from a plurality of materials, such as, but not limited to, metal oxide, solid electrolyte, phase change material such as a chalcogenide glass, graphene fabrics, and carbon nanotube fabrics. The resistances of the intermediate resistive reference elements RI00-RI0y are design variables selected by a circuit designer. The resistances of the intermediate resistive reference elements RI00-RI0y set a boundary for resistance values that correspond with a low resistive state during READ operations and resistance values that correspond with a high resistive state during READ operations. The circuit designer typically selects resistances for the intermediate resistive reference elements RI00-RI0y greater than resistances of the low resistive reference elements RL00-RL0y and less than resistances of the high resistive reference elements RH00-RH0y.

For example, when a model resistance for a low resistive state of the resistive change elements SW00-SWxy is 1 MΩ and a model resistance for a high resistive state of the resistive change elements SW00-SWxy is 10 MΩ, a circuit designer can select the resistances of the intermediate resistive reference elements RI00-RI0y to be 5.5 MΩ, and thus, resistive change elements having a resistance less than or equal to approximately 5.5 MΩ are determined to have a low resistive state during READ operations and resistive change elements SW00-SWxy having a resistance greater than approximately 5.5 MΩ are determined to have a high resistive state during READ operations. The resistances of the intermediate resistive reference elements RI00-RI0y are not limited to a resistance at the exact midpoint between a model resistance for a low resistive state of the resistive change elements SW00-SWxy and a model resistance for a high resistive state of the resistive change elements SW00-SWxy, but rather the resistances of the intermediate resistive reference elements RI00-RI0y can be any resistance between the resistances of the low resistive reference elements RL00-RL0y and the resistances of the high resistive reference elements RH00-RH0y. It is noted that the intermediate resistive reference elements RI00-RI0y are not limited to having approximately the same resistance. For example, the intermediate resistive reference elements located closer to the circuit for sourcing an adjustable amount of current 202 can have resistances greater than resistances of the intermediate resistive reference elements located further from the circuit for sourcing an adjustable amount of current 202.

The high resistive reference elements RH00-RH0y can be resistors, two-terminal nanotube switching elements, phase change memory elements, metal oxide memory elements, or conductive bridge memory elements as well as other materials and designs. The high resistive reference elements RH00-RH0y can be formed from a plurality of materials, such as, but not limited to, metal oxide, solid electrolyte, phase change material such as a chalcogenide glass, graphene fabrics, and carbon nanotube fabrics. The resistances of the high resistive reference elements RH00-RH0y are design variables selected by a circuit designer. The resistances of the high resistive reference elements RH00-RH0y set a lower boundary for determining resistance values that correspond with a high resistive state during RESET VERIFY operations. The circuit designer typically selects resistances for the high resistive reference elements RH00-RH0y less than a model resistance for a high resistive state of the resistive change elements SW00-SWxy so that the resistive change elements SW00-SWxy can have resistances less than the model resistance for the high resistive state and be determined to have a high resistive state during RESET VERIFY operations.

For example, when a model resistance for a high resistive state of the resistive change elements SW00-SWxy is 10 MΩ, a circuit designer can select the resistances of the high resistive reference elements RH00-RH0y to be 9 MΩ, and thus, resistive change elements having a resistance greater than approximately 9 MΩ are determined to have a high resistive state during RESET VERIFY operations. It is noted that the circuit designer typically selects resistances for the high resistive reference elements RH00-RH0y that are greater than resistances of the intermediate resistive reference elements RI00-RI0y and less than a model resistance for a high resistive state of the resistive change elements SW00-SWxy. It is further noted that the high resistive reference elements RH00-RH0y are not limited to having approximately the same resistance. For example, the high resistive reference elements located closer to the circuit for sourcing an adjustable amount of current 202 can have resistances greater than resistances of the high resistive reference elements located further from the circuit for sourcing an adjustable amount of current 202.

Additionally, selecting resistances of the low resistive reference elements RL00-RL0y less than resistances of the intermediate resistive reference elements RI00-RI0y and resistances of the high resistive reference elements RH00-RH0y greater than resistances of the intermediate resistive reference elements RI00-RI0y creates a buffer between resistance values that correspond with a low resistive state during SET VERIFY operations and resistance values that correspond with a high resistive state during RESET VERIFY operations. Resistive change elements having resistances in the buffer are determined to have a low resistive state during READ operations or a high resistive state during READ operations. However, the resistive change elements having resistances in the buffer are determined to have a resistive state other than a low resistive state during SET VERIFY operations or are determined to have a resistive state other than a high resistive state during RESET VERIFY operations. Thus, when the resistances of the low resistive reference elements RL00-RL0y are less than the resistances of the intermediate resistive reference elements RI00-RI0y, SET VERIFY operations require a closer correspondence between resistances of the resistive change elements SW00-SWxy and a model resistance for a low resistive state than READ operations and when the resistances of the high resistive reference elements RH00-RH0y are greater than the resistances of the intermediate resistive reference elements RI00-RI0y, RESET VERIFY operations require a closer correspondence between resistances of the resistive change elements SW00-SWxy and a model resistance for a high resistive state than READ operations.

For example, when the low resistive reference elements RL00-RL0y have resistances of 2 MΩ, the intermediate resistive reference elements RI00-RI0y have resistances of 5.5 MΩ, and the high resistive reference elements RH00-RH0y have resistances of 9 MΩ, the low resistive reference elements RL00-RL0y and the high resistive reference elements RH00-RH0y create a buffer between approximately 2 MΩ and approximately 9 MΩ. In the above example, resistive change elements having resistances from approximately 2 MΩ to approximately 5.5 MΩ are determined to have a low resistive state during READ operations but are determined to have a resistive state other than a low resistive state during SET VERIFY operations and resistive change elements having resistances from approximately 5.5 MΩ to approximately 9 MΩ are determined to have a high resistive state during READ operations but are determined to have a resistive state other than a high resistive state during RESET VERIFY operations. A circuit designer can adjust the buffer by adjusting the resistances of the low resistive reference elements RL00-RL0y and the resistances of the high resistive reference elements RH00-RH0y. It is noted the resistances of the low resistive reference elements RL00-RL0y and the resistances of the high resistive reference element RH00-RH0y are not required to be equal distances from the resistance of the intermediate resistive change element RI00-RI0y. For example, the resistances of the low resistive reference elements RL00-RL0y can be closer to the resistances of the intermediate resistive reference elements RI00-RI0y or the resistances of the high resistive reference elements RH00-RH0y can be closer to the resistances of the intermediate resistive reference elements RI00-RI0y.

Each resistive change element SW00-SWxy has a first terminal and a second terminal. The first terminals of the resistive change elements SW00-SWxy are electrically connected to bit lines BL(0)-BL(x) and the second terminals of the resistive change elements SW00-SWxy are electrically connected to word lines WL(0)-WL(y). Each low resistive reference element RL00-RL0y has a first terminal and a second terminal. The first terminals of the low resistive reference elements RL00-RL0y are electrically connected to a bit line BL(L0) and the second terminals of the low resistive reference elements RL00-RL0y are electrically connected to word lines WL(0)-WL(y). Each intermediate resistive reference element RI00-RI0y has a first terminal and a second terminal. The first terminals of the intermediate resistive reference elements RI00-RI0y are electrically connected to a bit line BL(I0) and the second terminals of the intermediate resistive reference elements RI00-RI0y are electrically connected to word lines WL(0)-WL(y). Each high resistive reference element RH00-RH0y has a first terminal and a second terminal. The first terminals of the high resistive reference elements RH00-RH0y are electrically connected to a bit line BL(H0) and the second terminals of the high resistive reference elements RH00-RH0y are electrically connected to word lines WL(0)-WL(y).

The resistive change element array 200 is electrically connected to the circuit for sourcing an adjustable amount of current 202 and the plurality of sense devices 260, 262. The circuit for sourcing an adjustable amount of current 202 includes a differential amplifier 210, a first p-channel metal oxide semiconductor field effect transistor (MOSFET) 220, also referred to as a first PMOS transistor 220, a plurality of p-channel MOSFETs 230, 232, also referred to as a plurality of PMOS transistors 230, 232, and a plurality of n-channel MOSFETs 240, 242, 244, also referred to as a plurality of NMOS transistors 240, 242, 244. The differential amplifier 210 has a non-inverting input terminal, an inverting input terminal, and an output terminal. The first PMOS transistor 220 has a source terminal, a drain terminal, and a gate terminal. Each PMOS transistor in the plurality of PMOS transistors 230, 232 has a source terminal, a drain terminal, and a gate terminal. Each NMOS transistor in the plurality of NMOS transistors 240, 242, 244 has a source terminal, a drain terminal, and a gate terminal. Each sense device in the plurality of sense devices 260, 262 has a first input terminal, a second input terminal, and an output terminal. It is noted that the differential amplifier 210, the first PMOS transistor 220, each PMOS transistor in the plurality of PMOS transistors 230, 232, each NMOS transistor in the plurality of NMOS transistors 240, 242, 244, and each sense device in the plurality of sense device 260, 262 can additionally have other terminals.

The differential amplifier 210 can be an amplifier that generates an output voltage based on the difference between two input voltages, such as an operational amplifier. The sense devices 260, 262 can be components that generate an output voltage that corresponds with a data value or a logic value based on at least one input voltage, such as sense amplifiers, differential amplifiers, and analog to digital converters. It is noted that, as discussed above, the sense devices in the plurality of sense device 260, 262 can additionally have other terminals, such as when the sense devices are fully differential sense amplifiers having positive output terminals and negative output terminals. Additionally, the circuit for sourcing an adjustable amount of current 202 can include other types of field effect transistors, such as carbon nanotube field effect transistors (CNTFETs), SiGE FETs, fully-depleted silicon-on-insulator FETs, or multiple gate field effect transistors such as FinFETs, in place of the first PMOS transistor 220, the plurality of PMOS transistors 230, 232, and the plurality of NMOS transistors 240, 242, 244. When field effect transistors that do not require a semiconductor substrate are used with nanotube based resistive change elements, this enables chips fabricated entirely on insulator material, and additionally, enables the field effect transistors to be stacked to reduce the amount of chip area consumed by the circuit for sourcing an adjustable amount of current 202.

An inverting input terminal of the differential amplifier 210, can be electrically connected to a power supply, a voltage source, a driver circuit, a resistor divider, a test circuit, a control circuit such as a processor, a controller, a programmable logic device, and a field programmable gate array (FGPA), or other device that can supply a desired voltage, a non-inverting input terminal of the differential amplifier 210 is electrically connected to a drain terminal of the first PMOS transistor 220 and a drain terminal of each NMOS transistor in the plurality of NMOS transistors 240, 242, 244 forming a feedback loop, and an output terminal of the differential amplifier 210 is electrically connected to a gate terminal of the first PMOS transistor 220, and a gate terminal of each PMOS transistor in the plurality of PMOS transistors 230, 232. A source terminal of the first PMOS transistor 220 is electrically connected to a power supply, a voltage source, a driver circuit or other device that supplies the system voltage Vdd, a drain terminal of the first PMOS transistor 220 is electrically connected to a drain terminal of each NMOS transistor in the plurality of NMOS transistors 240, 242, 244 and a non-inverting input terminal of the differential amplifier 210, and a gate terminal of the first PMOS transistor 220 is electrically connected to an output terminal of the differential amplifier 210. Source terminals of the PMOS transistors in the plurality of PMOS transistors 230, 232 are electrically connected to a power supply, a voltage source, a driver circuit, or other device that supplies the system voltage Vdd, drain terminals of the PMOS transistors in the plurality of PMOS transistors 230, 232 are electrically connected to bit lines BL(0)-BL(x) of the resistive change element array 200, and gate terminals of the PMOS transistors in the plurality of PMOS transistors 230, 232 are electrically connected to an output terminal of the differential amplifier 210. Drain terminals of the NMOS transistors in the plurality of NMOS transistors 240, 242, 244 are electrically connected to a drain terminal of the first PMOS transistor 220 and a non-inverting input terminal of the differential amplifier 210, source terminals of the NMOS transistors in the plurality of NMOS transistors 240, 242, 244 are electrically connected to bit lines BL(L0)-BL(H0) of the resistive change element array 200, and gate terminals of the NMOS transistors in the plurality of NMOS transistors 240, 242, 244 can be electrically connected to a test circuit or a control circuit such as a processor, a controller, a programmable logic device, and a FGPA, that supplies control signals S1-S3 for turning on and turning off the NMOS transistors.

Alternatively, the circuit for sourcing an adjustable amount of current 202 can additionally include a plurality of field effect (FETs), such as metal oxide semiconductor field effect transistors (MOSFETs), carbon nanotube field effect transistors (CNTFETs), SiGE FETs, fully-depleted silicon-on-insulator FETs, or multiple gate field effect transistors such as FinFETs, for controlling current flow into the bit lines BL(0)-BL(x). Each FET in the plurality of FETs is electrically connected in series with a PMOS transistor in the plurality of PMOS transistors 230, 232 and each FET in the plurality of FETs has a gate terminal electrically connected to a test circuit or a control circuit such as a processor, a controller, a programmable logic device, and a FGPA, that supplies a control signal for turning on and turning off the FET.

Figure 2B:
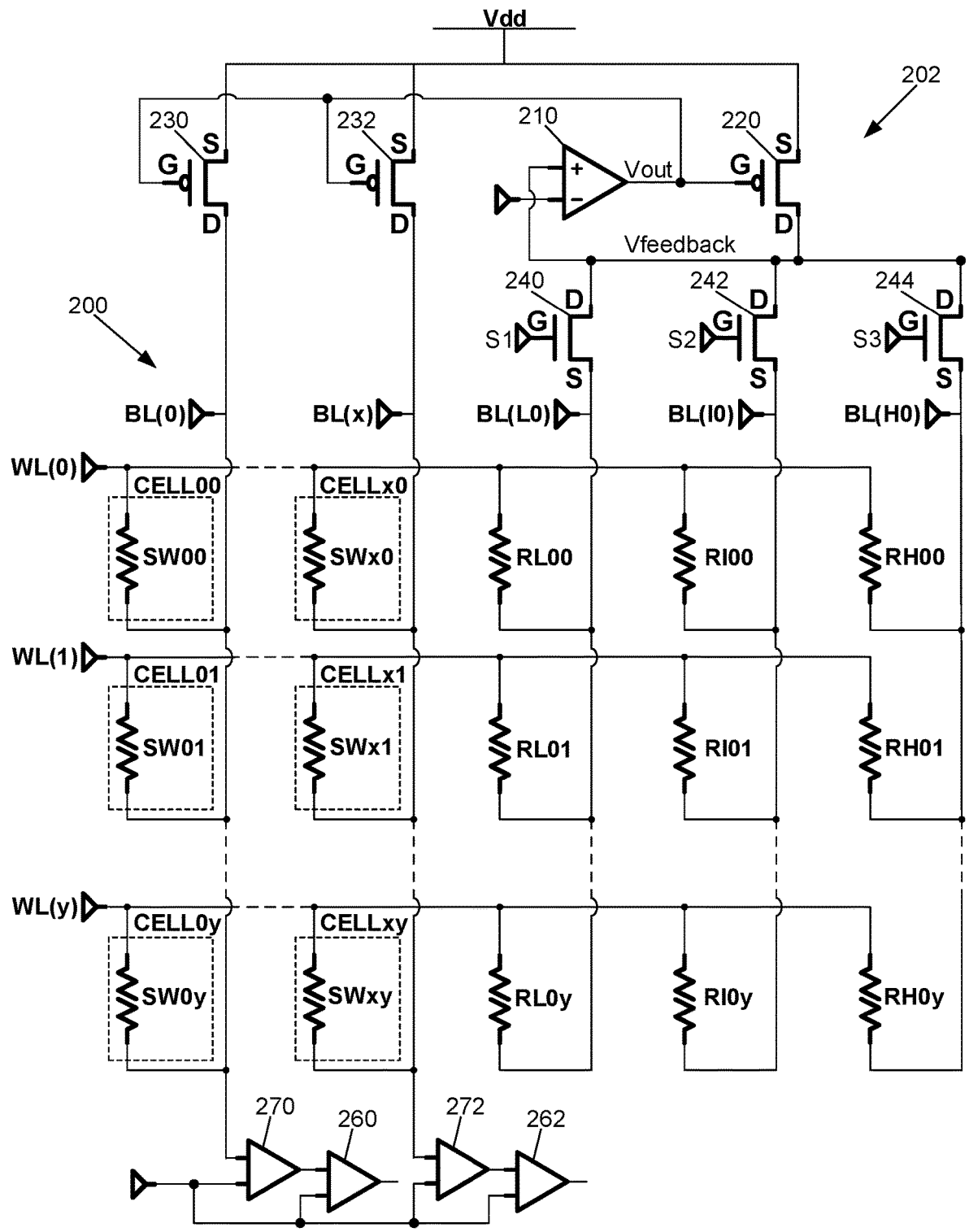
FIG. 2B illustrates a simplified schematic diagram of the exemplary architecture of FIG. 2A further including amplifiers for increasing small signals.
Figure 2C:
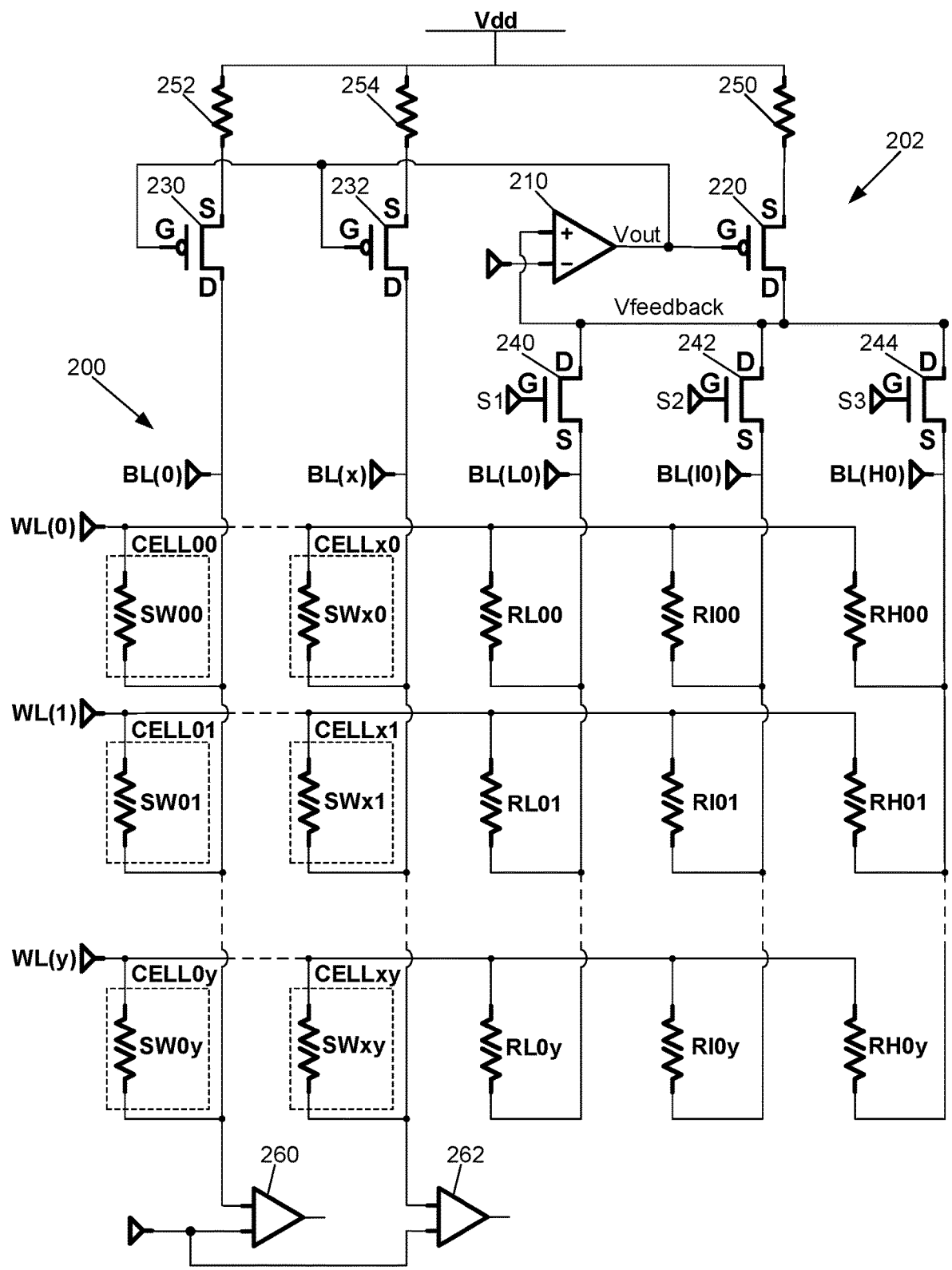
FIG. 2C illustrates a simplified schematic diagram of the exemplary architecture of FIG. 2A further including resistors for reducing current variations.
Figure 2D:
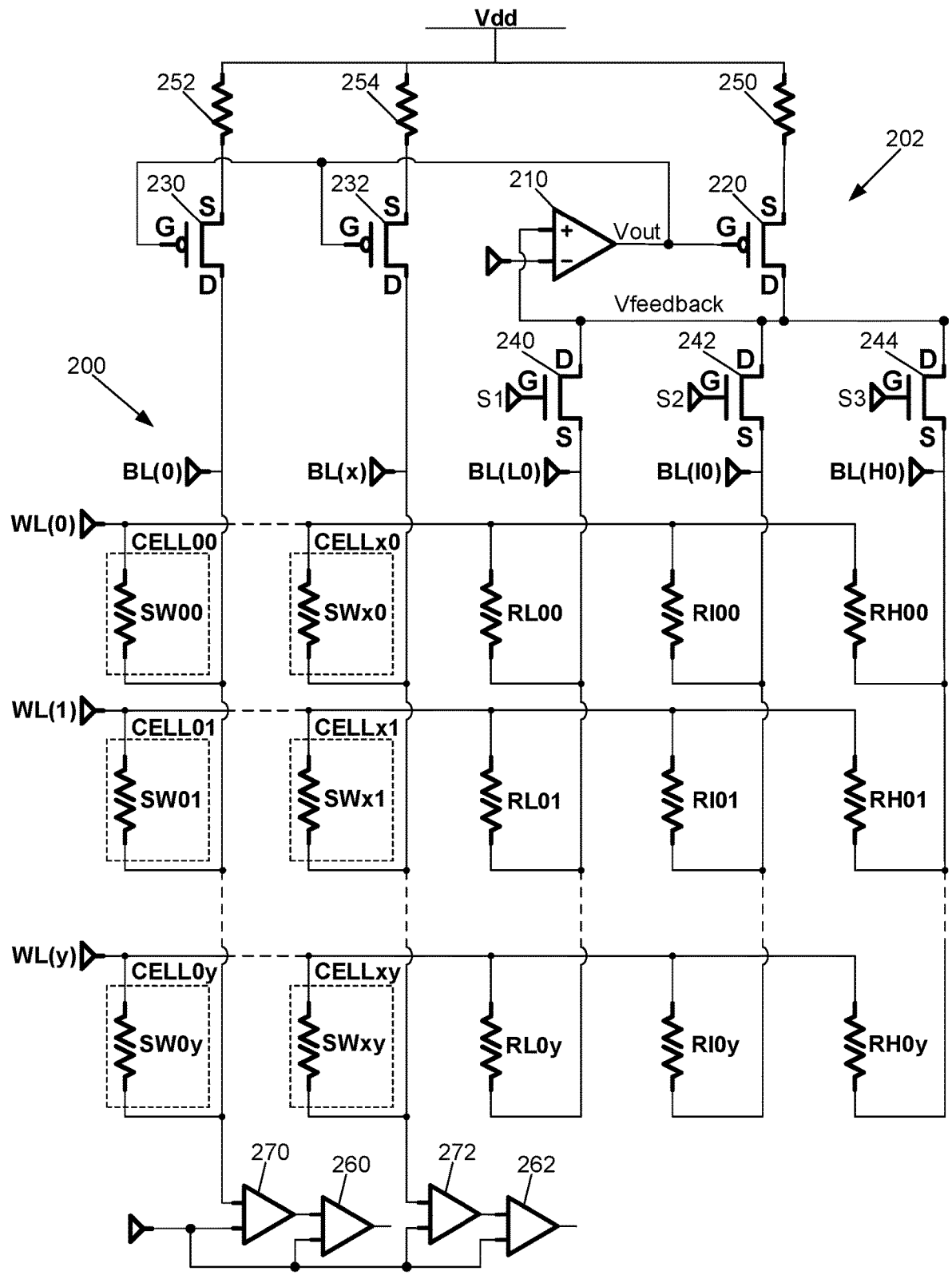
FIG. 2D illustrates a simplified schematic diagram of the exemplary architecture of FIG. 2A further including amplifiers for increasing small signals and resistors for reducing current variations.

Alternatively, as shown in FIGS. 2C-2D, a source terminal of the first PMOS transistor 220 is electrically connected to a power supply, a voltage source, a driver circuit, or other device by a resistor 250 for reducing variations in an amount of current supplied by the first PMOS transistor 220. Additionally, as shown in FIGS. 2C-2D, source terminals of the PMOS transistors in the plurality of PMOS transistors 230, 232 are electrically connected to a power supply, a voltage source, a driver circuit, or other device by resistors in a plurality of resistors 252, 254 for reducing variations in amounts of current supplied by the PMOS transistors in the plurality of PMOS transistors 230, 232.

Referring back to FIG. 2A, first input terminals of the sense devices in the plurality of sense devices 260, 262 are electrically connected to bit lines BL(0)-BL(x) of the resistive change element array 200, second input terminals of the sense devices in the plurality of sense devices 260, 262 can be electrically connected to a power supply, a voltage source, a driver circuit, a resistor divider, a test circuit, a control circuit such as a processor, a controller, a programmable logic device, and a FGPA, or other device that can supply a desired voltage, and output terminals of the sense devices in the plurality of sense devices 260, 262 can be electrically connected to a bus, a buffer, a level shift circuit, a test circuit, or a control circuit such as a processor, a controller, a programmable logic device and an FGPA.

Alternatively, as shown in FIGS. 2B and 2D, a plurality of amplifiers 270, 272 for increasing small signals are electrically connected to the resistive change element array 200 and the plurality of sense devices 260, 262 are electrically connected to the plurality of amplifiers 270, 272. Each amplifier in the plurality of amplifiers 270, 272 has a first input terminal, a second input terminal, and an output terminal. First input terminals of the amplifiers in the plurality of amplifiers 270, 272 are electrically connected to bit lines BL(0)-BL(x) of the resistive change element array 200, second input terminals of the amplifiers in the plurality of amplifiers 270, 272 can be electrically connected to a power supply, a voltage source, a driver circuit, a resistor divider, a test circuit, a control circuit such as a processor, a controller, a programmable logic device, and a FGPA, or other device that can supply a desired voltage, and output terminals of the amplifiers in the plurality of amplifiers 270, 272 are electrically connected to first input terminals of sense devices in the plurality of sense device 260, 262. It is noted that each amplifier in the plurality of amplifiers 270, 272 can additionally have other terminals. Also, as shown in FIGS. 2B and 2D, second input terminals of the sense devices in the plurality of sense devices 260, 262 can be electrically connected to a power supply, a voltage source, a driver circuit, a resistor divider, a test circuit, a control circuit such as a processor, a controller, a programmable logic device, and a FGPA, or other device that can supply a desired voltage, and output terminals of the sense devices in the plurality of sense devices 260, 262 can be electrically connected to a bus, a buffer, a level shift circuit, a test circuit, or a control circuit such as a processor, a controller, a programmable logic device, and an FGPA.

Figure 2E:
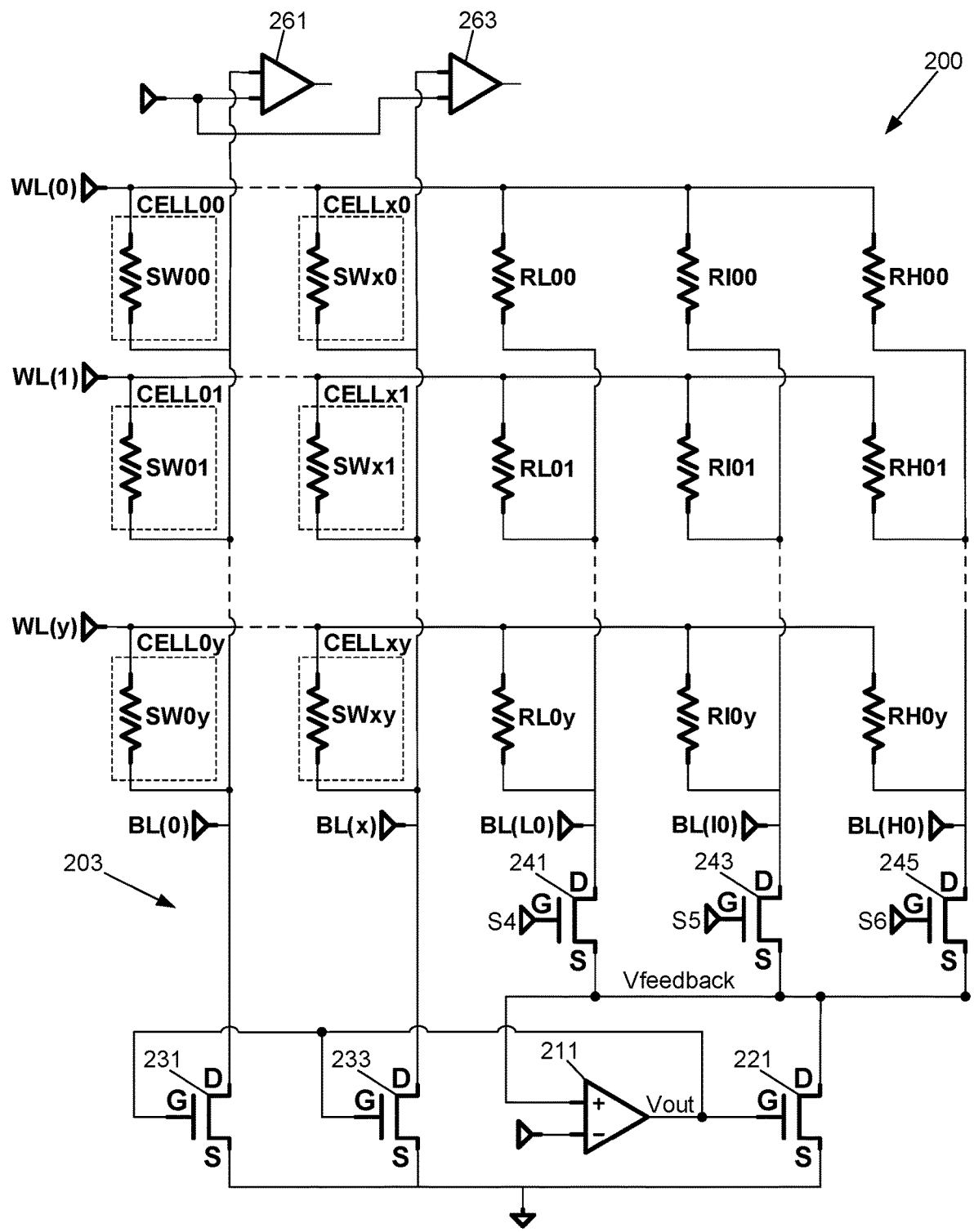
FIG. 2E illustrates a simplified schematic diagram of an exemplary architecture for accessing at least one resistive change element in a resistive change element array using a resistance of a resistive reference element to sink an amount of current.

Referring now to FIG. 2E, an exemplary architecture for accessing at least one resistive change element in a resistive change element array using a resistance of a resistive reference element to sink an amount of current is illustrated in a simplified schematic diagram. The exemplary architecture is operable to select from a low resistance of a low resistive reference element, an intermediate resistance of an intermediate resistive reference element, and a high resistance of a high resistive reference element, and as discussed below, for SET VERIFY operations the low resistance is selected, for READ operations the intermediate resistance is selected, and for RESET VERIFY operations the high resistance is selected. Additionally, the exemplary architecture can select from additional resistances by including additional resistive reference elements with different resistances in the exemplary architecture. The exemplary architecture, as shown in FIG. 2E, includes the resistive change element array 200, a circuit for sinking an adjustable amount of current 203, and a plurality of sense devices 261, 263. However, the exemplary architecture is not limited to FIG. 2E and the exemplary architecture can include additional components not shown in FIG. 2E, such as resistors, amplifiers, and inverters, and can omit components shown in FIG. 2E, such as sense amplifiers. Further, the exemplary architecture is not limited to FIGS. 2F-2I and the exemplary architecture can include additional components not shown in FIGS. 2F-2I and can omit components shown in FIGS. 2F-2I. It is noted that the structure of the resistive change element array 200 is discussed above, and thus, the structure of the resistive change element array 200 is not discussed below.

The resistive change element array 200 is electrically connected to the circuit for sinking an adjustable amount of current 203 and the plurality of sense devices 261, 263. The circuit for sinking an adjustable amount of current 203 includes a differential amplifier 211, a first n-channel metal oxide semiconductor field effect transistor (MOSFET) 221, also referred to as a first NMOS transistor 221, a first plurality of n-channel MOSFETs 231, 233, also referred to as a first plurality of NMOS transistors 231, 233, and a second plurality of n-channel MOSFETs 241, 243, 245, also referred to as a second plurality of NMOS transistors 241, 243, 245. The differential amplifier 211 has a non-inverting input terminal, an inverting input terminal, and an output terminal. The first NMOS transistor 221 has a source terminal, a drain terminal, and a gate terminal. Each NMOS transistor in the first plurality of NMOS transistors 231, 233 has a source terminal, a drain terminal, and a gate terminal. Each NMOS transistor in the second plurality of NMOS transistors 241, 243, 245 has a source terminal, a drain terminal, and a gate terminal. Each sense device in the plurality of sense devices 261, 263 has a first input terminal, a second input terminal, and an output terminal. It is noted that the differential amplifier 211, the first NMOS transistor 221, each NMOS transistor in the first plurality of NMOS transistors 231, 233, each NMOS transistor in the second plurality of NMOS transistors 241, 243, 245, and each sense device in the plurality of sense devices 261, 263 can additionally have other terminals.

The differential amplifier 211 can be an amplifier that generates an output voltage based on the difference between two input voltages, such as an operational amplifier. The sense devices 261, 263 can be components that generate an output voltage that corresponds with a data value or a logic value based on at least one input voltage, such as sense amplifiers, differential amplifiers, and analog to digital converters. It is noted that, as discussed above, the sense devices in the plurality of sense device 261, 263 can additionally have other terminals, such as when the sense devices are fully differential sense amplifiers having positive output terminals and negative output terminals. Additionally, the circuit for sinking an adjustable amount of current 203 can include other types of field effect transistors, such as carbon nanotube field effect transistors (CNTFETs), SiGE FETs, fully-depleted silicon-on-insulator FETs, or multiple gate field effect transistors such as FinFETs, in place of the first NMOS transistor 221, the first plurality of NMOS transistors 231, 233, and the second plurality of NMOS transistors 241, 243, 245. When field effect transistors that do not require a semiconductor substrate are used with nanotube based resistive change elements, this enables chips fabricated entirely on insulator material, and additionally, enables the field effect transistors to be stacked to reduce the amount of chip area consumed by the circuit for sinking an adjustable amount of current 203.

An inverting input terminal of the differential amplifier 211, can be electrically connected to a power supply, a voltage source, a driver circuit, a resistor divider, a test circuit, a control circuit such as a processor, a controller, a programmable logic device, and a field programmable gate array (FGPA), or other device that can supply a desired voltage, a non-inverting input terminal of the differential amplifier 211 is electrically connected to a drain terminal of the first NMOS transistor 221 and a source terminal of each NMOS transistor in the second plurality of NMOS transistors 241, 243, 245 forming a feedback loop, and an output terminal of the differential amplifier 211 is electrically connected to a gate terminal of the first NMOS transistor 221, and a gate terminal of each NMOS transistor in the first plurality of PMOS transistors 231, 233. A source terminal of the first NMOS transistor 221 is electrically connected to 0 volts or ground, a drain terminal of the first NMOS transistor 221 is electrically connected to a source terminal of each NMOS transistor in the second plurality of NMOS transistors 241, 243, 245 and a non-inverting input terminal of the differential amplifier 211, and a gate terminal of the first NMOS transistor 221 is electrically connected to an output terminal of the differential amplifier 211. Source terminals of the NMOS transistors in the first plurality NMOS transistors 231, 233 are electrically connected to 0 volts or ground, drain terminals of the NMOS transistors in the first plurality of NMOS transistors 231, 233 are electrically connected to bit lines BL(0)-BL(x) of the resistive change element array 200, and gate terminals of the NMOS transistors in the first plurality NMOS transistors 231, 233 are electrically connected to an output terminal of the differential amplifier 211. Drain terminals of the NMOS transistors in the second plurality of NMOS transistors 241, 243, 245 are electrically connected to bit lines BL(L0)-BL(H0) of the resistive change element array 200, source terminals of the NMOS transistors in the second plurality of NMOS transistors 241, 243, 245 are electrically connected to a drain terminal of the first NMOS transistor 221 and a non-inverting input terminal of the differential amplifier 211, and gate terminals of the NMOS transistors in the second plurality of NMOS transistors 241, 243, 245 can be electrically connected to a test circuit or a control circuit such as a processor, a controller, a programmable logic device, and a FGPA, that supplies control signals S4-S6 for turning on and turning off the NMOS transistors.

Alternatively, the circuit for sinking an adjustable amount of current 203 can additionally include a plurality of field effect (FETs), such as metal oxide semiconductor field effect transistors (MOSFETs), carbon nanotube field effect transistors (CNTFETs), SiGE FETs, fully-depleted silicon-on-insulator FETs, or multiple gate field effect transistors such as FinFETs, for controlling current flow from the bit lines BL(0)-BL(x). Each FET in the plurality of FETs is electrically connected in series with a NMOS transistor in the first plurality of NMOS transistors 231, 233 and each FET in the plurality of FETs has a gate terminal electrically connected to a test circuit or a control circuit such as a processor, a controller, a programmable logic device, and a FGPA, that supplies a control signal for turning on and turning off the FET.

Figure 2F:
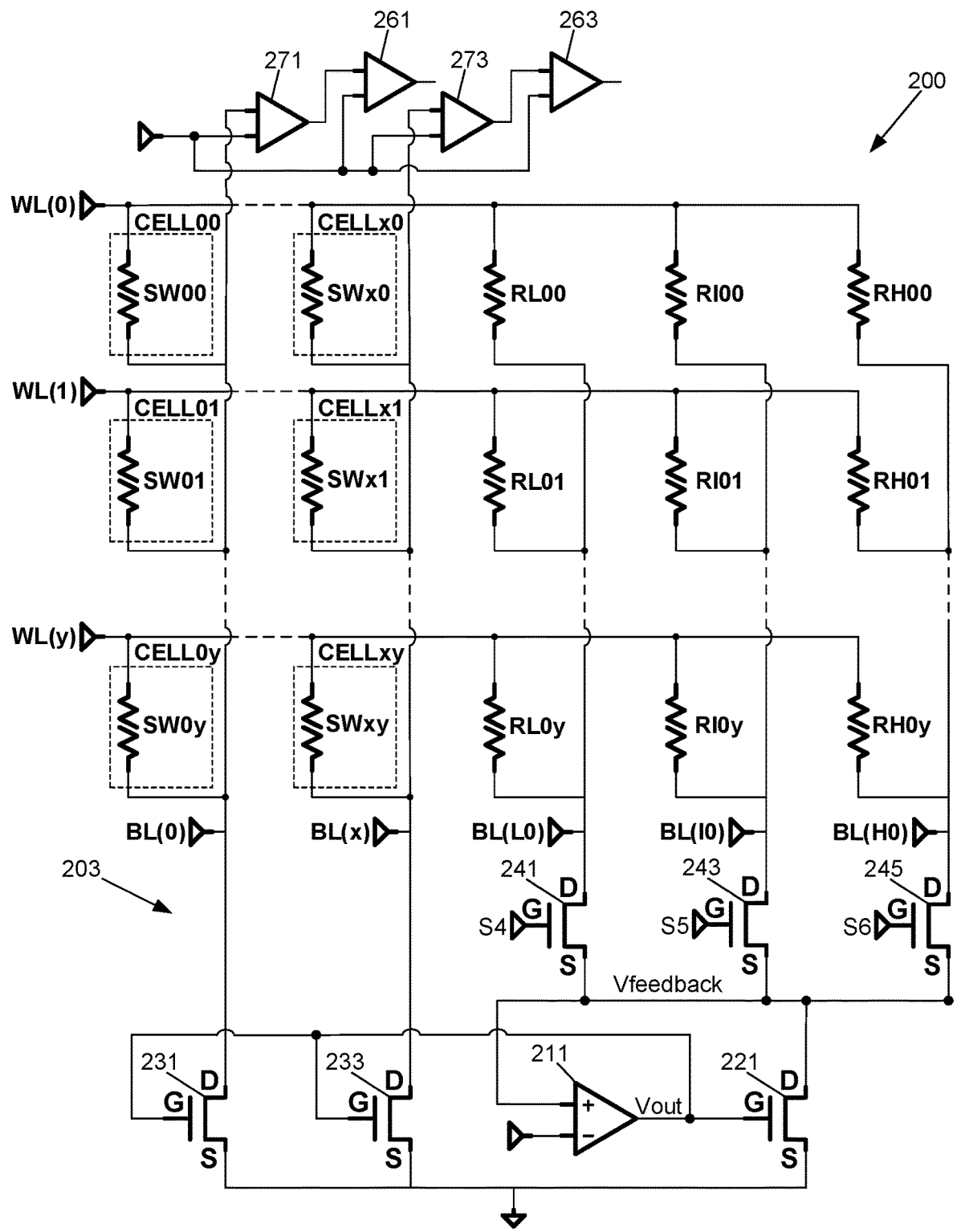
FIG. 2F illustrates a simplified schematic diagram of the exemplary architecture of FIG. 2E further including amplifiers for increasing small signals.
Figure 2G:
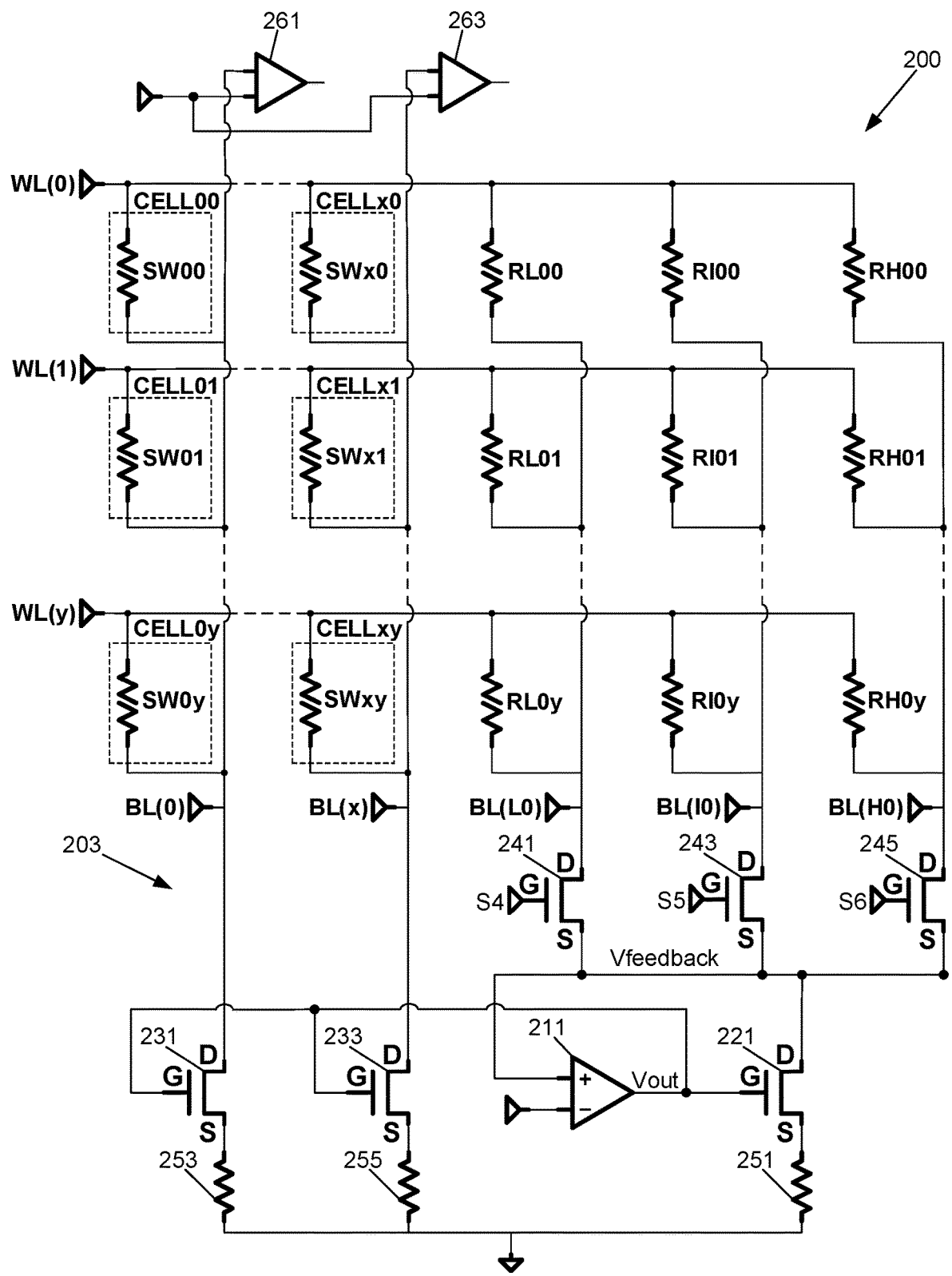
FIG. 2G illustrates a simplified schematic diagram of the exemplary architecture of FIG. 2E further including resistors for reducing current variations.
Figure 2H:
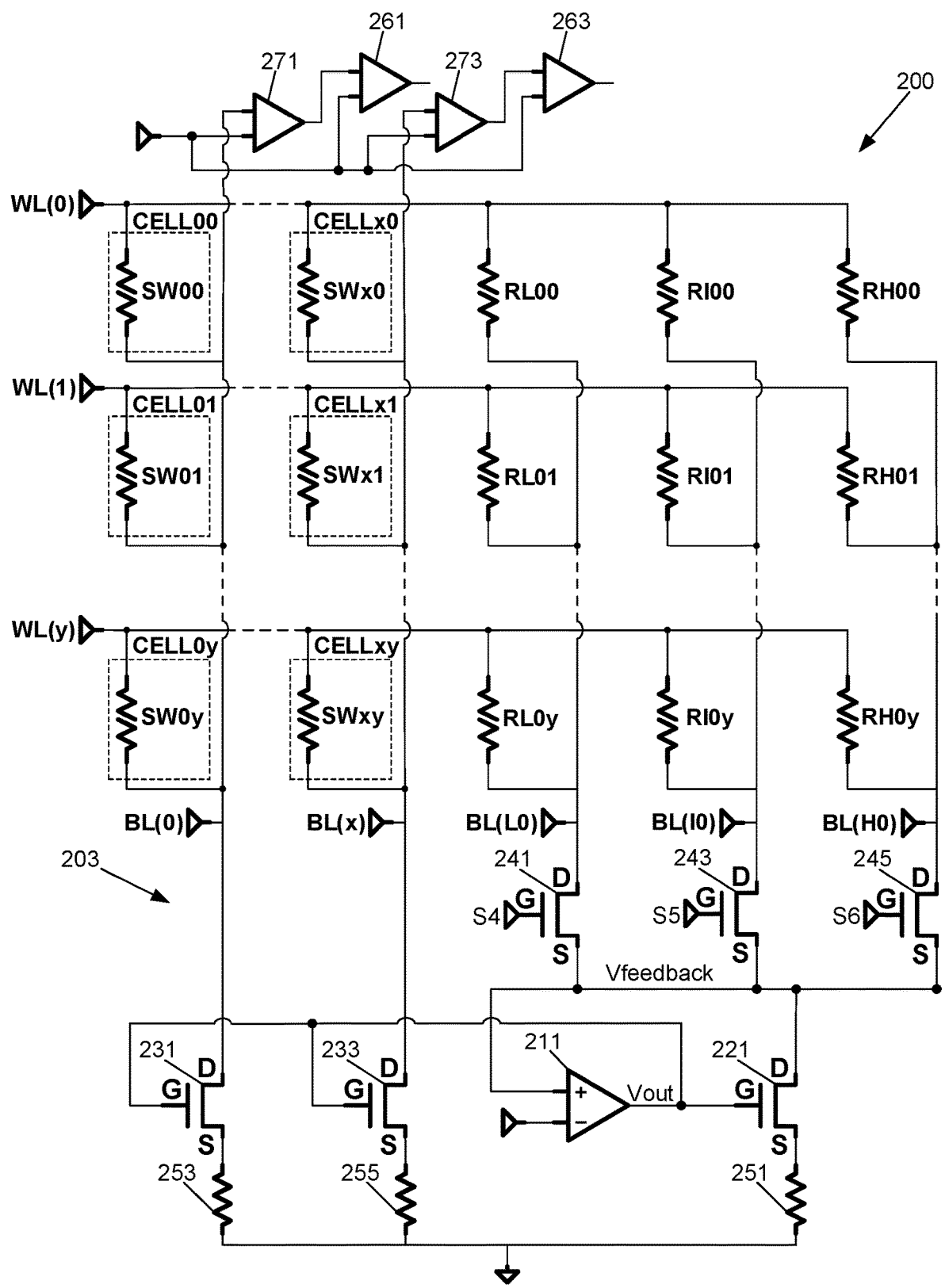
FIG. 2H illustrates a simplified schematic diagram of the exemplary architecture of FIG. 2E further including amplifiers for increasing small signals and resistors for reducing current variations.

Alternatively, as shown in FIGS. 2G-2H, a source terminal of the first NMOS transistor 221 is electrically connected to 0 volts or ground by a resistor 251 for reducing variations in an amount of current supplied by the first NMOS transistor 221. Additionally, as shown in FIGS. 2G-2H, source terminals of the NMOS transistors in the first plurality of NMOS transistors 231, 233 are electrically connected to 0 volts or ground by resistors in a plurality of resistors 253, 255 for reducing variations in amounts of current supplied by the NMOS transistors in the first plurality of NMOS transistors 231, 233.

Referring back to FIG. 2E, first input terminals of the sense devices in the plurality of sense devices 261, 263 are electrically connected to bit lines BL(0)-BL(x) of the resistive change element array 200, second input terminals of the sense devices in the plurality of sense devices 261, 263 can be electrically connected to a power supply, a voltage source, a driver circuit, a resistor divider, a test circuit, a control circuit such as a processor, a controller, a programmable logic device, and a FGPA, or other device that can supply a desired voltage, and output terminals of the sense devices in the plurality of sense devices 261, 263 can be electrically connected to a bus, a buffer, a level shift circuit, a test circuit, or a control circuit such as a processor, a controller, a programmable logic device and an FGPA.

Alternatively, as shown in FIGS. 2F and 2H, a plurality of amplifiers 271, 273 for increasing small signals are electrically connected to the resistive change element array 200 and the plurality of sense devices 261, 263 are electrically connected to the plurality of amplifiers 271, 273. Each amplifier in the plurality of amplifiers 271, 273 has a first input terminal, a second input terminal, and an output terminal. First input terminals of the amplifiers in the plurality of amplifiers 271, 273 are electrically connected to bit lines BL(0)-BL(x) of the resistive change element array 200, second input terminals of the amplifiers in the plurality of amplifiers 271, 273 can be electrically connected to a power supply, a voltage source, a driver circuit, a resistor divider, a test circuit, a control circuit such as a processor, a controller, a programmable logic device, and a FGPA, or other device that can supply a desired voltage, and output terminals of the amplifiers in the plurality of amplifiers 271, 273 are electrically connected to first input terminals of sense devices in the plurality of sense device 261, 263. It is noted that each amplifier in the plurality of amplifiers 271, 273 can additionally have other terminals. Also, as shown in FIGS. 2F and 2H, second input terminals of the sense devices in the plurality of sense devices 261, 263 can be electrically connected to a power supply, a voltage source, a driver circuit, a resistor divider, a test circuit, a control circuit such as a processor, a controller, a programmable logic device, and a FGPA, or other device that can supply a desired voltage, and output terminals of the sense devices in the plurality of sense devices 261, 263 can be electrically connected to a bus, a buffer, a level shift circuit, a test circuit, or a control circuit such as a processor, a controller, a programmable logic device, and an FGPA.

Figure 2I:
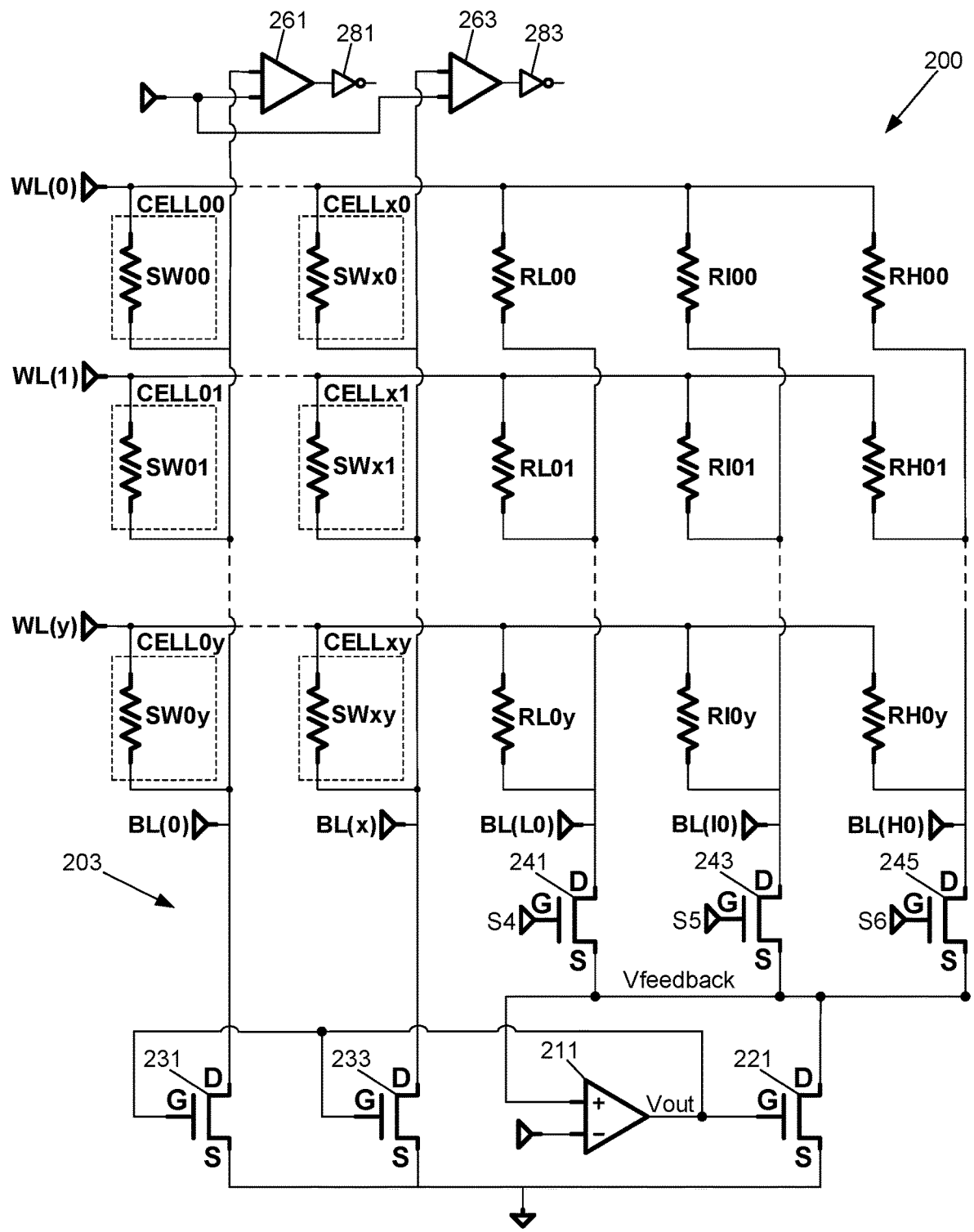
FIG. 2I illustrates a simplified schematic diagram of the exemplary architecture of FIG. 2E further including inverters.

Alternatively, as shown in FIG. 2I, a plurality of inverters 281, 283 are electrically connected to the plurality of sense amplifiers 261, 263. Each inverter in the plurality of inverters 281, 283 has an input terminal and an output terminal. Input terminals of the inverters in the plurality of inverters 281, 283 are electrically connected to output terminals of sense amplifiers in the plurality of sense amplifiers 261, 263 and output terminals of the inverters in the plurality of inverters 281, 283 are electrically connected to a bus, a buffer, a level shift circuit, a test circuit, or a control circuit such as a processor, a controller, a programmable logic device, and an FGPA. It is noted that each inverter in the plurality of inverters 281, 283 can additionally have other terminals.

FIG. 4 illustrates a flow chart 400 showing a method for accessing at least one resistive change element in a resistive change element array. The method starts in step 402 with selecting at least one resistive change element from a plurality of resistive change elements in a resistive change element array, where each resistive change element is electrically connected to a bit line of a plurality of bit lines in the resistive change element array and a word line of a plurality of word lines in the resistive change element array. The method proceeds in step 404 with selecting a resistance for an operation of the at least one resistive change element. The method continues in step 406 with supplying an amount of current for the operation based on the resistance for the operation. The method proceeds in step 408 with determining a resistive state of the at least one resistive change element based on a resistance of the at least one resistive change element and the resistance for the operation. It is noted that the steps of the method for accessing at least one resistive change element in a resistive change element array are not limited to being performed in the order shown in FIG. 4. Additionally, the method can include additional steps, such as adjusting the amount of current for the operation to compensate for circuit conditions of the resistive change element array and initializing to 0 volts or ground the array lines of the resistive change element array before selecting at least one resistive change element from the plurality of resistive change elements in the resistive change element array.

The method for accessing at least one resistive change element in a resistive change element array discussed above with respect to FIG. 4, will be discussed below with respect to READ operations, SET VERIFY operations, and RESET VERIFY operations of CELL00 of FIGS. 2A, 2E, 5A, 5E. Further, the method for accessing at least one resistive change element in a resistive change element array discussed above with respect to FIG. 4, will be discussed below with respect to READ operations, SET VERIFY operations, and RESET VERIFY operations of each cell on word line WL(0) in the resistive change element array 200 of FIG. 2A performed at the same time, of each cell on word line WL(0) in the resistive change element array 200 of FIG. 2E performed at the same time, of each cell on word line WL(0) in the resistive change element array 500 of FIG. 5A performed at the same time, and of each cell on the word line WL(0) in the resistive change element array 500 of FIG. 5E performed at the same time. Performing READ operations, SET VERIFY operations, and RESET VERIFY operations of each cell on a word line at the same time can be highly desirable in certain applications where rapid data READ operations, rapid data SET VERIFY operations, rapid data RESET VERIFY operations, page mode READ operations, page mode SET VERIFY operations, or page mode RESET VERIFY operations are required. It is noted that the method for accessing at least one resistive change element in a resistive change element array is not limited to the exemplary architectures as shown in FIGS. 2A, 2E, 5A, and 5E. It is further noted that the method for accessing at least one resistive change element in a resistive change element array can be performed by other architectures.

Figure 3A:
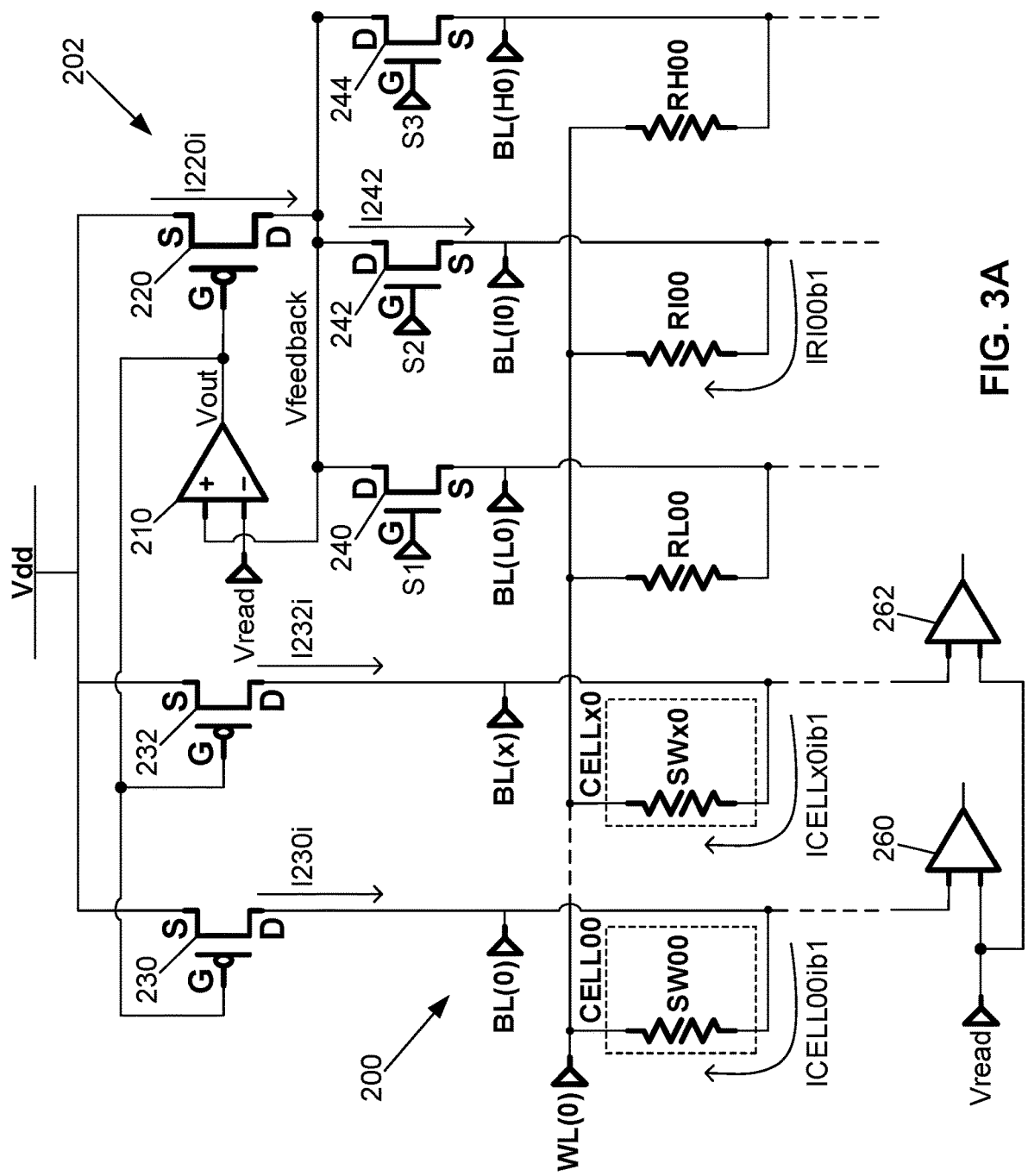
FIG. 3A illustrates a simplified schematic diagram showing current flow in the exemplary architecture of FIG. 2A during a READ operation, where a reduced version of the resistive change element array is shown so that current flow can be shown in greater detail.

The exemplary architecture for accessing at least one resistive change element in a resistive change element array using a resistance of a resistive reference element to source an amount of current accessing resistive change elements through READ operations, SET VERIFY operations, and RESET VERIFY operations will be explained in detail below starting with READ operations. A READ operation of CELL00 in the exemplary architecture of FIG. 2A will be explained in detail below, and READ operations of each cell in the exemplary architecture of FIG. 2A can be performed in a similar manner to the READ operation of CELL00. FIG. 3A illustrates a simplified schematic diagram showing current flow, ignoring leakage currents, during a READ operation of CELL00 in the exemplary architecture of FIG. 2A. FIG. 3A shows a reduced version of the resistive change element array 200, so that current flow can be shown in greater detail. It is noted that READ operations of CELL00 explained in further detail below generally describe current flowing through CELL00 as flowing from the bit line BL(0) to the word line WL(0), however, the devices and methods of the present disclosure are not limited to current flow through the cells as flowing from the bit line to the word line. It is also noted that FIG. 3A can be referred to for a READ operation of CELL00 and for READ operations of each cell on the word line WL(0) performed at the same time because current flows through each PMOS transistor in the plurality of PMOS transistors 230, 232 and through each cell on the word line WL(0) for a READ operation of CELL00 and for READ operations of each cell on the word line WL(0) performed at the same time.

A READ operation of CELL00 starts, as similarly discussed above in step 402 of flow chart 400, by selecting CELL00 from the plurality of resistive change element cells CELL00-CELLxy in the resistive change element array 200. CELL00 is selected from the plurality of resistive change element cells CELL00-CELLxy by driving a voltage VWL(0) on the word line WL(0) to 0 volts or ground and driving the other word lines WL(1)-WL(y) to a read voltage Vread or a high impedance state. The voltage VWL(0) on the word line WL(0) and the read voltage Vread are design variables selected by a circuit designer. It is noted that although the voltage VWL(0) on the word line WL(0) is discussed as being driven to 0 volts or ground, the voltage VWL(0) on the word line WL(0) is not limited to being driven to 0 volts or ground and that the circuit designer can select other voltage levels for the voltage on the word line WL(0), such as a voltage level less than 0 volts and a voltage level greater than 0 volts. It is also noted that although the read voltage Vread is discussed as having a voltage level of 1 volt, the read voltage Vread is not limited to having a voltage level of 1 volt and that the circuit designer can select other voltage levels for the read voltage Vread, such as a voltage level greater than 1 volt and a voltage level less than 1 volt. It is further noted that the system voltage Vdd is a design variable selected by a circuit designer.

Selecting a resistance for an operation of the at least one resistive change element, as similarly discussed above in step 404 of flow chart 400, during a READ operation of CELL00 is carried out by turning on the first PMOS transistor 220 and turning on the NMOS transistor 242 to select the resistance of the intermediate resistive reference element RI00 for the READ operation of CELL00. Alternatively, when the first PMOS transistor 220 is already turned on, selecting a resistance for an operation of the at least one resistive change element, as similarly discussed above in step 404 of flow chart 400, during a READ operation of CELL00 is carried out by turning on the NMOS transistor 242 to select the resistance of the intermediate resistive reference element RI00 for the READ operation of CELL00.

The first PMOS transistor 220 is turned on when a gate to source voltage VGS of the first PMOS transistor 220 is less than a threshold voltage VT of the first PMOS transistor 220. The gate to source voltage VGS of the first PMOS transistor 220 is determined by the difference between a gate voltage VG and a source voltage VS. The gate voltage VG of the first PMOS transistor 220 is the output voltage Vout of the differential amplifier 210 because the gate terminal of the first PMOS transistor 220 is electrically connected to the output terminal of the differential amplifier 210. The source voltage VS of the first PMOS transistor 220 is the system voltage Vdd because the source terminal of the first PMOS transistor 220 is electrically connected a power supply, a voltage source, a driver circuit, or other device that supplies the system voltage Vdd. Thus, the gate to source voltage VGS of the first PMOS transistor 220 can be expressed by VGS=VG-VS, where the gate voltage VG is the output voltage Vout of the differential amplifier 210 and the source voltage VS is the system voltage Vdd.

The output voltage Vout of the differential amplifier 210 is determined by multiplying a gain of the differential amplifier 210 with the difference between a voltage of the non-inverting input and a voltage of the inverting input. The differential amplifier 210 has a gain of 1, however, the differential amplifier 210 is not limited to having a gain of 1. The gain of the differential amplifier 210 is a design variable selected by a circuit designer and the circuit designer can select other values for the gain of the differential amplifier 210, such as a gain of the differential amplifier 210 greater than 1 and a gain of the differential amplifier 210 less than 1. The voltage of the non-inverting input of the differential amplifier 210 is the feedback voltage Vfeedback because the non-inverting input terminal is electrically connected to the drain terminal of the first PMOS transistor 220 and the drain terminals of each NMOS transistor in the plurality of NMOS transistors 240, 242, 244 through the feedback loop. The voltage of the inverting input of the differential amplifier 210 is the read voltage Vread because the inverting input terminal is electrically connected to a power supply, a voltage source, a driver circuit, a resistor divider, a test circuit, a control circuit such as a processor, a controller, a programmable logic device, and a FGPA, or other device that supplies the read voltage Vread. Thus, the output voltage Vout of the differential amplifier 210 can be expressed by Vout=Gain(Voltage of the Non-Inverting Input-Voltage of the Inverting Input), where the gain is 1, the voltage of the non-inverting input is the feedback voltage Vfeedback, and the voltage of the inverting input is the read voltage Vread.

Substituting for the gain, the voltage of the non-inverting input, and the voltage of the inverting input, in the above equation for determining the output voltage Vout of the differential amplifier 210 provides Vout=Vfeedback-Vread and substituting Vfeedback-Vread for the gate voltage VG in the above equation for determining the gate to source voltage VGS of the first PMOS transistor 220 provides the equation VGS=Vfeedback-Vread-Vdd. As shown by this equation, the gate to source voltage VGS of the first PMOS transistor 220 changes when the feedback voltage Vfeedback changes because the voltage level of the read voltage Vread and the voltage level of the system voltage Vdd are generally constant. Thus, the first PMOS transistor 220 is turned on when the feedback voltage Vfeedback has a voltage level such that the gate to source voltage VGS of the first PMOS transistor 220 is less than a threshold voltage VT of the first PMOS transistor 220.

The NMOS transistor 242 is turned on by a control signal S2 supplied by a test circuit or a control circuit such as a processor, a controller, a programmable logic device, and a FGPA, and the NMOS transistors 240 and 244 are turned off by control signals S1 and S3 supplied by the test circuit or the control circuit. The test circuit or the control circuit supplies the control signal S1 having a voltage level such that a gate to source voltage VGS of the NMOS transistor 240 is less than a threshold voltage VT of the NMOS transistor 240, the control signal S2 having a voltage level such that a gate to source voltage VGS of the NMOS transistor 242 is greater than a threshold voltage VT of the NMOS transistor 242, and the control signal S3 having a voltage level such that a gate to source voltage VGS of the NMOS transistor 244 is less than a threshold voltage VT of the NMOS transistor 244.

When the first PMOS transistor 220 and the NMOS transistor 242 are turned on, an intermediate current I220i flows through the first PMOS transistor 220, a current I242 flows into the bit line BL(I0) through the NMOS transistor 242, a current IRI00b1 flows from the bit line BL(I0) through the intermediate resistive reference element RI00, and a voltage on the bit line BL(I0) is driven to the feedback voltage Vfeedback. FIG. 3A shows the intermediate current I220i flowing through the first PMOS transistor 220, the current I242 flowing through the NMOS transistor 242, and the current IRI00b1 flowing through the intermediate resistive reference element RI00. The current IRI00b1 flows through the intermediate resistive reference element RI00 because the first terminal of the intermediate resistive reference element RI00 is at the voltage VBL(I0) on the bit line BL(I0), which as discussed above is feedback voltage Vfeedback and the second terminal of the intermediate resistive reference element RI00 is at the voltage VWL(0) on the word line WL(0), which as discussed above is ground or 0 volts. While, ignoring leakage currents, current does not flow through the other intermediate resistive reference elements RI01-RI0y electrically connected to the bit line BL(I0) because the first terminals of the other intermediate resistive reference elements RI01-RI0y are at the feedback voltage Vfeedback and the second terminals of the other intermediate resistive reference elements RI01-RI0y are at the read voltage Vread or a high impedance state to prevent current flow. It is noted that, as discussed below, the feedback voltage Vfeedback is regulated such that the voltage level of the feedback voltage Vfeedback is approximately equal to the voltage level of the read voltage Vread.

The amount of the current IRI00b1, ignoring leakage currents, can be approximated using Ohm's Law as IRI00b1=VBL(I0)/RRI00, where VBL(I0) is the voltage on the bit line BL(I0) and RRI00 is the resistance of the intermediate resistive reference element RI00. For example, when the voltage VBL(I0) is the feedback voltage Vfeedback of 1 volt and the intermediate resistive reference element RI00 has a resistance of 5.5 MΩ, the amount of the current IRI00b1 can be approximated using Ohm's Law as IRI00b1=1 V/5.5 MΩ=1/5.5 μA. The amount of the current IRI00b1, ignoring leakage currents, is approximately equal to the amount of the current I242 supplied to the bit line BL(I0) by the NMOS transistor 242 because the amount of current flowing into the bit line BL(I0) is approximately equal to the amount of current flowing from the bit line BL(I0). The amount of current IRI00b1 is also approximately equal to the amount of the intermediate current I220i supplied by the first PMOS transistor 220 because the amount of the intermediate current I220i and the amount of the current I242 are approximately equal because the first PMOS transistor 220 is electrically connected in series with the NMOS transistor 242. Referring to the above example, where the amount of the current IRI00b1 is 1/5.5 microamps, the amount of the intermediate current I220i supplied by the first PMOS transistor 220 is 1/5.5 microamps. It is noted that leakage currents do not prevent the READ operation of CELL00 when the leakage currents are much less than the amount of the current IRI00b1.

Supplying an amount of current for the operation based on the resistance for the operation, as similarly discussed above in step 406 of flow chart 400, during the READ operation of CELL00 is carried out by the PMOS transistor 230 supplying a current I230i that is proportional to the intermediate current I220i. Alternatively, when the circuit for sourcing an adjustable amount of current 202 additionally includes a plurality of FETs electrically connected in series with the plurality of PMOS transistors 230, 232, as discussed above, supplying an amount of current for the operation based on the resistance for the operation, as similarly discussed above in step 406 of flow chart 400, during the READ operation of CELL00 is carried out by turning on the FET electrically connected in series with the PMOS transistor 230 and the PMOS transistor 230 supplying a current I230i that is proportional to the intermediate current I220i. As discussed above, the amount of the intermediate current I220i is based on the amount of the current IRI00b1 flowing through the intermediate resistive reference element RI00.

The PMOS transistor 230 is turned on when a gate to source voltage VGS of the PMOS transistor 230 is less than a threshold voltage VT for the PMOS transistor 230. The gate to source voltage VGS of the PMOS transistor 230 is determined by the difference between a gate voltage VG and a source voltage VS. The gate voltage VG of the PMOS transistor 230 is the output voltage Vout of the differential amplifier 210 because the gate terminal of the PMOS transistor 230 is electrically connected to the output terminal of the differential amplifier 210. The source voltage VS of the PMOS transistor 230 is the system voltage Vdd because the source terminal of the PMOS transistor 230 is electrically connected a power supply, a voltage source, a driver circuit, or other device that supplies the system voltage Vdd. Thus, the gate to source voltage VGS of the PMOS transistor 230 can be expressed by VGS=VG−VS, where the gate voltage VG is the output voltage Vout of the differential amplifier 210 and the source voltage VS is the system voltage Vdd. Further, the gate to source voltage VGS of the PMOS transistor 230 is approximately equal to the gate to source voltage VGS of the first PMOS transistor 220 because the gate voltages of the PMOS transistor 230 and the first PMOS transistor 220 are the output voltage Vout of the differential amplifier 210 and the source voltages of the PMOS transistor 230 and the first PMOS transistor 220 are the system voltage Vdd.

As discussed above, the output voltage Vout of the differential amplifier 210 can be expressed by Vout=Vfeedback−Vread and substituting Vfeedback−Vread for the gate voltage VG in the above equation for determining the gate to source voltage VGS of the PMOS transistor 230 provides the equation VGS=Vfeedback−Vread−Vdd. As shown by this equation, the gate to source voltage VGS of the PMOS transistor 230 changes when the feedback voltage Vfeedback changes because the voltage level of the read voltage Vread and the voltage level of the system voltage Vdd are generally constant. Thus, the PMOS transistor 230 is turned on when the feedback voltage Vfeedback has a voltage level such that the gate to source voltage VGS of the PMOS transistor 230 is less than a threshold voltage VT of the PMOS transistor 230.

The amount of the current I230i supplied by the PMOS transistor 230 is proportional to the amount of the intermediate current I220i supplied by the first PMOS transistor 220. The proportion between the amount of the current I230i supplied by the PMOS transistor 230 and the amount of the intermediate current I220i supplied by the first PMOS transistor 220 is a design variable selected by a circuit designer. The circuit designer can select the proportion between the amount of the current I230i supplied by the PMOS transistor 230 and the amount of the intermediate current I220i supplied by the first PMOS transistor 220 by selecting the features of the PMOS transistor 230 and the features of the first PMOS transistor 220. The proportion between the amount of the current I230i supplied by the PMOS transistor 230 and the amount of the intermediate current I220*i* supplied by the first PMOS transistor 220 is selected as 1 by selecting a width to length ratio of the PMOS transistor 230 that is approximately equal to a width to length ratio of the first PMOS transistor 220. However, the proportion is not limited to 1 and the circuit designer can select other values for the proportion, such as a proportion greater than 1 and a proportion less than 1. Further, the circuit designer can select other features of the PMOS transistor 230 and the first PMOS transistor 220 to achieve the desired proportion between the amount of the current I230*i* supplied by the PMOS transistor 230 and the amount of the intermediate current I220*i* supplied by the first PMOS transistor 220. For example, the circuit designer can select other dimensions of the PMOS transistors, layouts of the PMOS transistors, and materials for fabricating the PMOS transistors to achieve the desired proportion between the amount of the current I230*i* supplied by the PMOS transistor 230 and the amount of the intermediate current I220*i* supplied by the first PMOS transistor 220. It is noted that when other types of field effect transistors are used in place of the first PMOS transistor 220 and the plurality of PMOS transistor 230, 232, a circuit designer can also select dimensions, layouts, and materials for fabricating the other types of field effect transistors to achieve the desired proportion between currents.

When the proportion between the amount of the current I230*i* supplied by the PMOS transistor 230 and the amount of the intermediate current I220*i* supplied by the first PMOS transistor 220 is selected based on the width to length ratios of the PMOS transistor 230 and the first PMOS transistor 220, the amount of the current I230*i* can be approximated by the following equation, I230*i*=(IRI00*b*1)((Channel Width of PMOS 230/Channel Length of PMOS 230)/(Channel Width of PMOS 220/Channel Length of PMOS 220)), where IRI00*b*1 is the amount of current flowing through the intermediate resistive reference element RI00. For example, when the current IRI00*b*1 is 1/5.5 microamps and the width to length ratio of the PMOS transistor 230 equals the width to length ratio of the first PMOS transistor 220, the current I230*i*=(1/5.5 µA)(1)=1/5.5 µA.

The current I230*i* supplied by the PMOS transistor 230 flows into the bit line BL(0) and a current ICELL00*ib*1 flows from the bit line BL(0) through CELL00. FIG. 3A shows the current I230*i* flowing through the PMOS transistor 230 and the current ICELL00*ib*1 flowing through CELL00. The current ICELL00*ib*1 flows through CELL00 because the first terminal of the resistive change element SW00 within CELL00 is at a voltage VBL(0) on the bit line BL(0) and the second terminal of the resistive change element SW00 is the voltage VWL(0) on the word line WL(0), which as discussed above is ground or 0 volts. While, ignoring leakage currents, current does not flow through the other resistive change element cells CELL01-CELL0*y* on the bit line BL(0) because the first terminals of the resistive change elements SW01-SW0*y* within the other resistive change element cells CELL01-CELL0*y* are at the voltage VBL(0) on the bit line BL(0) and the second terminals of the resistive change elements SW01-SW0*y* are at the read voltage Vread or a high impedance state to prevent current flow. The amount of the current ICELL00*ib*1, ignoring leakage currents, is approximately equal to the amount of the current I230*i* supplied to the bit line BL(0) by the PMOS transistor 230 because the amount of current flowing into the bit line BL(0) is approximately equal to the amount of current flowing from the bit line BL(0). Further, the amount of the current ICELL00*ib*1 is approximately equal to the amount of the current IRI00*b*1 because the amount of the current I230*i* supplied by the PMOS transistor 230 is approximately equal to the amount of the intermediate current I220*i* supplied by the first PMOS transistor 220 and the amount of the intermediate current I220*i* supplied by the first PMOS transistor 220 is approximately equal to the amount of the current IRI00*b*1. It is noted that leakage currents do not prevent a READ operation of CELL00 when the leakage currents are much less than the amount of the current ICELL00*ib*1.

The voltage VBL(0) on the bit line BL(0), ignoring leakage currents, can be approximated using Ohm's Law as VBL(0)=ICELL00*ib*1×RCELL00, where the current ICELL00*ib*1 is the current flowing through CELL00 and RCELL00 is the resistance of the resistive change element SW00 within CELL00. As shown by this equation, the voltage VBL(0) on the bit line BL(0) changes when the resistance of the resistive change element SW00 changes because the current flowing through CELL00 is generally constant. For example, when ICELL00*ib*1=IRI00*b*1=1/5.5 microamps and RCELL00=5.5 MΩ, the voltage VBL(0)=1/5.5 µA×5.5 MΩ=1 V. For example, when ICELL00*ib*1=IRI00*b*1=1/5.5 microamps and RCELL00=1 MΩ, the voltage VBL(0)=1/5.5 µA×1 MΩ=1/5.5 V. For example, when ICELL00*ib*1=IRI00*b*1=1/5.5 microamps and RCELL00=10 MΩ, the voltage VBL(0)=1/5.5 µA×10 MΩ=10/5.5 V.

It is noted that when the voltage VBL(0) on the bit line BL(0) is less than the read voltage Vread and the word lines WL(1)-WL(y) electrically connected to the other resistive change element cells CELL01-CELL0*y* on the bit line BL(0) are driven to the read voltage Vread, leakage currents flow into the bit line BL(0) through the other resistive change element cells CELL01-CELL0*y* and pull up the voltage VBL(0) on the bit line BL(0). It is also noted that when the voltage VBL(0) on the bit line BL(0) is greater than the read voltage Vread and the word lines WL(1)-WL(y) electrically connected to the other resistive change element cells CELL01-CELL0*y* on the bit line BL(0) are driven to the read voltage Vread, leakage currents flow from the bit line BL(0) through the other resistive change element cells CELL01-CELL0*y* and pull down the voltage VBL(0) on the bit line BL(0). It is further noted that when the voltage VBL(0) on the bit line BL(0) is pulled up by leakage currents flowing into the bit line BL(0) and when the voltage VBL(0) on the bit line BL(0) is pulled down by leakage currents flowing from the bit line BL(0), the number of the word lines WL(1)-WL(y) should be small enough to allow a margin to determine a resistive state of the selected resistive change element SW00.

Determining a resistive state of the at least one resistive change element based on a resistance of the at least one resistive change element and the resistance for the operation, as similarly discussed above in step 408 of flow chart 400, during the READ operation of CELL00 is carried out by determining the resistive state of the resistive change element SW00 by comparing the voltage VBL(0) on the bit line BL(0) with the read voltage Vread. As discussed above, the voltage VBL(0) on the bit line BL(0) is determined by the amount of the current ICELL00*ib*1 and the resistance of the resistive change element SW00. The voltage VBL(0) on the bit line BL(0) is indicative of the resistive state of the resistive change element SW00 because the amount of current ICELL00*ib*1 is approximately the same for both a low resistive state and a high resistive state of the resistive change element SW00, while, the resistance of the resistive change element SW00 is different for a low resistive state and a high resistive state. The read voltage Vread is indicative of the resistance RRI00 of the intermediate resistive reference element RI00 for the READ operation of CELL00 because the read voltage Vread is equal to the amount of the current ICELL00$ib$1 multiplied by the resistance RRI00 of the intermediate resistive reference element RI00. For example, when ICELL00$ib$1=1/5.5 µA, RRI00=5.5 MΩ, Vread=1/5.5 µA×5.5 MΩ=1 V. When the voltage VBL(0) on the bit line BL(0) is less than or equal to the read voltage Vread (i.e. the voltage VBL(0) on the bit line BL(0)≤Vread) the resistance of the resistive change element SW00 is less than or equal to the resistance RRI00 of the intermediate resistive reference element RI00 (i.e. RCELL00≤RRI00, where RCELL00 is the resistance of the resistive change element SW00 within CELL00) and the resistive state of the resistive change element SW00 is determined to be a low resistive state. When the voltage VBL(0) on the bit line BL(0) is greater than the read voltage Vread (i.e. the voltage VBL(0) on the bit line BL(0)>Vread) the resistance of the resistive change element SW00 is greater than the resistance RRI00 of the intermediate resistive reference element RI00 (i.e. RCELL00>RRI00, where RCELL00 is the resistance of the resistive change element SW00 within CELL00) and the resistive state of resistive change element SW00 is determined to be a high resistive state.

The sense device 260 receives the voltage VBL(0) on the bit line BL(0) on a first input terminal because the first input terminal is electrically connected to the bit line BL(0) and receives the read voltage Vread on a second input terminal because the second input terminal is electrically connected to a power supply, a voltage source, a driver circuit, a resistor divider, a test circuit, a control circuit such as a processor, a controller, a programmable logic device, and a FGPA, or other device that supplies the read voltage Vread. The sense device 260 determines the resistive state of the resistive change element SW00 by comparing the voltage VBL(0) on the bit line BL(0) with the read voltage Vread. The sense device 260 outputs a signal indicative of the resistive state of the resistive change element SW00 on an output terminal. When the voltage VBL(0) on the bit line BL(0) is less than or equal to the read voltage Vread, the sense device 260 outputs a signal indicating the resistive change element SW00 has a low resistive state. When the voltage VBL(0) on the bit line BL(0) is greater than the read voltage Vread, the sense device 260 outputs a signal indicating the resistive change element SW00 has a high resistive state. For example, when ICELL00$ib$1=1/5.5 microamps, RCELL00=1 MΩ, VBL(0)=1/5.5 V, and Vread=1 V, the sense device 260 outputs a signal indicating that the resistive change element SW00 has a low resistive state (corresponding, typically, to a logic 1, a SET state). For example, when ICELL00$ib$1=1/5.5 microamps, RCELL00=5.5 MΩ, VBL(0)=1 V, and Vread=1 V, the sense device 260 outputs a signal indicating that the resistive change element SW00 has a low resistive state (corresponding, typically, to a logic 1, a SET state). For example, when ICELL00$ib$1=1/5.5 microamps, RCELL00=10 MΩ, VBL(0)=10/5.5 V, and Vread=1 V, the sense device 260 outputs a signal indicating that the resistive change element SW00 has a high resistive state (corresponding, typically, to a logic 0, a RESET state). It is noted that when the plurality of sense devices 260, 262 are electrically connected to the plurality of amplifiers 270, 272 as shown in FIGS. 2B and 2D, the plurality of sense device 260, 262 determine the resistive states of the resistive change elements SW00-SWxy by comparing amplified voltages with a selected voltage, such as the read voltage Vread.

Alternatively, the plurality of sense devices 260, 262 are omitted from the exemplary architecture shown in FIGS. 2A-2D and a test circuit, a logic circuit, or a control circuit such as a processor, a controller, a programmable logic device and a FGPA, is electrically connected to the bit lines BL(0)-BL(x) to receive the voltages on the bit lines BL(0)-BL(x) or is electrically connected to the plurality of amplifiers 270, 272 to receive amplified voltages. When the test circuit, the logic circuit, or the control circuit is electrically connected to the bit lines BL(0)-BL(x), the test circuit, the logic circuit, or the control circuit determines the resistive states of the resistive change elements SW00-SWxy by comparing the voltages on the bit lines BL(0)-BL(x) with the read voltage Vread or a stored value corresponding to the read voltage Vread. For example, for a READ operation of CELL00, when the test circuit, the logic circuit, or the control circuit is electrically connected to the bit lines BL(0)-BL(x), the test circuit, the logic circuit, or the control circuit determines the resistive state of the resistive change element SW00 by comparing a voltage VBL(0) on the bit line BL(0) with the read voltage Vread or a stored value corresponding to the read voltage Vread. When the test circuit, the logic circuit, or the control circuit is electrically connected to the plurality of amplifiers 270, 272 the test circuit, the logic circuit, or the control circuit determines the resistive states of the resistive change elements SW00-SWxy by comparing the amplified voltages with a selected voltage, such as the read voltage Vread, or a stored value corresponding to a selected voltage, such as the read voltage Vread. Additionally, the test circuit, the logic circuit, or the control circuit can output signals indicative of the resistive states of the resistive change elements SW00-SWxy.

Further, the circuit for sourcing an adjustable amount of current 202 compensates for the circuit conditions of the resistive change element array 200 by regulating the feedback voltage Vfeedback to be approximately equal to the read voltage Vread. The feedback voltage Vfeedback reflects the circuit conditions of the resistive change element array 200 because the feedback voltage Vfeedback is based on the amount of the intermediate current I220$i$ flowing through the first PMOS transistor 220 and the amount of the intermediate current I220$i$ is impacted by the circuit conditions of the resistive change element array 200. For example, changes in the resistances of the intermediate resistive reference elements RI00-RI0$y$ due to temperature, leakage currents, and parasitic impedances can impact the amount of the intermediate current I220$i$. The feedback voltage Vfeedback is supplied to the non-inverting input of the differential amplifier 210 and, as discussed above, the gate voltage VG of the first PMOS transistor 220 is the output voltage Vout of the differential amplifier 210 and the source voltage VS of the first PMOS transistor 220 is the system voltage Vdd. The gate to source voltage VGS of the first PMOS transistor 220 regulates the amount of the intermediate current I220$i$ flowing through the first PMOS transistor 220 and the differential amplifier 210 adjusts the gate to source voltage VGS of the first PMOS transistor 220 so that the amount of the intermediate current I220$i$ adjusts the feedback voltage Vfeedback to be approximately equal to the read voltage Vread. Also, as discussed above, the amount of the current I230$i$ supplied by the PMOS transistor 230 is proportional to the amount of the intermediate current I220$i$ supplied by the first PMOS transistor 220. Thus, adjusting the amount of the intermediate current I220$i$ supplied by the first PMOS transistor 220 to compensate for circuit conditions of the resistive change element array 200 proportionally adjusts the amount of the current I230$i$ supplied by the PMOS transistor 230 to compensate for circuit conditions of the resistive change element array 200.

Additionally, READ operations of each resistive change element cell CELL00-CELLx0 on the word line WL(0) can be performed at the same time because each PMOS transistor in the plurality of PMOS transistors 230, 232 supplies approximately the same amount of current to a bit line BL(0)-BL(x) at the same time. Each PMOS transistor in the plurality of PMOS transistors 230, 232 supplies approximately the same amount of current for READ operations because each PMOS transistor in the plurality of PMOS transistors 230, 232 has approximately the same features and approximately the same gate to source voltage VGS. FIG. 3A shows the PMOS transistor 230 supplying a current I230$i$ to the bit line BL(0), the PMOS transistor 232 supplying a current I232$i$ to the bit line BL(x), a current ICELL00$ib$1 flowing from the bit line BL(0) through CELL00, and a current ICELLx0$ib$1 flowing from the bit line BL(x) through CELLx0. READ operations of each resistive change element cell CELL00-CELLx0 on the word line WL(0) are performed in a similar manner to the READ operation of CELL00, discussed above. Performing READ operations of each cell on a word line at the same time can be highly desirable in certain applications where rapid data READ operations or page mode READ operations are required.

Figure 3B:
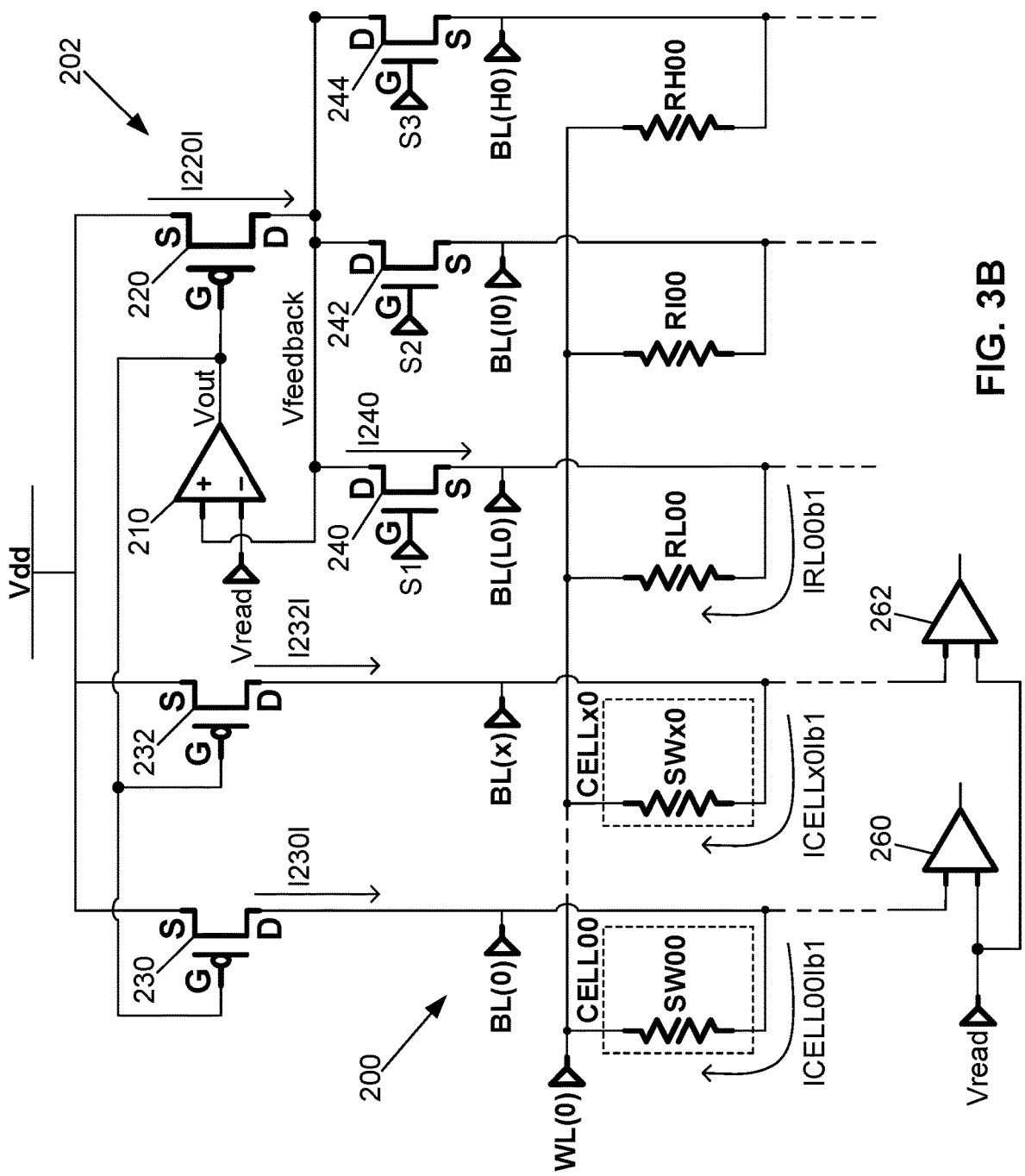
FIG. 3B illustrates a simplified schematic diagram showing current flow in the exemplary architecture of FIG. 2A during a SET VERIFY operation, where a reduced version of the resistive change element array is shown so that current flow can be shown in greater detail.

A SET VERIFY operation of CELL00 in the exemplary architecture of FIG. 2A will be explained in detail below, and SET VERIFY operations of each cell in the exemplary architecture of FIG. 2A can be performed in a similar manner to the SET VERIFY operation of CELL00. FIG. 3B illustrates a simplified schematic diagram showing current flow, ignoring leakage currents, during a SET VERIFY operation of CELL00 in the exemplary architecture of FIG. 2A. FIG. 3B shows a reduced version of the resistive change element array 200, so that current flow can be shown in greater detail. It is noted that SET VERIFY operations of CELL00 explained in further detail below generally describe current flowing through CELL00 as flowing from the bit line BL(0) to the word line WL(0), however, the devices and methods of the present disclosure are not limited to current flow through the cells as flowing from the bit line to the word line. It is also noted that FIG. 3B can be referred to for a SET VERIFY operation of CELL00 and for SET VERIFY operations of each cell on the word line WL(0) performed at the same time because current flows through each PMOS transistor in the plurality of PMOS transistors 230, 232 and through each cell on the word line WL(0) for a SET VERIFY operation of CELL00 and for SET VERIFY operations of each cell on the word line WL(0) performed at the same time.

A SET VERIFY operation of CELL00 starts, as similarly discussed above in step 402 of flow chart 400, by selecting CELL00 from the plurality of resistive change element cells CELL00-CELLxy in the resistive change element array 200. CELL00 is selected from the plurality of resistive change element cells CELL00-CELLxy by driving a voltage VWL(0) on the word line WL(0) to 0 volts or ground and driving the other word lines WL(1)-WL(y) to a read voltage Vread or a high impedance state. The voltage VWL(0) on the word line WL(0) and the read voltage Vread are design variables selected by a circuit designer. It is noted that although the voltage VWL(0) on the word line WL(0) is discussed as being driven to 0 volts or ground, the voltage VWL(0) on the word line WL(0) is not limited to being driven to 0 volts or ground and that the circuit designer can select other voltage levels for the voltage VWL(0) on the word line WL(0), such as a voltage level less than 0 volts and a voltage level greater than 0 volts. It is also noted that although the read voltage Vread is discussed as having a voltage level of 1 volt, the read voltage Vread is not limited to having a voltage level of 1 volt and that the circuit designer can select other voltage levels for the read voltage Vread, such as a voltage level greater than 1 volt and a voltage level less than 1 volt. It is further noted that the system voltage Vdd is a design variable selected by a circuit designer.

Selecting a resistance for an operation of the at least one resistive change element, as similarly discussed above in step 404 of flow chart 400, during a SET VERIFY operation of CELL00 is carried out by turning on the first PMOS transistor 220 and turning on the NMOS transistor 240 to select the resistance of the low resistive reference element RL00 for the SET VERIFY operation. Alternatively, when the first PMOS transistor 220 is already turned on, selecting a resistance for an operation of the at least one resistive change element, as similarly discussed above in step 404 of flow chart 400, during a SET VERIFY operation of CELL00 is carried out by turning on the NMOS transistor 240 to select the resistance of the low resistive reference element RL00 for the SET VERIFY operation of CELL00.

The first PMOS transistor 220 is turned on when a gate to source voltage VGS of the first PMOS transistor 220 is less than a threshold voltage VT of the first PMOS transistor 220. The gate to source voltage VGS of the first PMOS transistor 220 is determined by the difference between a gate voltage VG and a source voltage VS. The gate voltage VG of the first PMOS transistor 220 is the output voltage Vout of the differential amplifier 210 because the gate terminal of the first PMOS transistor 220 is electrically connected to the output terminal of the differential amplifier 210. The source voltage VS of the first PMOS transistor 220 is the system voltage Vdd because the source terminal of the first PMOS transistor 220 is electrically connected a power supply, a voltage source, a driver circuit, or other device that supplies the system voltage Vdd. Thus, the gate to source voltage VGS of the first PMOS transistor 220 can be expressed by VGS=VG−VS, where the gate voltage VG is the output voltage Vout of the differential amplifier 210 and the source voltage VS is the system voltage Vdd.

The output voltage Vout of the differential amplifier 210 is determined by multiplying a gain of the differential amplifier 210 with the difference between a voltage of the non-inverting input and a voltage of the inverting input. The differential amplifier 210 has a gain of 1, however, the differential amplifier 210 is not limited to having a gain of 1. The gain of the differential amplifier 210 is a design variable selected by a circuit designer and the circuit designer can select other values for the gain of the differential amplifier 210, such as a gain of the differential amplifier 210 greater than 1 and a gain of the differential amplifier 210 less than 1. The voltage of the non-inverting input of the differential amplifier 210 is the feedback voltage Vfeedback because the non-inverting input terminal is electrically connected to the drain terminal of the first PMOS transistor 220 and the drain terminal of each NMOS transistor in the plurality of NMOS transistors 240, 242, 244 through the feedback loop. The voltage of the inverting input of the differential amplifier 210 is the read voltage Vread because the inverting input terminal is electrically connected to a power supply, a voltage source, a driver circuit, a resistor divider, a test circuit, a control circuit such as a processor, a controller, a programmable logic device, and a FGPA, or other device that supplies the read voltage Vread. Thus, the output voltage Vout of the differential amplifier 210 can be expressed by Vout=Gain(Voltage of the Non-Inverting Input−Voltage of the Inverting Input), where the gain is 1, the voltage of the non-inverting input is the feedback voltage Vfeedback, and the voltage of the inverting input is the read voltage Vread.

Substituting for the gain, the voltage of the non-inverting input, and the voltage of the inverting input, in the above equation for determining the output voltage Vout of the differential amplifier 210 provides Vout=Vfeedback−Vread and substituting Vfeedback−Vread for the gate voltage VG in the above equation for determining the gate to source voltage VGS of the first PMOS transistor 220 provides the equation VGS=Vfeedback−Vread−Vdd. As shown by this equation, the gate to source voltage VGS of the first PMOS transistor 220 changes when the feedback voltage Vfeedback changes because the voltage level of the read voltage Vread and the voltage level of the system voltage Vdd are generally constant. Thus, the first PMOS transistor 220 is turned on when the feedback voltage Vfeedback has a voltage level such that the gate to source voltage VGS of the first PMOS transistor 220 is less than a threshold voltage VT of the first PMOS transistor 220.

The NMOS transistor 240 is turned on by a control signal S1 supplied by a test circuit or a control circuit such as a processor, a controller, a programmable logic device, and a FGPA, and the NMOS transistors 242 and 244 are turned off by control signals S2-S3 supplied by the test circuit or the control circuit. The test circuit or the control circuit supplies the control signal S1 having a voltage level such that a gate to source voltage VGS of the NMOS transistor 240 is greater than a threshold voltage VT of the NMOS transistor 240, the control signal S2 having a voltage level such that a gate to source voltage VGS of the NMOS transistor 242 is less than a threshold voltage VT of the NMOS transistor 242, and the control signal S3 having a voltage level such that a gate to source voltage VGS of the NMOS transistor 244 is less than a threshold voltage VT of the NMOS transistor 244.

When the first PMOS transistor 220 and the NMOS transistor 240 are turned on, a large current I220*l* flows through the first PMOS transistor 220, a current I240 flows into the bit line BL(L0) through the NMOS transistor 240, a current IRL00*b*1 flows from the bit line BL(L0) through the low resistive reference element RL00, and a voltage on the bit line BL(L0) is driven to the feedback voltage Vfeedback. FIG. 3B shows the large current I220*l* flowing through the first PMOS transistor 220, the current I240 flowing through the NMOS transistor 240, and the current IRL00*b*1 flowing through the low resistive reference element RL00. The current IRL00*b*1 flows through the low resistive reference element RL00 because the first terminal of the low resistive reference element RL00 is at the voltage VBL(L0) on the bit line BL(L0), which as discussed above is feedback voltage Vfeedback, and the second terminal of the low resistive reference element RL00 is at the voltage VWL(0) on the word line WL(0), which as discussed above is ground or 0 volts. While, ignoring leakage currents, current does not flow through the other low resistive reference elements RL01-RL0*y* electrically connected to the bit line BL(L0) because the first terminals of the other low resistive reference elements RL01-RL0*y* are at the feedback voltage Vfeedback and the second terminals of the other low resistive reference elements RL01-RL0*y* are at the read voltage Vread or a high impedance state to prevent current flow. It is noted that, as discussed below, the feedback voltage Vfeedback is regulated such that the voltage level of the feedback voltage Vfeedback is approximately equal to the voltage level of the read voltage Vread.

The amount of the current IRL00*b*1, ignoring leakage currents, can be approximated using Ohm's Law as IRL00*b*1=VBL(L0)/RRL00, where VBL(L0) is the voltage on the bit line BL(L0) and RRL00 is the resistance of the low resistive reference element RL00. For example, when the voltage VBL(L0) is the feedback voltage Vfeedback of 1 volt and the low resistive reference element RL00 has a resistance of 2 MΩ, the amount of the current IRL00*b*1 can be approximated using Ohm's Law as IRL00*b*1=1 V/2 MΩ=½ µA. The amount of the current IRL00*b*1, ignoring leakage currents, is approximately equal to the amount of the current I240 supplied to the bit line BL(L0) by the NMOS transistor 240 because the amount of current flowing into the bit line BL(L0) is approximately equal to the amount of current flowing from the bit line BL(L0). The amount of current IRL00*b*1 is also approximately equal to the amount of the large current I220*l* supplied by the first PMOS transistor 220 because the amount of the large current I220*l* and the amount of the current I240 are approximately equal because the first PMOS transistor 220 is electrically connected in series with the NMOS transistor 240. Referring to the above example, where the amount of the current IRL00*b*1 is ½ microamps, the amount of the large current I220*l* supplied by the first PMOS transistor 220 is ½ microamps. It is noted that leakage currents do not prevent the SET VERIFY operation of CELL00 when the leakage currents are much less than the amount of the current IRL00*b*1.

Supplying an amount of current for the operation based on the resistance for the operation, as similarly discussed above in step 406 of flow chart 400, during the SET VERIFY operation of CELL00 is carried out by the PMOS transistor 230 supplying a current I203*l* that is proportional to the large current I220*l*. Alternatively, when the circuit for sourcing an adjustable amount of current 202 additionally includes a plurality of FETs electrically connected in series with the plurality of PMOS transistors 230, 232, as discussed above, supplying an amount of current for the operation based on the resistance for the operation, as similarly discussed above in step 406 of flow chart 400, during the SET VERIFY operation of CELL00 is carried out by turning on the FET electrically connected in series with the PMOS transistor 230 and the PMOS transistor 230 supplying a current I203*l* that is proportional to the large current I220*l*. As discussed above, the amount of the large current I220*l* is based on the amount of the current IRL00*b*1 flowing through the low resistive reference element RL00.

The PMOS transistor 230 is turned on when a gate to source voltage VGS of the PMOS transistor 230 is less than a threshold voltage VT for the PMOS transistor 230. The gate to source voltage VGS of the PMOS transistor 230 is determined by the difference between a gate voltage VG and a source voltage VS. The gate voltage VG of the PMOS transistor 230 is the output voltage Vout of the differential amplifier 210 because the gate terminal of the PMOS transistor 230 is electrically connected to the output terminal of the differential amplifier 210. The source voltage VS of the PMOS transistor 230 is the system voltage Vdd because the source terminal of the PMOS transistor 230 is electrically connected a power supply, a voltage source, a driver circuit, or other device that supplies the system voltage Vdd. Thus, the gate to source voltage VGS of the PMOS transistor 230 can be expressed by VGS=VG−VS, where the gate voltage VG is the output voltage Vout of the differential amplifier 210 and the source voltage VS is the system voltage Vdd. Further, the gate to source voltage VGS of the PMOS transistor 230 is approximately equal to the gate to source voltage VGS of the first PMOS transistor 220 because the gate voltages of the PMOS transistor 230 and the first PMOS transistor 220 are the output voltage Vout of the differential amplifier 210 and the source voltages of the PMOS transistor 230 and the first PMOS transistor 220 are the system voltage Vdd.

As discussed above, the output voltage Vout of the differential amplifier 210 can be expressed by Vout=Vfeedback−Vread and substituting Vfeedback−Vread for the gate voltage VG in the above equation for determining the gate to source voltage VGS of the PMOS transistor 230 provides the equation VGS=Vfeedback−Vread−Vdd. As shown by this equation, the gate to source voltage VGS of the PMOS transistor 230 changes when the feedback voltage Vfeedback changes because the voltage level of the read voltage Vread and the voltage level of the system voltage Vdd are generally constant. Thus, the PMOS transistor 230 is turned on when the feedback voltage Vfeedback has a voltage level such that the gate to source voltage VGS of the PMOS transistor 230 is less than a threshold voltage VT of the PMOS transistor 230.

The amount of the current I203*l* supplied by the PMOS transistor 230 is proportional to the amount of the large current I220*l* supplied by the first PMOS transistor 220. The proportion between the amount of the current I203*l* supplied by the PMOS transistor 230 and the amount of the large current I220*l* supplied by the first PMOS transistor 220 is a design variable selected by a circuit designer. The circuit designer can select the proportion between the amount of the current I203*l* supplied by the PMOS transistor 230 and the amount of the large current I220*l* supplied by the first PMOS transistor 220 by selecting the features of the PMOS transistor 230 and the features of the first PMOS transistor 220. The proportion between the amount of the current I203*l* supplied by the PMOS transistor 230 and the amount of the large current I220*l* supplied by the first PMOS transistor 220 is selected as 1 by selecting a width to length ratio of the PMOS transistor 230 that is approximately equal to a width to length ratio of the first PMOS transistor 220. However, the proportion is not limited to 1 and the circuit designer can select other values for the proportion, such as a proportion greater than 1 and a proportion less than 1. Further, the circuit designer can select other features of the PMOS transistor 230 and the first PMOS transistor 220 to achieve the desired proportion between the amount of the current I203*l* supplied by the PMOS transistor 230 and the amount of the large current I220*l* supplied by the first PMOS transistor 220. For example, the circuit designer can select other dimensions of the PMOS transistors, layouts of the PMOS transistors, and materials for fabricating the PMOS transistors to achieve the desired proportion between the amount of the current I203*l* supplied by the PMOS transistor 230 and the amount of the large current I220*l* supplied by the first PMOS transistor 220. It is noted that when other types of field effect transistors are used in place of the first PMOS transistor 220 and the plurality of PMOS transistor 230, 232 the circuit designer can also select dimensions, layouts, and materials for fabricating the other types of field effect transistors to achieve the desired proportion between currents.

When the proportion between the amount of the current I203*l* supplied by the PMOS transistor 230 and the amount of the large current I220*l* supplied by the first PMOS transistor 220 is selected based on the width to length ratios of the PMOS transistor 230 and the first PMOS transistor 220, the amount of the current I203*l* can be approximated by the following equation, I230*l*=(IRL00*b*1)((Channel Width of PMOS 230/Channel Length of PMOS 230)/(Channel Width of PMOS 220/Channel Length of PMOS 220)), where IRL00*b*1 is the amount of current flowing through the low resistive reference element RL00. For example, when the current IRL00*b*1 is ½ microamps and the width to length ratio of the PMOS transistor 230 equals the width to length ratio of the first PMOS transistor 220, the current I230*l*=(½ μA)(1)=½ μA.

The current I203*l* supplied by the PMOS transistor 230 flows into the bit line BL(0) and a current ICELL00*lb*1 flows from the bit line BL(0) through CELL00. FIG. 3B shows the current I203*l* flowing through the PMOS transistor 230 and the current ICELL00*lb*1 flowing through CELL00. The current ICELL00*lb*1 flows through CELL00 because the first terminal of the resistive change element SW00 within CELL00 is at a voltage VBL(0) on the bit line BL(0) and the second terminal of the resistive change element SW00 is at the voltage VWL(0) on the word line WL(0), which as discussed above is ground or 0 volts. While, ignoring leakage currents, current does not flow through the other resistive change element cells CELL01-CELL0*y* on the bit line BL(0) because the first terminals of the resistive change elements SW01-SW0*y* within the other resistive change element cells CELL01-CELL0*y* are at the voltage VBL(0) on the bit line BL(0) and the second terminals of the resistive change elements SW01-SW0*y* are at the read voltage Vread or a high impedance state to prevent current flow. The amount of the current ICELL00*lb*1, ignoring leakage currents, is approximately equal to the amount of the current I203*l* supplied to the bit line BL(0) by the PMOS transistor 230 because the amount of current flowing into the bit line BL(0) is approximately equal to the amount of current flowing from the bit line BL(0). Further, the amount of the current ICELL00*lb*1 is approximately equal to the amount of the current IRL00*b*1 because the amount of the current I203*l* supplied by the PMOS transistor 230 is approximately equal to the amount of the large current I220*l* supplied by the first PMOS transistor 220 and the amount of the large current I220*l* supplied by the first PMOS transistor 220 is approximately equal to the amount of the current IRL00*b*1. It is noted that leakage currents do not prevent a SET VERIFY operation of CELL00 when the leakage currents are much less than the amount of the current ICELL00*lb*1.

The voltage VBL(0) on the bit line BL(0), ignoring leakage currents, can be approximated using Ohm's Law as VBL(0)=ICELL00*lb*1×RCELL00, where the current ICELL00*lb*1 is the current flowing through CELL00 and RCELL00 is the resistance of the resistive change element SW00 within CELL00. As shown by this equation, the voltage VBL(0) on the bit line BL(0) changes when the resistance of the resistive change element SW00 changes because the current flowing through CELL00 is generally constant. For example, when ICELL00*lb*1=IRL00*b*1=½ microamps and RCELL00=2 MΩ, the voltage VBL(0)=½ μA×2 MΩ=1 V. For example, when ICELL00*lb*1=IRL00*b*1=½ microamps and RCELL00=1 MΩ, the voltage VBL(0)=½ μA×1 MΩ=½ V. For example, when ICELL00*lb*1=IRL00*b*1=½ microamps and RCELL00=10 MΩ, the voltage VBL(0)=½ μA×10 MΩ=5 V.

It is noted that when the voltage VBL(0) on the bit line BL(0) is less than the read voltage Vread and the word lines WL(1)-WL(y) electrically connected to the other resistive change element cells CELL01-CELL0*y* on the bit line BL(0) are driven to the read voltage Vread, leakage currents flow into the bit line BL(0) through the other resistive change element cells CELL01-CELL0*y* and pull up the voltage VBL(0) on the bit line BL(0). It is also noted that when the voltage VBL(0) on the bit line BL(0) is greater than the read voltage Vread and the word lines WL(1)-WL(y) electrically connected to the other resistive change element cells CELL01-CELL0y on the bit line BL(0) are driven to the read voltage Vread, leakage currents flow from the bit line BL(0) through the other resistive change element cells CELL01-CELL0y and pull down the voltage VBL(0) on the bit line BL(0). It is further noted that when the voltage VBL(0) on the bit line BL(0) is pulled up by leakage currents flowing into the bit line BL(0) and when the voltage VBL(0) on the bit line BL(0) is pulled down by leakage currents flowing from the bit line BL(0), the number of the word lines WL(1)-WL(y) should be small enough to allow a margin to determine a resistive state of the selected resistive change element SW00.

Determining a resistive state of the at least one resistive change element based on a resistance of the at least one resistive change element and the resistance for the operation, as similarly discussed above in step 408 of flow chart 400, during the SET VERIFY operation of CELL00 is carried out by determining the resistive state of the resistive change element SW00 by comparing the voltage VBL(0) on the bit line BL(0) with the read voltage Vread. As discussed above, the voltage VBL(0) on the bit line BL(0) is determined by the amount of the current ICELL00$lb$1 and the resistance of the resistive change element SW00. The voltage VBL(0) on the bit line BL(0) is indicative of the resistive state of the resistive change element SW00 because the amount of current ICELL00$lb$1 is approximately the same for both a low resistive state and a resistive state other than a low resistive state of the resistive change element SW00, while, the resistance of the resistive change element SW00 is different for a low resistive state and a resistive state other than a low resistive state. The read voltage Vread is indicative of the resistance RRL00 of the low resistive reference element RL00 for the SET VERIFY operation of CELL00 because the read voltage Vread is equal to the amount of the current ICELL00$lb$1 multiplied by the resistance RRL00 of the low resistive reference element RL00. For example, when ICELL00$lb$1=½ μA, RRL00=2 MΩ, Vread=½ μA×2 MΩ=1 V. When the voltage VBL(0) on the bit line BL(0) is less than or equal to the read voltage Vread (i.e. the voltage VBL(0) on the bit line BL(0)≤Vread) the resistance of the resistive change element SW00 is less than or equal to the resistance RRL00 of the low resistive reference element RL00 (i.e. RCELL00≤RRL00, where RCELL00 is the resistance of the resistive change element SW00 within CELL00) and the resistive state of the resistive change element SW00 is determined to be a low resistive state. When the voltage VBL(0) on the bit line BL(0) is greater than the read voltage Vread (i.e. the voltage VBL(0) on the bit line BL(0)>Vread) the resistance of the resistive change element SW00 is greater than the resistance RRL00 of the low resistive reference element RL00 (i.e. RCELL00>RRL00, where RCELL00 is the resistance of the resistive change element SW00 within CELL00) and the resistive state of resistive change element SW00 is determined to be a resistive state other than a low resistive state.

The sense device 260 receives the voltage VBL(0) on the bit line BL(0) on a first input terminal because the first input terminal is electrically connected to the bit line BL(0) and receives the read voltage Vread on a second input terminal because the second input terminal is electrically connected to a power supply, a voltage source, a driver circuit, a resistor divider, a test circuit, a control circuit such as a processor, a controller, a programmable logic device, and a FGPA, or other device that supplies the read voltage Vread. The sense device 260 determines the resistive state of the resistive change element SW00 by comparing the voltage VBL(0) on the bit line BL(0) with the read voltage Vread. The sense device 260 outputs a signal indicative of the resistive state of the resistive change element SW00 on an output terminal. When the voltage VBL(0) on the bit line BL(0) is less than or equal to the read voltage Vread, the sense device 260 outputs a signal indicating the resistive change element SW00 has a low resistive state. When the voltage VBL(0) on the bit line BL(0) is greater than the read voltage Vread, the sense device 260 outputs a signal indicating the resistive change element SW00 has a resistive state other than a low resistive state. For example, when ICELL00$lb$1=½ microamps, RCELL00=1 MΩ, VBL(0)=½ V, and Vread=1 V, the sense device 260 outputs a signal indicating that the resistive change element SW00 has a low resistive state (corresponding, typically, to a logic 1, a SET state). For example, when ICELL00$lb$1=½ microamps, RCELL00=2 MΩ, VBL(0)=1 V, and Vread=1 V, the sense device 260 outputs a signal indicating that the resistive change element SW00 has a low resistive state (corresponding, typically, to a logic 1, a SET state). For example, when ICELL00$lb$1=½ microamps, RCELL00=10 MΩ, VBL(0)=5 V, and Vread=1 V, the sense device 260 outputs a signal indicating that the resistive change element SW00 has a resistive state other than a low resistive state. It is noted that when the plurality of sense devices 260, 262 are electrically connected to the plurality of amplifiers 270, 272, as shown in FIGS. 2B and 2D, the plurality of sense devices 260, 262 determine the resistive state of the resistive change elements SW00-SWxy by comparing amplified voltages with a selected voltage, such as the read voltage Vread.

Alternatively, the plurality of sense devices 260, 262 are omitted from the exemplary architecture shown in FIGS. 2A-2D and a test circuit, a logic circuit, or a control circuit such as a processor, a controller, a programmable logic device, and a FGPA, is electrically connected to the bit lines BL(0)-BL(x) to receive the voltages on the bit lines BL(0)-BL(x) or is electrically connected to the plurality of amplifiers 270, 272 to receive amplified voltages. When the test circuit, the logic circuit, or the control circuit is electrically connected to the bit lines BL(0)-BL(x), the test circuit, the logic circuit, or the control circuit determines the resistive states of the resistive change elements SW00-SWxy by comparing the voltages on the bit lines BL(0)-BL(x) with the read voltage Vread or a stored value corresponding to the read voltage Vread. For example, for a SET VERIFY operation of CELL00 when the test circuit, the logic circuit, or the control circuit is electrically connected to the bit lines BL(0)-BL(x), the test circuit, the logic circuit, or the control circuit determines the resistive state of the resistive change element SW00 by comparing the voltage VBL(0) on the bit line BL(0) with the read voltage Vread or a stored value corresponding to the read voltage Vread. When the test circuit, the logic circuit, or the control circuit is electrically connected to the plurality of amplifiers 270, 272, the test circuit, the logic circuit, or the control circuit determines the resistive states of the resistive change elements SW00-SWxy by comparing the amplified voltages with a selected voltage, such as the read voltage Vread, or a stored value corresponding to the selected voltage, such as the read voltage Vread. Additionally, the test circuit, the logic circuit, or the control circuit can output signals indicative of the resistive states of the resistive change elements SW00-SWxy.

Further, the circuit for sourcing an adjustable amount of current 202 compensates for the circuit conditions of the resistive change element array 200 by regulating the feedback voltage Vfeedback to be approximately equal to the read voltage Vread. The feedback voltage Vfeedback reflects the circuit conditions of the resistive change element array 200 because the feedback voltage Vfeedback is based on the amount of the large current I220*l* flowing through the first PMOS transistor 220 and the amount of the large current I220*l* is impacted by the circuit conditions of the resistive change element array 200. For example, changes in the resistances of the low resistive reference elements RL00-RL0*y* due to temperature, leakage currents, and parasitic impedances can impact the amount of the large current I220*l*. The feedback voltage Vfeedback is supplied to the non-inverting input of the differential amplifier 210 and, as discussed above, the gate voltage VG of the first PMOS transistor 220 is the output voltage Vout of the differential amplifier 210 and the source voltage VS of the first PMOS transistor 220 is the system voltage Vdd. The gate to source voltage VGS of the first PMOS transistor 220 regulates the amount of the large current I220*l*, flowing through the first PMOS transistor 220 and the differential amplifier 210 adjusts the gate to source voltage VGS of the first PMOS transistor 220 so that the amount of the large current I220*l* adjusts the feedback voltage Vfeedback to be approximately equal to the read voltage Vread. Also, as discussed above, the amount of the current I203*l* supplied by the PMOS transistor 230 is proportional to the amount of the large current I220*l* supplied by the first PMOS transistor 220. Thus, adjusting the amount of the large current I220*l* supplied by the first PMOS transistor 220 to compensate for circuit conditions of the resistive change element array 200 proportionally adjusts the amount of the current I203*l* supplied by the PMOS transistor 230 to compensate for circuit conditions of the resistive change element array 200.

Additionally, SET VERIFY operations of each resistive change element cell CELL00-CELLx0 on the word line WL(0) can be performed at the same time because each PMOS transistor in the plurality of PMOS transistors 230, 232 supplies approximately the same amount of current to a bit line BL(0)-BL(x) at the same time. Each PMOS transistor in the plurality of PMOS transistors 230, 232 supplies approximately the same amount of current for SET VERIFY operations because each PMOS transistor in the plurality of PMOS transistors 230, 232 has approximately the same features and approximately the same gate to source voltage VGS. FIG. 3B shows the PMOS transistor 230 supplying a current I203*l* to the bit line BL(0), the PMOS transistor 232 supplying a current I232*l* to the bit line BL(x), a current ICELL00*lb*1 flowing from the bit line BL(0) through CELL00, and a current ICELLx01*b*1 flowing from the bit line BL(x) through CELLx0. SET VERIFY operations of each resistive change element cell CELL00-CELLx0 on the word line WL(0) are performed in a similar manner to the SET VERIFY operation of CELL00, discussed above. Performing SET VERIFY operations of each cell on a word line at the same time can be highly desirable in certain applications where rapid data SET VERIFY operations or page mode SET VERIFY operations are required.

Figure 3C:
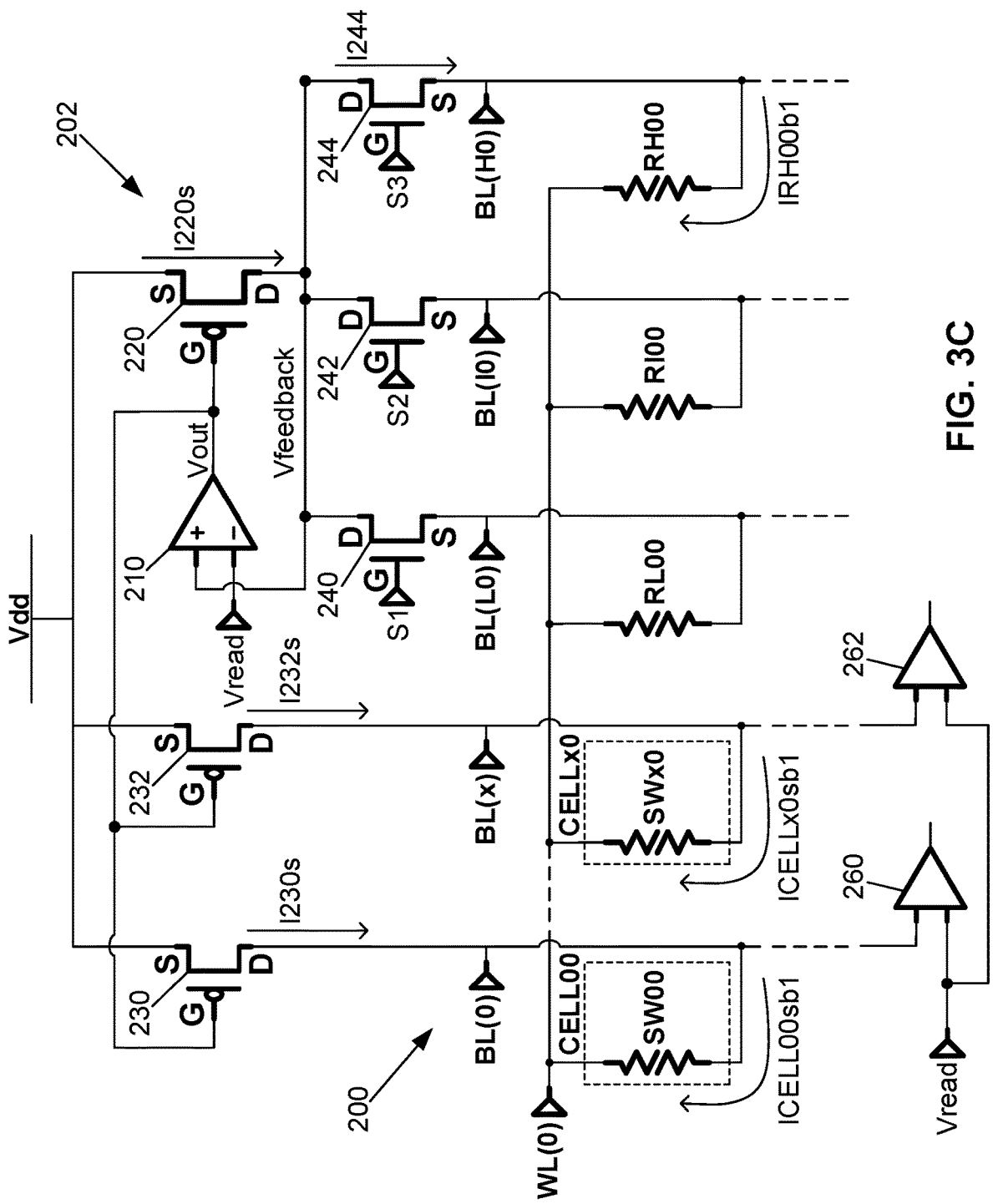
FIG. 3C illustrates a simplified schematic diagram showing current flow in the exemplary architecture of FIG. 2A during a RESET VERIFY operation, where a reduced version of the resistive change element array is shown so that current flow can be shown in greater detail.

A RESET VERIFY operation of CELL00 in the exemplary architecture of FIG. 2A will be explained in detail further below, and RESET VERIFY operations of each cell in the exemplary architecture of FIG. 2A can be performed in a similar manner to the RESET VERIFY operation of CELL00. FIG. 3C illustrates a simplified schematic diagram showing current flow, ignoring leakage currents, during a RESET VERIFY operation of CELL00 in the exemplary architecture of FIG. 2A. FIG. 3C shows a reduced version of the resistive change element array 200, so that current flow can be shown in greater detail. It is noted that RESET VERIFY operations of CELL00 explained in further detail below generally describe current flowing through CELL00 as flowing from the bit line BL(0) to the word line WL(0), however, the devices and methods of the present disclosure are not limited to current flow through the cells as flowing from the bit line to the word line. It is also noted that FIG. 3C can be referred to for a RESET VERIFY operation of CELL00 and for RESET VERIFY operations of each cell on the word line WL(0) performed at the same time because current flows through each PMOS transistor in the plurality of PMOS transistors 230, 232 and through each cell on the word line WL(0) for a RESET VERIFY operation of CELL00 and for RESET VERIFY operations of each cell on the word line WL(0) performed at the same time.

A RESET VERIFY operation of CELL00 starts, as similarly discussed above in step 402 of flow chart 400, by selecting CELL00 from the plurality of resistive change element cells CELL00-CELLxy in the resistive change element array 200. CELL00 is selected from the plurality of resistive change element cells CELL00-CELLxy by driving a voltage VWL(0) on the word line WL(0) to 0 volts or ground and driving the other word lines WL(1)-WL(y) to a read voltage Vread or a high impedance state. The voltage VWL(0) on the word line WL(0) and the read voltage Vread are design variables selected by a circuit designer. It is noted that although the voltage VWL(0) on the word line WL(0) is discussed as being driven to 0 volts or ground, the voltage VWL(0) on the word line WL(0) is not limited to being driven to 0 volts or ground and that the circuit designer can select other voltage levels for the voltage VWL(0) on the word line WL(0) such as a voltage level less than 0 volts and a voltage level greater than 0 volts. It is also noted that although the read voltage Vread is discussed as having a voltage level of 1 volt, the read voltage Vread is not limited to having a voltage level of 1 volt and that the circuit designer can select other voltage levels for the read voltage Vread, such as a voltage level greater than 1 volt and a voltage level less than 1 volt. It is further noted that the system voltage Vdd is a design variable selected by a circuit designer.

Selecting a resistance for an operation of the at least one resistive change element, as similarly discussed above in step 404 of flow chart 400, during a RESET VERIFY operation of CELL00 is carried out by turning on the first PMOS transistor 220 and turning on the NMOS transistor 244 to select the resistance of the high resistive reference element RH00 for the RESET VERIFY operation of CELL00. Alternatively, when the first PMOS transistor 220 is already turned on, selecting a resistance for an operation of the at least one resistive change element, as similarly discussed above in step 404 of flow chart 400, during a RESET VERIFY operation of CELL00 is carried out by turning on the NMOS transistor 244 to select the resistance of the high resistive reference element RH00 for the RESET VERIFY operation of CELL00.

The first PMOS transistor 220 is turned on when a gate to source voltage VGS of the first PMOS transistor 220 is less than a threshold voltage VT of the first PMOS transistor 220. The gate to source voltage VGS of the first PMOS transistor 220 is determined by the difference between a gate voltage VG and a source voltage VS. The gate voltage VG of the first PMOS transistor 220 is the output voltage Vout of the differential amplifier 210 because the gate terminal of the first PMOS transistor 220 is electrically connected to the output terminal of the differential amplifier 210. The source voltage VS of the first PMOS transistor 220 is the system voltage Vdd because the source terminal of the first PMOS transistor 220 is electrically connected a power supply, a voltage source, a driver circuit, or other device that supplies the system voltage Vdd. Thus, the gate to source voltage VGS of the first PMOS transistor 220 can be expressed by VGS=VG−VS, where the gate voltage VG is the output voltage Vout of the differential amplifier 210 and the source voltage VS is the system voltage Vdd.

The output voltage Vout of the differential amplifier 210 is determined by multiplying a gain of the differential amplifier 210 with the difference between a voltage of the non-inverting input and a voltage of the inverting input. The differential amplifier 210 has a gain of 1, however, the differential amplifier 210 is not limited to having a gain of 1. The gain of the differential amplifier 210 is a design variable selected by a circuit designer and the circuit designer can select other values for the gain of the differential amplifier 210, such as a gain of the differential amplifier 210 greater than 1 and a gain of the differential amplifier 210 less than 1. The voltage of the non-inverting input of the differential amplifier 210 is the feedback voltage Vfeedback because the non-inverting input terminal is electrically connected to the drain terminal of the first PMOS transistor 220 and the drain terminal of each NMOS transistors in the plurality of NMOS transistors 240, 242, 244 through the feedback loop. The voltage of the inverting input of the differential amplifier 210 is the read voltage Vread because the inverting input terminal is electrically connected to a power supply, a voltage source, a driver circuit, a resistor divider, a test circuit, a control circuit such as a processor, a controller, a programmable logic device, and a FGPA, or other device that supplies the read voltage Vread. Thus, the output voltage Vout of the differential amplifier 210 can be expressed by Vout=Gain(Voltage of the Non-Inverting Input−Voltage of the Inverting Input), where the gain is 1, the voltage of the non-inverting input is the feedback voltage Vfeedback, and the voltage of the inverting input is the read voltage Vread.

Substituting for the gain, the voltage of the non-inverting input, and the voltage of the inverting input, in the above equation for determining the output voltage Vout of the differential amplifier 210 provides Vout=Vfeedback−Vread and substituting Vfeedback−Vread for the gate voltage VG in the above equation for determining the gate to source voltage VGS of the first PMOS transistor 220 provides the equation VGS=Vfeedback−Vread−Vdd. As shown by this equation, the gate to source voltage VGS of the first PMOS transistor 220 changes when the feedback voltage Vfeedback changes because the voltage level of the read voltage Vread and the voltage level of the system voltage Vdd are generally constant. Thus, the first PMOS transistor 220 is turned on when the feedback voltage Vfeedback has a voltage level such that the gate to source voltage VGS of the first PMOS transistor 220 is less than a threshold voltage VT of the first PMOS transistor 220.

The NMOS transistor 244 is turned on by a control signal S3 supplied by a test circuit or a control circuit such as a processor, a controller, a programmable logic device, and a FGPA, and the NMOS transistors 240 and 242 are turned off by control signals S1-S2 supplied by the test circuit or the control circuit. The test circuit or the control circuit supplies the control signal S1 having a voltage level such that a gate to source voltage VGS of the NMOS transistor 240 is less than a threshold voltage VT of the NMOS transistor 240, the control signal S2 having a voltage level such that a gate to source voltage VGS of the NMOS transistor 242 is less than a threshold voltage VT of the NMOS transistor 242, and the control signal S3 having a voltage level such that a gate to source voltage VGS of the NMOS transistor 244 is greater than a threshold voltage VT of the NMOS transistor 244.

When the first PMOS transistor 220 and the NMOS transistor 244 are turned on, a small current I220s flows through the first PMOS transistor 220, a current I244 flows into the bit line BL(H0) through the NMOS transistor 244, a current IRH00b1 flows from the bit line BL(H0) through the high resistive reference element RH00, and a voltage on the bit line BL(H0) is driven to the feedback voltage Vfeedback. FIG. 3C shows the small current I220s flowing through the first PMOS transistor 220, the current I244 flowing through the NMOS transistor 244, and the current IRH00b1 flowing through the high resistive reference element RH00. The current IRH00b1 flows through the high resistive reference element RH00 because the first terminal of the high resistive reference element RH00 is at the voltage VBL(H0) on the bit line BL(H0), which as discussed above is the feedback voltage Vfeedback, and the second terminal of the high resistive reference element RH00 is at the voltage VWL(0) on the word line WL(0), which as discussed above is ground or 0 volts. While, ignoring leakage currents, current does not flow through the other high resistive reference elements RH01-RH0y electrically connected to the bit line BL(H0) because the first terminals of the other high resistive reference elements RH01-RH0y are at the feedback voltage Vfeedback and the second terminals of the other high resistive reference elements RH01-RH0y are at the read voltage Vread or a high impedance state to prevent current flow. It is noted that, as discussed below, the feedback voltage Vfeedback is regulated such that the voltage level of the feedback voltage Vfeedback is approximately equal to the voltage level of the read voltage Vread.

The amount of the current IRH00b1, ignoring leakage currents, can be approximated using Ohm's Law as IRH00b1=VBL(H0)/RRH00, where VBL(H0) is the voltage on the bit line BL(H0) and RRH00 is the resistance of the high resistive reference element RH00. For example, when the voltage VBL(H0) is the feedback voltage Vfeedback of 1 volt and the high resistive reference element RH00 has a resistance of 9 MΩ, the amount of the current IRH00b1 can be approximated using Ohm's Law as IRH00b1=1 V/9 MΩ=⅑ μA. The amount of the current IRH00b1, ignoring leakage currents, is approximately equal to the amount of the current I244 supplied to the bit line BL(H0) by the NMOS transistor 244 because the amount of current flowing into the bit line BL(H0) is approximately equal to the amount of current flowing from the bit line BL(H0). The amount of current IRH00b1 is also approximately equal to the amount of the small current I220s supplied by the first PMOS transistor 220 because the amount of the small current I220s and the amount of the current I244 are approximately equal because the first PMOS transistor 220 is electrically connected in series with the NMOS transistor 244. Referring to the above example, where the amount of the current IRH00b1 is ⅑ microamps, the amount of the small current I220s supplied by the first PMOS transistor 220 is ⅑ microamps. It is noted that leakage currents do not prevent the RESET VERIFY operation of CELL00 when the leakage currents are much less than the amount of the current IRH00b1.

Supplying an amount of current for the operation based on the resistance for the operation, as similarly discussed above in step 406 of flow chart 400, during the RESET VERIFY operation of CELL00 is carried out by the PMOS transistor 230 supplying a current I230s that is proportional to the small current I220s. Alternatively, when the circuit for sourcing an adjustable amount of current 202 additionally includes a plurality of FETs electrically connected in series with the plurality of PMOS transistors 230, 232, as discussed above, supplying an amount of current for the operation based on the resistance for the operation, as similarly discussed above in step 406 of flow chart 400, during the RESET VERIFY operation of CELL00 is carried out by turning on the FET electrically connected in series with the PMOS transistor 230 and the PMOS transistor 230 supplying a current I230s that is proportional to the small current I220s. As discussed above, the amount of the small current I220s is based on the amount of the current IRH00b1 flowing through the high resistive reference element RH00.

The PMOS transistor 230 is turned on when a gate to source voltage VGS of the PMOS transistor 230 is less than a threshold voltage VT for the PMOS transistor 230. The gate to source voltage VGS of the PMOS transistor 230 is determined by the difference between a gate voltage VG and a source voltage VS. The gate voltage VG of the PMOS transistor 230 is the output voltage Vout of the differential amplifier 210 because the gate terminal of the PMOS transistor 230 is electrically connected to the output terminal of the differential amplifier 210. The source voltage VS of the PMOS transistor 230 is the system voltage Vdd because the source terminal of the PMOS transistor 230 is electrically connected a power supply, a voltage source, a driver circuit, or other device that supplies the system voltage Vdd. Thus, the gate to source voltage VGS of the PMOS transistor 230 can be expressed by VGS=VG−VS, where the gate voltage VG is the output voltage Vout of the differential amplifier 210 and the source voltage VS is the system voltage Vdd. Further, the gate to source voltage VGS of the PMOS transistor 230 is approximately equal to the gate to source voltage VGS of the first PMOS transistor 220 because the gate voltages of the PMOS transistor 230 and the first PMOS transistor 220 are the output voltage of the differential amplifier 210 and the source voltages of the PMOS transistor 230 and the first PMOS transistor 220 are the system voltage Vdd.

As discussed above, the output voltage Vout of the differential amplifier 210 can be expressed by Vout=Vfeedback−Vread and substituting Vfeedback−Vread for the gate voltage VG in the above equation for determining the gate to source voltage VGS of the PMOS transistor 230 provides the equation VGS=Vfeedback−Vread−Vdd. As shown by this equation, the gate to source voltage VGS of the PMOS transistor 230 changes when the feedback voltage Vfeedback changes because the voltage level of the read voltage Vread and the voltage level of the system voltage Vdd are generally constant. Thus, the PMOS transistor 230 is turned on when the feedback voltage Vfeedback has a voltage level such that the gate to source voltage VGS of the PMOS transistor 230 is less than a threshold voltage VT of the PMOS transistor 230.

The amount of the current I230s supplied by the PMOS transistor 230 is proportional to the amount of the small current I220s supplied by the first PMOS transistor 220. The proportion between the amount of the current I230s supplied by the PMOS transistor 230 and the amount of the small current I220s supplied by the first PMOS transistor 220 is a design variable selected by a circuit designer. The circuit designer can select the proportion between the amount of the current I230s supplied by the PMOS transistor 230 and the amount of the small current I220s supplied by the first PMOS transistor 220 by selecting the features of the PMOS transistor 230 and the features of the first PMOS transistor 220. The proportion between the amount of the current I230s supplied by the PMOS transistor 230 and the amount of the small current I220s supplied by the first PMOS transistor 220 is selected as 1 by selecting a width to length ratio of the PMOS transistor 230 that is approximately equal to a width to length ratio of the first PMOS transistor 220. However, the proportion is not limited to 1 and the circuit designer can select other values for the proportion, such as a proportion greater than 1 and a proportion less than 1. Further, the circuit designer can select other features of the PMOS transistor 230 and the first PMOS transistor 220 to achieve the desired proportion between the amount of the current I230s supplied by the PMOS transistor 230 and the amount of the small current I220s supplied by the first PMOS transistor 220. For example, the circuit designer can select other dimensions of the PMOS transistors, layouts of the PMOS transistors, and materials for fabricating the PMOS transistors to achieve the desired proportion between the amount of the current I230s supplied by the PMOS transistor 230 and the amount of the small current I220s supplied by the first PMOS transistor 220. It is noted that when other types of field effect transistors are used in place of the first PMOS transistor 220 and the plurality of PMOS transistor 230, 232 the circuit designer can also select dimensions, layouts, and materials for fabricating the other types of field effect transistors to achieve the desired proportion between currents.

When the proportion between the amount of the current I230s supplied by the PMOS transistor 230 and the amount of the small current I220s supplied by the first PMOS transistor 220 is selected based on the width to length ratios of the PMOS transistor 230 and the first PMOS transistor 220, the amount of the current I230s can be approximated by the following equation, I230s=(IRH00b1)((Channel Width of PMOS 230/Channel Length of PMOS 230)/(Channel Width of PMOS 220/Channel Length of PMOS 220)), where IRH00b1 is the amount of current flowing through the high resistive reference element RH00. For example, when the current IRH00b1 is ⅕ microamps and the width to length ratio of the PMOS transistor 230 equals the width to length ratio of the first PMOS transistor 220, the current I230s=(⅕ μA)(1)=⅕ μA.

The current I230s supplied by the PMOS transistor 230 flows into the bit line BL(0) and a current ICELL00sb1 flows from the bit line BL(0) through CELL00. FIG. 3C shows the current I230s flowing through the PMOS transistor 230 and the current ICELL00sb1 flowing through CELL00. The current ICELL00sb1 flows through CELL00 because the first terminal of the resistive change element SW00 within CELL00 is at a voltage VBL(0) on the bit line BL(0) and the second terminal of the resistive change element SW00 is at the voltage VWL(0) on the word line WL(0), which as discussed above is ground or 0 volts. While, ignoring leakage currents, current does not flow through the other resistive change element cells CELL01-CELL0y on the bit line BL(0) because the first terminals of the resistive change elements SW01-SW0y within the other resistive change element cells CELL01-CELL0y are at the voltage VBL(0) on the bit line BL(0) and the second terminals of the resistive change elements SW01-SW0y are at the read voltage Vread or a high impedance state to prevent current flow. The amount of the current ICELL00sb1, ignoring leakage currents, is approximately equal to the amount of the current I230s supplied to the bit line BL(0) by the PMOS transistor 230 because the amount of current flowing into the bit line BL(0) is approximately equal to the amount of current flowing from the bit line BL(0). Further, the amount of the current ICELL00sb1 is approximately equal to the amount of the current IRH00b1 because the amount of the current I230s supplied by the PMOS transistor 230 is approximately equal to the amount of the small current I220s supplied by the first PMOS transistor 220 and the amount of the small current I220s supplied by the first PMOS transistor 220 is approximately equal to the amount of the current IRH00b1. It is noted that leakage currents do not prevent a RESET VERIFY operation of CELL00 when the leakage currents are much less than the amount of the current ICELL00sb1.

The voltage VBL(0) on the bit line BL(0), ignoring leakage currents, can be approximated using Ohm's Law as VBL(0)=ICELL00sb1×RCELL00, where the current ICELL00sb1 is the current flowing through CELL00 and RCELL00 is the resistance of the resistive change element SW00 within CELL00. As shown by this equation, the voltage VBL(0) on the bit line BL(0) changes when the resistance of the resistive change element SW00 changes because the current flowing through CELL00 is generally constant. For example, when ICELL00sb1=IRH00b1=⅑ microamps and RCELL00=9 MΩ, the voltage VBL(0)=⅑ μA×9 MΩ=1 V. For example, when ICELL00sb1=IRH00b1=⅑ microamps and RCELL00=1 MΩ, the voltage VBL(0)=⅑ μA×1 MΩ=⅑ V. For example, when ICELL00sb1=IRH00b1=⅑ microamps and RCELL00=10 MΩ, the voltage VBL(0)=⅑ μA×10 M1=10/9V.

It is noted that when the voltage VBL(0) on the bit line BL(0) is less than the read voltage Vread and the word lines WL(1)-WL(y) electrically connected to the other resistive change element cells CELL01-CELL0y on the bit line BL(0) are driven to the read voltage Vread, leakage currents flow into the bit line BL(0) through the other resistive change element cells CELL01-CELL0y and pull up the voltage VBL(0) on the bit line BL(0). It is also noted that when the voltage VBL(0) on the bit line BL(0) is greater than the read voltage Vread and the word lines WL(1)-WL(y) electrically connected to the other resistive change element cells CELL01-CELL0y on the bit line BL(0) are driven to the read voltage Vread, leakage currents flow from the bit line BL(0) through the other resistive change element cells CELL01-CELL0y and pull down the voltage VBL(0) on the bit line BL(0). It is further noted that when the voltage VBL(0) on the bit line BL(0) is pulled up by leakage currents flowing into the bit line BL(0) and when the voltage VBL(0) on the bit line BL(0) is pulled down by leakage currents flowing from the bit line BL(0), the number of the word lines WL(1)-WL(y) should be small enough to allow a margin to determine a resistive state of the selected resistive change element SW00.

Determining a resistive state of the at least one resistive change element based on a resistance of the at least one resistive change element and the resistance for the operation, as similarly discussed above in step 408 of flow chart 400, during the RESET VERIFY operation of CELL00 is carried out by determining the resistive state of the resistive change element SW00 by comparing the voltage VBL(0) on the bit line BL(0) with the read voltage Vread. As discussed above, the voltage VBL(0) on the bit line BL(0) is determined by the amount of the current ICELL00sb1 and the resistance of the resistive change element SW00. The voltage VBL(0) on the bit line BL(0) is indicative of the resistive state of the resistive change element SW00 because the amount of current ICELL00sb1 is approximately the same for both a high resistive state and a resistive state other than a high resistive state of the resistive change element SW00, while, the resistance of the resistive change element SW00 is different for a high resistive state and a resistive state other than a high resistive state. The read voltage Vread is indicative of the resistance RRH00 of the high resistive reference element RH00 for the RESET VERIFY operation of CELL00 because the read voltage Vread is equal to the amount of the current ICELL00sb1 multiplied by the resistance RRH00 of the high resistive reference element RH00. For example, when ICELL00sb1=⅑ μA, RRH00=9 MΩ, Vread=⅑ μA×9 MΩ=1 V. When the voltage VBL(0) on the bit line BL(0) is greater than the read voltage Vread (i.e. the voltage VBL(0) on the bit line BL(0)>Vread) the resistance of the resistive change element SW00 is greater than the resistance RRH00 of the high resistive reference element RH00 (i.e. RCELL00>RRH00, where RCELL00 is the resistance of the resistive change element SW00 within CELL00) and the resistive state of resistive change element SW00 is determined to be a high resistive state. When the voltage VBL(0) on the bit line BL(0) is less than or equal to the read voltage Vread (i.e. the voltage VBL(0) on the bit line BL(0)≤Vread) the resistance of the resistive change element SW00 is less than or equal to the resistance RRH00 of the high resistive reference element RH00 (i.e. RCELL00≤RRH00, where RCELL00 is the resistance of the resistive change element SW00 within CELL00) and the resistive state of the resistive change element SW00 is determined to be a resistive state other than a high resistive state.

The sense device 260 receives the voltage VBL(0) on the bit line BL(0) on a first input terminal because the first input terminal is electrically connected to the bit line BL(0) and receives the read voltage Vread on a second input terminal because the second input terminal is electrically connected to a power supply, a voltage source, a driver circuit, a resistor divider, a test circuit, a control circuit such as a processor, a controller, a programmable logic device, and a FGPA, or other device that supplies the read voltage Vread. The sense device 260 determines the resistive state of the resistive change element SW00 by comparing the voltage VBL(0) on the bit line BL(0) with the read voltage Vread. The sense device 260 outputs a signal indicative of the resistive state of the resistive change element SW00 on an output terminal. When the voltage VBL(0) on the bit line BL(0) is greater than the read voltage Vread, the sense device 260 outputs a signal indicating the resistive change element SW00 has a high resistive state. When the voltage VBL(0) on the bit line BL(0) is less than or equal to the read voltage Vread, the sense device 260 outputs a signal indicating the resistive change element SW00 has a resistive state other than a high resistive state. For example, when ICELL00sb1=⅑ microamps, RCELL00=10 MΩ, VBL(0)=10/9 V, and Vread=1 V, the sense device 260 outputs a signal indicating that the resistive change element SW00 has a high resistive state (corresponding, typically, to a logic 0, a RESET state). For example, when ICELL00sb1=⅑ microamps, RCELL00=9 MΩ, VBL(0)=1 V, and Vread=1 V, the sense device 260 outputs a signal indicating that the resistive change element SW00 has a resistive state other than a high resistive state. For example, when ICELL00sb 1=⅑ microamps, RCELL00=1 MΩ, VBL(0)=⅑ V, and Vread=1 V, the sense device 260 outputs a signal indicating that the resistive change element SW00 has a resistive state other than a high resistive state. It is noted that when the plurality of sense devices 260, 262 are electrically connected to the plurality of amplifiers 270, 272, as shown in FIGS. 2B and 2D, the plurality of sense devices 260, 262 determine the resistive states of the resistive change elements SW00-SWxy by comparing amplified voltages with a selected voltage, such as the read voltage Vread.

Alternatively, the plurality of sense devices 260, 262 are omitted from the exemplary architecture shown in FIGS. 2A-2D and a test circuit, a logic circuit, or a control circuit such as a processor, a controller, a programmable logic device, and a FGPA, is electrically connected to the bit lines BL(0)-BL(x) to receive the voltages on the bit lines BL(0)-BL(x) or is electrically connected to the plurality of amplifiers 270, 272 to receive amplified voltages. When the test circuit, the logic circuit, or the control circuit is electrically connected to the bit lines BL(0)-BL(x), the test circuit, the logic circuit, or the control circuit determines the resistive states of the resistive change elements SW00-SWxy by comparing the voltages on the bit lines BL(0)-BL(x) with the read voltage Vread or a stored value corresponding to the read voltage Vread. For example, for a RESET VERIFY operation of CELL00, when the test circuit, the logic circuit, or the control circuit is electrically connected to the bit lines BL(0)-BL(x), the test circuit, the logic circuit, or the control circuit determines the resistive state of the resistive change element SW00 by comparing the voltage VBL(0) on the bit line BL(0) with the read voltage Vread or a stored value corresponding to the read voltage Vread. When the test circuit, the logic circuit, or the control circuit is electrically connected to the plurality of amplifiers 270, 272, the test circuit, the logic circuit, or the control circuit determines the resistive states of the resistive change elements SW00-SWxy by comparing the amplified voltages with a selected voltage, such as the read voltage Vread, or a stored value corresponding to the selected voltage, such as the read voltage Vread. Additionally, the test circuit, the logic circuit, or the control circuit can output signals indicative of the resistive states of the resistive change elements SW00-SWxy.

Further, the circuit for sourcing an adjustable amount of current 202 compensates for the circuit conditions of the resistive change element array 200 by regulating the feedback voltage Vfeedback to be approximately equal to the read voltage Vread. The feedback voltage Vfeedback reflects the circuit conditions of the resistive change element array 200 because the feedback voltage Vfeedback is based on the amount of the small current I220s flowing through the first PMOS transistor 220 and the amount of the small current I220s is impacted by the circuit conditions of the resistive change element array 200. For example, changes in the resistances of the high resistive reference elements RH00-RH0y due to temperature, leakage currents, and parasitic impedances can impact the amount of the small current I220s. The feedback voltage Vfeedback is supplied to the non-inverting input of the differential amplifier 210 and, as discussed above, the gate voltage VG of the first PMOS transistor 220 is the output voltage Vout of the differential amplifier 210 and the source voltage VS of the first PMOS transistor 220 is the system voltage Vdd. The gate to source voltage VGS of the first PMOS transistor 220 regulates the amount of the small current I220s flowing through the first PMOS transistor 220 and the differential amplifier 210 adjusts the gate to source voltage VGS of the first PMOS transistor 220 so that the amount of the small current I220s adjusts the feedback voltage Vfeedback to be approximately equal to the read voltage Vread. Also, as discussed above, the amount of the current I230s supplied by the PMOS transistor 230 is proportional to the amount of the small current I220s supplied by the first PMOS transistor 220. Thus, adjusting the amount of the small current I220s supplied by the first PMOS transistor 220 to compensate for circuit conditions of the resistive change element array 200 proportionally adjusts the amount of the current I230s supplied by the PMOS transistor 230 to compensate for circuit conditions of the resistive change element array 200.

Additionally, RESET VERIFY operations of each resistive change element cell CELL00-CELLx0 on the word line WL(0) can be performed at the same time because each PMOS transistor in the plurality of PMOS transistors 230, 232 supplies approximately the same amount of current to a bit line BL(0)-BL(x) at the same time. Each PMOS transistor in the plurality of PMOS transistors 230, 232 supplies approximately the same amount of current for RESET VERIFY operations because each PMOS transistor in the plurality of PMOS transistors 230, 232 has approximately the same features and approximately the same gate to source voltage VGS. FIG. 3C shows the PMOS transistor 230 supplying a current I230s to the bit line BL(0), the PMOS transistor 232 supplying a current I232s to the bit line BL(x), a current ICELL00sb1 flowing from the bit line BL(0) through CELL00, and a current ICELLx0sb1 flowing from the bit line BL(x) through CELLx0. RESET VERIFY operations of each resistive change element cell CELL00-CELLx0 on the word line WL(0) are performed in a similar manner to the RESET VERIFY operation of CELL00, discussed above. Performing RESET VERIFY operations of each cell on a word line at the same time can be highly desirable in certain applications where rapid data RESET VERIFY operations or page mode RESET VERIFY operations are required.

Figure 3D:
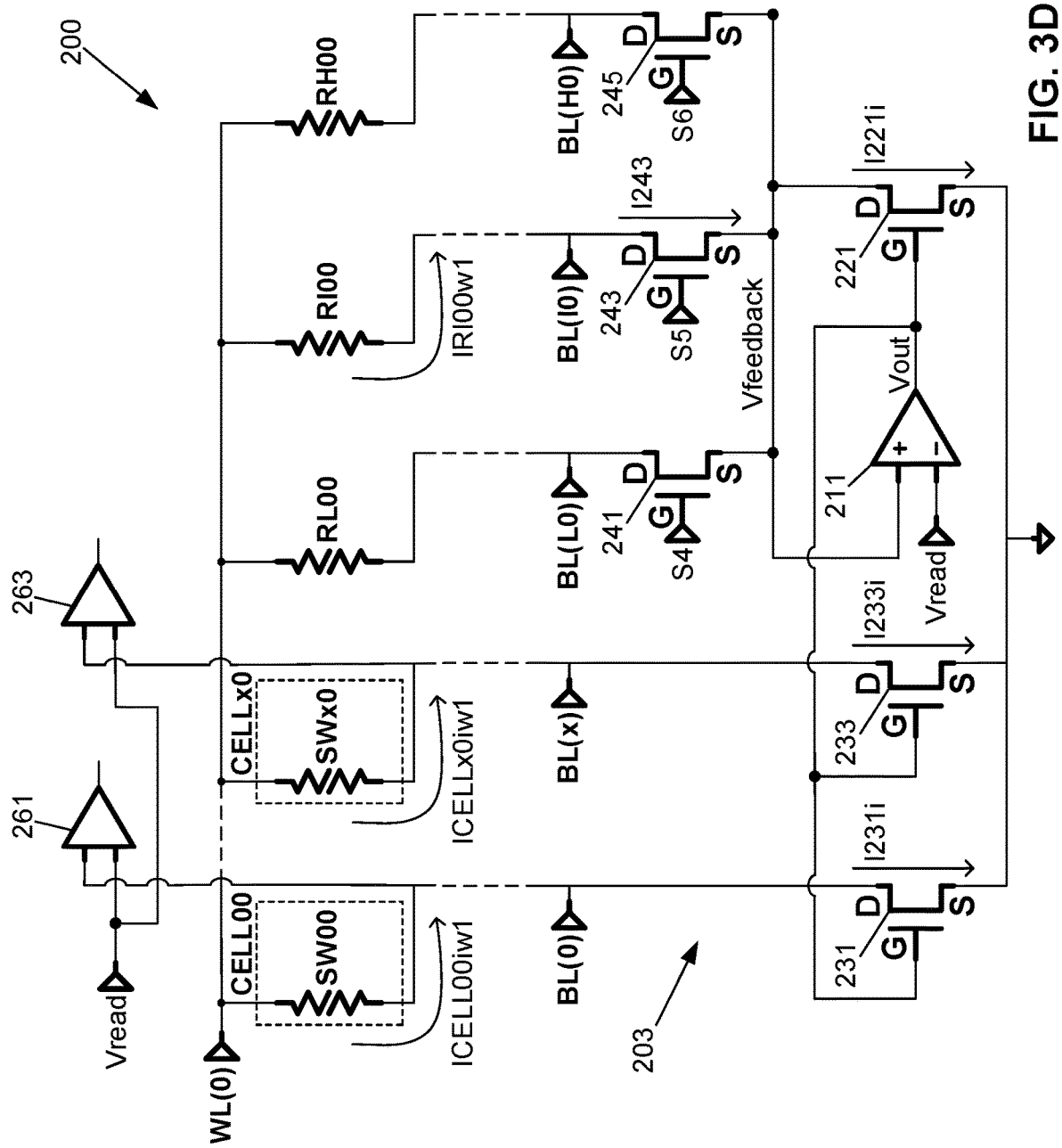
FIG. 3D illustrates a simplified schematic diagram showing current flow in the exemplary architecture of FIG. 2E during a READ operation, where a reduced version of the resistive change element array is shown so that current flow can be shown in greater detail.

The exemplary architecture for accessing at least one resistive change element in a resistive change element array using a resistance of a resistive reference element to sink an amount of current accessing resistive change elements through READ operations, SET VERIFY operations, and RESET VERIFY operations will be explained in detail below starting with READ operations. A READ operation of CELL00 in the exemplary architecture of FIG. 2E will be explained in detail below, and READ operations of each cell in the exemplary architecture of FIG. 2E can be performed in a similar manner to the READ operation of CELL00. FIG. 3D illustrates a simplified schematic diagram showing current flow, ignoring leakage currents, during a READ operation of CELL00 in the exemplary architecture of FIG. 2E. FIG. 3D shows a reduced version of the resistive change element array 200, so that current flow can be shown in greater detail. It is noted that READ operations of CELL00 explained in further detail below generally describe current flowing through CELL00 as flowing from the word line WL(0) to the bit line BL(0), however, the devices and methods of the present disclosure are not limited to current flow through the cells as flowing from the word line to the bit line. It is also noted that FIG. 3D can be referred to for a READ operation of CELL00 and for READ operations of each cell on the word line WL(0) performed at the same time because current flows through each NMOS transistor in the first plurality of NMOS transistors 231, 233 and through each cell on the word line WL(0) for a READ operation of CELL00 and for READ operations of each cell on the word line WL(0) performed at the same time.

A READ operation of CELL00 starts, as similarly discussed above in step 402 of flow chart 400, by selecting CELL00 from the plurality of resistive change element cells CELL00-CELLxy in the resistive change element array 200. CELL00 is selected from the plurality of resistive change element cells CELL00-CELLxy by driving a voltage VWL(0) on the word line WL(0) to the system voltage Vdd and driving the other word lines WL(1)-WL(y) to a read voltage Vread or high impedance state. The voltage VWL(0) on the word line WL(0), the system voltage Vdd, and the read voltage Vread are design variables selected by a circuit designer. It is noted that although the voltage VWL(0) on the word line WL(0) is discussed as being driven to the system voltage Vdd of 2 volts, the voltage VWL(0) on the word line WL(0) is not limited to being driven to the system voltage Vdd or being driven to 2 volts and that the circuit designer can select other voltage levels for the voltage VWL(0) on the word line WL(0), such as a voltage level greater than 2 volts and a voltage level less than 2 volts. It is also noted that although the system voltage Vdd is discussed as having a voltage level of 2 volts, the system voltage Vdd is not limited to having a voltage level of 2 volts and that the circuit designer can select other voltage levels for the system voltage Vdd, such as a voltage level greater than 2 volts and a voltage level less than 2 volts. It is further noted that although the read voltage Vread is discussed as having a voltage level of 1 volt, the read voltage Vread is not limited to having a voltage level of 1 volt and that the circuit designer can select other voltage levels for the read voltage Vread, such as a voltage level greater than 1 volt and a voltage level less than 1 volt.

Selecting a resistance for an operation of the at least one resistive change element, as similarly discussed above in step 404 of flow chart 400, during a READ operation of CELL00 is carried out by turning on the first NMOS transistor 221 and turning on the NMOS transistor 243 to select the resistance of the intermediate resistive reference element RI00 for the READ operation of CELL00. Alternatively, when the first NMOS transistor 221 is already turned on, selecting a resistance for an operation of the at least one resistive change element, as similarly discussed above in step 404 of flow chart 400, during a READ operation of CELL00 is carried out by turning on the NMOS transistor 243 to select the resistance of the intermediate resistive reference element RI00 for the READ operation of CELL00.

The first NMOS transistor 221 is turned on when a gate to source voltage VGS of the first NMOS transistor 221 is greater than a threshold voltage VT of the first NMOS transistor 221. The gate to source voltage VGS of the first NMOS transistor 221 is determined by the difference between a gate voltage VG and a source voltage VS. The gate voltage VG of the first NMOS transistor 221 is the output voltage Vout of the differential amplifier 211 because the gate terminal of the first NMOS transistor 221 is electrically connected to the output terminal of the differential amplifier 211. The source voltage VS of the first NMOS transistor 221 is 0 volts or ground because the source terminal of the first NMOS transistor 221 is electrically connected to 0 volts or ground. Thus, the gate to source voltage VGS of the first NMOS transistor 221 can be expressed by VGS=VG−VS, where the gate voltage VG is the output voltage Vout of the differential amplifier 211 and the source voltage VS is 0 volts or ground.

The output voltage Vout of the differential amplifier 211 is determined by multiplying a gain of the differential amplifier 211 with the difference between a voltage of the non-inverting input and a voltage of the inverting input. The differential amplifier 211 has a gain of 1, however, the differential amplifier 211 is not limited to having a gain of 1. The gain of the differential amplifier 211 is a design variable selected by a circuit designer and the circuit designer can select other values for the gain of the differential amplifier 211, such as a gain of the differential amplifier 211 greater than 1 and a gain of the differential amplifier 211 less than 1. The voltage of the non-inverting input of the differential amplifier 211 is the feedback voltage Vfeedback because the non-inverting input terminal is electrically connected to the drain terminal of the first NMOS transistor 221 and the source terminal of each NMOS transistor in the second plurality of NMOS transistors 241, 243, 245 through the feedback loop. The voltage of the inverting input of the differential amplifier 211 is the read voltage Vread because the inverting input terminal is electrically connected to a power supply, a voltage source, a driver circuit, a resistor divider, a test circuit, a control circuit such as a processor, a controller, a programmable logic device, and a FGPA, or other device that supplies the read voltage Vread. Thus, the output voltage Vout of the differential amplifier 211 can be expressed by Vout=Gain (Voltage of the Non-Inverting Input−Voltage of the Inverting Input), where the gain is 1, the voltage of the non-inverting input is the feedback voltage Vfeedback, and the voltage of the inverting input is the read voltage Vread.

Substituting for the gain, the voltage of the non-inverting input, and the voltage of the inverting input, in the above equation for determining the output voltage Vout of the differential amplifier 211 provides Vout=Vfeedback−Vread and substituting Vfeedback−Vread for the gate voltage VG in the above equation for determining the gate to source voltage VGS of the first NMOS transistor 221 provides the equation VGS=Vfeedback−Vread−0 volts. As shown by this equation, the gate to source voltage VGS of the first NMOS transistor 221 changes when the feedback voltage Vfeedback changes because the voltage level of the read voltage Vread and 0 volts are generally constant. Thus, the first NMOS transistor 221 is turned on when the feedback voltage Vfeedback has a voltage level such that the gate to source voltage VGS of the first NMOS transistor 221 is greater than a threshold voltage VT of the first NMOS transistor 221.

The NMOS transistor 243 is turned on by a control signal S5 supplied by a test circuit or a control circuit such as a processor, a controller, a programmable logic device, and a FGPA, and the NMOS transistors 241 and 245 are turned off by control signals S4 and S6 supplied by the test circuit or the control circuit. The test circuit or the control circuit supplies the control signal S4 having a voltage level such that a gate to source voltage VGS of the NMOS transistor 241 is less than a threshold voltage VT of the NMOS transistor 241, the control signal S5 having a voltage level such that a gate to source voltage VGS of the NMOS transistor 243 is greater than a threshold voltage VT of the NMOS transistor 243, and the control signal S6 having a voltage level such that a gate to source voltage VGS of the NMOS transistor 245 is less than a threshold voltage VT of the NMOS transistor 245.

When the first NMOS transistor 221 and the NMOS transistor 243 are turned on, a current IRI00w1 flows into the bit line BL(I0) through the intermediate resistive reference element M00, a current I243 flows from the bit line BL(I0) through the NMOS transistor 243, an intermediate current I221i flows through the first NMOS transistor 221, and a voltage VBL(I0) on the bit line BL(I0) is driven the feedback voltage Vfeedback. FIG. 3D shows the current IRI00w1 flowing through the intermediate resistive reference element M00, the current I243 flowing through the NMOS transistor 243, and the intermediate current I221i flowing through the first NMOS transistor 221. The current IRI00w1 flows through the intermediate resistive reference element RI00 because the second terminal of the intermediate resistive reference element M00 is at the voltage VWL(0) on the word line WL(0), which as discussed above is the system voltage Vdd, and the first terminal of the intermediate resistive reference element MOO is at the voltage VBL(I0) on the bit line BL(I0), which as discussed above is the feedback voltage Vfeedback. While, ignoring leakage currents, current does not flow through the other intermediate resistive reference elements RI01-RI0y electrically connected to the bit line BL(I0) because the second terminals of the other intermediate resistive reference elements RI01-RI0y are at the read voltage Vread or a high impedance state to prevent current flow and the first terminals of the other intermediate resistive reference elements RI01-RI0y are at the feedback voltage Vfeedback. It is noted that, as discussed below, the feedback voltage Vfeedback is regulated such that the voltage level of the feedback voltage Vfeedback is approximately equal to the voltage level of the read voltage Vread.

The amount of the current IRI00w1, ignoring leakage currents, can be approximated using Ohm's Law as IRI00w1=(VWL(0)−VBL(I0))/RRI00, where VWL(0) is the voltage on the word line WL(0), VBL(I0) is the voltage on the bit line BL(I0), and RRI00 is the resistance of the intermediate resistive reference element MOO. For example, when the voltage VWL(0) is the system voltage Vdd of 2 volts, the voltage VBL(I0) is the feedback voltage Vfeedback of 1 volt, and the intermediate resistive reference element MOO has a resistance of 5.5 MΩ, the amount of the current IRI00w1 can be approximated using Ohm's Law as IRI00w1=(2V−1V)/5.5 MΩ=1/5.5 µA. The amount of the current IRI00w1, ignoring leakage currents, is approximately equal to the amount of the current I243 flowing from the bit line BL(I0) through the NMOS transistor 243 because the amount of current flowing into the bit line BL(I0) is approximately equal to the amount of current flowing from the bit line BL(I0). The amount of current IRI00w1 is also approximately equal to the amount of the intermediate current I221i flowing through the first NMOS transistor 221 because the amount of the intermediate current I221i and the amount of the current I243 are approximately equal because the NMOS transistor 243 is electrically connected in series with the first NMOS transistor 221. Referring to the above example, where the amount of the current IRI00w1 is 1/5.5 microamps, the amount of the intermediate current I221i flowing through the first NMOS transistor 221 is 1/5.5 microamps. It is noted that leakage currents do not prevent the READ operation of CELL00 when the leakage currents are much less than the amount of the current IRI00w1.

Supplying an amount of current for the operation based on the resistance for the operation, as similarly discussed above in step 406 of flow chart 400, during the READ operation of CELL00 is carried out by the NMOS transistor 231 supplying a current I231i that is proportional to the intermediate current I221i. Alternatively, when the circuit for sinking an adjustable amount of current 203 additionally includes a plurality of FETs electrically connected in series with the first plurality of NMOS transistors 231, 233, as discussed above, supplying an amount of current for the operation based on the resistance for the operation, as similarly discussed above in step 406 of flow chart 400, during the READ operation of CELL00 is carried out by turning on the FET electrically connected in series with the NMOS transistor 231 and the NMOS transistor 231 supplying a current I231i that is proportional to the intermediate current I221i. As discussed above, the amount of the intermediate current I221i is based on the amount of the current IRI00w1 flowing through the intermediate resistive reference element RI00. It is noted that the current I231i causes current flow into the bit line BL(0) approximately equal to the amount of the current I231i because the current I231i flows from the bit line BL(0) and the amount of current flowing from the bit line BL(0) is approximately equal to the amount of current flowing into the bit line BL(0).

The NMOS transistor 231 is turned on when a gate to source voltage VGS of the NMOS transistor 231 is greater than a threshold voltage VT for the NMOS transistor 231. The gate to source voltage VGS of the NMOS transistor 231 is determined by the difference between a gate voltage VG and a source voltage VS. The gate voltage VG of the NMOS transistor 231 is the output voltage Vout of the differential amplifier 211 because the gate terminal of the NMOS transistor 231 is electrically connected to the output terminal of the differential amplifier 211. The source voltage VS of the NMOS transistor 231 is 0 volts or ground because the source terminal of the NMOS transistor 231 is electrically connected to 0 volts or ground. Thus, the gate to source voltage VGS of the NMOS transistor 231 can be expressed by VGS=VG−VS, where the gate voltage VG is the output voltage Vout of the differential amplifier 211 and the source voltage VS is 0 volts or ground. Further, the gate to source voltage VGS of the NMOS transistor 231 is approximately equal to the gate to source voltage VGS of the first NMOS transistor 221 because the gate voltages of the NMOS transistor 231 and the first NMOS transistor 221 are the output voltage Vout of the differential amplifier 211 and the source voltages of the NMOS transistor 231 and the first NMOS transistor 221 are 0 volts or ground. It is noted that the source terminal of the first NMOS transistor 221 and the source terminals of NMOS transistors in the first plurality of NMOS transistors 231, 233 can be electrically connected to voltages other than 0 volts or ground, such a voltage greater than 0 volts or ground and a voltage less than 0 volts or ground.

As discussed above, the output voltage Vout of the differential amplifier 211 can be expressed by Vout=Vfeedback−Vread and substituting Vfeedback−Vread for the gate voltage VG in the above equation for determining the gate to source voltage VGS of the NMOS transistor 231 provides the equation VGS=Vfeedback−Vread−0 volts. As shown by this equation, the gate to source voltage VGS of the NMOS transistor 231 changes when the feedback voltage Vfeedback changes because the voltage level of the read voltage Vread and 0 volts are generally constant. Thus, the NMOS transistor 231 is turned on when the feedback voltage Vfeedback has a voltage level such that the gate to source voltage VGS of the NMOS transistor 231 is greater than a threshold voltage VT of the NMOS transistor 231.

The amount of the current I231i supplied by the NMOS transistor 231 is proportional to the amount of the intermediate current I221i supplied by the first NMOS transistor 221. The proportion between the amount of the current I231i supplied by the NMOS transistor 231 and the amount of the intermediate current I221i supplied by the first NMOS transistor 221 is a design variable selected by a circuit designer. The circuit designer can select the proportion between the amount of the current I231i supplied by the NMOS transistor 231 and the amount of the intermediate current I221i supplied by the first NMOS transistor 221 by selecting the features of the NMOS transistor 231 and the features of the first NMOS transistor 221. The proportion between the amount of the current I231i supplied by the NMOS transistor 231 and the amount of the intermediate current I221i supplied by the first NMOS transistor 221 is selected as 1 by selecting a width to length ratio of the NMOS transistor 231 that is approximately equal to a width to length ratio of the first NMOS transistor 221. However, the proportion is not limited to 1 and the circuit designer can select other values for the proportion, such as a proportion greater than 1 and a proportion less than 1. Further, the circuit designer can select other features of the NMOS transistor 231 and the first NMOS transistor 221 to achieve the desired proportion between the amount of the current I231i supplied by the NMOS transistor 231 and the amount of the intermediate current I221i supplied by the first NMOS transistor 221. For example, the circuit designer can select other dimensions of the NMOS transistors, layouts of the NMOS transistors, and materials for fabricating the NMOS transistors to achieve the desired proportion between the amount of the current I231i supplied by the NMOS transistor 231 and the amount of the intermediate current I221i supplied by the first NMOS transistor 221. It is noted that when other types of field effect transistors are used in place of the first NMOS transistor 221 and the first plurality of NMOS transistors 231, 233, a circuit designer can also select dimensions, layouts, and materials for fabricating the other types of field effect transistors to achieve the desired proportion between currents.

When the proportion between the amount of the current I231i supplied by the NMOS transistor 231 and the amount of the intermediate current I221i supplied by the first NMOS transistor 221 is selected based on the width to length ratios of the NMOS transistor 231 and the first NMOS transistor 221, the amount of the current I231i can be approximated by the following equation, I231i=(IRI00w1)((Channel Width of NMOS 231/Channel Length of NMOS 231)/(Channel Width of NMOS 221/Channel Length of NMOS 221)), where IRI00w1 is the amount of current flowing through the intermediate resistive reference element RI00. For example, when the current IRI00w1 is 1/5.5 microamps and the width to length ratio of the NMOS transistor 231 equals the width to length ratio of the first NMOS transistor 221, the current I231i=(1/5.5 µA)(1)=1/5.5 µA.

A current ICELL00iw1 flows into the bit line BL(0) through CELL00 and the current I231i flows from the bit line BL(0) through the NMOS transistor 231. FIG. 3D shows the current ICELL00iw1 flowing through CELL00 and the current I231i flowing through the NMOS transistor 231. The current ICELL00iw1 flows through CELL00 because the second terminal of the resistive change element SW00 within CELL00 is at the voltage VWL(0) on the word line WL(0), which as discussed above is the system voltage Vdd, and the first terminal of the resistive change element SW00 is at a voltage VBL(0) on the bit line BL(0). While, ignoring leakage currents, current does not flow through the other resistive change element cells CELL01-CELL0y on the bit line BL(0) because the second terminals of the resistive change elements SW01-SW0y within the other resistive change element cells CELL01-CELL0y are at the read voltage Vread or a high impedance state to prevent current flow and the first terminals of the resistive change elements SW01-SW0y are at the voltage VBL(0) on the bit line BL(0). The amount of the current ICELL00iw1, ignoring leakage currents, is approximately equal to the amount of the current I231i flowing through the NMOS transistor 231 because the amount of current flowing into the bit line BL(0) is approximately equal to the amount of current flowing from the bit line BL(0). Further, the amount of the current ICELL00iw1 is approximately equal to the amount of the current IRI00w1 because the amount of the current I231i flowing through the NMOS transistor 231 is approximately equal to the amount of the intermediate current I221i flowing through the first NMOS transistor 221 and the amount of the intermediate current I221i flowing through the first NMOS transistor 221 is approximately equal to the amount of the current IRI00w1. It is noted that leakage currents do not prevent a READ operation of CELL00 when the leakage currents are much less than the amount of the current ICELL00iw1.

The voltage VBL(0) on the bit line BL(0), ignoring leakage currents, can be approximated by subtracting the voltage drop across CELL00 from the voltage VWL(0) on the word line WL(0) and the voltage drop across CELL00 can be approximated using Ohm's Law. Thus, the voltage VBL(0) on the bit line BL(0) can be approximated by VBL(0)=VWL(0)−(ICELL00iw1×RCELL00), where VWL(0) is the voltage on the word line WL(0), the current ICELL00iw1 is the current flowing through CELL00, and RCELL00 is the resistance of the resistive change element SW00 within CELL00. As shown by this equation, the voltage VBL(0) on the bit line BL(0) changes when the resistance of the resistive change element SW00 changes because the voltage VWL(0) on the word line WL(0) and the current flowing through CELL00 are generally constant. For example, when VWL(0)=2 volts, ICELL00iw1=IRI00w1=1/5.5 microamps, and RCELL00=5.5 MΩ, the voltage VBL(0)=2 V−(1/5.5 µA×5.5 MΩ)=1 V. For example, when VWL(0)=2 volts, ICELL00iw1=IRI00w1=1/5.5 microamps, and RCELL00=1 MΩ, the voltage VBL(0)=2 V−(1/5.5 µA×1 MΩ)=1.82 V. For example, when VWL(0)=2 volts, ICELL00iw1=IRI00w1=1/5.5 microamps, and RCELL00=10 MΩ, the voltage VBL(0)=2 V−(1/5.5 µA×10 MΩ)=0.182 V.

It is noted that when the voltage VBL(0) on the bit line BL(0) is less than the read voltage Vread and the word lines WL(1)-WL(y) electrically connected to the other resistive change element cells CELL01-CELL0y on the bit line BL(0) are driven to the read voltage Vread, leakage currents flow into the bit line BL(0) through the other resistive change element cells CELL01-CELL0y and pull up the voltage VBL(0) on the bit line BL(0). It is also noted that when the voltage VBL(0) on the bit line BL(0) is greater than the read voltage Vread and the word lines WL(1)-WL(y) electrically connected to the other resistive change element cells CELL01-CELL0y on the bit line BL(0) are driven to the read voltage Vread, leakage currents flow from the bit line BL(0) through the other resistive change element cells CELL01-CELL0y and pull down the voltage VBL(0) on the bit line BL(0). It is further noted that when the voltage VBL(0) on the bit line BL(0) is pulled up by leakage currents flowing into the bit line BL(0) and when the voltage VBL(0) on the bit line BL(0) is pulled down by leakage currents flowing from the bit line BL(0), the number of the word lines WL(1)-WL(y) should be small enough to allow a margin to determine a resistive state of the selected resistive change element SW00.

Determining a resistive state of the at least one resistive change element based on a resistance of the at least one resistive change element and the resistance for the operation, as similarly discussed above in step 408 of flow chart 400, during the READ operation of CELL00 is carried out by determining the resistive state of the resistive change element SW00 by comparing the voltage VBL(0) on the bit line BL(0) with the read voltage Vread. As discussed above, the voltage VBL(0) on the bit line BL(0) is determined by the voltage VWL(0) on the word line WL(0), the amount of the current ICELL00,iw1 and the resistance of the resistive change element SW00. The voltage VBL(0) on the bit line BL(0) is indicative of the resistive state of the resistive change element SW00 because the voltage VWL(0) on the word line WL(0) and the amount of current ICELL00iw1 are approximately the same for both a low resistive state and a high resistive state of the resistive change element SW00, while, the resistance of the resistive change element SW00 is different for a low resistive state and a high resistive state. The read voltage Vread is indicative of the resistance RRI00 of the intermediate resistive reference element RI00 for the READ operation of CELL00 because the read voltage Vread is equal to the voltage VWL(0) on the word line WL(0) subtracted by a voltage calculated by the amount of current ICELL00*iw*1 multiplied by the resistance RRI00 of the intermediate resistive reference element RI00. For example, when VWL(0)=2V, ICELL00*iw*1=1/5.5 µA, RRI00=5.5 MΩ, Vread=2V−(1/5.5 µA×5.5 MΩ)=1V. When the voltage VBL(0) on the bit line BL(0) is greater than the read voltage Vread (i.e. the voltage VBL(0) on the bit line BL(0)>Vread) the resistance of the resistive change element SW00 is less than the resistance RRI00 of the intermediate resistive reference element RI00 (i.e. RCELL00<RRI00, where RCELL00 is the resistance of the resistive change element SW00 within CELL00) and the resistive state of the resistive change element SW00 is determined to be a low resistive state. When the voltage VBL(0) on the bit line BL(0) is less than or equal to the read voltage Vread (i.e. the voltage VBL(0) on the bit line BL(0)≤Vread) the resistance of the resistive change element SW00 is greater than or equal to the resistance RRI00 of the intermediate resistive reference element RI00 (i.e. RCELL00>RRI00, where RCELL00 is the resistance of the resistive change element SW00 within CELL00) and the resistive state of resistive change element SW00 is determined to be a high resistive state.

The sense device 261 receives the voltage VBL(0) on the bit line BL(0) on a first input terminal because the first input terminal is electrically connected to the bit line BL(0) and receives the read voltage Vread on a second input terminal because the second input terminal is electrically connected to a power supply, a voltage source, a driver circuit, a resistor divider, a test circuit, a control circuit such as a processor, a controller, a programmable logic device, and a FGPA, or other device that supplies the read voltage Vread. The sense device 261 determines the resistive state of the resistive change element SW00 by comparing the voltage VBL(0) on the bit line BL(0) with the read voltage Vread. The sense device 261 outputs a signal indicative of the resistive state of the resistive change element SW00 on an output terminal. When the voltage VBL(0) on the bit line BL(0) is greater than the read voltage Vread, the sense device 261 outputs a signal indicating the resistive change element SW00 has a low resistive state. When the voltage VBL(0) on the bit line BL(0) is less than or equal to the read voltage Vread, the sense device 261 outputs a signal indicating the resistive change element SW00 has a high resistive state. For example, when ICELL00*iw*1=1/5.5 microamps, RCELL00=1 MΩ, VBL(0)=1.82 V, and Vread=1 V, the sense device 261 outputs a signal indicating that the resistive change element SW00 has a low resistive state (corresponding, typically, to a logic 1, a SET state). For example, when ICELL00*iw*1=1/5.5 microamps, RCELL00=5.5 MΩ, VBL(0)=1 V, and Vread=1 V, the sense device 261 outputs a signal indicating that the resistive change element SW00 has a high resistive state (corresponding, typically, to a logic 0, a RESET state). For example, when ICELL00*iw*1=1/5.5 microamps, RCELL00=10 MΩ, VBL(0)=0.182 V, and Vread=1 V, the sense device 261 outputs a signal indicating that the resistive change element SW00 has a high resistive state (corresponding, typically, to a logic 0, a RESET state). It is noted that when the plurality of sense devices 261, 263 are electrically connected to the plurality of amplifiers 271, 273 as shown in FIGS. 2F and 2H, the plurality of sense devices 261, 263 determine the resistive states of the resistive change elements SW00-SWxy by comparing amplified voltages with a selected voltage, such as the read voltage Vread. It is further noted that when the plurality of sense devices 261, 263 are electrically connected to the plurality of inverters 281, 283 as shown in FIG. 2I, the plurality of inverters 281, 283 invert signals output by the plurality of sense devices 261, 263.

Alternatively, the plurality of sense devices 261, 263 are omitted from the exemplary architecture shown in FIGS. 2E-2H and a test circuit, a logic circuit, or a control circuit such as a processor, a controller, a programmable logic device and a FGPA, is electrically connected to the bit lines BL(0)-BL(x) to receive the voltages on the bit lines BL(0)-BL(x) or is electrically connected to the plurality of amplifiers 271, 273 to receive amplified voltages. When the test circuit, the logic circuit, or the control circuit is electrically connected to the bit lines BL(0)-BL(x), the test circuit, the logic circuit, or the control circuit determines the resistive states of the resistive change elements SW00-SWxy by comparing the voltages on the bit lines BL(0)-BL(x) with the read voltage Vread or a stored value corresponding to the read voltage Vread. For example, for a READ operation of CELL00, when the test circuit, the logic circuit, or the control circuit is electrically connected to the bit lines BL(0)-BL(x), the test circuit, the logic circuit, or the control circuit determines the resistive state of the resistive change element SW00 by comparing a voltage VBL(0) on the bit line BL(0) with the read voltage Vread or a stored value corresponding to the read voltage Vread. When the test circuit, the logic circuit, or the control circuit is electrically connected to the plurality of amplifiers 271, 273 the test circuit, the logic circuit, or the control circuit determines the resistive states of the resistive change elements SW00-SWxy by comparing the amplified voltages with a selected voltage, such as the read voltage Vread, or a stored value corresponding to a selected voltage, such as the read voltage Vread. Additionally, the test circuit, the logic circuit, or the control circuit can output signals indicative of the resistive states of the resistive change elements SW00-SWxy.

Further, the circuit for sinking an adjustable amount of current 203 compensates for the circuit conditions of the resistive change element array 200 by regulating the feedback voltage Vfeedback to be approximately equal to the read voltage Vread. The feedback voltage Vfeedback reflects the circuit conditions of the resistive change element array 200 because the feedback voltage Vfeedback is based on the amount of the intermediate current I221*i* flowing through the first NMOS transistor 221 and the amount of the intermediate current I221*i* is impacted by the circuit conditions of the resistive change element array 200. For example, changes in the resistances of the intermediate resistive reference elements RI00-RI0*y* due to temperature, leakage currents, and parasitic impedances can impact the amount of the intermediate current I221*i*. The feedback voltage Vfeedback is supplied to the non-inverting input of the differential amplifier 211 and, as discussed above, the gate voltage VG of the first NMOS transistor 221 is the output voltage Vout of the differential amplifier 211 and the source voltage VS of the first NMOS transistor 221 is 0 volts or ground. The gate to source voltage VGS of the first NMOS transistor 221 regulates the amount of the intermediate current I221*i* flowing through the first NMOS transistor 221 and the differential amplifier 211 adjusts the gate to source voltage VGS of the first NMOS transistor 221 so that the amount of the intermediate current I221*i* adjusts the feedback voltage Vfeedback to be approximately equal to the read voltage Vread. Also, as discussed above, the amount of the current I231$i$ supplied by the NMOS transistor 231 is proportional to the amount of the intermediate current I221$i$ supplied by the first NMOS transistor 221. Thus, adjusting the amount of the intermediate current I221$i$ supplied by the first NMOS transistor 221 to compensate for circuit conditions of the resistive change element array 200 proportionally adjusts the amount of the current I231$i$ supplied by the NMOS transistor 231 to compensate for circuit conditions of the resistive change element array 200.

Additionally, READ operations of each resistive change element cell CELL00-CELLx0 on the word line WL(0) can be performed at the same time because each NMOS transistor in the first plurality of NMOS transistors 231, 233 supplies approximately the same amount of current. Each NMOS transistor in the first plurality of NMOS transistors 231, 233 supplies approximately the same amount of current for READ operations because each NMOS transistor in the first plurality of NMOS transistors 231, 233 has approximately the same features and approximately the same gate to source voltage VGS. FIG. 3D shows a current ICELL00$iw$1 flowing into the bit line BL(0) through CELL00, a current ICELLx0$iw$1 flowing into the bit line BL(x) through CELLx0, a current I231$i$ flowing from the bit line BL(0) through the NMOS transistor 231, and a current I233$i$ flowing from the bit line BL(x) through the NMOS transistor 233. The current I231$i$ causes current flow into the bit line BL(0) approximately equal to the amount of the current I231$i$ because the current I231$i$ flows from the bit line BL(0) and the amount of current flowing from the bit line BL(0) is approximately equal to the amount of current flowing into the bit line BL(0). The current I233$i$ causes current flow into the bit line BL(x) approximately equal to the amount of the current I233$i$ because the current I233$i$ flows from the bit line BL(x) and the amount of current flowing from the bit line BL(x) is approximately equal to the amount of current flowing into the bit line BL(x). READ operations of each resistive change element cell CELL00-CELLx0 on the word line WL(0) are performed in a similar manner to the READ operation of CELL00, discussed above. Performing READ operations of each cell on a word line at the same time can be highly desirable in certain applications where rapid data READ operations or page mode READ operations are required.

Figure 3E:
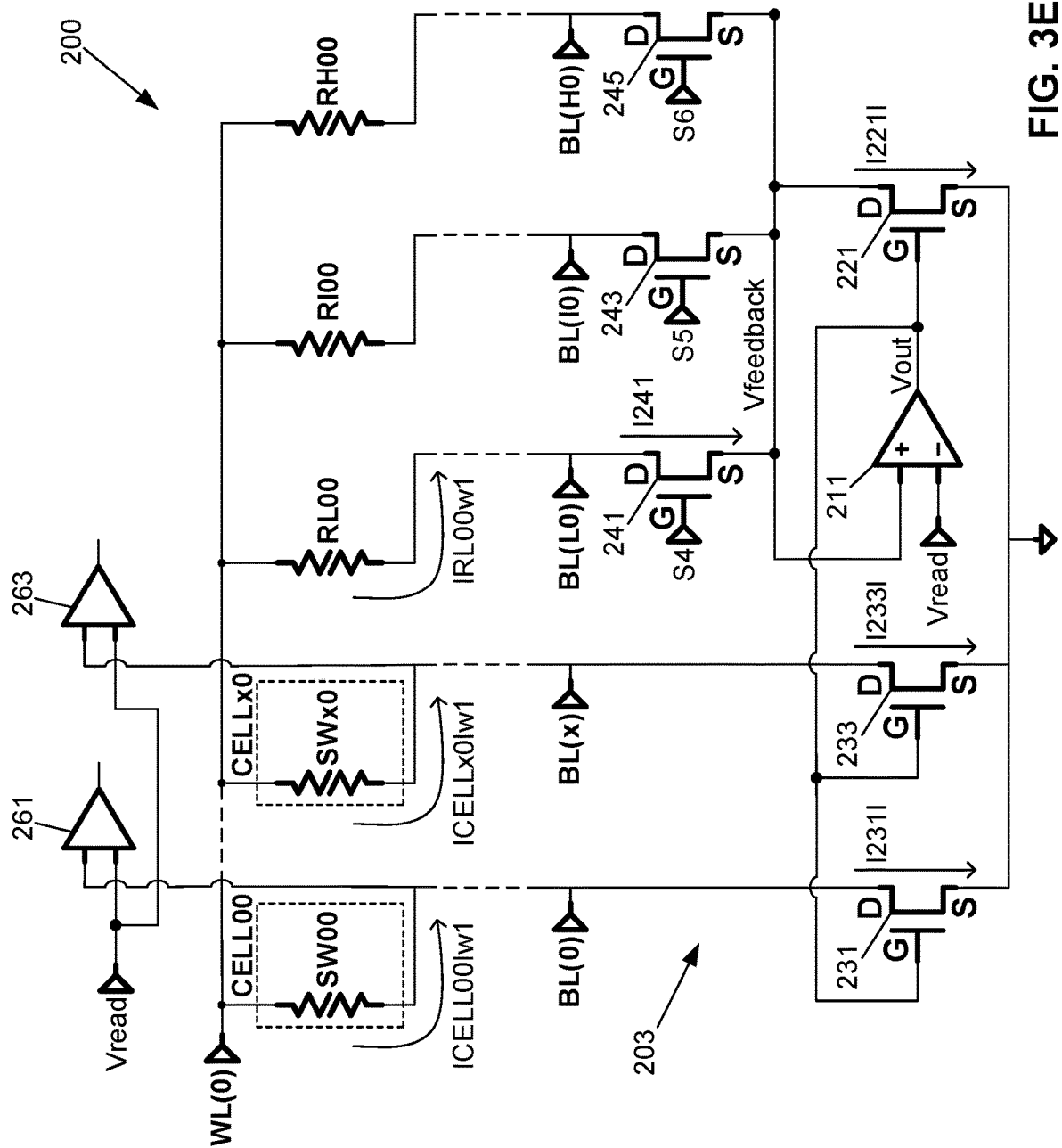
FIG. 3E illustrates a simplified schematic diagram showing current flow in the exemplary architecture of FIG. 2E during a SET VERIFY operation, where a reduced version of the resistive change element array is shown so that current flow can be shown in greater detail.

A SET VERIFY operation of CELL00 in the exemplary architecture of FIG. 2E will be explained in detail further below, and SET VERIFY operations of each cell in the exemplary architecture of FIG. 2E can be performed in a similar manner to the SET VERIFY operation of CELL00. FIG. 3E illustrates a simplified schematic diagram showing current flow, ignoring leakage currents, during a SET VERIFY operation of CELL00 in the exemplary architecture of FIG. 2E. FIG. 3E shows a reduced version of the resistive change element array 200, so that current flow can be shown in greater detail. It is noted that SET VERIFY operations of CELL00 explained in further detail below generally describe current flowing through CELL00 as flowing from the word line WL(0) to the bit line BL(0), however, the devices and methods of the present disclosure are not limited to current flow through the cells as flowing from the word line to the bit line. It is also noted that FIG. 3E can be referred to for a SET VERIFY operation of CELL00 and for SET VERIFY operations of each cell on the word line WL(0) performed at the same time because current flows through each NMOS transistor in the first plurality of NMOS transistors 231, 233 and through each cell on the word line WL(0) for a SET VERIFY operation of CELL00 and for SET VERIFY operations of each cell on the word line WL(0) performed at the same time.

A SET VERIFY operation of CELL00 starts, as similarly discussed above in step 402 of flow chart 400, by selecting CELL00 from the plurality of resistive change element cells CELL00-CELLxy in the resistive change element array 200. CELL00 is selected from the plurality of resistive change element cells CELL00-CELLxy by driving a voltage VWL(0) on the word line WL(0) to the system voltage Vdd and driving the other word lines WL(1)-WL(y) to a read voltage Vread or a high impedance state. The voltage VWL(0) on the word line WL(0), the system voltage Vdd, and the read voltage Vread are design variables selected by a circuit designer. It is noted that although the voltage VWL(0) on the word line WL(0) is discussed as being driven to the system voltage Vdd of 2 volts, the voltage VWL(0) on the word line WL(0) is not limited to being driven the system voltage Vdd or being driven to 2 volts and that the circuit designer can select other voltage levels for the voltage VWL(0) on the word line WL(0), such as a voltage level greater than 2 volts and a voltage level less than 2 volts. It is also noted that although the system voltage Vdd is discussed as having a voltage level of 2 volts, the system voltage Vdd is not limited to having a voltage level of 2 volts and that the circuit designer can select other voltage levels for the system voltage, such as a voltage level greater than 2 volts and a voltage level less than 2 volts. It is further noted that although the read voltage Vread is discussed as having a voltage level of 1 volt, the read voltage Vread is not limited to having a voltage level of 1 volt and that the circuit designer can select other voltage levels for the read voltage Vread, such as a voltage level greater than 1 volt and a voltage level less than 1 volt.

Selecting a resistance for an operation of the at least one resistive change element, as similarly discussed above in step 404 of flow chart 400, during a SET VERIFY operation of CELL00 is carried out by turning on the first NMOS transistor 221 and turning on the NMOS transistor 241 to select the resistance of the low resistive reference element RL00 for the SET VERIFY operation of CELL00. Alternatively, when the first NMOS transistor 221 is already turned on, selecting a resistance for an operation of the at least one resistive change element, as similarly discussed above in step 404 of flow chart 400, during a SET VERIFY operation of CELL00 is carried out by turning on the NMOS transistor 241 to select the resistance of the low resistive reference element RL00 for the SET VERIFY operation of CELL00.

The first NMOS transistor 221 is turned on when a gate to source voltage VGS of the first NMOS transistor 221 is greater than a threshold voltage VT of the first NMOS transistor 221. The gate to source voltage VGS of the first NMOS transistor 221 is determined by the difference between a gate voltage VG and a source voltage VS. The gate voltage VG of the first NMOS transistor 221 is the output voltage Vout of the differential amplifier 211 because the gate terminal of the first NMOS transistor 221 is electrically connected to the output terminal of the differential amplifier 211. The source voltage VS of the first NMOS transistor 221 is 0 volts or ground because the source terminal of the first NMOS transistor 221 is electrically connected 0 volts or ground. Thus, the gate to source voltage VGS of the first NMOS transistor 221 can be expressed by VGS=VG−VS, where the gate voltage VG is the output voltage Vout of the differential amplifier 211 and the source voltage VS is 0 volts or ground.

The output voltage Vout of the differential amplifier 211 is determined by multiplying a gain of the differential amplifier 211 with the difference between a voltage of the non-inverting input and a voltage of the inverting input. The differential amplifier 211 has a gain of 1, however, the differential amplifier 211 is not limited to having a gain of 1. The gain of the differential amplifier 211 is a design variable selected by a circuit designer and the circuit designer can select other values for the gain of the differential amplifier 211, such as a gain of the differential amplifier 211 greater than 1 and a gain of the differential amplifier 210 less than 1. The voltage of the non-inverting input of the differential amplifier 211 is the feedback voltage Vfeedback because the non-inverting input terminal is electrically connected to the drain terminal of the first NMOS transistor 221 and the source terminal of each NMOS transistor in the second plurality of NMOS transistors 241, 243, 245 through the feedback loop. The voltage of the inverting input of the differential amplifier 211 is the read voltage Vread because the inverting input terminal is electrically connected to a power supply, a voltage source, a driver circuit, a resistor divider, a test circuit, a control circuit such as a processor, a controller, a programmable logic device, and a FGPA, or other device that supplies the read voltage Vread. Thus, the output voltage Vout of the differential amplifier 211 can be expressed by Vout=Gain (Voltage of the Non-Inverting Input–Voltage of the Inverting Input), where the gain is 1, the voltage of the non-inverting input is the feedback voltage Vfeedback, and the voltage of the inverting input is the read voltage Vread.

Substituting for the gain, the voltage of the non-inverting input, and the voltage of the inverting input, in the above equation for determining the output voltage Vout of the differential amplifier 211 provides Vout=Vfeedback–Vread and substituting Vfeedback–Vread for the gate voltage VG in the above equation for determining the gate to source voltage VGS of the first NMOS transistor 221 provides the equation VGS=Vfeedback–Vread–0 volts. As shown by this equation, the gate to source voltage VGS of the first NMOS transistor 221 changes when the feedback voltage Vfeedback changes because the voltage level of the read voltage Vread and 0 volts are generally constant. Thus, the first NMOS transistor 221 is turned on when the feedback voltage Vfeedback has a voltage level such that the gate to source voltage VGS of the first NMOS transistor 221 is greater than a threshold voltage VT of the first NMOS transistor 221.

The NMOS transistor 241 is turned on by a control signal S4 supplied by a test circuit or a control circuit such as a processor, a controller, a programmable logic device, and a FGPA, and the NMOS transistors 243 and 245 are turned off by control signals S5-S6 supplied by the test circuit or the control circuit. The test circuit or the control circuit supplies the control signal S4 having a voltage level such that a gate to source voltage VGS of the NMOS transistor 241 is greater than a threshold voltage VT of the NMOS transistor 241, the control signal S5 having a voltage level such that a gate to source voltage VGS of the NMOS transistor 243 is less than a threshold voltage VT of the NMOS transistor 243, and the control signal S6 having a voltage level such that a gate to source voltage VGS of the NMOS transistor 245 is less than a threshold voltage VT of the NMOS transistor 245.

When the first NMOS transistor 221 and the NMOS transistor 241 are turned on, a current IRL00w1 flows into the bit line BL(L0) through the low resistive reference element RL00, a current I241 flows from the bit line BL(L0) through the NMOS transistor 241, a large current I221l flows through the first NMOS transistor 221, and a voltage VBL(L0) on the bit line BL(L0) is driven to the feedback voltage Vfeedback. FIG. 3E shows the current IRL00w1 flowing through the low resistive reference element RL00, the current I241 flowing through the NMOS transistor 241, and the large current I221l flowing through the first NMOS transistor 221. The current IRL00w1 flows through the low resistive reference element RL00 because the second terminal of the low resistive reference element RL00 is at the voltage VWL(0) on the word line WL(0), which as discussed above is the system voltage Vdd, and the first terminal of the low resistive reference element RL00 is at the voltage VBL(L0) on the bit line BL(L0), which as discussed above is feedback voltage Vfeedback. While, ignoring leakage currents, current does not flow through the other low resistive reference elements RL01-RL0y electrically connected to the bit line BL(L0) because the second terminals of the other low resistive reference elements RL01-RL0y are at the read voltage Vread or a high impedance state to prevent current flow and the first terminals of the other low resistive reference elements RL01-RL0y are at the feedback voltage Vfeedback. It is noted that, as discussed below, the feedback voltage Vfeedback is regulated such that the voltage level of the feedback voltage Vfeedback is approximately equal to the voltage level of the read voltage Vread.

The amount of the current IRL00w1, ignoring leakage currents, can be approximated using Ohm's Law as IRL00w1=(VWL(0)–VBL(L0))/RRL00, where VWL(0) is the voltage on the word line WL(0), VBL(L0) is the voltage on the bit line BL(L0), and RRL00 is the resistance of the low resistive reference element RL00. For example, when the voltage VWL(0) is the system voltage Vdd of 2 volts, the voltage VBL(L0) is the feedback voltage Vfeedback of 1 volt and the low resistive reference element RL00 has a resistance of 2 MΩ, the amount of the current IRL00w1 can be approximated using Ohm's Law as IRL00w1=(2V–1V)/2 MΩ=½ μA. The amount of the current IRL00w1, ignoring leakage currents, is approximately equal to the amount of the current I241 flowing from the bit line BL(L0) through the NMOS transistor 241 because the amount of current flowing into the bit line BL(L0) is approximately equal to the amount of current flowing from the bit line BL(L0). The amount of current IRL00w1 is also approximately equal to the amount of the large current I221l flowing through the first NMOS transistor 221 because the amount of the large current I220l and the amount of the current I241 are approximately equal because the first NMOS transistor 221 is electrically connected in series with the NMOS transistor 241. Referring to the above example, where the amount of the current IRL00w1 is ½ microamps, the amount of the large current I221l supplied by the first NMOS transistor 221 is ½ microamps. It is noted that leakage currents do not prevent the SET VERIFY operation of CELL00 when the leakage currents are much less than the amount of the current IRL00w1.

Supplying an amount of current for the operation based on the resistance for the operation, as similarly discussed above in step 406 of flow chart 400, during the SET VERIFY operation of CELL00 is carried out by the NMOS transistor 231 supplying a current I231l that is proportional to the large current I221l. Alternatively, when the circuit for sinking an adjustable amount of current 203 additionally includes a plurality of FETs electrically connected in series with the first plurality of NMOS transistors 231, 233, as discussed above, supplying an amount of current for the operation based on the resistance for the operation, as similarly discussed above in step 406 of flow chart 400, during the SET VERIFY operation of CELL00 is carried out by turning on the FET electrically connected in series with the NMOS transistor 231 and the NMOS transistor 231 supplying a current I231*l* that is proportional to the large current I221*l*. As discussed above, the amount of the large current I221*l* is based on the amount of the current IRL00*w*1 flowing through the low resistive reference element RL00. It is noted that the current I231*l* causes current flow into the bit line BL(0) approximately equal to the amount of the current I231*l* because the current I231*l* flows from the bit line BL(0) and the amount of current flowing from the bit line BL(0) is approximately equal to the amount of current flowing into the bit line BL(0).

The NMOS transistor 231 is turned on when a gate to source voltage VGS of the NMOS transistor 231 is greater than a threshold voltage VT for the NMOS transistor 231. The gate to source voltage VGS of the NMOS transistor 231 is determined by the difference between a gate voltage VG and a source voltage VS. The gate voltage VG of the NMOS transistor 231 is the output voltage Vout of the differential amplifier 211 because the gate terminal of the NMOS transistor 231 is electrically connected to the output terminal of the differential amplifier 211. The source voltage VS of the NMOS transistor 231 is 0 volts or ground because the source terminal of the NMOS transistor 231 is electrically connected 0 volts or ground. Thus, the gate to source voltage VGS of the NMOS transistor 231 can be expressed by VGS=VG−VS, where the gate voltage VG is the output voltage Vout of the differential amplifier 211 and the source voltage VS is 0 volts or ground. Further, the gate to source voltage VGS of the NMOS transistor 231 is approximately equal to the gate to source voltage VGS of the first NMOS transistor 221 because the gate voltages of the NMOS transistor 231 and the first NMOS transistor 221 are the output voltage Vout of the differential amplifier 211 and the source voltages of the NMOS transistor 231 and the first NMOS transistor 221 are 0 volts or ground. It is noted that the source terminal of the first NMOS transistor 221 and the source terminals of NMOS transistors in the first plurality of NMOS transistors 231, 233 can be electrically connected to voltages other than 0 volts or ground, such a voltage greater than 0 volts or ground and a voltage less than 0 volts or ground.

As discussed above, the output voltage Vout of the differential amplifier 211 can be expressed by Vout=Vfeedback−Vread and substituting Vfeedback−Vread for the gate voltage VG in the above equation for determining the gate to source voltage VGS of the NMOS transistor 231 provides the equation VGS=Vfeedback−Vread−0 volts. As shown by this equation, the gate to source voltage VGS of the NMOS transistor 231 changes when the feedback voltage Vfeedback changes because the voltage level of the read voltage Vread and 0 volts are generally constant. Thus, the NMOS transistor 231 is turned on when the feedback voltage Vfeedback has a voltage level such that the gate to source voltage VGS of the NMOS transistor 231 is greater than a threshold voltage VT of the NMOS transistor 231.

The amount of the current I231*l* supplied by the NMOS transistor 231 is proportional to the amount of the large current I221*l* supplied by the first NMOS transistor 221. The proportion between the amount of the current I231*l* supplied by the NMOS transistor 231 and the amount of the large current I221*l* supplied by the first NMOS transistor 221 is a design variable selected by a circuit designer. The circuit designer can select the proportion between the amount of the current I231*l* supplied by the NMOS transistor 231 and the amount of the large current I221*l* supplied by the first NMOS transistor 221 by selecting the features of the NMOS transistor 231 and the features of the first NMOS transistor 221. The proportion between the amount of the current I231*l* supplied by the NMOS transistor 231 and the amount of the large current I221*l* supplied by the first NMOS transistor 221 is selected as 1 by selecting a width to length ratio of the NMOS transistor 231 that is approximately equal to a width to length ratio of the first NMOS transistor 221. However, the proportion is not limited to 1 and the circuit designer can select other values for the proportion, such as a proportion greater than 1 and a proportion less than 1. Further, the circuit designer can select other features of the NMOS transistor 231 and the first NMOS transistor 221 to achieve the desired proportion between the amount of the current I231*l* supplied by the NMOS transistor 231 and the amount of the large current I221*l* supplied by the first NMOS transistor 221. For example, the circuit designer can select other dimensions of the NMOS transistors, layouts of the NMOS transistors, and materials for fabricating the NMOS transistors to achieve the desired proportion between the amount of the current I231*l* supplied by the NMOS transistor 231 and the amount of the large current I221*l* supplied by the first NMOS transistor 221. It is noted that when other types of field effect transistors are used in place of the first NMOS transistor 221 and the first plurality of NMOS transistors 231, 233 the circuit designer can also select dimensions, layouts, and materials for fabricating the other types of field effect transistors to achieve the desired proportion between currents.

When the proportion between the amount of the current I231*l* supplied by the NMOS transistor 231 and the amount of the large current I221*l* supplied by the first NMOS transistor 221 is selected based on the width to length ratios of the NMOS transistor 231 and the first NMOS transistor 221, the amount of the current I231*l* can be approximated by the following equation, I231*l*=(IRL00*w*1)((Channel Width of NMOS 231/Channel Length of NMOS 231)/(Channel Width of NMOS 221/Channel Length of NMOS 221)), where IRL00*w*1 is the amount of current flowing through the low resistive reference element RL00. For example, when the current IRL00*w*1 is ½ microamps and the width to length ratio of the NMOS transistor 231 equals the width to length ratio of the first NMOS transistor 221, the current I231*l*=(½ μA)(1)=½ μA.

A current ICELL00/*w*1 flows into the bit line BL(0) through CELL00 and the current I231*l* flows from the bit line BL(0) through the NMOS transistor 231. FIG. 3E shows the current ICELL00/*w*1 flowing through CELL00 and the current I231*l* flowing through the NMOS transistor 231. The current ICELL00/*w*1 flows through CELL00 because the second terminal of the resistive change element SW00 within CELL00 is at the voltage VWL(0) on the word line WL(0), which as discussed above is the system voltage Vdd, and the first terminal of the resistive change element SW00 is at a voltage VBL(0) on the bit line BL(0). While, ignoring leakage currents, current does not flow through the other resistive change element cells CELL01-CELL0*y* on the bit line BL(0) because the second terminals of the resistive change elements SW01-SW0*y* within the other resistive change element cells CELL01-CELL0*y* are at the read voltage Vread or a high impedance state to prevent current flow and the first terminals of the resistive change elements SW01-SW0*y* are at the voltage VBL(0) on the bit line BL(0). The amount of the current ICELL00/*w*1, ignoring leakage currents, is approximately equal to the amount of the current I231*l* flowing through the NMOS transistor 231 because the amount of current flowing into the bit line BL(0) is approximately equal to the amount of current flowing from the bit line BL(0). Further, the amount of the current ICELL00/*w*1 is approximately equal to the amount of the current IRL00$w$1 because the amount of the current I231$l$ flowing through the NMOS transistor 231 is approximately equal to the amount of the large current I221$l$ flowing through the first NMOS transistor 221 and the amount of the large current I221$l$ flowing through the first NMOS transistor 221 is approximately equal to the amount of the current IRL00$w$1. It is noted that leakage currents do not prevent a SET VERIFY operation of CELL00 when the leakage currents are much less than the amount of the current ICELL00/$w$1.

The voltage VBL(0) on the bit line BL(0), ignoring leakage currents, can be approximated by subtracting the voltage drop across CELL00 from the voltage VWL(0) on the word line WL(0) and the voltage drop across CELL00 can be approximated using Ohm's Law. Thus, the voltage VBL(0) on the bit line BL(0) can be approximated by VBL(0)=VWL(0)−(ICELL00/$w$1×RCELL00), where the voltage VWL(0) is the voltage on the word line WL(0), the current ICELL00/$w$1 is the current flowing through CELL00, and RCELL00 is the resistance of the resistive change element SW00 within CELL00. As shown by this equation, the voltage VBL(0) on the bit line BL(0) changes when the resistance of the resistive change element SW00 changes because the voltage VWL(0) on the word line WL(0) and the current flowing through CELL00 are generally constant. For example, when VWL(0)=2 volts, ICELL00/$w$1=IRL00$w$1=½ microamps, and RCELL00=2 MΩ, the voltage VBL(0)=2 V−(½ μA×2 MΩ)=1 V. For example, when VWL(0)=2 volts, ICELL00/$w$1=IRL00$w$1=½ microamps, and RCELL00=1 MΩ, the voltage VBL(0)=2 V−(½ μA×1 MΩ)=3/2 V. For example, when VWL(0)=2 volts, ICELL00/$w$1=IRL00$w$1=½ microamps, and RCELL00=10 MΩ, the voltage VBL(0)=2 V−(½ μA×10 MΩ)=−3 V. It is noted that, although the above exemplary calculation provides an exemplary voltage VBL(0) on the bit line BL(0) as being −3 V, practical circuit limitations would prevent the exemplary voltage VBL(0) on the bit line BL(0) from being a negative voltage.

It is noted that when the voltage VBL(0) on the bit line BL(0) is less than the read voltage Vread and the word lines WL(1)-WL(y) electrically connected to the other resistive change element cells CELL01-CELL0$y$ on the bit line BL(0) are driven to the read voltage Vread, leakage currents flow into the bit line BL(0) through the other resistive change element cells CELL01-CELL0$y$ and pull up the voltage VBL(0) on the bit line BL(0). It is also noted that when the voltage VBL(0) on the bit line BL(0) is greater than the read voltage Vread and the word lines WL(1)-WL(y) electrically connected to the other resistive change element cells CELL01-CELL0$y$ on the bit line BL(0) are driven to the read voltage Vread, leakage currents flow from the bit line BL(0) through the other resistive change element cells CELL01-CELL0$y$ and pull down the voltage VBL(0) on the bit line BL(0). It is further noted that when the voltage VBL(0) on the bit line BL(0) is pulled up by leakage currents flowing into the bit line BL(0) and when the voltage VBL(0) on the bit line BL(0) is pulled down by leakage currents flowing from the bit line BL(0), the number of the word lines WL(1)-WL(y) should be small enough to allow a margin to determine a resistive state of the selected resistive change element SW00.

Determining a resistive state of the at least one resistive change element based on a resistance of the at least one resistive change element and the resistance for the operation, as similarly discussed above in step 408 of flow chart 400, during the SET VERIFY operation of CELL00 is carried out by determining the resistive state of the resistive change element SW00 by comparing the voltage VBL(0) on the bit line BL(0) with the read voltage Vread. As discussed above, the voltage VBL(0) on the bit line BL(0) is determined by the voltage VWL(0) on the word line WL(0), the amount of the current ICELL00/$lw$1, and the resistance of the resistive change element SW00. The voltage VBL(0) on the bit line BL(0) is indicative of the resistive state of the resistive change element SW00 because the voltage VWL(0) on the word line WL(0) and the amount of current ICELL00/$lw$1 is approximately the same for both a low resistive state and a resistive state other than a low resistive state of the resistive change element SW00, while, the resistance of the resistive change element SW00 is different for a low resistive state and a resistive state other than a low resistive state. The read voltage Vread is indicative of the resistance RRL00 of the low resistive reference element RL00 for the SET VERIFY operation of CELL00 because the read voltage Vread is equal to the voltage VWL(0) on the word line WL(0) subtracted by a voltage calculated by the amount of current ICELL00/$lw$1 multiplied by the resistance RRL00 of the low resistive reference element RL00. For example, when VWL(0)=2V, ICELL00/$lw$1=½ μA, RRL00=2 MΩ, Vread=2V−(½ μA×2 MΩ)=1V. When the voltage VBL(0) on the bit line BL(0) is greater than the read voltage Vread (i.e. the voltage VBL(0) on the bit line BL(0)>Vread) the resistance of the resistive change element SW00 is less than the resistance RRL00 of the low resistive reference element RL00 (i.e. RCELL00<RRL00, where RCELL00 is the resistance of the resistive change element SW00 within CELL00) and the resistive state of the resistive change element SW00 is determined to be a low resistive state. When the voltage VBL(0) on the bit line BL(0) is less than or equal to the read voltage Vread (i.e. the voltage VBL(0) on the bit line BL(0)≤Vread) the resistance of the resistive change element SW00 is greater than or equal to the resistance RRL00 of the low resistive reference element RL00 (i.e. RCELL00>RRL00, where RCELL00 is the resistance of the resistive change element SW00 within CELL00) and the resistive state of resistive change element SW00 is determined to be a resistive state other than a low resistive state.

The sense device 261 receives the voltage VBL(0) on the bit line BL(0) on a first input terminal because the first input terminal is electrically connected to the bit line BL(0) and receives the read voltage Vread on a second input terminal because the second input terminal is electrically connected to a power supply, a voltage source, a driver circuit, a resistor divider, a test circuit, a control circuit such as a processor, a controller, a programmable logic device, and a FGPA, or other device that supplies the read voltage Vread. The sense device 261 determines the resistive state of the resistive change element SW00 by comparing the voltage VBL(0) on the bit line BL(0) with the read voltage Vread. The sense device 261 outputs a signal indicative of the resistive state of the resistive change element SW00 on an output terminal. When the voltage VBL(0) on the bit line BL(0) is greater than the read voltage Vread, the sense device 261 outputs a signal indicating the resistive change element SW00 has a low resistive state. When the voltage VBL(0) on the bit line BL(0) is less than or equal to the read voltage Vread, the sense device 261 outputs a signal indicating the resistive change element SW00 has a resistive state other than a low resistive state. For example, when ICELL00/$lw$1=½ microamps, RCELL00=1 MΩ, VBL(0)=3/2 V, and Vread=1 V, the sense device 261 outputs a signal indicating that the resistive change element SW00 has a low resistive state (corresponding, typically, to a logic 1, a SET state). For example, when ICELL00/w1=½ microamps, RCELL00=2 MΩ, VBL(0)=1 V, and Vread=1 V, the sense device 261 outputs a signal indicating that the resistive change element SW00 has a resistive state other than a low resistive state. For example, when ICELL00/w1=½ microamps, RCELL00=10 MΩ, VBL(0)=−3 V, and Vread=1 V, the sense device 261 outputs a signal indicating that the resistive change element SW00 has a resistive state other than a low resistive state. It is noted that, although the above example provides an exemplary voltage VBL(0) on the bit line BL(0) as being −3 V, practical circuit limitations would prevent the exemplary voltage VBL(0) on the bit line BL(0) from being a negative voltage. It is also noted that when the plurality of sense devices 261, 263 are electrically connected to the plurality of amplifiers 271, 273 as shown in FIGS. 2F and 2H, the plurality of sense devices 261, 263 determine the resistive states of the resistive change elements SW00-SWxy by comparing amplified voltages with a selected voltage, such as the read voltage Vread. It is further noted that when the plurality of sense devices 261, 263 are electrically connected to the plurality of inverters 281, 283 as shown in FIG. 2I, the plurality of inverters 281, 283 invert signals output by the plurality of sense devices 261, 263.

Alternatively, the plurality of sense devices 261, 263 are omitted from the exemplary architecture shown in FIGS. 2E-2H and a test circuit, a logic circuit, or a control circuit such as a processor, a controller, a programmable logic device, and a FGPA, is electrically connected to the bit lines BL(0)-BL(x) to receive the voltages on the bit lines BL(0)-BL(x) or is electrically connected to the plurality of amplifiers 271, 273 to receive amplified voltages. When the test circuit, the logic circuit, or the control circuit is electrically connected to the bit lines BL(0)-BL(x), the test circuit, the logic circuit, or the control circuit determine the resistive states of the resistive change elements SW00-SWxy by comparing the voltages on the bit lines BL(0)-BL(x) with the read voltage Vread or a stored value corresponding to the read voltage Vread. For example, for a SET VERIFY operation of CELL00 when the test circuit, the logic circuit, or the control circuit is electrically connected to the bit line BL(0)-BL(x), the test circuit, the logic circuit, or the control circuit determines the resistive state of the resistive change element SW00 by comparing a voltage VBL(0) on the bit line BL(0) with the read voltage Vread or a stored value corresponding to the read voltage Vread. When the test circuit, the logic circuit, or the control circuit is electrically connected to the plurality of amplifiers 271, 273, the test circuit, the logic circuit, or the control circuit determines the resistive states of the resistive change elements SW00-SWxy by comparing the amplified voltages with a selected voltage, such as the read voltage Vread, or a stored value corresponding to the selected voltage, such as the read voltage. Additionally, the test circuit, the logic circuit, or the control circuit can output signals indicative of the resistive states of the resistive change elements SW00-SWxy.

Further, the circuit for sinking an adjustable amount of current 203 compensates for the circuit conditions of the resistive change element array 200 by regulating the feedback voltage Vfeedback to be approximately equal to the read voltage Vread. The feedback voltage Vfeedback reflects the circuit conditions of the resistive change element array 200 because the feedback voltage Vfeedback is based on the amount of the large current I221l flowing through the first NMOS transistor 221 and the amount of the large current I221l is impacted by the circuit conditions of the resistive change element array 200. For example, changes in the resistances of the low resistive reference elements RL00-RL0y due to temperature, leakage currents, and parasitic impedances can impact the amount of the large current I221l. The feedback voltage Vfeedback is supplied to the non-inverting input of the differential amplifier 211 and, as discussed above, the gate voltage VG of the first NMOS transistor 221 is the output voltage Vout of the differential amplifier 211 and the source voltage VS of the first NMOS transistor 220 is 0 volts or ground. The gate to source voltage VGS of the first NMOS transistor 221 regulates the amount of the large current I221l, flowing through the first NMOS transistor 221 and the differential amplifier 211 adjusts the gate to source voltage VGS of the first NMOS transistor 221 so that the amount of the large current I221l adjusts the feedback voltage Vfeedback to be approximately equal to the read voltage Vread. Also, as discussed above, the amount of the current I231l supplied by the NMOS transistor 231 is proportional to the amount of the large current I221l supplied by the first NMOS transistor 221. Thus, adjusting the amount of the large current I221l supplied by the first NMOS transistor 221 to compensate for circuit conditions of the resistive change element array 200 proportionally adjusts the amount of the current I231l supplied by the NMOS transistor 231 to compensate for circuit conditions of the resistive change element array 200.

Additionally, SET VERIFY operations of each resistive change element cell CELL00-CELLx0 on the word line WL(0) can be performed at the same time because each NMOS transistor in the first plurality of NMOS transistors 231, 233 supplies approximately the same amount of current. Each NMOS transistor in the first plurality of NMOS transistors 231, 233 supplies approximately the same amount of current for SET VERIFY operations because each NMOS transistor in the first plurality of NMOS transistors 231, 233 has approximately the same features and approximately the same gate to source voltage VGS. FIG. 3E shows a current ICELL00/w1 flowing into the bit line BL(0) through CELL00, a current ICELLx01w1 flowing into the bit line BL(x) through CELLx0, a current I231l flowing from the bit line BL(0) through the NMOS transistor 231, and a current I233l flowing from the bit line BL(x) through the NMOS transistor 233. The current I231l causes current flow into the bit line BL(0) approximately equal to the amount of the current I231l because the current I231l flows from the bit line BL(0) and the amount of current flowing from the bit line BL(0) is approximately equal to the amount of current flowing into the bit line BL(0). The current I233l causes current flow into the bit line BL(x) approximately equal to the amount of the current I233l because the current I233l flows from the bit line BL(x) and the amount of current flowing from the bit line BL(x) is approximately equal to the amount of current flowing into the bit line BL(x). SET VERIFY operations of each resistive change element cell CELL00-CELLx0 on the word line WL(0) are performed in a similar manner to the SET VERIFY operation of CELL00, discussed above. Performing SET VERIFY operations of each cell on a word line at the same time can be highly desirable in certain applications where rapid data SET VERIFY operations or page mode SET VERIFY operations are required.

Figure 3F:
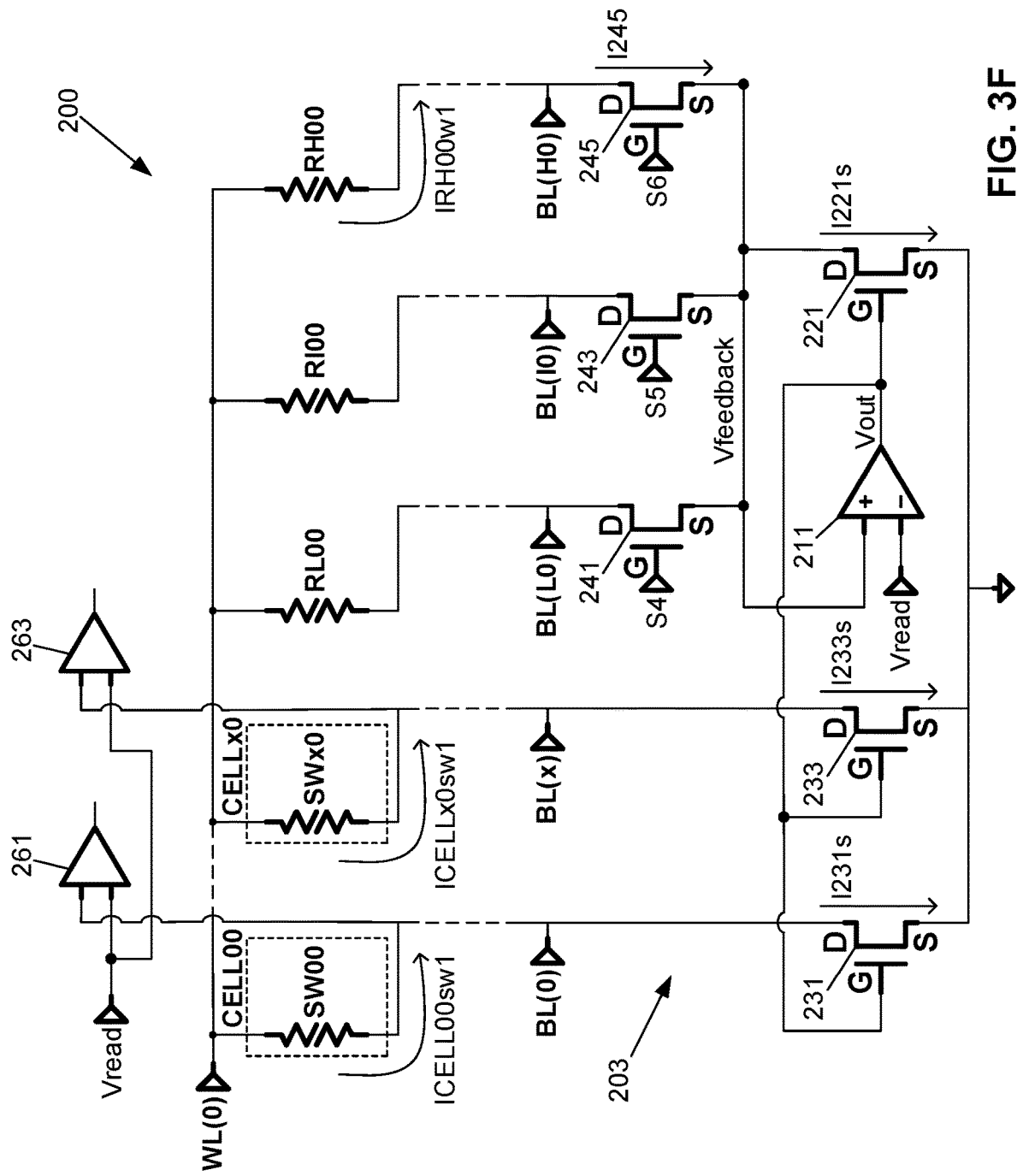
FIG. 3F illustrates a simplified schematic diagram showing current flow in the exemplary architecture of FIG. 2E during a RESET VERIFY operation, where a reduced version of the resistive change element array is shown so that current flow can be shown in greater detail.

A RESET VERIFY operation of CELL00 in the exemplary architecture of FIG. 2E will be explained in detail further below, and RESET VERIFY operations of each cell in the exemplary of FIG. 2E can be performed in a similar manner to the RESET VERIFY operation of CELL00. FIG. 3F illustrates a simplified schematic diagram showing current flow, ignoring leakage currents, during a RESET VERIFY operation of CELL00 in the exemplary architecture of FIG. 2E. FIG. 3F shows a reduced version of the resistive change element array 200, so that current flow can be shown in greater detail. It is noted that RESET VERIFY operations of CELL00 explained in further detail below generally describe current flowing through CELL00 as flowing from the word line WL(0) to the bit line BL(0), however, the devices and methods of the present disclosure are not limited to current flow through the cells as flowing from the word line to the bit line. It is also noted that FIG. 3F can be referred to for a RESET VERIFY operation of CELL00 and for RESET VERIFY operations of each cell on the word line WL(0) performed at the same time because current flows through each NMOS transistor in the first plurality of NMOS transistors 231, 233 and through each cell on the word line WL(0) for a RESET VERIFY operation of CELL00 and for RESET VERIFY operations of each cell on the word line WL(0) performed at the same time.

A RESET VERIFY operation of CELL00 starts, as similarly discussed above in step 402 of flow chart 400, by selecting CELL00 from the plurality of resistive change element cells CELL00-CELLxy in the resistive change element array 200. CELL00 is selected from the plurality of resistive change element cells CELL00-CELLxy by driving a voltage VWL(0) on the word line WL(0) to the system voltage Vdd and driving the other word lines WL(1)-WL(y) to a read voltage Vread or a high impedance state. The voltage VWL(0) on the word line WL(0), the system voltage Vdd, and the read voltage Vread are design variables selected by a circuit designer. It is noted that although the voltage VWL(0) on the word line WL(0) is discussed as being driven to the system voltage Vdd of 2 volts, the voltage VWL(0) on the word line WL(0) is not limited to being driven the system voltage Vdd or being driven to 2 volts and that the circuit designer can select other voltage levels for the voltage VWL(0) on the word line WL(0), such as a voltage level greater than 2 volts and a voltage level less than 2 volts. It is also noted that although the system voltage Vdd is discussed as having a voltage level of 2 volts, the system voltage Vdd is not limited to having a voltage level of 2 volts and that the circuit designer can select other voltage levels for the system voltage Vdd, such as a voltage level greater than 2 volts and a voltage level less than 2 volts. It is further noted that although the read voltage Vread is discussed as having a voltage level of 1 volt, the read voltage Vread is not limited to having a voltage level of 1 volt and that the circuit designer can select other voltage levels for the read voltage Vread, such as a voltage level greater than 1 volt and a voltage level less than 1 volt.

Selecting a resistance for an operation of the at least one resistive change element, as similarly discussed above in step 404 of flow chart 400, during a RESET VERIFY operation of CELL00 is carried out by turning on the first NMOS transistor 221 and turning on the NMOS transistor 245 to select the resistance of the high resistive reference element RH00 for the RESET VERIFY operation of CELL00. Alternatively, when the first NMOS transistor 221 is already turned on, selecting a resistance for an operation of the at least one resistive change element, as similarly discussed above in step 404 of flow chart, during a RESET VERIFY operation of CELL00 is carried out by turning on the NMOS transistor 245 to select the resistance of the high resistive reference element RH00 for the RESET VERIFY operation of CELL00.

The first NMOS transistor 221 is turned on when a gate to source voltage VGS of the first NMOS transistor 221 is greater than a threshold voltage VT of the first NMOS transistor 221. The gate to source voltage VGS of the first NMOS transistor 221 is determined by the difference between a gate voltage VG and a source voltage VS. The gate voltage VG of the first NMOS transistor 221 is the output voltage Vout of the differential amplifier 211 because the gate terminal of the first NMOS transistor 221 is electrically connected to the output terminal of the differential amplifier 211. The source voltage VS of the first NMOS transistor 221 is 0 volts or ground because the source terminal of the first NMOS transistor 221 is electrically connected to 0 volts or ground. Thus, the gate to source voltage VGS of the first NMOS transistor 221 can be expressed by VGS=VG−VS, where the gate voltage VG is the output voltage Vout of the differential amplifier 211 and the source voltage VS is 0 volts or ground.

The output voltage Vout of the differential amplifier 211 is determined by multiplying a gain of the differential amplifier 211 with the difference between a voltage of the non-inverting input and a voltage of the inverting input. The differential amplifier 211 has a gain of 1, however, the differential amplifier 211 is not limited to having a gain of 1. The gain of the differential amplifier 211 is a design variable selected by a circuit designer and the circuit designer can select other values for the gain of the differential amplifier 211, such as a gain of the differential amplifier 211 greater than 1 and a gain of the differential amplifier 211 less than 1. The voltage of the non-inverting input of the differential amplifier 211 is the feedback voltage Vfeedback because the non-inverting input terminal is electrically connected to the drain terminal of the first NMOS transistor 221 and the source terminals of each NMOS transistor in the second plurality of NMOS transistors 241, 243, 245 through the feedback loop. The voltage of the inverting input of the differential amplifier 211 is the read voltage Vread because the inverting input terminal is electrically connected to a power supply, a voltage source, a driver circuit, a resistor divider, a test circuit, a control circuit such as a processor, a controller, a programmable logic device, and a FGPA, or other device that supplies the read voltage Vread. Thus, the output voltage Vout of the differential amplifier 211 can be expressed by Vout=Gain (Voltage of the Non-Inverting Input−Voltage of the Inverting Input), where the gain is 1, the voltage of the non-inverting input is the feedback voltage Vfeedback, and the voltage of the inverting input is the read voltage Vread.

Substituting for the gain, the voltage of the non-inverting input, and the voltage of the inverting input, in the above equation for determining the output voltage Vout of the differential amplifier 211 provides Vout=Vfeedback−Vread and substituting Vfeedback−Vread for the gate voltage VG in the above equation for determining the gate to source voltage VGS of the first NMOS transistor 221 provides the equation VGS=Vfeedback−Vread−0 volts. As shown by this equation, the gate to source voltage VGS of the first NMOS transistor 221 changes when the feedback voltage Vfeedback changes because the voltage level of the read voltage Vread and 0 volts are generally constant. Thus, the first NMOS transistor 221 is turned on when the feedback voltage Vfeedback has a voltage level such that the gate to source voltage VGS of the first NMOS transistor 221 is greater than a threshold voltage VT of the first NMOS transistor 221.

The NMOS transistor 245 is turned on by a control signal S6 supplied by a test circuit or a control circuit such as a processor, a controller, a programmable logic device, and a FGPA, and the NMOS transistors 241 and 243 are turned off by control signals S4-S5 supplied by the test circuit or the control circuit. The test circuit or the control circuit supplies the control signal S4 having a voltage level such that a gate to source voltage VGS of the NMOS transistor 241 is less than a threshold voltage VT of the NMOS transistor 241, the control signal S5 having a voltage level such that a gate to source voltage VGS of the NMOS transistor 243 is less than a threshold voltage VT of the NMOS transistor 243, and the control signal S6 having a voltage level such that a gate to source voltage VGS of the NMOS transistor 245 is greater than a threshold voltage VT of the NMOS transistor 245.

When the first NMOS transistor 221 and the NMOS transistor 245 are turned on, a current IRH00w1 flows into the bit line BL(H0) through the high resistive reference element RH00, a current I245 flows from the bit line BL(H0) through the NMOS transistor 245, a small current I221s flows through the first NMOS transistor 221, and a voltage VBL(H0) on the bit line BL(H0) is driven to the feedback voltage Vfeedback. FIG. 3F shows the current IRH00w1 flowing through the high resistive reference element RH00, the current I245 flowing through the NMOS transistor 245, and the small current I221s flowing through the first NMOS transistor 221. The current IRH00w1 flows through the high resistive reference element RH00 because the second terminal of the high resistive reference element RH00 is at the voltage VWL(0) on the word line WL(0), which as discussed above is the system voltage Vdd, and the first terminal of the high resistive reference element RH00 is at the voltage VBL(H0) on the bit line BL(H0), which as discussed above is the feedback voltage Vfeedback. While, ignoring leakage currents, current does not flow through the other high resistive reference elements RH01-RH0y electrically connected to the bit line BL(H0) because the second terminals of the other high resistive reference elements RH01-RH0y are at the read voltage Vread or a high impedance state to prevent current flow and the first terminals of the other high resistive reference elements RH01-RH0y are at the feedback voltage Vfeedback. It is noted that, as discussed below, the feedback voltage Vfeedback is regulated such that the voltage level of the feedback voltage Vfeedback is approximately equal to the voltage level of the read voltage Vread.

The amount of the current IRH00w1, ignoring leakage currents, can be approximated using Ohm's Law as IRH00w1=(VWL(0)−VBL(H0))/RRH00, where VWL(0) is the voltage on the word line WL(0), VBL(H0) is the voltage on the bit line BL(H0), and RRH00 is the resistance of the high resistive reference element RH00. For example, when the voltage VWL(0) is the system voltage of 2 volts, the voltage VBL(0) is the feedback voltage Vfeedback of 1 volt, and the high resistive reference element RH00 has a resistance of 9 MΩ, the amount of the current IRH00w1 can be approximated using Ohm's Law as IRH00w1=(2V−1V)/9 MΩ=1/9 μA. The amount of the current IRH00w1, ignoring leakage currents, is approximately equal to the amount of the current I245 flowing from the bit line BL(H0) through the NMOS transistor 245 because the amount of current flowing into the bit line BL(H0) is approximately equal to the amount of current flowing from the bit line BL(H0). The amount of current IRH00w1 is also approximately equal to the amount of the small current I221s flowing through the first NMOS transistor 221 because the amount of the small current I221s and the amount of the current I245 are approximately equal because the first NMOS transistor 221 is electrically connected in series with the NMOS transistor 245. Referring to the above example, where the amount of the current IRH00w1 is 1/9 microamps, the amount of the small current I221s flowing through the first NMOS transistor 221 is 1/9 microamps. It is noted that leakage currents do not prevent the RESET VERIFY operation of CELL00 when the leakage currents are much less than the amount of the current IRH00w1.

Supplying an amount of current for the operation based on the resistance for the operation, as similarly discussed above in step 406 of flow chart 400, during the RESET VERIFY operation of CELL00 is carried out by the NMOS transistor 231 supplying a current I231s that is proportional to the small current I221s. Alternatively, when the circuit for sinking an adjustable amount of current 203 additionally includes a plurality of FETs electrically connected in series with the first plurality of NMOS transistors 231, 233, as discussed above, supplying an amount of current for the operation based on the resistance for the operation, as similarly discussed above in step 406 of flow chart 400, during the RESET VERIFY operation of CELL00 is carried out by turning on the FET electrically connected in series with the NMOS transistor 231 and the NMOS transistor 231 supplying a current I231s that is proportional to the small current I221s. As discussed above, the amount of the small current I221s is based on the amount of the current IRH00w1 flowing though the high resistive reference element RH00. It is noted that the current I231s causes current flow into the bit line BL(0) approximately equal to the amount of the current I231s because the current I231s flows from the bit line BL(0) and the amount of current flowing from the bit line BL(0) is approximately equal to the amount of current flowing into the bit line BL(0).

The NMOS transistor 231 is turned on when a gate to source voltage VGS of the NMOS transistor 231 is greater than a threshold voltage VT for the NMOS transistor 231. The gate to source voltage VGS of the NMOS transistor 231 is determined by the difference between a gate voltage VG and a source voltage VS. The gate voltage VG of the NMOS transistor 231 is the output voltage Vout of the differential amplifier 211 because the gate terminal of the NMOS transistor 231 is electrically connected to the output terminal of the differential amplifier 211. The source voltage VS of the NMOS transistor 231 is 0 volts or ground because the source terminal of the NMOS transistor 231 is electrically connected to 0 volts or ground. Thus, the gate to source voltage VGS of the NMOS transistor 231 can be expressed by VGS=VG−VS, where the gate voltage VG is the output voltage Vout of the differential amplifier 211 and the source voltage VS is 0 volts or ground. Further, the gate to source voltage VGS of the NMOS transistor 231 is approximately equal to the gate to source voltage VGS of the first NMOS transistor 221 because the gate voltages of the NMOS transistor 231 and the first NMOS transistor 221 are the output voltage Vout of the differential amplifier 211 and the source voltages of the NMOS transistor 231 and the first NMOS transistor 221 are 0 volts or ground. It is noted that the source terminal of the first NMOS transistor 221 and the source terminals of NMOS transistors in the first plurality of NMOS transistors 231, 233 can be electrically connected to voltages other than 0 volts or ground, such a voltage greater than 0 volts or ground and a voltage less than 0 volts or ground.

As discussed above, the output voltage Vout of the differential amplifier 211 can be expressed by Vout=Vfeedback−Vread and substituting Vfeedback−Vread for the gate voltage VG in the above equation for determining the gate to source voltage VGS of the NMOS transistor 231 provides the equation VGS=Vfeedback−Vread−0 volts. As shown by this equation, the gate to source voltage VGS of the NMOS transistor 231 changes when the feedback voltage Vfeedback changes because the voltage level of the read voltage Vread and 0 volts are generally constant. Thus, the NMOS transistor 231 is turned on when the feedback voltage Vfeedback has a voltage level such that the gate to source voltage VGS of the NMOS transistor 231 is greater than a threshold voltage VT of the NMOS transistor 231.

The amount of the current I231s supplied by the NMOS transistor 231 is proportional to the amount of the small current I221s supplied by the first NMOS transistor 221. The proportion between the amount of the current I231s supplied by the NMOS transistor 231 and the amount of the small current I221s supplied by the first NMOS transistor 221 is a design variable selected by a circuit designer. The circuit designer can select the proportion between the amount of the current I231s supplied by the NMOS transistor 231 and the amount of the small current I221s supplied by the first NMOS transistor 221 by selecting the features of the NMOS transistor 231 and the features of the first NMOS transistor 221. The proportion between the amount of the current I231s supplied by the NMOS transistor 231 and the amount of the small current I221s supplied by the first NMOS transistor 221 is selected as 1 by selecting a width to length ratio of the NMOS transistor 231 that is approximately equal to a width to length ratio of the first NMOS transistor 221. However, the proportion is not limited to 1 and the circuit designer can select other values for the proportion, such as a proportion greater than 1 and a proportion less than 1. Further, the circuit designer can select other features of the NMOS transistor 231 and the first NMOS transistor 221 to achieve the desired proportion between the amount of the current I231s supplied by the NMOS transistor 231 and the amount of the small current I221s supplied by the first NMOS transistor 221. For example, the circuit designer can select other dimensions of the NMOS transistors, layouts of the NMOS transistors, and materials for fabricating the NMOS transistors to achieve the desired proportion between the amount of the current I231s supplied by the NMOS transistor 231 and the amount of the small current I221s supplied by the first NMOS transistor 221. It is noted that when other types of field effect transistors are used in place of the first NMOS transistor 221 and the first plurality of NMOS transistors 231, 233 the circuit designer can also select dimensions, layouts, and materials for fabricating the other types of field effect transistors to achieve the desired proportion between currents.

When the proportion between the amount of the current I231s supplied by the NMOS transistor 231 and the amount of the small current I221s supplied by the first NMOS transistor 221 is selected based on the width to length ratios of the NMOS transistor 231 and the first NMOS transistor 221, the amount of the current I231s can be approximated by the following equation, I231s=(IRH00w1)((Channel Width of NMOS 231/Channel Length of NMOS 231)/(Channel Width of NMOS 221/Channel Length of NMOS 221)), where IRH00w1 is the amount of current flowing through the high resistive reference element RH00. For example, when the current IRH00w1 is ⅑ microamps and the width to length ratio of the NMOS transistor 231 equals the width to length ratio of the first NMOS transistor 221, the current I231s=(⅑ μA)(1)=⅑ μA.

A current ICELL00sw1 flows into the bit line BL(0) through CELL00 and the current I231s flows from the bit line BL(0) through the NMOS transistor 231. FIG. 3F shows the current ICELL00sw1 flowing through CELL00 and the current I231s flowing through the NMOS transistor 231. The current ICELL00sw1 flows through CELL00 because the second terminal of the resistive change element SW00 within CELL00 is at the voltage VWL(0) on the word line WL(0), which as discussed above is the system voltage Vdd, and the first terminal of the resistive change element SW00 is at a voltage VBL(0) on the bit line BL(0). While, ignoring leakage currents, current does not flow through the other resistive change element cells CELL01-CELL0y on the bit line BL(0) because the second terminals of the resistive change elements SW01-SW0y within the other resistive change element cells CELL01-CELL0y are at the read voltage Vread or a high impedance state to prevent current flow and the first terminals of the resistive change elements SW01-SW0y are at the voltage VBL(0) on the bit line BL(0). The amount of the current ICELL00sw1, ignoring leakage currents, is approximately equal to the amount of the current I231s flowing through the NMOS transistor 231 because the amount of current flowing into the bit line BL(0) is approximately equal to the amount of current flowing from the bit line BL(0). Further, the amount of the current ICELL00sw1 is approximately equal to the amount of the current IRH00w1 because the amount of the current I231s flowing through the NMOS transistor 231 is approximately equal to the amount of the small current I221s flowing through the first NMOS transistor 221 and the amount of the small current I221s flowing through the first NMOS transistor 221 is approximately equal to the amount of the current IRH00w1. It is noted that leakage currents do not prevent a RESET VERIFY operation of CELL00 when the leakage currents are much less than the amount of the current ICELL00sw1.

The voltage VBL(0) on the bit line BL(0), ignoring leakage currents, can be approximated by subtracting the voltage drop across CELL00 from the voltage VWL(0) on the word line WL(0) and the voltage drop across CELL00 can be approximated using Ohm's Law. Thus, the voltage VBL(0) on the bit line BL(0) can be approximated by VBL(0)=VWL(0)−(ICELL00sw1×RCELL00), where VWL (0) is the voltage on the word line WL(0), the current ICELL00sw1 is the current flowing through CELL00, and RCELL00 is the resistance of the resistive change element SW00 within CELL00. As shown by this equation, the voltage VBL(0) on the bit line BL(0) changes when the resistance of the resistive change element SW00 changes because the voltage VWL(0) on the word line WL(0) and the current flowing through CELL00 are generally constant. For example, when VWL(0)=2 volts, ICELL00sw1=IRH00w1=⅑ microamps, and RCELL00=9 MΩ, the voltage VBL(0)=2 V−(⅑ μA×9 MΩ)=1 V. For example, when VWL(0)=2 volts, ICELL00sw1=IRH00w1=⅑ microamps, and RCELL00=1 MΩ, the voltage VBL(0)=2 V−(⅑ μA×1 MΩ)=17/9 V. For example, when VWL(0)=2 volts, ICELL00sw1=IRH00w1=⅑ microamps, RCELL00=10 MΩ, the voltage VBL(0)=2 V−(⅑ μA×10 MΩ)=8/9 V.

It is noted that when the voltage VBL(0) on the bit line BL(0) is less than the read voltage Vread and the word lines WL(1)-WL(y) electrically connected to the other resistive change element cells CELL01-CELL0y on the bit line BL(0) are driven to the read voltage Vread, leakage currents flow into the bit line BL(0) through the other resistive change element cells CELL01-CELL0y and pull up the voltage VBL(0) on the bit line BL(0). It is also noted that when the voltage VBL(0) on the bit line BL(0) is greater than the read voltage Vread and the word lines WL(1)-WL(y) electrically connected to the other resistive change element cells CELL01-CELL0y on the bit line BL(0) are driven to the read voltage Vread, leakage currents flow from the bit line BL(0) through the other resistive change element cells CELL01-CELL0y and pull down the voltage VBL(0) on the bit line BL(0). It is further noted that when the voltage VBL(0) on the bit line BL(0) is pulled up by leakage currents flowing into the bit line BL(0) and when the voltage VBL(0) on the bit line BL(0) is pulled down by leakage currents flowing from the bit line BL(0), the number of the word lines WL(1)-WL(y) should be small enough to allow a margin to determine a resistive state of the selected resistive change element SW00.

Determining a resistive state of the at least one resistive change element based on a resistance of the at least one resistive change element and the resistance for the operation, as similarly discussed above in step 408 of flow chart 400, during the RESET VERIFY operation of CELL00 is carried out by determining the resistive state of the resistive change element SW00 by comparing the voltage VBL(0) on the bit line BL(0) with the read voltage Vread. As discussed above, the voltage VBL(0) on the bit line BL(0) is determined by the voltage VWL(0) on the word line WL(0), the amount of the current ICELL00$sw1$, and the resistance of the resistive change element SW00. The voltage VBL(0) on the bit line BL(0) is indicative of the resistive state of the resistive change element SW00 because the voltage VWL(0) on the word line WL(0) and the amount of current ICELL00$sw1$ are approximately the same for both a high resistive state and a resistive state other than a high resistive state of the resistive change element SW00, while, the resistance of the resistive change element SW00 is different for a high resistive state and a resistive state other than a high resistive state. The read voltage Vread is indicative of the resistance RRH00 of the high resistive reference element RH00 for the RESET VERIFY operation of CELL00 because the read voltage Vread is equal to the voltage VWL(0) on the word line WL(0) subtracted by a voltage calculated by the amount of current ICELL00$sw1$ multiplied by the resistance RRH00 of the high resistive reference element RH00. For example, when VWL(0)=2V, ICELL00$sw1$=⅑ μA, RRH00=9 MΩ, Vread=2V−(⅑ μA×9 MΩ)=1V. When the voltage VBL(0) on the bit line BL(0) is less than or equal to the read voltage Vread (i.e. the voltage VBL(0) on the bit line BL(0)≤Vread) the resistance of the resistive change element SW00 is greater than or equal to the resistance RRH00 of the high resistive reference element (i.e. RCELL00>RRH00, where RCELL00 is the resistance of the resistive change element SW00 within CELL00) and the resistive state of resistive change element SW00 is determined to be a high resistive state. When the voltage VBL(0) on the bit line BL(0) is greater than the read voltage Vread (i.e. the voltage VBL(0) on the bit line BL(0)>Vread) the resistance of the resistive change element SW00 is less than the resistance RRH00 of the high resistive reference element RH00 (i.e. RCELL00<RRH00, where RCELL00 is the resistance of the resistive change element SW00 within CELL00) and the resistive state of the resistive change element SW00 is determined to be a resistive state other than a high resistive state.

The sense device 261 receives the voltage VBL(0) on the bit line BL(0) on a first input terminal because the first input terminal is electrically connected to the bit line BL(0) and receives the read voltage Vread on a second input terminal because the second input terminal is electrically connected to a power supply, a voltage source, a driver circuit, a resistor divider, a test circuit, a control circuit such as a processor, a controller, a programmable logic device, and a FGPA, or other device that supplies the read voltage Vread. The sense device 261 determines the resistive state of the resistive change element SW00 by comparing the voltage VBL(0) on the bit line BL(0) with the read voltage Vread.

The sense device 261 outputs a signal indicative of the resistive state of the resistive change element SW00 on an output terminal. When the voltage VBL(0) on the bit line BL(0) is less than or equal the read voltage Vread, the sense device 261 outputs a signal indicating the resistive change element SW00 has a high resistive state. When the voltage VBL(0) on the bit line BL(0) is greater than the read voltage Vread, the sense device 261 outputs a signal indicating the resistive change element SW00 has a resistive state other than a high resistive state. For example, when ICELL00$sw1$=⅑ microamps, RCELL00=10 MΩ, VBL(0)=⅑ V, and Vread=1 V, the sense device 261 outputs a signal indicating that the resistive change element SW00 has a high resistive state (corresponding, typically, to a logic 0, a RESET state). For example, when ICELL00$sw1$=⅑ microamps, RCELL00=9 MΩ, VBL(0)=1 V, and Vread=1 V, the sense device 261 outputs a signal indicating that the resistive change element SW00 has a high resistive state (corresponding, typically, to a logic 0, a RESET state). For example, when ICELL00$sw1$=⅑ microamps, RCELL00=1 MΩ, VBL(0)=17/9 V, and Vread=1 V, the sense device 260 outputs a signal indicating that the resistive change element SW00 has a resistive state other than a high resistive state. It is noted that when the plurality of sense devices 261, 263 are electrically connected to the plurality of amplifiers 271, 273, as shown in FIGS. 2F and 2H, the plurality of sense devices 261, 263 determine the resistive states of the resistive change elements SW00-SWxy by comparing amplified voltages with a selected voltage, such as the read voltage Vread. It is further noted that when the plurality of sense devices 261, 263 are electrically connected to the plurality of inverters 281, 283 as shown in FIG. 2I, the plurality of inverters 281, 283 invert signals output by the plurality of sense devices 261, 263.

Alternatively, the plurality of sense devices 261, 263 are omitted from the exemplary architecture shown in FIGS. 2E-2H and a test circuit, a logic circuit, or a control circuit such as a processor, a controller, a programmable logic device, and a FGPA, is electrically connected to the bit lines BL(0)-BL(x) to receive the voltages on the bit lines BL(0)-BL(x) or is electrically connected to the plurality of amplifiers 271, 273 to receive amplified voltages. When the test circuit, the logic circuit, or the control circuit is electrically connected to the bit lines BL(0)-BL(x), the test circuit, the logic circuit, or the control circuit determines the resistive states of the resistive change elements SW00-SWxy by comparing the voltages on the bit lines BL(0)-BL(x) with the read voltage Vread or a stored value corresponding to the read voltage Vread. For example, for a RESET VERIFY operation of CELL00, when the test circuit, the logic circuit, or the control circuit is electrically connected to the bit lines BL(0)-BL(x), the test circuit, the logic circuit, or the control circuit determines the resistive state of the resistive change element SW00 by comparing the voltage VBL(0) on the bit line BL(0) with the read voltage Vread or a stored value corresponding to the read voltage Vread. When the test circuit, the logic circuit, or the control circuit is electrically connected to the plurality of amplifiers 271, 273, the test circuit, the logic circuit, or the control circuit determines the resistive states of the resistive change elements SW00-SWxy by comparing the amplified voltages with a selected voltage, such as the read voltage Vread, or a stored value corresponding to the selected voltage, such as the read voltage Vread. Additionally, the test circuit, the logic circuit, or the control circuit can output signals indicative of the resistive states of the resistive change elements SW00-SWxy.

Further, the circuit for sinking an adjustable amount of current 203 compensates for the circuit conditions of the resistive change element array 200 by regulating the feedback voltage Vfeedback to be approximately equal to the read voltage Vread. The feedback voltage Vfeedback reflects the circuit conditions of the resistive change element array 200 because the feedback voltage Vfeedback is based on the amount of the small current I221s flowing through the first NMOS transistor 221 and the amount of the small current I221s is impacted by the circuit conditions of the resistive change element array 200. For example, changes in the resistances of the high resistive reference elements RH00-RH0y due to temperature, leakage currents, and parasitic impedances can impact the amount of the small current I221s. The feedback voltage Vfeedback is supplied to the non-inverting input of the differential amplifier 211 and, as discussed above, the gate voltage VG of the first NMOS transistor 221 is the output voltage Vout of the differential amplifier 211 and the source voltage VS of the first NMOS transistor 221 is 0 volts or ground. The gate to source voltage VGS of the first NMOS transistor 221 regulates the amount of the small current I221s flowing through the first NMOS transistor 221 and the differential amplifier 211 adjusts the gate to source voltage VGS of the first NMOS transistor 221 so that the amount of the small current I221s adjusts the feedback voltage Vfeedback to be approximately equal to the read voltage Vread. Also, as discussed above, the amount of the current I231s supplied by the NMOS transistor 231 is proportional to the amount of the small current I221s supplied by the first NMOS transistor 221. Thus, adjusting the amount of the small current I221s supplied by the first NMOS transistor 221 to compensate for circuit conditions of the resistive change element array 200 proportionally adjusts the amount of the current I231s supplied by the NMOS transistor 231 to compensate for circuit conditions of the resistive change element array 200.

Additionally, RESET VERIFY operations of each resistive change element cell CELL00-CELLx0 on the word line WL(0) can be performed at the same time because each NMOS transistor in the first plurality of NMOS transistors 231, 233 supplies approximately the same amount of current. Each NMOS transistor in the first plurality of NMOS transistors 231, 233 supplies approximately the same amount of current for RESET VERIFY operations because each NMOS transistor in the first plurality of NMOS transistors 231, 233 has approximately the same features and approximately the same gate to source voltage VGS. FIG. 3F shows a current ICELL00sw1 flowing into the bit line BL(0) through CELL00, a current ICELLx0sw1 flowing into the bit line BL(x) through CELLx0, a current I231s flowing from the bit line BL(0) through the NMOS transistor 231, and a current I233s flowing from the bit line BL(x) through the NMOS transistor 233. The current I231s causes current flow into the bit line BL(0) approximately equal to the amount of the current I231s because the current I231s flows from the bit line BL(0) and the amount of current flowing from the bit line BL(0) is approximately equal to the amount of current flowing into the bit line BL(0). The current I233s causes current flow into the bit line BL(x) approximately equal to the amount of the current I233s because the current I233s flows from the bit line BL(x) and the amount of current flowing from the bit line BL(x) is approximately equal to the amount of current flowing into the bit line BL(x). RESET VERIFY operations of each resistive change element cell CELL00-CELLx0 on the word line WL(0) are performed in a similar manner to the RESET VERIFY operation of CELL00, discussed above. Performing RESET VERIFY operations of each cell on a word line at the same time can be highly desirable in certain applications where rapid data RESET VERIFY operations or page mode RESET VERIFY operations are required.

Figure 5A:
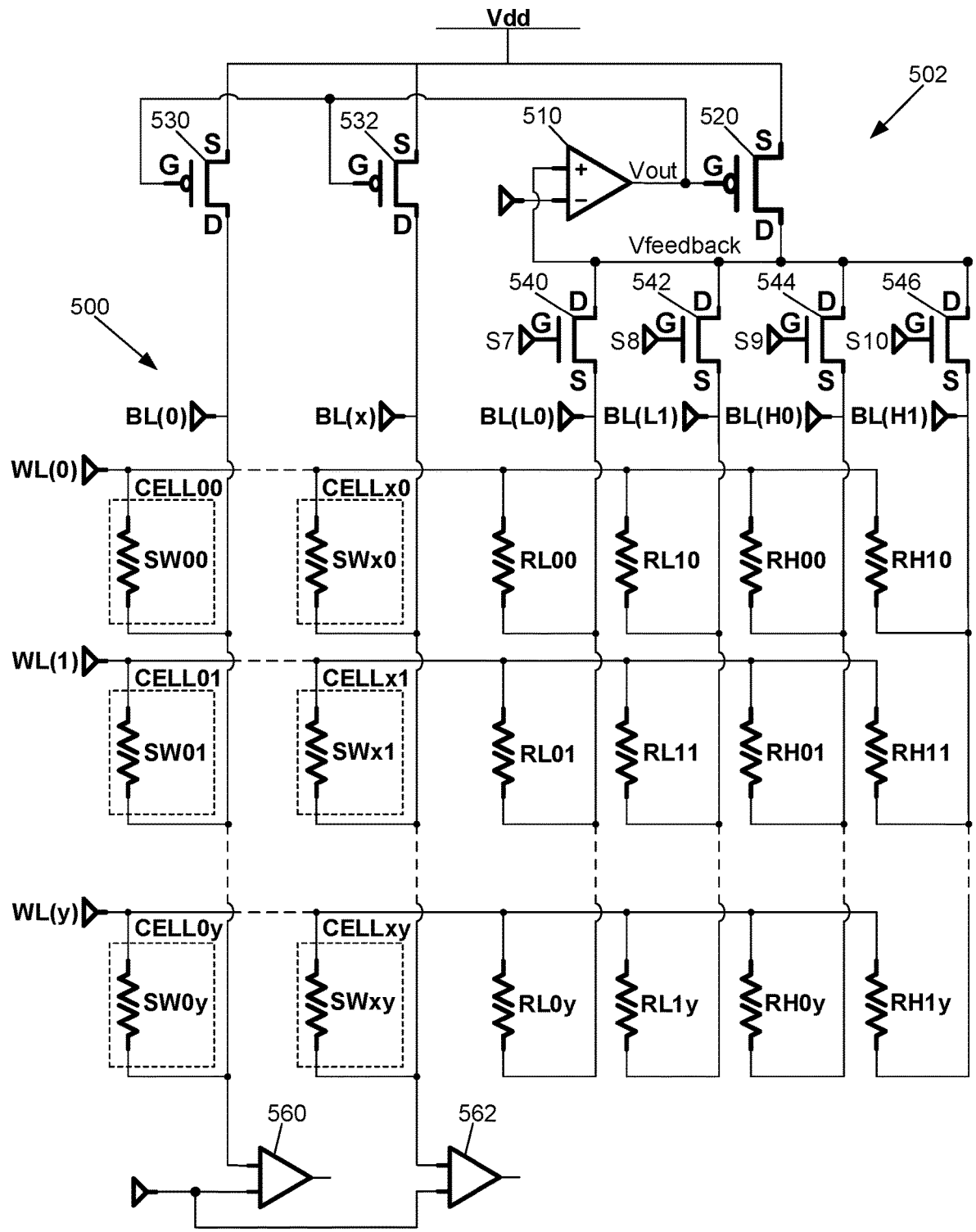
FIG. 5A illustrates a simplified schematic diagram of an exemplary architecture for accessing at least one resistive change element in a resistive change element array using a resistance based on resistances of resistive reference elements to source an amount of current.

Referring now to FIG. 5A, an exemplary architecture for accessing at least one resistive change element in a resistive change element array using a resistance based on resistances of resistive reference elements to source an amount of current is illustrated in a simplified schematic diagram. The exemplary architecture is operable to select from a low resistance Rlow generated using resistances of resistive reference elements, an intermediate resistance Rinter generated using resistances of resistive reference elements, and a high resistance Rhigh generated using resistances of resistive reference elements, and as discussed below, for SET VERIFY operations the low resistance Rlow is selected, for READ operations the intermediate resistance Rinter is selected, and for RESET VERIFY operations the high resistance Rhigh is selected. Additionally, the exemplary architecture can select from additional resistances by including additional resistive reference elements having different resistances in the exemplary architecture. The exemplary architecture, as shown in FIG. 5A, includes a resistive change element array 500, a circuit for sourcing an adjustable amount of current 502, and a plurality of sense devices 560, 562. However, the exemplary architecture is not limited to FIG. 5A and the exemplary architecture can include additional components not shown in FIG. 5A, such as resistors, amplifiers, and inverters, and can omit components shown in FIG. 5A, such as sense amplifiers. Further, the exemplary architecture is not limited to FIGS. 5B-5D and the exemplary architecture can include additional components not shown in FIGS. 5B-5D and can omit components shown in FIGS. 5B-5D.

The resistive change element array 500 includes a plurality of resistive change element cells CELL00-CELLxy, and each resistive change element cell includes a resistive change element SW00-SWxy that is accessed via two array lines (a bit line and a word line) and does not include an in situ selection device or other current limiting element. The resistive change element array 500 also includes a plurality of low resistive reference elements RL00-RL1y with each low resistive reference element accessed via two array lines (a bit line and a word line) and a plurality of high resistive reference elements RH00-RH1y with each high resistive reference element accessed via two array lines (a bit line and a word line). Alternatively, at least one of the plurality of low resistive reference elements RL00-RL1y and the plurality of high resistive reference elements RH00-RH1y can be located outside the resistive change element array 500.

The resistive change element cells CELL00-CELLxy are referred to as 1-R resistive change element cells or nR resistive change element cells because the resistive change element cells CELL00-CELLxy include a resistive change element and do not include an in situ selection device or other current limiting element. The resistive change element cells CELL00-CELLxy can have the same or similar structure to the resistive change element cells CELL00-CELLxy in the resistive change element array 100 discussed above with respect to FIG. 1. Additionally, the resistive change element array 500 can be referred to as a 1-R resistive change element array or an nR resistive change element array because the resistive change element array 500 includes resistive change element cells that include a resistive change element and do not include an in situ selection device or other current limiting element.

The location of the low resistive reference elements RL00-RL1y, the high resistive reference elements RH00-RH1y, and the resistive change elements SW00-SWxy in the resistive change element array 500 causes the low resistive reference elements RL00-RL1y, the high resistive reference elements RH00-RH1y, and the resistive change elements SW00-SWxy to be subject to essentially the same circuit conditions, such as temperature, array line capacitance and impedance, electrical resistance of unselected cells, and leakage paths within the array. Locating the low resistive reference elements RL00-RL1y, the high resistive reference elements RH00-RH1y, and the resistive change elements SW00-SWxy in the resistive change element array 500 can reduce the impact of circuit conditions of the resistive change element array 500 because the low resistive reference elements RL00-RL1y, the high resistive reference elements RH00-RH1y, and the resistive change elements SW00-SWxy are subject to essentially the same circuit conditions. Additionally, constructing the low resistive reference elements RL00-RL1y, the high resistive reference elements RH00-RH1y, and the resistive change elements SW00-SWxy from the same materials can reduce the impact of variations in electrical characteristics caused by the low resistive reference elements RL00-RL1y, the high resistive reference elements RH00-RH1y, and the resistive change elements SW00-SWxy being constructed from different materials.

The resistive change elements SW00-SWxy, as discussed above, can be two-terminal nanotube switching elements, phase change memory elements, metal oxide memory elements, or conductive bridge memory elements as well as other materials and designs. The resistive change elements SW00-SWxy can be formed from a plurality of materials, such as, but not limited to, metal oxide, solid electrolyte, phase change material such as a chalcogenide glass, graphene fabrics, and carbon nanotube fabrics. The resistive change elements SW00-SWxy are programmable into a low resistive state, for example a resistance on the order of 1 MΩ (corresponding, typically, to a logic '1,' a SET state), and a high resistive state, for example a resistance on the order of 10 MΩ (corresponding, typically, to a logic '0,' a RESET state).

The low resistive reference elements RL00-RL1y can be resistors, two-terminal nanotube switching elements, phase change memory elements, metal oxide memory elements, or conductive bridge memory elements as well as other materials and designs. The low resistive reference elements RL00-RL1y can be formed from a plurality of materials, such as, but not limited to, metal oxide, solid electrolyte, phase change material such as a chalcogenide glass, graphene fabrics, and carbon nanotube fabrics. The resistances of the low resistive reference elements RL00-RL1y are design variables selected by a circuit designer. The resistances of the low resistive reference elements RL00-RL1y set an upper boundary for resistance values that correspond with a low resistive state during SET VERIFY operations. The circuit designer typically selects resistances for the low resistive reference elements RL00-RL1y greater than a model resistance for a low resistive state of the resistive change elements SW00-SWxy so that the resistive change elements SW00-SWxy can have resistances greater than the model resistance for the low resistive state and be determined to have a low resistive state during SET VERIFY operations.

For example, when a model resistance for a low resistive state of the resistive change elements SW00-SWxy is 1 MΩ, a circuit designer can select the resistances of the low resistive reference elements RL00-RL1y to be 3 MΩ, and thus, resistive change elements having a resistance less than or equal to approximately 3 MΩ are determined to have a low resistive state during SET VERIFY operations. It is noted that the circuit designer typically selects resistances for the low resistive reference elements RL00-RL1y that are greater than a model resistance for a low resistive state of the resistive change elements SW00-SWxy and less than resistances of the high resistive reference elements RH00-RH1y. It is further noted that the low resistive reference elements RL00-RL1y are not limited to having approximately the same resistance. For example, the low resistive reference elements located closer to the circuit for sourcing an adjustable amount of current 502 can have resistances greater than resistances of the low resistive reference elements located further from the circuit for sourcing an adjustable amount of current 502.

The high resistive reference elements RH00-RH1y can be resistors, two-terminal nanotube switching elements, phase change memory elements, metal oxide memory elements, or conductive bridge memory elements as well as other materials and designs. The high resistive reference elements RH00-RH1y can be formed from a plurality of materials, such as, but not limited to, metal oxide, solid electrolyte, phase change material such as a chalcogenide glass, graphene fabrics, and carbon nanotube fabrics. The resistances of the high resistive reference elements RH00-RH1y are design variables selected by a circuit designer. The resistances of the high resistive reference elements RH00-RH1y set a lower boundary for resistance values that correspond with a high resistive state during RESET VERIFY operations. The circuit designer typically selects resistances for the high resistive reference elements RH00-RH1y less than a model resistance for a high resistive state of the resistive change elements SW00-SWxy so that the resistive change elements SW00-SWxy can have resistances less than the model resistance for the high resistive state and be determined to have a high resistive state during RESET VERIFY operations.

For example, when a model resistance for a high resistive state of the resistive change elements SW00-SWxy is 10 MΩ, a circuit designer can select the resistances of the high resistive reference elements RH00-RH1y to be 8 MΩ, and thus, resistive change elements having a resistance greater than approximately 8 MΩ are determined to have a high resistive state during RESET VERIFY operations. It is noted that the circuit designer typically selects resistances for the high resistive reference elements RH00-RH1y that are greater than resistances of the low resistive reference elements RL00-RL1y and less than a model resistance for a high resistive state of the resistive change elements SW00-SWxy. It is further noted that the high resistive reference elements RH00-RH1y are not limited to having approximately the same resistance. For example, the high resistive reference elements located closer to the circuit for sourcing an adjustable amount of current 502 can have resistances greater than resistances of the high resistive reference elements located further from the circuit for sourcing an adjustable amount of current 502.

As discussed below, the low resistive reference elements RL00-RL1y and the high resistive reference elements RH00-RH1y are used to set an intermediate resistance as a boundary for resistance values that correspond with a low resistive state during READ operations and resistance values that correspond with a high resistive state during READ operations. The intermediate resistance set as a boundary during READ operations can be additionally considered by a circuit designer when selecting the resistances of the low resistive reference elements RL00-RL1y and the resistances of the high resistive reference elements RH00-RH1y. The intermediate resistance is typically greater than the resistances of the low resistive reference elements RL00-RL1y and less than the resistances of the high resistive reference elements RH00-RH1y.

For example, when a circuit designer selects the resistances of the low resistive reference elements RL00-RL1y to be 3 MΩ and the resistances of the high resistive reference elements RH00-RH1y to be 8 MΩ, an intermediate resistance set as a boundary during READ operations can be 4.36 MΩ, as discussed below. In the above example, resistive change elements having a resistance less than or equal to approximately 4.36 MΩ are determined to have a low resistive state during READ operations and resistive change elements having a resistance greater than approximately 4.36 MΩ are determined to have a high resistive state during READ operations.

Additionally, selecting resistances of the low resistive reference elements RL00-RL1y less than resistances of the high resistive reference elements RH00-RH1y creates a buffer between resistance values that correspond with a low resistive state during SET VERIFY operations and resistance values that correspond with a high resistive state during RESET VERIFY operations. Resistive change elements having resistances in the buffer are determined to have a low resistive state during READ operations or a high resistive state during READ operations. However, the resistive change elements having resistances in the buffer are determined to have a resistive state other than a low resistive state during SET VERIFY operations or are determined to have a resistive state other than a high resistive state during RESET VERIFY operations. Thus, when the resistances of the low resistive reference elements RL00-RL1y are less than an intermediate resistance set as a boundary during READ operations, SET VERIFY operations require a closer correspondence between resistances of the resistive change elements SW00-SWxy and a model resistance for a low resistive state than READ operations and when the resistances of the high resistive reference elements RH00-RH1y are greater than the intermediate resistance set as a boundary during READ operations, RESET VERIFY operations require a closer correspondence between resistances of the resistive change elements SW00-SWxy and a model resistance for a high resistive state than READ operations.

For example, when the low resistive reference elements RL00-RL1y have resistances of 3 MΩ, the intermediate resistance is 4.36 MΩ, and the high resistive reference elements RH00-RH1y have resistances of 8 MΩ, the low resistive reference elements RL00-RL0y and the high resistive reference elements create a buffer between approximately 3 MΩ and approximately 8 MΩ. In the above example, resistive change elements having resistances from approximately 3 MΩ to approximately 4.36 MΩ are determined to have a low resistive state during READ operations but are determined to have a resistive state other than a low resistive state during SET VERIFY operations and resistive change elements having resistances from approximately 4.36 MΩ to approximately 8 MΩ are determined to have a high resistive state during READ operations but are determined to have a resistive state other than a high resistive state during RESET VERIFY operations. A circuit designer can adjust the buffer by adjusting the resistances of the low resistive reference elements RL00-RL1y and the resistances of the high resistive reference elements RH00-RH1y. It is noted that the resistances of the low resistive reference elements RL00-RL1y and the resistances of the high resistive reference element RH00-RH1y are not required to be equal distances from the intermediate resistance. For example, the resistances of the low resistive reference elements RL00-RL1y can be closer to the intermediate resistance or the resistances of the high resistive reference elements RH00-RH1y can be closer to the intermediate resistance.

Each resistive change element SW00-SWxy has a first terminal and a second terminal. The first terminals of the resistive change elements SW00-SWxy are electrically connected to bit lines BL(0)-BL(x) and the second terminals of the resistive change elements SW00-SWxy are electrically connected to word lines WL(0)-WL(y). Each low resistive reference element RL00-RL1y has a first terminal and a second terminal. The first terminals of the low resistive reference elements RL00-RL1y are electrically connected to bit lines BL(L0)-BL(L1) and the second terminals of the low resistive reference elements RL00-RL1y are electrically connected to word lines WL(0)-WL(y). Each high resistive reference element RH00-RH1y has a first terminal and a second terminal. The first terminals of the high resistive reference elements RH00-RH1y are electrically connected to bit lines BL(H0)-BL(H1) and the second terminals of the high resistive reference elements RH00-RH1y are electrically connected to word lines WL(0)-WL(y).

The resistive change element array 500 is electrically connected to the circuit for sourcing an adjustable amount of current 502 and the plurality of sense devices 560, 562. The circuit for sourcing an adjustable amount of current 502 includes a differential amplifier 510, a first p-channel metal oxide semiconductor field effect transistor (MOSFET) 520, also referred to as a first PMOS transistor 520, a plurality of p-channel MOSFETs 530, 532, also referred to as a plurality of PMOS transistors 530, 532, and a plurality of n-channel MOSFETs 540, 542, 544, 546, also referred to as a plurality of NMOS transistors 540, 542, 544, 546. The differential amplifier 510 has a non-inverting input terminal, an inverting input terminal, and an output terminal. The first PMOS transistor 520 has a source terminal, a drain terminal, and a gate terminal. Each PMOS transistor in the plurality of PMOS transistors 530, 532 has a source terminal, a drain terminal, and a gate terminal. Each NMOS transistor in the plurality of NMOS transistors 540, 542, 544, 546 has a source terminal, a drain terminal, and a gate terminal. Each sense device in the plurality of sense devices 560, 562 has a first input terminal, a second input terminal, and an output terminal. It is noted that the differential amplifier 510, the first PMOS transistor 520, each PMOS transistor in the plurality of PMOS transistors 530, 532, each NMOS transistor in the plurality of NMOS transistors 540, 542, 544, 546, and each sense device in the plurality of sense devices 560, 562 can additionally have other terminals.

The differential amplifier 510 can be an amplifier that generates an output voltage based on the difference between two input voltages, such as an operational amplifier. The sense devices 560, 562 can be components that generate an output voltage that corresponds with a data value or a logic value based on at least one input voltage, such as sense amplifiers, differential amplifiers, and analog to digital converters. It is noted that, as discussed above, the sense devices in the plurality of sense devices 560, 562 can additionally have other terminals, such as when the sense devices are fully differential sense amplifiers having positive output terminals and negative output terminals. Additionally, the circuit for sourcing an adjustable amount of current 502 can include other types of field effect transistors, such as carbon nanotube field effect transistors (CNTFETs), SiGE FETs, fully-depleted silicon-on-insulator FETs, or multiple gate field effect transistors such as FinFETs, in place of the first PMOS transistor 520, the plurality of PMOS transistors 530, 532, and the plurality of NMOS transistors 540, 542, 544, 546. When field effect transistors that do not require a semiconductor substrate are used with nanotube based resistive change elements, this enables chips fabricated entirely on insulator material, and additionally, enables the field effect transistors to be stacked to reduce the amount of chip area consumed by the circuit for sourcing an adjustable amount of current 502.

An inverting input terminal of the differential amplifier 510, can be electrically connected to a power supply, a voltage source, a driver circuit, a resistor divider, a test circuit, a control circuit such as a processor, a controller, a programmable logic device, and a field programmable gate array (FGPA), or other device that can supply a desired voltage, a non-inverting input terminal of the differential amplifier 510 is electrically connected to a drain terminal of the first PMOS transistor 520 and a drain terminal of each NMOS transistor in the plurality of NMOS transistors 540, 542, 544, 546 forming a feedback loop, and an output terminal of the differential amplifier 510 is electrically connected to a gate terminal of the first PMOS transistor 520, and a gate terminal of each PMOS transistor in the plurality of PMOS transistors 530, 532. A source terminal of the first PMOS transistor 520 is electrically connected to a power supply, a voltage source, a driver circuit, or other device that supplies the system voltage Vdd, a drain terminal of the first PMOS transistor 520 is electrically connected to a drain terminal of each NMOS transistor in the plurality of NMOS transistors 540, 542, 544, 546 and a non-inverting input terminal of the differential amplifier 510, and a gate terminal of the first PMOS transistor 520 is electrically connected to an output terminal of the differential amplifier 510. Source terminals of the PMOS transistors in the plurality of PMOS transistors 530, 532 are electrically connected to a power supply, a voltage source, a driver circuit, or other device that supplies the system voltage Vdd, drain terminals of the PMOS transistors in the plurality of PMOS transistors 530, 532 are electrically connected to bit lines BL(0)-BL(x) of the resistive change element array 500, and gate terminals of the PMOS transistors in the plurality of PMOS transistors 530, 532 are electrically connected to an output terminal of the differential amplifier 510. Drain terminals of the NMOS transistors in the plurality of NMOS transistors 540, 542, 544, 546 are electrically connected to a drain terminal of the first PMOS transistor 520 and a non-inverting input terminal of the differential amplifier 510, source terminals of the NMOS transistors in the plurality of NMOS transistors 540, 542, 544, 546 are electrically connected to bit lines BL(L0)-BL(H1) of the resistive change element array 500, and gate terminals of the NMOS transistors in the plurality of NMOS transistors 540, 542, 544, 546 can be electrically connected to a test circuit or a control circuit such as a processor, a controller, a programmable logic device, and a FGPA, that supplies control signals S7-S10 for turning on and turning off the NMOS transistors.

Alternatively, the circuit for sourcing an adjustable amount of current 502 can additionally include a plurality of field effect (FETs), such as metal oxide semiconductor field effect transistors (MOSFETs), carbon nanotube field effect transistors (CNTFETs), SiGE FETs, fully-depleted silicon-on-insulator FETs, or multiple gate field effect transistors such as FinFETs, for controlling current flow into the bit lines BL(0)-BL(x). Each FET in the plurality of FETs is electrically connected in series with a PMOS transistor in the plurality of PMOS transistors 530, 532 and each FET in the plurality of FETs has a gate terminal electrically connected to a test circuit or a control circuit such as a processor, a controller, a programmable logic device, and a FGPA, that supplies a control signal for turning on and turning off the FET.

Figure 5B:
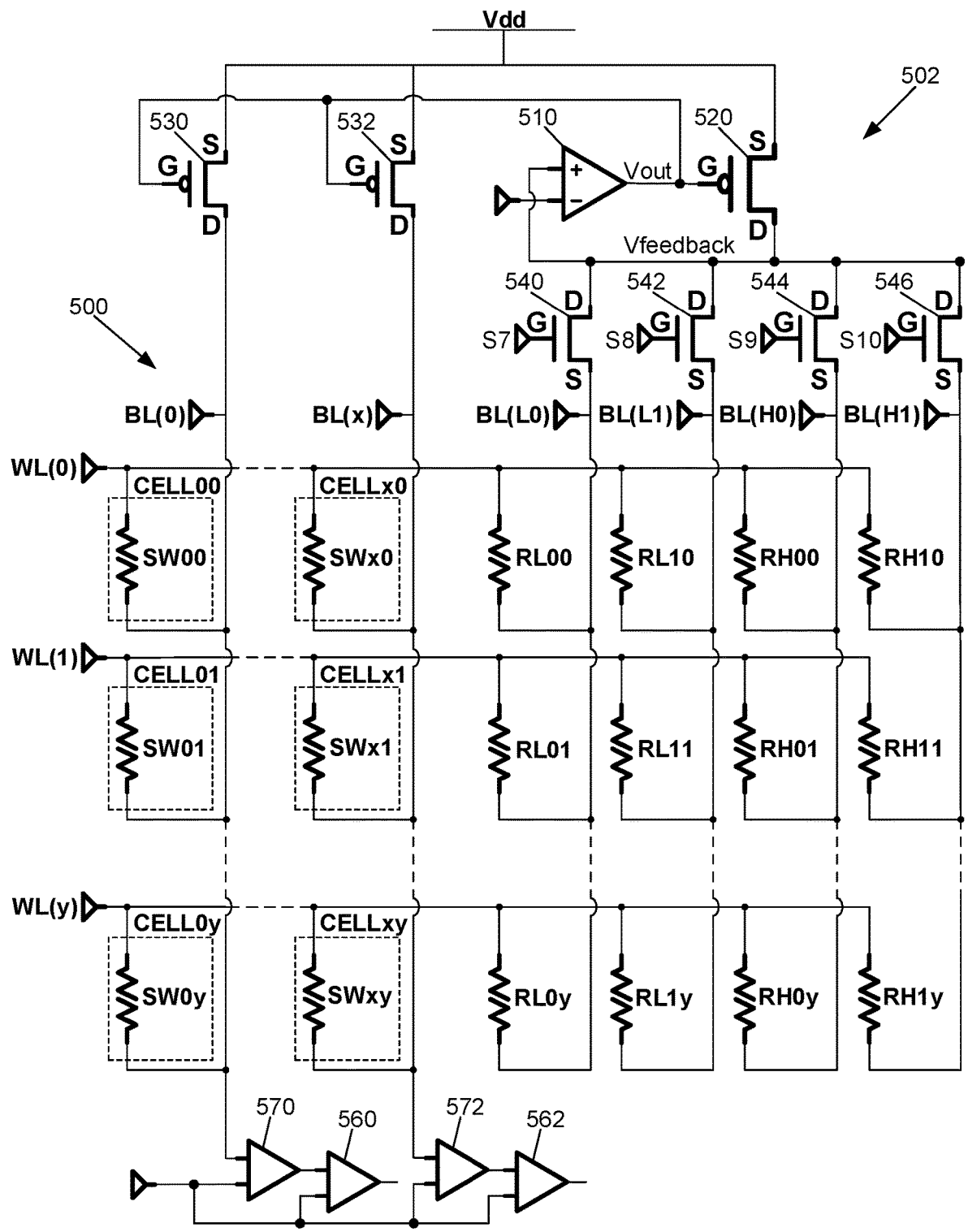
FIG. 5B illustrates a simplified schematic diagram of the exemplary architecture of FIG. 5A further including amplifiers for increasing small signals.
Figure 5C:
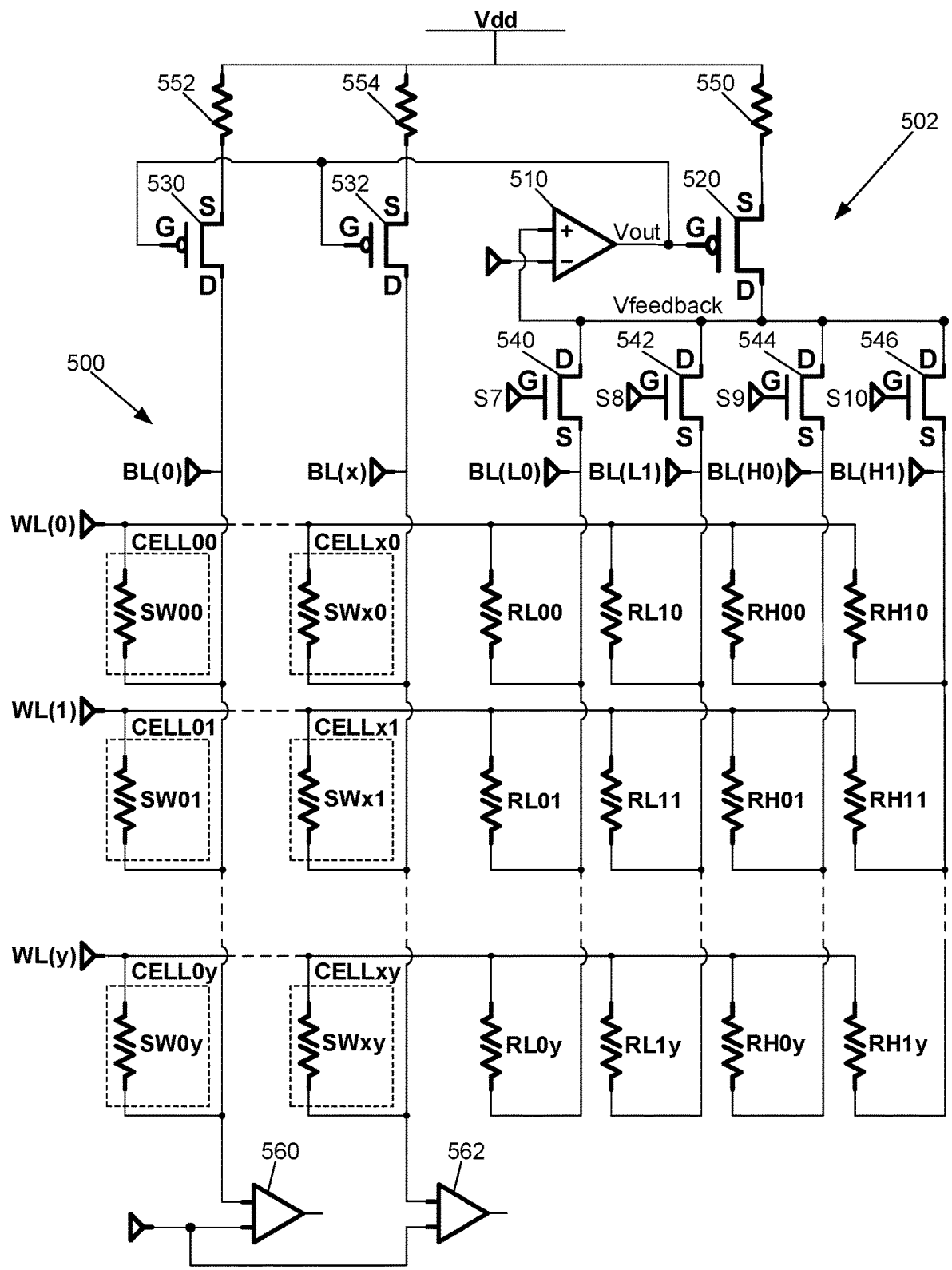
FIG. 5C illustrates a simplified schematic diagram of the exemplary architecture of FIG. 5A further including resistors for reducing current variations.
Figure 5D:
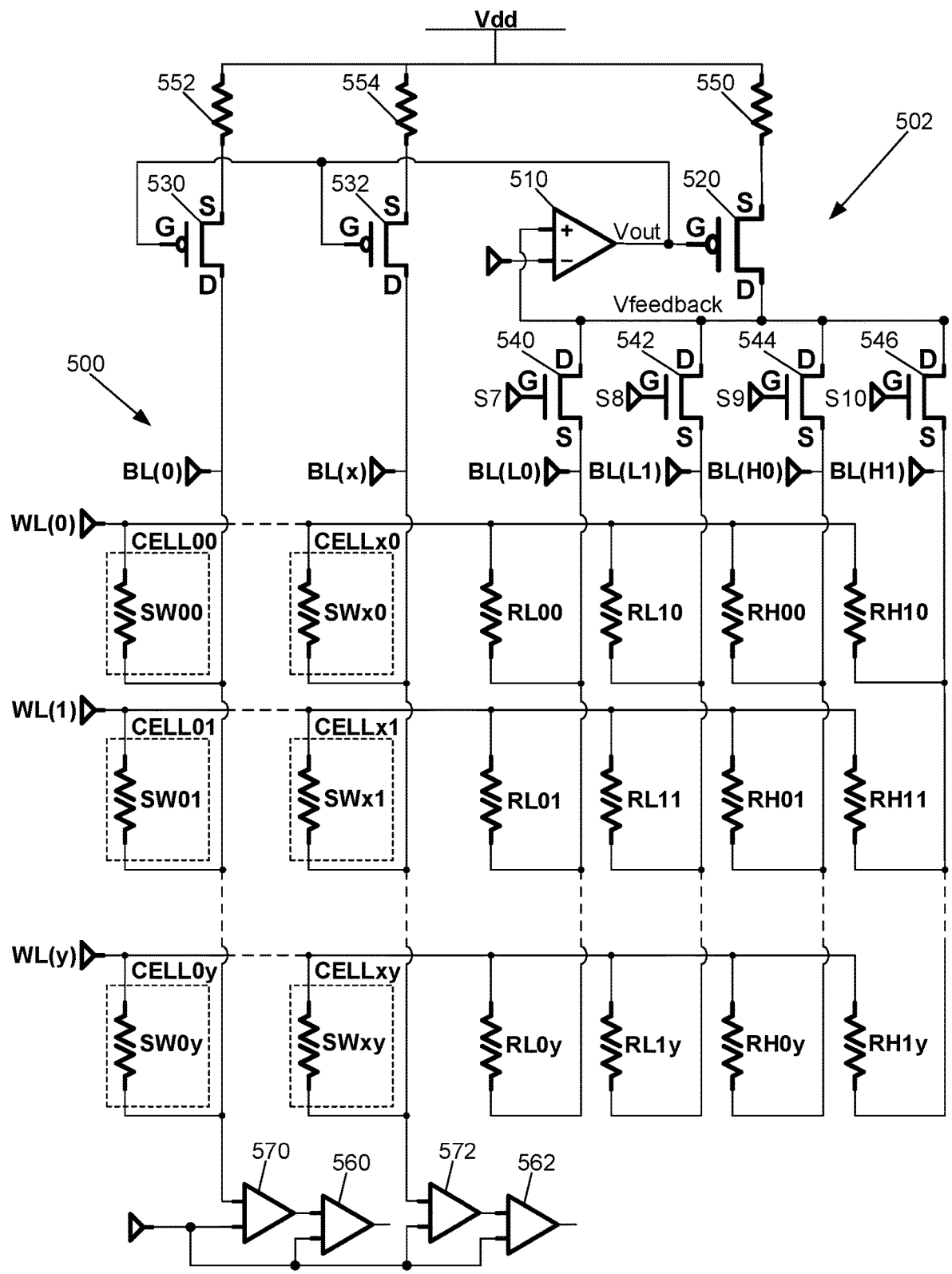
FIG. 5D illustrates a simplified schematic diagram of the exemplary architecture of FIG. 5A further including amplifiers for increasing small signals and resistors for reducing current variations.

Alternatively, as shown in FIGS. 5C-5D, a source terminal of the first PMOS transistor 520 is electrically connected to a power supply, a voltage source, a driver circuit, or other device by a resistor 550 for reducing variations in an amount of current supplied by the first PMOS transistor 520. Additionally, as shown in FIGS. 5C-5D, source terminals of the PMOS transistors in the plurality of PMOS transistors 530, 532 are electrically connected to a power supply, a voltage source, a driver circuit, or other device by resistors in a plurality of resistors 552, 554 for reducing variations in amounts of current supplied by the PMOS transistors in the plurality of PMOS transistors 530, 532.

Referring back to FIG. 5A, first input terminals of the sense devices in the plurality of sense devices 560, 562 are electrically connected to bit lines BL(0)-BL(x) of the resistive change element array 500 and second input terminals of the sense devices in the plurality of sense devices 560, 562 can be electrically connected to a power supply, a voltage source, a driver circuit, a resistor divider, a test circuit, a control circuit such as a processor, a controller, a programmable logic device, and a FGPA, or other device that can supply a desired voltage, and output terminals of the sense devices in the plurality of sense devices 560, 562 can be electrically connected to a bus, a buffer, a level shift circuit, a test circuit, or a control circuit such a processor, a controller, a programmable logic device and a FGPA.

Alternatively, as shown in FIGS. 5B and 5D, a plurality of amplifiers 570, 572 for increasing small signals are electrically connected to the resistive change element array 500 and the plurality of sense devices 560, 562 are electrically connected to the plurality of amplifiers 570, 572. Each amplifier in the plurality of amplifiers 570, 572 has a first input terminal, a second input terminal, and an output terminal. First input terminals of the amplifiers in the plurality of amplifiers 570, 572 are electrically connected to bit lines BL(0)-BL(x) of the resistive change element array 500, second input terminals of the amplifiers in the plurality of amplifiers 570, 572 can be electrically connected to a power supply, a voltage source, a driver circuit, a resistor divider, a test circuit, a control circuit such as a processor, a controller, a programmable logic device, and a FGPA, or other device that can supply a desired voltage, and output terminals of the amplifiers in the plurality of amplifiers 570, 572 are electrically connected to first input terminals of sense devices in the plurality of sense device 560, 562. It is noted that each amplifier in the plurality of amplifiers 570, 572 can additionally have other terminals. Also, as shown in FIGS. 5B and 5D, second input terminals of the sense devices in the plurality of sense devices 560, 562 can be electrically connected to a power supply, a voltage source, a driver circuit, a resistor divider, a test circuit, a control circuit such as a processor, a controller, a programmable logic device, and a FGPA, or other device that can supply a desired voltage, and output terminals of the sense devices in the plurality of sense devices 560, 562 can be electrically connected to a bus, a buffer, a level shift circuit, a test circuit, or a control circuit such as a processor, a controller, a programmable logic device, and an FGPA.

Figure 5E:
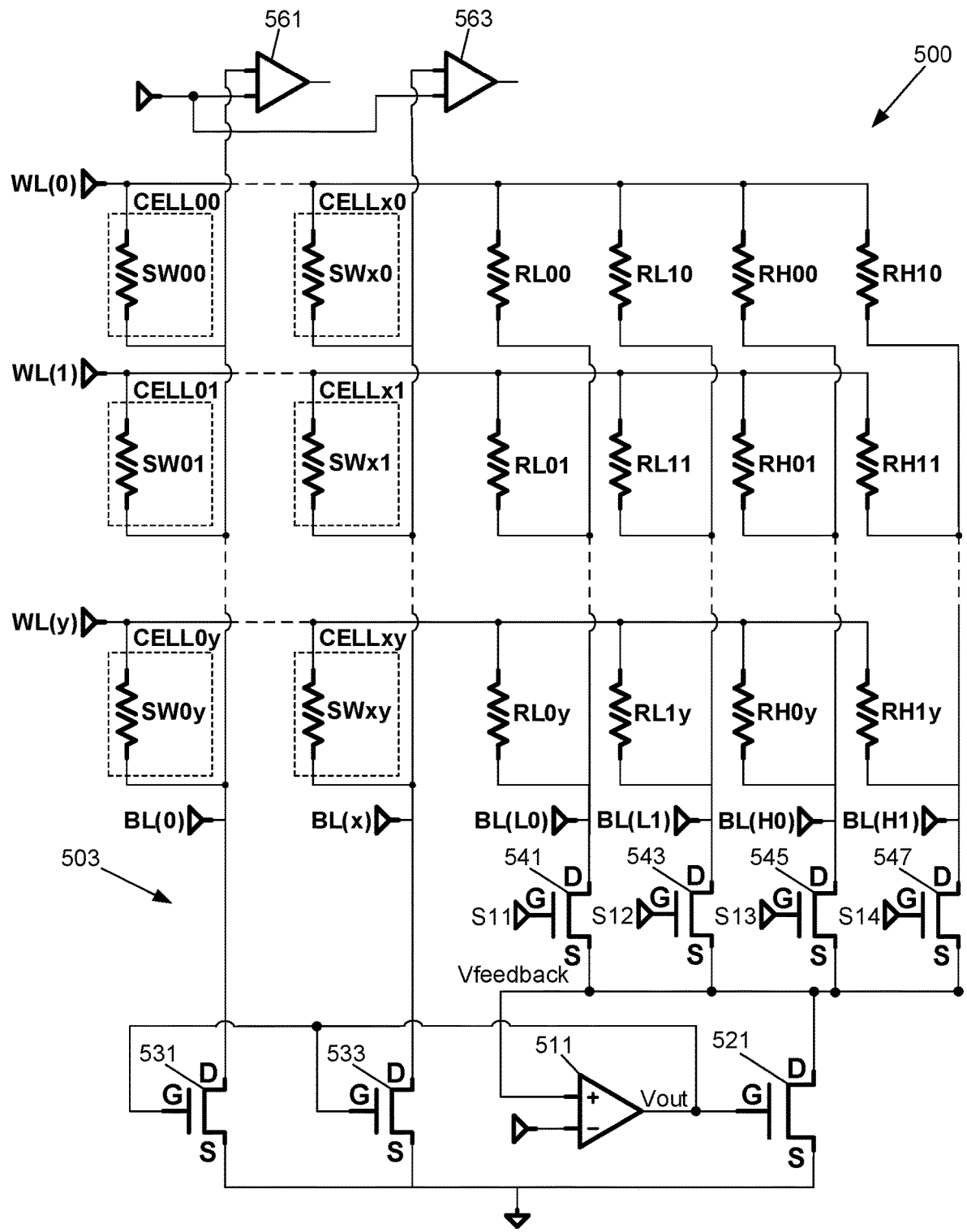
FIG. 5E illustrates a simplified schematic diagram of an exemplary architecture for accessing at least one resistive change element in a resistive change element array using a resistance based on resistances of resistive reference elements to sink an amount of current.

Referring now to FIG. 5E, an exemplary architecture for accessing at least one resistive change element in a resistive change element array using a resistance based on resistances of resistive reference elements to sink an amount of current is illustrated in a simplified schematic diagram. The exemplary architecture is operable to select from a low resistance Rlow generated using resistances of resistive reference elements, an intermediate resistance Rinter generated using resistances of resistive reference elements, and a high resistance Rhigh generated using resistances of resistive reference elements, and as discussed below, for SET VERIFY operations the low resistance Rlow is selected, for READ operations the intermediate resistance Rinter is selected, and for RESET VERIFY operations the high resistance Rhigh is selected. Additionally, the exemplary architecture can select from additional resistances by including additional resistive reference elements having different resistances in the exemplary architecture. The exemplary architecture, as shown in FIG. 5E, includes the resistive change element array 500, a circuit for sinking an adjustable amount of current 503, and a plurality of sense devices 561, 563. However, the exemplary architecture is not limited to FIG. 5E and the exemplary architecture can include additional components not shown in FIG. 5E, such as resistors, amplifiers, and inverters, and can omit components shown in FIG. 5E, such as sense amplifiers. Further, the exemplary architecture is not limited to FIGS. 5F-5I and the exemplary architecture can include additional components not shown in FIGS. 5F-5I and can omit components shown in FIGS. 5F-5I. It is noted that the structure of the resistive change element array 500 is discussed above, and thus, the structure of the resistive change element array 500 is not discussed below.

The resistive change element array 500 is electrically connected to the circuit for sinking an adjustable amount of current 503 and the plurality of sense devices 561, 563. The circuit for sinking an adjustable amount of current 503 includes a differential amplifier 511, a first n-channel metal oxide semiconductor field effect transistor (MOSFET) 521, also referred to as a first NMOS transistor 521, a first plurality of n-channel MOSFETs 531, 533, also referred to as a first plurality of NMOS transistors 531, 533, and a second plurality of n-channel MOSFETs 541, 543, 545, 547, also referred to as a second plurality of NMOS transistors 541, 543, 545, 547. The differential amplifier 511 has a non-inverting input terminal, an inverting input terminal, and an output terminal. The first NMOS transistor 521 has a source terminal, a drain terminal, and a gate terminal. Each NMOS transistor in the first plurality of NMOS transistors 531, 533 has a source terminal, a drain terminal, and a gate terminal. Each NMOS transistor in the second plurality of NMOS transistors 541, 543, 545, 547 has a source terminal, a drain terminal, and a gate terminal. Each sense device in the plurality of sense devices 561, 563 has a first input terminal, a second input terminal, and an output terminal. It is noted that the differential amplifier 511, the first NMOS transistor 521, each NMOS transistor in the first plurality of NMOS transistors 531, 533, each NMOS transistor in the second plurality of NMOS transistors 541, 543, 545, 547, and each sense device in the plurality of sense devices 561, 563 can additionally have other terminals.

The differential amplifier 511 can be an amplifier that generates an output voltage based on the difference between two input voltages, such as an operational amplifier. The sense devices 561, 563 can be components that generate an output voltage that corresponds with a data value or a logic value based on at least one input voltage, such as sense amplifiers, differential amplifiers, and analog to digital converters. It is noted that, as discussed above, the sense devices 561, 563 can additionally have other terminals, such as when the sense devices are fully differential sense amplifiers having positive output terminals and negative output terminals. Additionally, the circuit for sinking an adjustable amount of current 503 can include other types of field effect transistors, such as carbon nanotube field effect transistors (CNTFETs), SiGE FETs, fully-depleted silicon-on-insulator FETs, or multiple gate field effect transistors such as FinFETs, in place of the first NMOS transistor 521, the first plurality of NMOS transistors 531, 533, and the second plurality of NMOS transistors 541, 543, 545, 547. When field effect transistors that do not require a semiconductor substrate are used with nanotube based resistive change elements, this enables chips fabricated entirely on insulator material, and additionally, enables the field effect transistors to be stacked to reduce the amount of chip area consumed by the circuit for sinking an adjustable amount of current 503.

An inverting input terminal of the differential amplifier 511, can be electrically connected to a power supply, a voltage source, a driver circuit, a resistor divider, a test circuit, a control circuit such as a processor, a controller, a programmable logic device, and a field programmable gate array (FGPA), or other device that can supply a desired voltage, a non-inverting input terminal of the differential amplifier 511 is electrically connected to a drain terminal of the first NMOS transistor 521 and a source terminal of each NMOS transistor in the first plurality of NMOS transistors 541, 543, 545, 547 forming a feedback loop, and an output terminal of the differential amplifier 511 is electrically connected to a gate terminal of the first NMOS transistor 521, and a gate terminal of each NMOS transistor in the first plurality of NMOS transistors 531, 533. A source terminal of the first NMOS transistor 521 is electrically connected to 0 volts or ground, a drain terminal of the first NMOS transistor 521 is electrically connected to a source terminal of each NMOS transistor in the first plurality of NMOS transistors 541, 543, 545, 547 and a non-inverting input terminal of the differential amplifier 511, and a gate terminal of the first NMOS transistor 521 is electrically connected to an output terminal of the differential amplifier 511. Source terminals of the NMOS transistors in the first plurality of NMOS transistors 531, 533 are electrically connected to 0 volts or ground, drain terminals of the NMOS transistors in the plurality of NMOS transistors 531, 533 are electrically connected to bit lines BL(0)-BL(x) of the resistive change element array 500, and gate terminals of the NMOS transistors in the first plurality NMOS transistors 531, 533 are electrically connected to an output terminal of the differential amplifier 511. Drain terminals of the NMOS transistors in the second plurality of NMOS transistors 541, 543, 545, 547 are electrically connected to bit lines BL(L0)-BL(H1) of the resistive change element array 500, source terminals of the NMOS transistors in the second plurality of NMOS transistors 541, 543, 545, 547 are electrically connected to a drain terminal of the first PMOS transistor 521 and a non-inverting input terminal of the differential amplifier 511, and gate terminals of the NMOS transistors in the second plurality of NMOS transistors 541, 543, 545, 547 can be electrically connected to a test circuit or a control circuit such as a processor, a controller, a programmable logic device, and a FGPA, that supplies control signals S11-S14 for turning on and turning off the NMOS transistors.

Alternatively, the circuit for sinking an adjustable amount of current 503 can additionally include a plurality of field effect (FETs), such as metal oxide semiconductor field effect transistors (MOSFETs), carbon nanotube field effect transistors (CNTFETs), SiGE FETs, fully-depleted silicon-on-insulator FETs, or multiple gate field effect transistors such as FinFETs, for controlling current flow into the bit lines BL(0)-BL(x). Each FET in the plurality of FETs is electrically connected in series with a NMOS transistor in the first plurality of NMOS transistors 530, 531 and each FET in the plurality of FETs has a gate terminal electrically connected to a test circuit or a control circuit such as a processor, a controller, a programmable logic device, and a FGPA, that supplies a control signal for turning on and turning off the FET.

Figure 5F:
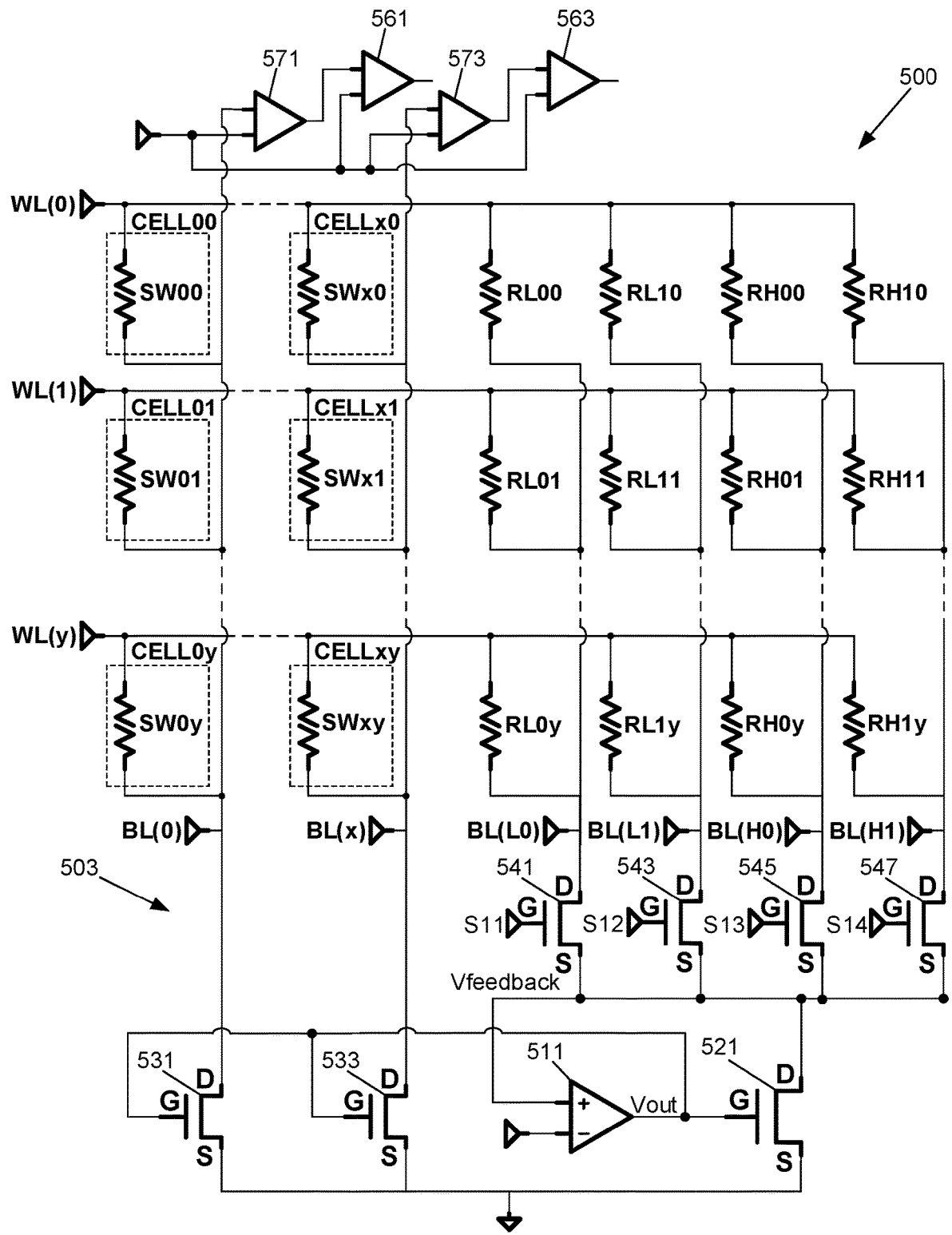
FIG. 5F illustrates a simplified schematic diagram of the exemplary architecture of FIG. 5E further including amplifiers for increasing small signals.
Figure 5G:
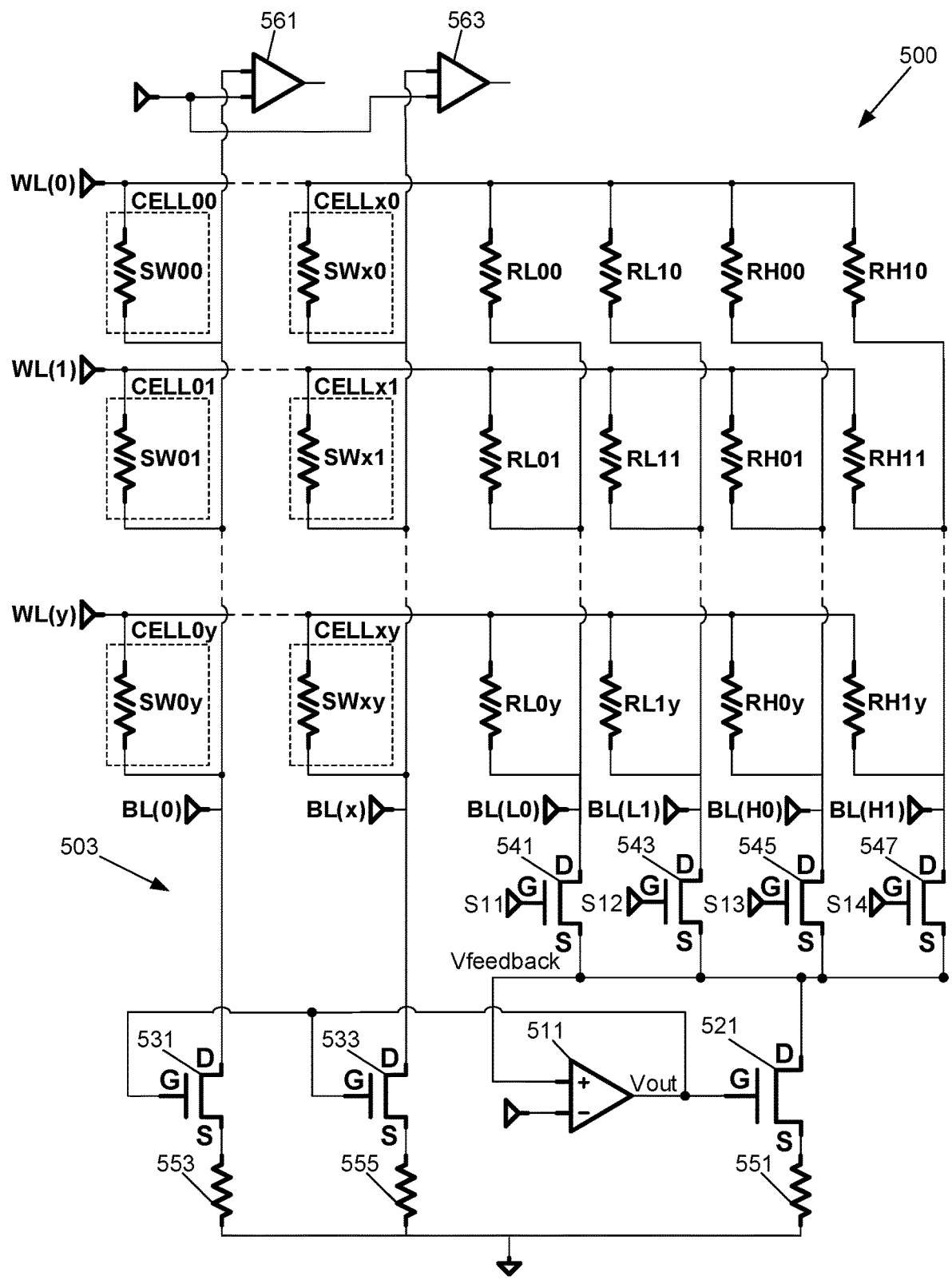
FIG. 5G illustrates a simplified schematic diagram of the exemplary architecture of FIG. 5E further including resistors for reducing current variations.
Figure 5H:
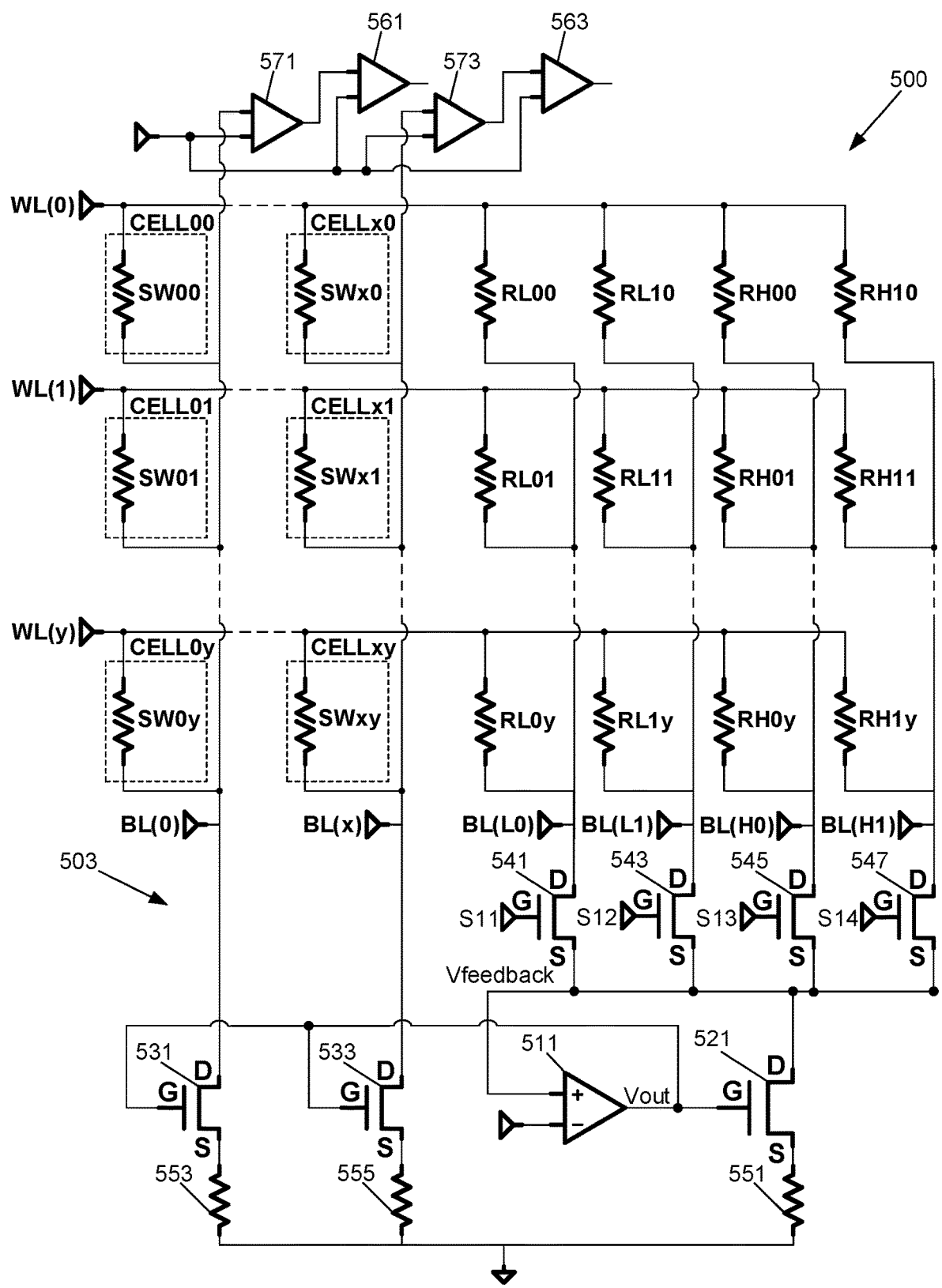
FIG. 5H illustrates a simplified schematic diagram of the exemplary architecture of FIG. 5E further including amplifiers for increasing small signals and resistors for reducing current variations.

Alternatively, as shown in FIGS. 5G-5H, a source terminal of the first NMOS transistor 521 is electrically connected to 0 volts or ground by a resistor 551 for reducing variations in an amount of current supplied by the first NMOS transistor 521. Additionally, as shown in FIGS. 5G-5H, source terminals of the NMOS transistors in the first plurality of NMOS transistors 531, 533 are electrically connected to 0 volts or ground by resistors in a plurality of resistors 553, 555 for reducing variations in amounts of current supplied by the NMOS transistors in the first plurality of NMOS transistors 531, 533.

Referring back to FIG. 5E, first input terminals of the sense devices in the plurality of sense devices 561, 563 are electrically connected to bit lines BL(0)-BL(x) of the resistive change element array 500 and second input terminals of the sense devices in the plurality of sense devices 561, 563 can be electrically connected to a power supply, a voltage source, a driver circuit, a resistor divider, a test circuit, a control circuit such as a processor, a controller, a programmable logic device, and a FGPA, or other device that can supply a desired voltage, and output terminals of the sense devices in the plurality of sense devices 561, 563 can be electrically connected to a bus, a buffer, a level shift circuit, a test circuit, or a control circuit such a processor, a controller, a programmable logic device and a FGPA.

Alternatively, as shown in FIGS. 5F and 5H, a plurality of amplifiers 571, 573 for increasing small signals are electrically connected to the resistive change element array 500 and the plurality of sense devices 561, 563 are electrically connected to the plurality of amplifiers 571, 573. Each amplifier in the plurality of amplifiers 571, 573 has a first input terminal, a second input terminal, and an output terminal. First input terminals of the amplifiers in the plurality of amplifiers 571, 573 are electrically connected to bit lines BL(0)-BL(x) of the resistive change element array 500, second input terminals of the amplifier in the plurality of amplifiers 571, 573 can be electrically connected to a power supply, a voltage source, a driver circuit, a resistor divider, a test circuit, a control circuit such as a processor, a controller, a programmable logic device, and a FGPA, or other device that can supply a desired voltage, and output terminals of the amplifiers in the plurality of amplifiers 571, 573 are electrically connected to first input terminals of sense devices in the plurality of sense devices 561, 563. It is noted that each amplifier in the plurality of amplifiers 571, 573 can additionally have other terminals. Also, as shown in FIGS. 5F and 5H, second input terminals of the sense devices in the plurality of sense devices 561, 563 can be electrically connected to a power supply, a voltage source, a driver circuit, a resistor divider, a test circuit, a control circuit such as a processor, a controller, a programmable logic device, and a FGPA, or other device that can supply a desired voltage, and output terminals of the sense devices in the plurality of sense devices 561, 563 can be electrically connected to a bus, a buffer, a level shift circuit, a test circuit, or a control circuit such as a processor, a controller, a programmable logic device, and an FGPA.

Figure 5I:
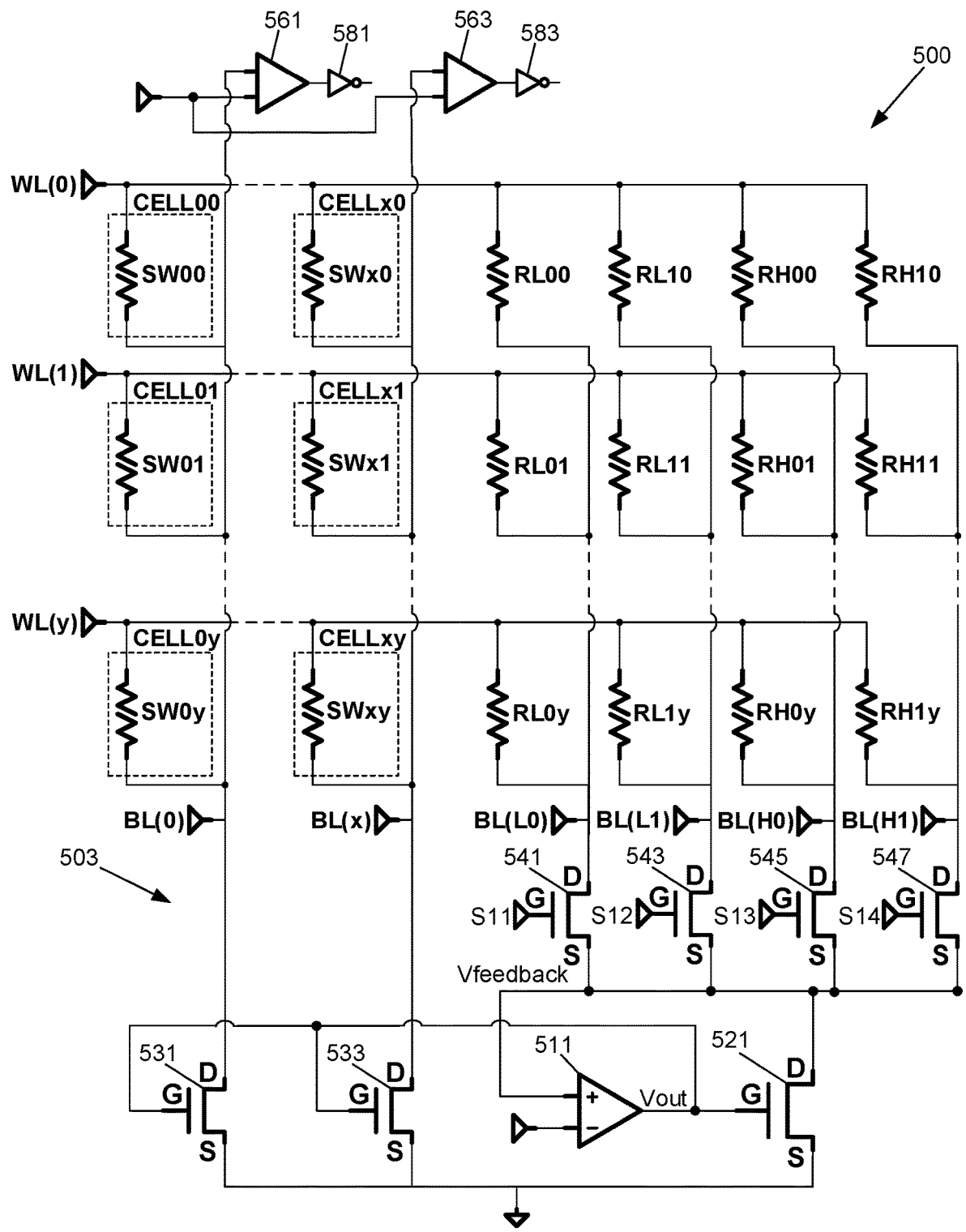
FIG. 5I illustrates a simplified schematic diagram of the exemplary architecture of FIG. 5E further including inverters.

Alternatively, as shown in FIG. 5I, a plurality of inverters 581, 583 are electrically connected to the plurality of sense amplifiers 561, 563. Each inverter in the plurality of inverters 581, 583 has an input terminal and an output terminal. Input terminals of the inverters in the plurality of inverters 581, 583 are electrically connected to output terminals of sense amplifiers in the plurality of sense amplifiers 561, 563 and output terminals of the inverters in the plurality of inverters 581, 583 are electrically connected to a bus, a buffer, a level shift circuit, a test circuit, or a control circuit such as a processor, a controller, a programmable logic device, and an FGPA. It is noted that each inverter in the plurality of inverters 581, 583 can additionally have other terminals.

Figure 6A:
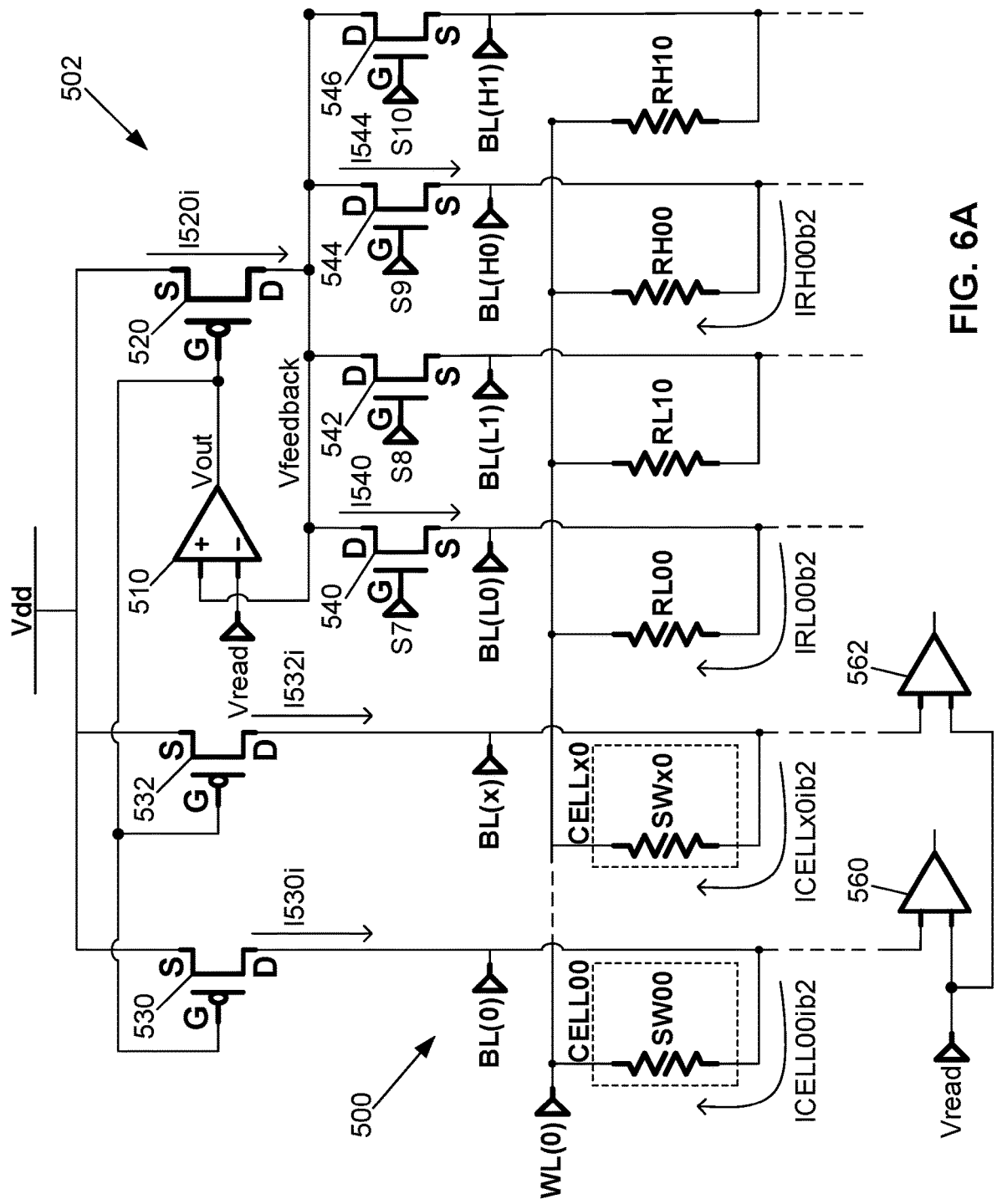
FIG. 6A illustrates a simplified schematic diagram showing current flow in the exemplary architecture of FIG. 5A during a READ operation, where a reduced version of the resistive change element array is shown so that current flow can be shown in greater detail.

The exemplary architecture for accessing at least one resistive change element in a resistive change element array using a resistance based on resistances of resistive reference elements to source an amount of current accessing resistive change elements through READ operations, SET VERIFY operations, and RESET VERIFY operations will be explained in detail below starting with READ operations. A READ operation of CELL00 in the exemplary architecture of FIG. 5A will be explained in detail below, and READ operations of each cell in the exemplary architecture of FIG. 5A can be performed in a similar manner to the READ operation of CELL00. FIG. 6A illustrates a simplified schematic diagram showing current flow, ignoring leakage currents, during a READ operation of CELL00 in the exemplary architecture of FIG. 5A. FIG. 6A shows a reduced version of the resistive change element array 500, so that current flow can be shown in greater detail. It is noted that READ operations of CELL00 explained in further detail below generally describe current flowing through CELL00 as flowing from the bit line BL(0) to the word line WL(0), however, the devices and methods of the present disclosure are not limited to current flow through the cells as flowing from the bit line to the word line. It is also noted that FIG. 6A can be referred to for a READ operation of CELL00 and for READ operations of each cell on the word line WL(0) performed at the same time because current flows through each PMOS transistor in the plurality of PMOS transistors 530, 532 and through each cell on the word line WL(0) for a READ operation of CELL00 and for READ operations of each cell on the word line WL(0) performed at the same time.

A READ operation of CELL00 starts, as similarly discussed above in step 402 of flow chart 400, by selecting CELL00 from the plurality of resistive change element cells CELL00-CELLxy in the resistive change element array 500. CELL00 is selected from the plurality of resistive change element cells CELL00-CELLxy by driving a voltage VWL(0) on the word line WL(0) to 0 volts or ground and driving the other word lines WL(1)-WL(y) to a read voltage Vread or a high impedance state. The voltage VWL(0) on the word line WL(0) and the read voltage Vread are design variables selected by a circuit designer. It is noted that although the voltage VWL(0) on the word line WL(0) is discussed as being driven to 0 volts or ground, the voltage VWL(0) on the word line WL(0) is not limited to being driven to 0 volts or ground and that the circuit designer can select other voltage levels for the voltage VWL(0) on the word line WL(0), such as a voltage level less than 0 volts and a voltage level greater than 0 volts. It is also noted that although the read voltage Vread is discussed as having a voltage level of 1 volt, the read voltage Vread is not limited to having a voltage level of 1 volt and that the circuit designer can select other voltage levels for the read voltage Vread, such as a voltage level greater than 1 volt and a voltage level less than 1 volt. It is further noted that the system voltage Vdd is a design variable selected by a circuit designer.

Selecting a resistance for an operation of the at least one resistive change element, as similarly discussed above in step 404 of flow chart 400, during a READ operation of CELL00 is carried out by turning on the first PMOS transistor 520, turning on one of the NMOS transistors 540, 542, and turning on one of the NMOS transistors 544, 546 to select an intermediate resistance Rinter for the READ operation of CELL00. Alternatively, when the first PMOS transistor 520 is already turned on, selecting a resistance for an operation of the at least one resistive change element, as similarly discussed above in step 404 of flow chart 400, during a READ operation of CELL00 is carried out by turning on one of the NMOS transistors 540, 542, and turning on one of the NMOS transistors 544, 546 to select an intermediate resistance Rinter for the READ operation of CELL00. FIG. 6A shows the first PMOS transistor 520, the NMOS transistor 540, and the NMOS transistor 544 turned on, however, the intermediate resistance Rinter also can be selected by turning on the first PMOS transistor 520, the NMOS transistor 542, and the NMOS transistor 546. When the first PMOS transistor 520, the NMOS transistor 540 and the NMOS transistor 544 are turned on, the circuit for sourcing an adjustable amount of current 502 is set to supply an amount of current Iinter that would flow through a resistive reference element having an intermediate resistance Rinter, a first terminal electrically connected to the feedback voltage Vfeedback, and a second terminal electrically connected to the voltage VWL(0) on the word line WL(0), which as discussed above is 0 volts or ground. The intermediate resistance Rinter can be determined by the following equation, Rinter=(Inverse of the proportion between the amount of the current I530$i$ supplied by the PMOS transistor 530 and the amount of the intermediate current I520$i$ supplied by the first PMOS transistor 520) ((RRL00×RRH00)/(RRL00+RRH00)) where RRL00 is the resistance of the low resistive reference element RL00 and RRH00 is the resistance of the high resistive reference element RH00. For example, when the resistance of the low resistive reference element RRL00=3 MΩ, the resistance of the high resistive reference element RRH00=8 MΩ, the inverse of the proportion between the amount of the current I530$i$ supplied by the PMOS transistor 530 and the intermediate current I520$i$ supplied by the first PMOS transistor 520 is 2, Rinter=(2)((3 MΩ×8 MΩ)/(3 MΩ+8 MΩ))=48/11 MΩ (i.e. approximately 4.36 MΩ).

The first PMOS transistor 520 is turned on when a gate to source voltage VGS of the first PMOS transistor 520 is less than a threshold voltage VT of the first PMOS transistor 520. The gate to source voltage of the first PMOS transistor 520 is determined by the difference between a gate voltage VG and a source voltage VS. The gate voltage VG of the first PMOS transistor 520 is the output voltage Vout of the differential amplifier 510 because the gate terminal of the first PMOS transistor 520 is electrically connected to the output terminal of the differential amplifier 510. The source voltage VS of the first PMOS transistor 520 is the system voltage Vdd because the source terminal of the first PMOS transistor 520 is electrically connected to a power supply, a voltage source, a driver circuit, or other device that supplies the system voltage Vdd. Thus, the gate to source voltage VGS of the first PMOS transistor 520 can be expressed by VGS=VG−VS, where the gate voltage VG is the output voltage Vout of the differential amplifier 510 and the source voltage VS is the system voltage Vdd.

The output voltage Vout of the differential amplifier 510 is determined by multiplying a gain of the differential amplifier 510 with the difference between a voltage of the non-inverting input and a voltage of the inverting input. The differential amplifier 510 has a gain of 1, however, the differential amplifier 510 is not limited to having a gain of 1. The gain of the differential amplifier 510 is a design variable selected by a circuit designer and the circuit designer can select other values for the gain of the differential amplifier 510, such as a gain of the differential amplifier 510 greater than 1 and a gain of the differential amplifier 510 less than 1. The voltage of the non-inverting input of the differential amplifier 510 is the feedback voltage Vfeedback because the non-inverting input terminal is electrically connected to the drain terminal of the first PMOS transistor 520 and the drain terminal of each NMOS transistor in the plurality of NMOS transistors 540, 542, 544, 546 through the feedback loop. The voltage of the inverting input of the differential amplifier 510 is the read voltage Vread because the inverting input terminal is electrically connected to a power supply, a voltage source, a driver circuit, a resistor divider, a test circuit, a control circuit such as a processor, a controller, a programmable logic device, and a FGPA, or other device that supplies the read voltage Vread. Thus, the output voltage Vout of the differential amplifier 510 can be expressed by Vout=Gain(Voltage of the Non-Inverting Input−Voltage of the Inverting Input), where the gain is 1, the voltage of the non-inverting input is the feedback voltage Vfeedback, and the voltage of non-inverting input is the read voltage Vread.

Substituting for the gain, the voltage of the non-inverting input, and the voltage of the inverting input, in the above equation for determining the output voltage Vout of the differential amplifier 510 provides Vout=Vfeedback−Vread and substituting Vfeedback−Vread for the gate voltage VG in the above equation for determining the gate to source voltage VGS of the first PMOS transistor 520 provides the equation VGS=Vfeedback−Vread−Vdd. As shown by this equation, the gate to source voltage VGS of the first PMOS transistor 520 changes when the feedback voltage Vfeedback changes because the voltage level of the read voltage Vread and the voltage level of the system voltage Vdd are generally constant. Thus, the first PMOS transistor 520 is turned on when the feedback voltage Vfeedback has a voltage level such that the gate to source voltage VGS of the first PMOS transistor 520 is less than a threshold voltage VT of the first PMOS transistor 520.

One of the NMOS transistors 540, 542, is turned on by a control signal S7 or S8 supplied by a test circuit or a control circuit such as a processor, a controller, a programmable logic device, and a FGPA, and the other of the NMOS transistors 540, 542, is turned off by a control signal S7 or S8 supplied by the test circuit or the control circuit. One of the NMOS transistors 544, 546, is turned on by a control signal S9 or S10 supplied by the test circuit or the control circuit and the other of the NMOS transistors 544, 546, is turned off by a control signal S9 or S10 supplied by the test circuit or the control circuit. FIG. 6A shows the NMOS transistors 540 and 544 turned on by the control signals S7 and S9 and the NMOS transistors 542 and 546 turned off by the control signal S8 and S10. The test circuit or the control circuit supplies the control signal S7 having a voltage level such that a gate to source voltage VGS for the NMOS transistor 540 is greater than a threshold voltage VT for the NMOS transistor 540, the control signal S8 having a voltage level such that a gate to source voltage VGS for the NMOS transistor 542 is less than a threshold voltage VT for the NMOS transistor 542, the control signal S9 having a voltage level such that a gate to source voltage VGS for the NMOS transistor 544 is greater than a threshold voltage VT for the NMOS transistor 544, and the control signal S10 having a voltage level such that a gate to source voltage VGS for the NMOS transistor 546 is less than a threshold voltage VT for the NMOS transistor 546.

When the first PMOS transistor 520, the NMOS transistor 540, and the NMOS transistor 544 are turned on, an intermediate current I520*i* flows through the first PMOS transistor 520, a current I540 flows into the bit line BL(L0) through the NMOS transistor 540, a current I544 flows into the bit line BL(H0) through the NMOS transistor 544, a current IRL00*b*2 flows from the bit line BL(L0) through the low resistive reference element RL00, a current IRH00*b*2 flows from the bit line BL(H0) through the high resistive reference element RH00, a voltage on the bit line BL(L0) is driven to the feedback voltage Vfeedback, and a voltage on the bit line BL(H0) is driven to the feedback voltage Vfeedback. FIG. 6A shows the intermediate current I520*i* flowing through the first PMOS transistor 520, the current I540 flowing through the NMOS transistor 540, the current I544 flowing through the NMOS transistor 544, the current IRL00*b*2 flowing through the low resistive reference element RL00, and the current IRH00*b*2 flowing through the high resistive reference element RH00. The current IRL00*b*2 flows through the low resistive reference element RL00 because the first terminal of the low resistive reference element RL00 is at the voltage VBL(L0) on the bit line BL(L0), which as discussed above is the feedback voltage Vfeedback, and the second terminal of the low resistive reference element RL00 is at the voltage VWL(0) on the word line WL(0), which as discussed above is ground or 0 volts. While, ignoring leakage currents, current does not flow through the other low resistive reference elements RL01-RL0*y* electrically connected to the bit line BL(L0) because the first terminals of the other low resistive reference elements RL01-RL0*y* are at the feedback voltage Vfeedback and the second terminals of the other low resistive reference elements RL01-RL0*y* are at the read voltage Vread or a high impedance state to prevent current flow. The current IRH00*b*2 flows through the high resistive reference element RH00 because the first terminal of the high resistive reference element RH00 is at the voltage VBL(H0) on the bit line BL(H0), which as discussed above is the feedback voltage Vfeedback, and the second terminal of the high resistive reference element RH00 is at the voltage VWL(0) on the word line WL(0), which as discussed above is ground or 0 volts. While, ignoring leakage currents, current does not flow through the other high resistive reference elements RH01-RH0*y* electrically connected to the bit line BL(H0) because the first terminals of the other high resistive reference elements RH01-RH0*y* are at the feedback voltage Vfeedback and the second terminals of the other high resistive reference elements RH01-RH0*y* are at the read voltage Vread or a high impedance state to prevent current flow. It is noted that, as discussed below, the feedback voltage Vfeedback is regulated such that the voltage level of the feedback voltage Vfeedback is approximately equal to the voltage level of the read voltage Vread.

The amount of the current IRL00*b*2, ignoring leakage currents, can be approximated using Ohm's Law as IRL00*b*2=VBL(L0)/RRL00, where VBL(L0) is the voltage on the bit line BL(L0) and RRL00 is the resistance of the low resistive reference element RL00. For example, when the voltage VBL(L0) is the feedback voltage Vfeedback of 1 volt and the low resistive reference element RL00 has a resistance of 3 MΩ, the amount of the current IRL00*b*2 can be approximated using Ohm's Law as IRL00*b*2=1 V/3 MΩ=⅓ µA. The amount of the current IRL00*b*2, ignoring leakage currents, is approximately equal to the amount of the current I540 supplied to the bit line BL(L0) by the NMOS transistor 540 because the amount of current flowing into the bit line BL(L0) is approximately equal to the amount of current flowing from the bit line BL(L0). The amount of the current IRH00*b*2, ignoring leakage currents, can be approximated using Ohm's Law as IRH00*b*2=VBL(H0)/RRH00, where VBL(H0) is the voltage on the bit line BL(H0) and RRH00 is the resistance of the high resistive reference element RH00. For example, when the voltage VBL(H0) is the feedback voltage Vfeedback of 1 volt and the high resistive reference element RH00 has a resistance of 8 MΩ, the amount of the current IRH00*b*2 can be approximated using Ohm's Law as IRH00*b*2=1 V/8 MΩ=⅛ µA. The amount of the current IRH00*b*2, ignoring leakage currents, is approximately equal to the amount of the current I544 supplied to the bit line BL(H0) by the NMOS transistor 544 because the amount of current flowing into the bit line BL(H0) is approximately equal to the amount of current flowing from the bit line BL(H0). The sum of the amount of the current I540 and the amount of the current I544 is approximately equal to the amount of the intermediate current I520*i* supplied by the first PMOS transistor 520 because the first PMOS transistor 520 is electrically connected in series with the plurality of NMOS transistors 540, 542, 544, 546. Thus, the sum of the amount of the current IRL00*b*2 and the amount of the current IRH00*b*2 is approximately equal to the amount of the intermediate current I520*i* supplied by the first PMOS transistor 520. Referring to the above examples, where the amount of the current IRL00*b*2 is ⅓ microamps and the amount of the current IRH00*b*2 is ⅛ microamps, the amount of the intermediate current I520*i* supplied by the first PMOS transistor 520 is 11/24 microamps. It is noted that leakage currents do not prevent the READ operation of CELL00 when the leakage currents are much less than the sum of the currents IRL00*b*2 and IRH00*b*2.

It is noted that when the NMOS transistor 542 is turned on instead of the NMOS transistor 540, a current I542 flows into the bit line BL(L1) through the NMOS transistor 542, a current IRL10*b*2 flows from the bit line BL(L1) through the low resistive reference element RL10, and a voltage on the bit line BL(L1) is driven to the feedback voltage Vfeedback. The current IRL10*b*2 flows through the low resistive reference element RL10 because the first terminal of the low resistive reference element RL10 is at the voltage VBL(L1) on the bit line BL(L1), which as discussed above is the feedback voltage Vfeedback, and the second terminal of the low resistive reference element RL10 is at the voltage VWL(0), which as discussed above is ground or 0 volts. While, ignoring leakage currents, current does not flow through the other low resistive reference elements RL11-RL1*y* electrically connected to the bit line BL(L1) because the first terminals of the other low resistive reference elements RL11-RL1*y* are at the feedback voltage Vfeedback and the second terminals of the other low resistive reference elements RL11-RL1*y* are at the read voltage Vread or a high impedance state to prevent current flow. It is further noted that the current I542 flowing through the NMOS transistor 542 is approximately equal to the current I540 discussed above because the voltage level of the control signal S8 for turning on the NMOS transistor 542 is approximately equal to the voltage level of the control signal S7 for turning on the NMOS transistor 540 and the NMOS transistors 540, 542 have approximately the same features. It is even further noted that the current IRL10b2 flowing through the low resistive reference element RL10 is approximately equal to the current IRL00b2 discussed above because the low resistive reference elements RL00, RL10 have approximately the same resistances.

It is noted that when the NMOS transistor 546 is turned on instead of the NMOS transistor 544, a current I546 flows into the bit line BL(H1) through the NMOS transistor 546, a current IRH10b2 flows from the bit line BL(H1) through the high resistive reference element RH10, and a voltage on the bit line BL(H1) is driven to the feedback voltage Vfeedback. The current IRH10b2 flows through the high resistive reference element RH10 because the first terminal of the high resistive reference element RH10 is at the voltage VBL(H1) on the bit line BL(H1), which as discussed above is the feedback voltage Vfeedback, and the second terminal of the high resistive reference element RH10 is at the voltage VWL(0), which as discussed above is ground or 0 volts. While, ignoring leakage currents, current does not flow through the other high resistive reference elements RH11-RH1y electrically connected to the bit line BL(H1) because the first terminals of the other high resistive reference elements RH11-RH1y are at the feedback voltage Vfeedback and the second terminals of the other high resistive reference elements RH11-RH1y are at the read voltage Vread or a high impedance state to prevent current flow. It is further noted that the current I546 flowing through the NMOS transistor 546 is approximately equal to the current I544 discussed above because the voltage level of the control signal S10 for turning on the NMOS transistor 546 is approximately equal to the voltage level of the control signal S9 for turning on the NMOS transistor 544 and the NMOS transistors 544, 546 have approximately the same features. It is even further noted that the current IRH10b2 flowing through the high resistive reference element RH10 is approximately equal to the current IRH00b2 discussed above because the high resistive reference elements RH00, RH10 have approximately the same resistances.

Supplying an amount of current for the operation based on the resistance for the operation, as similarly discussed above in step 406 of flow chart 400, during the READ operation of CELL00 is carried out by the PMOS transistor 530 supplying a current I530i that generally corresponds with the amount of current Iinter. Alternatively, when the circuit for sourcing an adjustable amount of current 502 additionally includes a plurality of FETs electrically connected in series with the plurality of PMOS transistors 530, 532, as discussed above, supplying an amount of current for the operation based on the resistance for the operation, as similarly discussed above in step 406 of flow chart 400, during the READ operation of CELL00 is carried out by turning on the FET electrically connected in series with the PMOS transistor 530 and the PMOS transistor 530 supplying a current I530i that generally corresponds with the amount of current Iinter. As discussed above, the amount of current Inter is the amount of current that would flow through a resistive reference element having an intermediate resistance Rinter, a first terminal electrically connected to the feedback voltage Vfeedback, and a second terminal electrically connected to the voltage VWL(0) on the word line WL(0), which as discussed above is 0 volts or ground. The amount of current Iinter can be determined using Ohm's Law as Iinter=(Vfeedback−VWL(0))/Rinter, where Vfeedback is the feedback voltage, VWL(0) is the voltage on the word line WL(0), and Rinter is the intermediate resistance.

For example, when Vfeedback=1V, VWL(0)=0V, Rinter=48/11 MΩ, Iinter=(1V−0V)/(48/11 MΩ)=11/48 µA.

The PMOS transistor 530 is turned on when a gate to source voltage VGS of the PMOS transistor 530 is less than a threshold voltage VT for the PMOS transistor 530. The gate to source voltage VGS of the PMOS transistor 530 is determined by the difference between a gate voltage VG and a source voltage VS. The gate voltage VG of the PMOS transistor 530 is the output voltage Vout of the differential amplifier 510 because the gate terminal of the PMOS transistor 530 is electrically connected to the output terminal of the differential amplifier 510. The source voltage VS of the PMOS transistor 530 is the system voltage Vdd because the source terminal of the PMOS transistor 530 is electrically connected a power supply, a voltage source, a driver circuit, or other device that supplies the system voltage Vdd. Thus, the gate to source voltage VGS of the PMOS transistor 530 can be expressed by VGS=VG−VS, where the gate voltage VG is the output voltage Vout of the differential amplifier 510 and the source voltage VS is the system voltage Vdd. Further, the gate to source voltage VGS of the PMOS transistor 530 is approximately equal to the gate to source voltage VGS of the first PMOS transistor 520 because the gate voltages of the PMOS transistor 530 and the first PMOS transistor 520 are the output voltage Vout of the differential amplifier 510 and the source voltages of the PMOS transistor 530 and the first PMOS transistor 520 are the system voltage Vdd.

As discussed above, the output voltage Vout of the differential amplifier 510 can be expressed by Vout=Vfeedback−Vread and substituting Vfeedback−Vread for the gate voltage VG in the above equation for determining the gate to source voltage VGS of the PMOS transistor 530 provides the equation VGS=Vfeedback−Vread−Vdd. As shown by this equation, the gate to source voltage VGS of the PMOS transistor 530 changes when the feedback voltage Vfeedback changes because the voltage level of the read voltage Vread and the voltage level of the system voltage Vdd are generally constant. Thus, the PMOS transistor 530 is turned on when the feedback voltage Vfeedback has a voltage level such that the gate to source voltage VGS of the PMOS transistor 530 is less than a threshold voltage VT of the PMOS transistor 530.

The amount of the current I530i supplied by the PMOS transistor 530 is proportional to the amount of the intermediate current I520i supplied by the first PMOS transistor 520. The proportion between the amount of the current I530i supplied by the PMOS transistor 530 and the amount of the intermediate current I520i supplied by the first PMOS transistor 520 is a design variable selected by a circuit designer. The circuit designer can select the proportion between the amount of the current I530i supplied by the PMOS transistor 530 and the amount of the intermediate current I520i supplied by the first PMOS transistor 520 by selecting the features of the PMOS transistor 530 and the features of the first PMOS transistor 520. The proportion between the amount of the current I530i supplied by the PMOS transistor 530 and the amount of the intermediate current I520i supplied by the first PMOS transistor 520 is selected as 0.5 by selecting a width to length ratio of the PMOS transistor 530 that is approximately 0.5 a width to length ratio of the first PMOS transistor 520. However, the proportion is not limited to 0.5 and the circuit designer can select other values for the proportion, such as a proportion greater than 0.5 and a proportion less than 0.5. Further, the circuit designer can select other features of the PMOS transistor 530 and the first PMOS transistor 520 to achieve the desired proportion between the amount of the current I530i supplied by the PMOS transistor 530 and the amount of the intermediate current I520i supplied by the first PMOS transistor 520. For example, the circuit designer can select other dimensions of the PMOS transistors, layouts of the PMOS transistors, and materials for fabricating the PMOS transistors to achieve the desired proportion between the amount of the current I530i supplied by the PMOS transistor 530 and the amount of the intermediate current I520i supplied by the first PMOS transistor 520. It is noted that when other types of field effect transistors are used in place of the first PMOS transistor 520 and the plurality of PMOS transistor 530, 532 the circuit designer can also select dimensions, layouts, and materials for fabricating the other types of field effect transistors to achieve the desired proportion between currents.

When the proportion between the amount of the current I530i supplied by the PMOS transistor 530 and the amount of the intermediate current I520i supplied by the first PMOS transistor 520 is selected based on the width to length ratios of the PMOS transistor 530 and the first PMOS transistor 520, the amount of the current I530i can be approximated by the following equation, I530i=(IRL00b2+IRH00b2)((Channel Width of PMOS 530/Channel Length of PMOS 530)/(Channel Width of PMOS 520/Channel Length of PMOS 520)), where IRL00b2 is the amount of current flowing through the low resistive reference element RL00 and IRH00b2 is the amount of current flowing through the high resistive reference element RH00. For example, when the current IRL00b2 is ⅓ microamps, the current IRH00b2 is ⅛ microamps, and the width to length ratio of the PMOS transistor 530 is 0.5 the width to length ratio of the first PMOS transistor 520, the current I530i=(⅓ μA+⅛ μA) (0.5)=11/48 μA.

It is noted that the amount of the current I530i supplied by the PMOS transistor 530 can be an average of the currents flowing through the plurality of NMOS transistors 540, 542, 544, 546 by turning on at the same time a number of the NMOS transistors that matches the inverse of the proportion between the amount of the current I530i supplied by the PMOS transistor 530 and the amount of the intermediate current I520i supplied by the first PMOS transistor 520. For example, when the proportion between the amount of the current I530i supplied by the PMOS transistor 530 and the amount of the intermediate current I520i supplied by the first PMOS transistor 520 is 0.5, the inverse of the proportion is 2, and the amount of the current I530i can be an average of the current flowing through the plurality of NMOS transistors 540, 542, 544, 546 by turning on at the same time 2 of the NMOS transistors. For example, when the NMOS transistors 540, 544 are turned on at the same time, the NMOS transistors 542, 546 are turned off, the current I540=⅓ microamps, the current I544=⅛ microamps, and the proportion between the amount of the current I530i supplied by the PMOS transistor 530 and the intermediate current I520i supplied by the first PMOS transistor 520 is 0.5, the current I530i is I530i=(I540+I544)/2=(⅓ μA+⅛ μA)/2=11/48 μA.

The current I530i supplied by the PMOS transistor 530 flows into the bit line BL(0) and a current ICELL00ib2 flows from the bit line BL(0) through CELL00. FIG. 6A shows the current I530i flowing through the PMOS transistor 530 and the current ICELL00ib2 flowing through CELL00. The current ICELL00ib2 flows through CELL00 because the first terminal of the resistive change element SW00 within CELL00 is at a voltage VBL(0) on the bit line BL(0) and the second terminal of the resistive change element SW00 is at the voltage VWL(0) on the word line WL(0), which as discussed above is ground or 0 volts. While, ignoring leakage currents, current does not flow through the other resistive change element cells CELL01-CELL0y on the bit line BL(0) because the first terminals of the resistive change elements SW01-SW0y within the other resistive change element cells CELL01-CELL0y are at the voltage VBL(0) on the bit line BL(0) and the second terminals of the resistive change elements SW01-SW0y are at the read voltage Vread or a high impedance state to prevent current flow. The amount of the current ICELL00ib2, ignoring leakage currents, is approximately equal to the amount of the current I530i supplied to the bit line BL(0) by the PMOS transistor 530 because the amount of current flowing into the bit line BL(0) is approximately equal to the amount of current flowing from the bit line BL(0). Further, the amount of the current ICELL00ib2 is approximately equal to the average of the amount of the current I540 flowing through the NMOS transistor 540 and the current I544 flowing through the NMOS transistor 544. It is noted that leakage currents do not prevent a READ operation of CELL00 when the leakage currents are much less than the amount of the current ICELL00ib2.

The voltage VBL(0) on the bit line BL(0), ignoring leakage currents, can be approximated using Ohm's Law as VBL(0)=ICELL00ib2×RCELL00, where the current ICELL00ib2 is the current flowing through CELL00 and RCELL00 is the resistance of the resistive change element SW00 within CELL00. As shown by this equation, the voltage VBL(0) on the bit line BL(0) changes when the resistance of the resistive change element SW00 changes because the current flowing through CELL00 is generally constant. For example, when IRL00b2=⅓ μA, IRH00b2=⅛ μA, ICELL00ib2=11/48 μA, and RCELL00=48/11 MΩ, the voltage VBL(0)=11/48 μA×48/11 MΩ=1 V. For example, when IRL00b2=⅓ μA, IRH00b2=⅛ μA, ICELL00ib2=11/48 μA, and RCELL00=1 MΩ, the voltage VBL(0)=11/48 μA×1 MΩ=11/48 V. For example, when IRL00b2=⅓ μA, IRH00b2=⅛ μA, ICELL00ib2=11/48 μA, and RCELL00=10 MΩ, the voltage VBL(0)=11/48 μA×10 MΩ=110/48 V.

It is noted that when the voltage VBL(0) on the bit line BL(0) is less than the read voltage Vread and the word lines WL(1)-WL(y) electrically connected to the other resistive change element cells CELL01-CELL0y on the bit line BL(0) are driven to the read voltage Vread, leakage currents flow into the bit line BL(0) through the other resistive change element cells CELL01-CELL0y and pull up the voltage VBL(0) on the bit line BL(0). It is also noted that when the voltage VBL(0) on the bit line BL(0) is greater than the read voltage Vread and the word lines WL(1)-WL(y) electrically connected to the other resistive change element cells CELL01-CELL0y on the bit line BL(0) are driven to the read voltage Vread, leakage currents flow from the bit line BL(0) through the other resistive change element cells CELL01-CELL0y and pull down the voltage VBL(0) on the bit line BL(0). It is further noted that when the voltage VBL(0) on the bit line BL(0) is pulled up by leakage currents flowing into the bit line BL(0) from the word lines WL(1)-WL(y) and when the voltage VBL(0) on the bit line BL(0) is pulled down by leakage currents flowing from the bit line BL(0) into the word lines WL(1)-WL(y), the number of the word lines WL(1)-WL(y) should be small enough to allow a margin to determine a resistive state of the selected resistive change element SW00.

Determining a resistive state of the at least one resistive change element based on a resistance of the at least one resistive change element and the resistance for the operation, as similarly discussed above in step 408 of flow chart 400, during the READ operation of CELL00 is carried out by determining the resistive state of the resistive change element SW00 by comparing the voltage VBL(0) on the bit line BL(0) with the read voltage Vread. As discussed above, the voltage VBL(0) on the bit line BL(0) is determined by the amount of the current ICELL00$ib2$ and the resistance of the resistive change element SW00. The voltage VBL(0) on the bit line BL(0) is indicative of the resistive state of the resistive change element SW00 because the amount of current ICELL00$ib2$ is approximately the same for both a low resistive state and a high resistive state of the resistive change element SW00, while, the resistance of the resistive change element SW00 is different for a low resistive state and a high resistive state. The read voltage Vread is indicative of the intermediate resistance Rinter for the READ operation of CELL00 because the read voltage Vread is equal to the amount of the current ICELL00$ib2$ multiplied by the intermediate resistance Rinter. For example, when ICELL00$ib2$=11/48 µA, Rinter=48/11 MΩ, Vread=11/48 µA×48/11 MΩ=1 V. When the voltage VBL(0) on the bit line BL(0) is less than or equal to the read voltage Vread (i.e. the voltage VBL(0) on the bit line BL(0)≤Vread) the resistance of the resistive change element SW00 is less than or equal to the intermediate resistance Rinter (i.e. RCELL00≤Rinter, where RCELL00 is the resistance of the resistive change element SW00 within CELL00) and the resistive state of the resistive change element SW00 is determined to be a low resistive state. When the voltage VBL(0) on the bit line BL(0) is greater than the read voltage Vread (i.e. the voltage VBL(0) on the bit line BL(0)>Vread) the resistance of the resistive change element SW00 is greater than the intermediate resistance Rinter (i.e. RCELL00>Rinter, where RCELL00 is the resistance of the resistive change element SW00 within CELL00) and the resistive state of resistive change element SW00 is determined to be a high resistive state.

The sense device 560 receives the voltage VBL(0) on the bit line BL(0) on a first input terminal because the first input terminal is electrically connected to the bit line BL(0) and receives the read voltage Vread on a second input terminal because the second input terminal is electrically connected to a power supply, a voltage source, a driver circuit, a resistor divider, a test circuit, a control circuit such as a processor, a controller, a programmable logic device, and a FGPA, or other device that supplies the read voltage Vread. The sense device 560 determines the resistive state of the resistive change element SW00 by comparing the voltage VBL(0) on the bit line BL(0) with the read voltage Vread. The sense device 560 outputs a signal indicative of the resistive state of the resistive change element SW00 on an output terminal. When the voltage VBL(0) on the bit line BL(0) is less than or equal to the read voltage Vread, the sense device 560 outputs a signal indicating the resistive change element SW00 has a low resistive state. When the voltage VBL(0) on the bit line BL(0) is greater than the read voltage Vread, the sense device 560 outputs a signal indicating the resistive change element SW00 has a high resistive state. For example, when ICELL00$ib2$=11/48 microamps, RCELL00=1 MΩ, VBL(0)=11/48 V, and Vread=1 V, the sense device 560 outputs a signal indicating that the resistive change element SW00 has a low resistive state (corresponding, typically, to a logic 1, a SET state). For example, when ICELL00$ib2$=11/48 microamps, RCELL00=48/11 MΩ, VBL(0)=1 V, and Vread=1 V, the sense device 560 outputs a signal indicating that the resistive change element SW00 has a low resistive state (corresponding, typically, to a logic 1, a SET state). For example, when ICELL00$ib2$=11/48 microamps, RCELL00=10 MΩ, VBL(0)=110/48 V, and Vread=1 V, the sense device 560 outputs a signal indicating that the resistive change element SW00 has a high resistive state (corresponding, typically, to a logic 0, a RESET state). It is noted that when the plurality of sense devices 560, 562 are electrically connected to the plurality of amplifier 570, 572 as shown in FIGS. 5B and 5D, the plurality of sense devices 560, 562 determine the resistive states of the resistive change elements SW00-SWxy by comparing amplified voltages with a selected voltage, such as the read voltage Vread.

Alternatively, the plurality of sense devices 560, 562 are omitted from the exemplary architecture shown in FIGS. 5A-5D and a test circuit, a logic circuit, or a control circuit such as a processor, a controller, a programmable logic device, and a FGPA, is electrically connected to the bit lines BL(0)-BL(x) to receive the voltages on the bit lines BL(0)-BL(x) or is electrically connected to the plurality of amplifiers 570, 572 to receive amplified voltages. When the test circuit, the logic circuit, or the control circuit is electrically connected to the bit lines BL(0)-BL(x), the test circuit, the logic circuit, or the control circuit determines the resistive states of the resistive change elements SW00-SWxy by comparing the voltages on the bit lines BL(0)-BL(x) with the read voltage Vread or a stored value corresponding to the read voltage Vread. For example, for a READ operation of CELL00 when the test circuit, the logic circuit, or the control circuit is electrically connected to the bit lines BL(0)-BL(x), the test circuit, the logic circuit, or the control circuit determines the resistive state of the resistive change element SW00 by comparing the voltage VBL(0) on the bit line BL(0) with the read voltage Vread or a stored value corresponding to the read voltage Vread. When the test circuit, the logic circuit, or the control circuit is electrically connected to the plurality of amplifiers 570, 572, the test circuit, the logic circuit, or the control circuit determines the resistive states of the resistive change elements SW00-SWxy by comparing the amplified voltages with a selected voltage, such as the read voltage Vread, or a stored value corresponding to the selected voltage, such as the read voltage Vread. Additionally, the test circuit, the logic circuit, or the control circuit can output signals indicative of the resistive states of the resistive change elements SW00-SWxy.

Further, the circuit for sourcing an adjustable amount of current 502 compensates for the circuit conditions of the resistive change element array 500 by regulating the feedback voltage Vfeedback to be approximately equal to the read voltage Vread. The feedback voltage Vfeedback reflects the circuit conditions of the resistive change element array 500 because the feedback voltage Vfeedback is based on the amount of the intermediate current I520$i$ flowing through the first PMOS transistor 520 and the amount of the intermediate current I520$i$ is impacted by the circuit conditions of the resistive change element array 500. For example, changes in the resistances of the low resistive reference elements RL00-RL1$y$ and changes in the resistances of the high resistive reference elements RH00-RH1$y$ due to temperature, leakage currents, and parasitic impedances, can impact the amount of the intermediate current I520$i$. The feedback voltage Vfeedback is supplied to the non-inverting input of the differential amplifier 510 and, as discussed above, the gate voltage VG of the first PMOS transistor 520 is the output voltage Vout of the differential amplifier 510 and the source voltage VS of the first PMOS transistor 520 is the system voltage Vdd. The gate to source voltage VGS of the first PMOS transistor 520 regulates the amount of the intermediate current I520$i$ flowing through the first PMOS transistor 520 and the differential amplifier 510 adjusts the gate to source voltage VGS of the first PMOS transistor 520 so that the amount of the intermediate current I520i adjusts the feedback voltage Vfeedback to be approximately equal to the read voltage Vread. Also, as discussed above, the amount of the current I530i supplied by the PMOS transistor 530 is proportional to the amount of the intermediate current I520i supplied by the first PMOS transistor 520. Thus, adjusting the amount of the intermediate current I520i supplied by the first PMOS transistor 520 to compensate for circuit conditions of the resistive change element array 500 proportionally adjusts the amount of the current I530i supplied by the PMOS transistor 530 to compensate for circuit conditions of the resistive change element array 500.

Additionally, READ operations of each resistive change element cell CELL00-CELLx0 on the word line WL(0) can be performed at the same time because each PMOS transistor in the plurality of PMOS transistors 530, 532 supplies approximately the same amount of current to a bit line BL(0)-BL(x) at the same time. Each PMOS transistor in the plurality of PMOS transistors 530, 532 supplies approximately the same amount of current for READ operations because each PMOS transistor in the plurality of PMOS transistors 530, 532 has approximately the same features and approximately the same gate to source voltage VGS. FIG. 6A shows the PMOS transistor 530 supplying a current I530i to the bit line BL(0), the PMOS transistor 532 supplying a current I532i to the bit line BL(x), a current ICELL00ib2 flowing from the bit line BL(0) through CELL00, and a current ICELLx0ib2 flowing from the bit line BL(x) through CELLx0. READ operations of each resistive change element cell CELL00-CELLx0 on the word line WL(0) are performed in a similar manner to the READ operation of CELL00, discussed above. Performing READ operations of each cell on a word line at the same time can be highly desirable in certain application where rapid data READ operations or page mode READ operations are required.

Figure 6B:
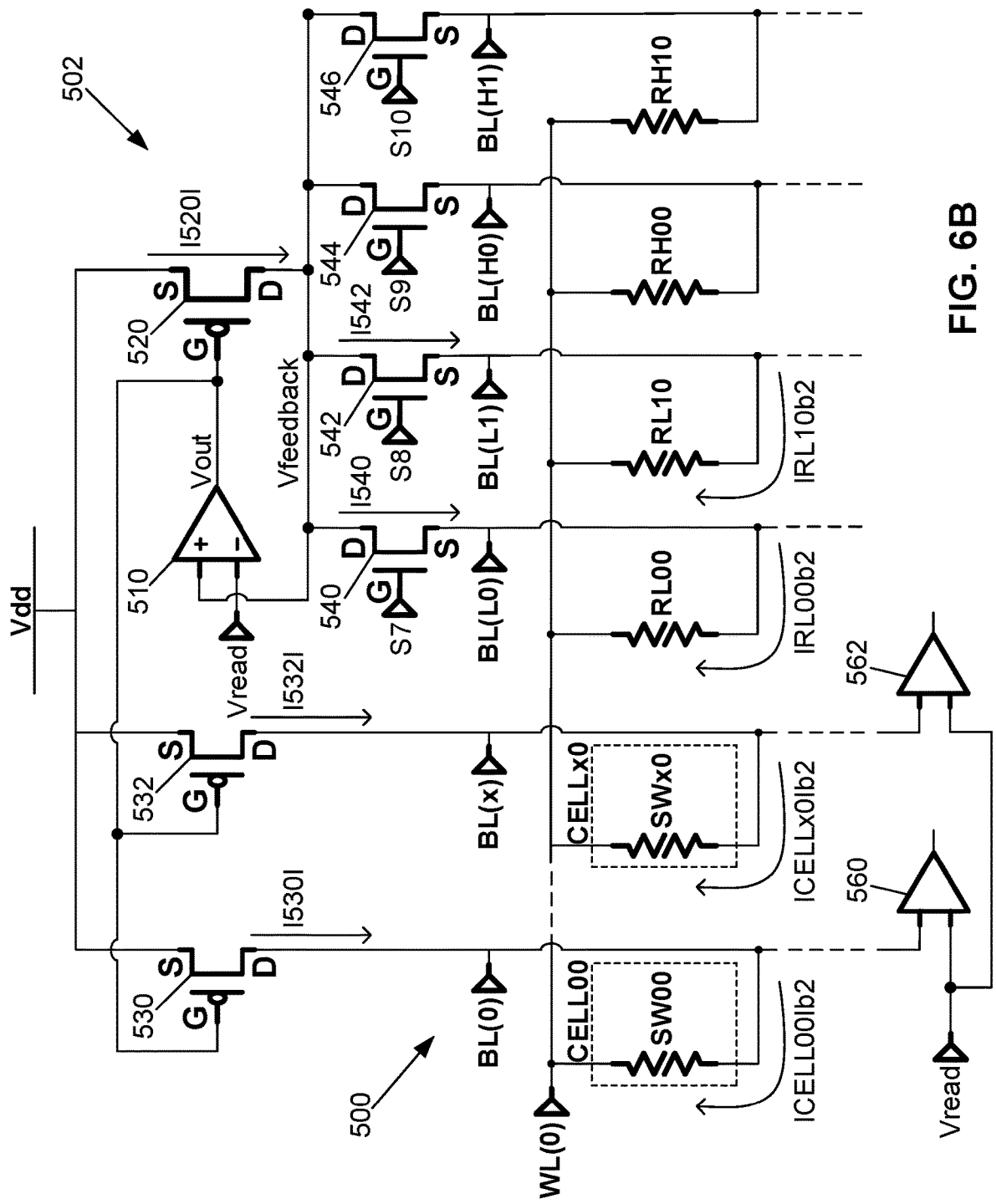
FIG. 6B illustrates a simplified schematic diagram showing current flow in the exemplary architecture of FIG. 5A during a SET VERIFY operation, where a reduced version of the resistive change element array is shown so that current flow can be shown in greater detail.

A SET VERIFY operation of CELL00 in the exemplary architecture of FIG. 5A will be explained in detail below, and SET VERIFY operations of each cell in the exemplary architecture of FIG. 5A can be performed in a similar manner to the SET VERIFY operation of CELL00. FIG. 6B illustrates a simplified schematic diagram showing current flow, ignoring leakage currents, during a SET VERIFY operation of CELL00 in the exemplary architecture of FIG. 5A. FIG. 6B shows a reduced version of the resistive change element array 500, so that current flow can be shown in greater detail. It is noted that SET VERIFY operations of CELL00 explained in further detail below generally describe current flowing through CELL00 as flowing from the bit line BL(0) to the word line WL(0), however, the devices and methods of the present disclosure are not limited to current flow through the cells as flowing from the bit line to the word line. It is also noted that FIG. 6B can be referred to for a SET VERIFY operation of CELL00 and for SET VERIFY operations of each cell on the word line WL(0) performed at the same time because current flows through each PMOS transistor in the plurality of PMOS transistors 530, 532 and through each cell on the word line WL(0) for a SET VERIFY operation of CELL00 and for SET VERIFY operations of each cell on the word line WL(0) performed at the same time.

A SET VERIFY operation of CELL00 starts, as similarly discussed above in step 402 of flow chart 400, by selecting CELL00 from the plurality of resistive change element cells CELL00-CELLxy in the resistive change element array 500. CELL00 is selected from the plurality of resistive change element cells CELL00-CELLxy by driving a voltage VWL (0) on the word line WL(0) to 0 volts or ground and driving the other word lines WL(1)-WL(y) to a read voltage Vread or a high impedance state. The voltage VWL(0) on the word line WL(0) and the read voltage Vread are design variables selected by a circuit designer. It is noted that although the voltage VWL(0) on the word line WL(0) is discussed as being driven to 0 volts or ground, the voltage VWL(0) on the word line WL(0) is not limited to being driven to 0 volts or ground and that the circuit designer can select other voltage levels for the voltage VWL(0) on the word line WL(0), such as a voltage level less than 0 volts and a voltage level greater than 0 volts. It is also noted that although the read voltage Vread is discussed as having a voltage level of 1 volt, the read voltage Vread is not limited to having a voltage level of 1 volt and that the circuit designer can select other voltage levels for the read voltage Vread, such as a voltage level greater than 1 volt and a voltage level less than 1 volt. It is further noted that the system voltage Vdd is a design variable selected by a circuit designer.

Selecting a resistance for an operation of the at least one resistive change element, as similarly discussed above in step 404 of flow chart 400, during a SET VERIFY operation of CELL00 is carried out by turning on the first PMOS transistor 520, the NMOS transistor 540, and the NMOS transistor 542 to select a low resistance Rlow for the SET VERIFY operation of CELL00. Alternatively, when the first PMOS transistor 520 is already turned on, selecting a resistance for an operation of the at least one resistive change element, as similarly discussed above in step 404 of flow chart 400, during a SET VERIFY operation of CELL00 is carried out by turning on the NMOS transistor 540 and the NMOS transistor 542 to select a low resistance Rlow for the SET VERIFY operation of CELL00. When the first PMOS transistor 520, the NMOS transistor 540, and the NMOS transistor 542 are turned on, the circuit for sourcing an adjustable amount of current 502 is set to supply an amount of current Ilow that would flow through a resistive reference element having a low resistance Rlow, a first terminal electrically connected to the feedback voltage Vfeedback and a second terminal electrically connected to the voltage VWL(0) on the word line WL(0), which as discussed above is 0 volts or ground. The low resistance Rlow can be determined by the following equation, Rlow=(Inverse of the proportion between the amount of the current I530l supplied by the PMOS transistor 530 and the amount of the large current I520l supplied by the first PMOS transistor 520) ((RRL00×RRL10)/(RRL00+RRL10)) where RRL00 is the resistance of the low resistive reference element RL00 and RRL10 is the resistance of the low resistive reference element RL10. It is noted that when the resistance of the low resistive reference element RL00 and the resistance of the low resistive reference element RL10 are approximately the same, the resistance of the low resistive reference element RL00, the resistance of the low resistive reference element RL10, and the low resistance Rlow are approximately the same. For example, when the resistance of the low resistive reference element RRL00=3 MΩ, the resistance of the low resistive reference element RRL10=3 MΩ, the inverse of the proportion between the amount of the current I530l supplied by the PMOS transistor 530 and the large current I520l supplied by the first PMOS transistor 520 is 2, Rlow=(2)((3 MΩ×3 MΩ)/(3 MΩ+3 MΩ))=3 MΩ.

The first PMOS transistor 520 is turned on when a gate to source voltage VGS of the first PMOS transistor 520 is less than a threshold voltage VT of the first PMOS transistor 520. The gate to source voltage of the first PMOS transistor 520 is determined by the difference between a gate voltage VG and a source voltage VS. The gate voltage VG of the first PMOS transistor 520 is the output voltage Vout of the differential amplifier 510 because the gate terminal of the first PMOS transistor 520 is electrically connected to the output terminal of the differential amplifier 510. The source voltage VS of the first PMOS transistor 520 is the system voltage Vdd because the source terminal of the first PMOS transistor 520 is electrically connected to a power supply, a voltage source, a driver circuit, or other device that supplies the system voltage Vdd. Thus, the gate to source voltage VGS of the first PMOS transistor 520 can be expressed by VGS=VG−VS, where the gate voltage VG is the output voltage Vout of the differential amplifier 510 and the source voltage VS is the system voltage Vdd.

The output voltage Vout of the differential amplifier 510 is determined by multiplying a gain of the differential amplifier 510 with the difference between a voltage of the non-inverting input and a voltage of the inverting input. The differential amplifier 510 has a gain of 1, however, the differential amplifier 510 is not limited to having a gain of 1. The gain of the differential amplifier 510 is a design variable selected by a circuit designer and the circuit designer can select other values for the gain of the differential amplifier 510, such as a gain of the differential amplifier 510 greater than 1 and a gain of the differential amplifier 510 less than 1. The voltage of the non-inverting input of the differential amplifier 510 is the feedback voltage Vfeedback because the non-inverting input terminal is electrically connected to the drain terminal of the first PMOS transistor 520 and the drain terminal of each NMOS transistor in the plurality of NMOS transistors 540, 542, 544, 546 through the feedback loop. The voltage of the inverting input of the differential amplifier 510 is the read voltage Vread because the inverting input terminal is electrically connected to a power supply, a voltage source, a driver circuit, a resistor divider, a test circuit, a control circuit such as a processor, a controller, a programmable logic device, and a FGPA, or other device that supplies the read voltage Vread. Thus, the output voltage Vout of the differential amplifier 510 can be expressed by Vout=Gain(Voltage of the Non-Inverting Input−Voltage of the Inverting Input), where the gain is 1, the voltage of the non-inverting input is the feedback voltage Vfeedback, and the voltage of inverting input is the read voltage Vread.

Substituting for the gain, the voltage of the non-inverting input, and the voltage of the inverting input, in the above equation for determining the output voltage Vout of the differential amplifier 510 provides Vout=Vfeedback−Vread and substituting Vfeedback−Vread for the gate voltage VG in the above equation for determining the gate to source voltage VGS of the first PMOS transistor 520 provides the equation VGS=Vfeedback−Vread−Vdd. As shown by this equation, the gate to source voltage VGS of the first PMOS transistor 520 changes when the feedback voltage Vfeedback changes because the voltage level of the read voltage Vread and the voltage level of the system voltage Vdd are generally constant. Thus, the first PMOS transistor 520 is turned on when the feedback voltage Vfeedback has a voltage level such that the gate to source voltage VGS of the first PMOS transistor 520 is less than a threshold voltage VT of the first PMOS transistor 520.

The NMOS transistors 540, 542 are turned on by control signals S7-S8 supplied by a test circuit or a control circuit such as a processor, a controller, a programmable logic device, and a FGPA, and the NMOS transistors 544, 546 are turned off by control signals S9-S10 supplied by the test circuit or the control circuit. The test circuit or the control circuit supplies the control signal S7 having a voltage level such that a gate to source voltage VGS for the NMOS transistor 540 is greater than a threshold voltage VT for the NMOS transistor 540, the control signal S8 having a voltage level such that a gate to source voltage VGS for the NMOS transistor 542 is greater than a threshold voltage VT for the NMOS transistor 542, the control signal S9 having a voltage level such that a gate to source voltage VGS for the NMOS transistor 544 is less than a threshold voltage VT for the NMOS transistor 544, and the control signal S10 having a voltage level such that a gate to source voltage VGS for the NMOS transistor 546 is less than a threshold voltage VT for the NMOS transistor 546.

When the first PMOS transistor 520, the NMOS transistor 540, and the NMOS transistor 542 are turned on, a large current I520*l* flows through the first PMOS transistor 520, a current I540 flows into the bit line BL(L0) through the NMOS transistor 540, a current I542 flows into the bit line BL(L1) through the NMOS transistor 542, a current IRL00*b*2 flows from the bit line BL(L0) through the low resistive reference element RL00, a current IRL10*b*2 flows from the bit line BL(L1) through the low resistive reference element RL10, a voltage on the bit line BL(L0) is driven to the feedback voltage Vfeedback, and a voltage on the bit line BL(L1) is driven to the feedback voltage Vfeedback. FIG. 6B shows the large current I520*l* flowing through the first PMOS transistor 520, the current I540 flowing through the NMOS transistor 540, the current I542 flowing through the NMOS transistor 542, the current IRL00*b*2 flowing through the low resistive reference element RL00, and the current IRL10*b*2 flowing through the low resistive reference element RL10. The current IRL00*b*2 flows through the low resistive reference element RL00 because the first terminal of the low resistive reference element RL00 is at the voltage VBL(L0) on the bit line BL(L0), which as discussed above the feedback voltage Vfeedback, and the second terminal of the low resistive reference element RL00 is at the voltage VWL(0) on the word line WL(0), which as discussed above is ground or 0 volts. While, ignoring leakage currents, current does not flow through the other low resistive reference elements RL01-RL0*y* electrically connected to the bit line BL(L0) because the first terminals of the other low resistive reference elements RL01-RL0*y* are at the feedback voltage Vfeedback and the second terminals of the other low resistive reference elements RL01-RL0*y* are at the read voltage Vread or a high impedance state to prevent current flow. The current IRL10*b*2 flows through the low resistive reference element RL10 because the first terminal of the low resistive reference element RL10 is at the voltage VBL(L1), which as discussed above is the feedback voltage Vfeedback, and the second terminal of the low resistive reference element RL10 is at the voltage VWL(0), which as discussed above is ground or 0 volts. While, ignoring leakage currents, current does not flow through the other low resistive reference elements RL11-RH1*y* electrically connected to the bit line BL(L1) because the first terminals of the other low resistive reference elements RL11-RL1*y* are at the feedback voltage Vfeedback and the second terminals of the other low resistive reference elements RL11-RL1*y* are at the read voltage Vread or a high impedance state to prevent current flow. It is noted that, as discussed below, the feedback voltage Vfeedback is regulated such that the voltage level of the feedback voltage Vfeedback is approximately equal to the voltage level of the read voltage Vread.

The amount of the current IRL00*b*2, ignoring leakage currents, can be approximated using Ohm's Law as IRL00*b*2=VBL(L0)/RRL00, where VBL(L0) is the voltage on the bit line BL(L0) and RRL00 is the resistance of the low resistive reference element RL00. For example, when VBL (L0) is the feedback voltage Vfeedback of 1 volt and the low resistive reference element RL00 has a resistance of 3 MΩ, the amount of the current IRL00b2 can be approximated using Ohm's Law as IRL00b2=1 V/3 MΩ=⅓ μA. The amount of the current IRL00b2, ignoring leakage currents, is approximately equal to the amount of the current I540 supplied to the bit line BL(L0) by the NMOS transistor 540 because the amount of current flowing into the bit line BL(L0) is approximately equal to the amount of current flowing from the bit line BL(L0). The amount of the current IRL10b2, ignoring leakage currents, can be approximated using Ohm's Law as IRL10b2=VBL(L1)/RRL10, where VBL(L1) is the voltage on the bit line BL(L1) and RRL10 is the resistance of the low resistive reference element RL10. For example, when the feedback voltage Vfeedback is 1 volt and the low resistive reference element RL10 has a resistance of 3 MΩ, the amount of the current IRL10b2 can be approximated using Ohm's Law as IRL10b2=1 V/3 MΩ=⅓ μA. The amount of the current IRL10b2, ignoring leakage currents, is approximately equal to the amount of the current I542 supplied to the bit line BL(L1) by the NMOS transistor 542 because the amount of current flowing into the bit line BL(L1) is approximately equal to the amount of current flowing from the bit line BL(L1). The sum of the amount of the current I540 and the amount of the current I542 is approximately equal to the amount of the large current I520l supplied by the first PMOS transistor 520 because the first PMOS transistor 520 is electrically connected in series with the plurality of NMOS transistors 540, 542, 544, 546. Thus, the sum of the amount of the current IRL00b2 and the amount of the current IRL10b2 is approximately equal to the amount of the large current I520l supplied by the first PMOS transistor 520. Referring to the above examples, where the amount of the current IRL00b2 is ⅓ microamps and the amount of the current IRL10b2 is ⅓ microamps, the amount of the large current I520l supplied by the first PMOS transistor 520 is ⅔ microamps. It is noted that leakage currents do not prevent the SET VERIFY operation of CELL00 when the leakage currents are much less than the sum of the currents IRL00b2 and IRL10b2.

Supplying an amount of current for the operation based on the resistance for the operation, as similarly discussed above in step 406 of flow chart 400, during the SET VERIFY operation of CELL00 is carried out by the PMOS transistor 530 supplying a current I530l that generally corresponds with the amount of current Ilow. Alternatively, when the circuit for sourcing an adjustable amount of current 502 additionally includes a plurality of FETs electrically connected in series with the plurality of PMOS transistors 530, 532, as discussed above, supplying an amount of current for the operation based on the resistance for the operation, as similarly discussed above in step 406 of flow chart 400, during the SET VERIFY operation of CELL00 is carried out by turning on the FET electrically connected in series with the PMOS transistor 530 and the PMOS transistor 530 supplying a current I530l that generally corresponds with the amount of current Ilow. As discussed above, the amount of current Ilow is the amount of current that would flow through a resistive reference element having a low resistance Rlow, a first terminal electrically connected to the feedback voltage Vfeedback, and a second terminal electrically connected to the voltage VWL(0) on the word line WL(0), which as discussed above is 0 volts. The amount of current Ilow can be determined using Ohm's Law as Ilow=(Vfeedback−VWL(0))/Rlow, where Vfeedback is the feedback voltage, VWL(0) is the voltage on the word line WL(0), and Rlow is the low resistance. For example, when Vfeedback=1 V, VWL(0)=0 volts, and Rlow=3 MΩ, Ilow=(1V−0V)/3 MΩ=⅓ μA.

The PMOS transistor 530 is turned on when a gate to source voltage VGS of the PMOS transistor 530 is less than a threshold voltage VT for the PMOS transistor 530. The gate to source voltage VGS of the PMOS transistor 530 is determined by the difference between a gate voltage VG and a source voltage VS. The gate voltage VG of the PMOS transistor 530 is the output voltage Vout of the differential amplifier 510 because the gate terminal of the PMOS transistor 530 is electrically connected to the output terminal of the differential amplifier 510. The source voltage VS of the PMOS transistor 530 is the system voltage Vdd because the source terminal of the PMOS transistor 530 is electrically connected a power supply, a voltage source, a driver circuit, or other device that supplies the system voltage Vdd. Thus, the gate to source voltage VGS of the PMOS transistor 530 can be expressed by VGS=VG−VS, where the gate voltage VG is the output voltage Vout of the differential amplifier 510 and the source voltage VS is the system voltage Vdd. Further, the gate to source voltage VGS of the PMOS transistor 530 is approximately equal to the gate to source voltage VGS of the first PMOS transistor 520 because the gate voltages of the PMOS transistor 530 and the first PMOS transistor 520 are the output voltage Vout of the differential amplifier 510 and the source voltages of the PMOS transistor 530 and the first PMOS transistor 520 are the system voltage Vdd.

As discussed above, the output voltage Vout of the differential amplifier 510 can be expressed by Vout=Vfeedback−Vread and substituting Vfeedback−Vread for the gate voltage VG in the above equation for determining the gate to source voltage VGS of the PMOS transistor 530 provides the equation VGS=Vfeedback−Vread−Vdd. As shown by this equation, the gate to source voltage VGS of the PMOS transistor 530 changes when the feedback voltage Vfeedback changes because the voltage level of the read voltage Vread and the voltage level of the system voltage Vdd are generally constant. Thus, the PMOS transistor 530 is turned on when the feedback voltage Vfeedback has a voltage level such that the gate to source voltage VGS of the PMOS transistor 530 is less than a threshold voltage VT of the PMOS transistor 530.

The amount of the current I530l supplied by the PMOS transistor 530 is proportional to the amount of the large current I520l supplied by the first PMOS transistor 520. The proportion between the amount of the current I530l supplied by the PMOS transistor 530 and the amount of the large current I520l supplied by the first PMOS transistor 520 is a design variable selected by a circuit designer. The circuit designer can select the proportion between the amount of the current I530l supplied by the PMOS transistor 530 and the amount of the large current I520l supplied by the first PMOS transistor 520 by selecting the features of the PMOS transistor 530 and the features of the first PMOS transistor 520. The proportion between the amount of the current I530l supplied by the PMOS transistor 530 and the amount of the large current I520l supplied by the first PMOS transistor 520 is selected as 0.5 by selecting a width to length ratio of the PMOS transistor 530 that is approximately 0.5 a width to length ratio of the first PMOS transistor 520. However, the proportion is not limited to 0.5 and the circuit designer can select other values for the proportion, such as a proportion greater than 0.5 and a proportion less than 0.5. Further, the circuit designer can select other features of the PMOS transistor 530 and the first PMOS transistor 520 to achieve the desired proportion between the amount of the current I530l supplied by the PMOS transistor 530 and the amount of the large current I520l supplied by the first PMOS transistor 520. For example, the circuit designer can select other dimensions of the PMOS transistors, layouts of the PMOS transistors, and materials for fabricating the PMOS transistors to achieve the desired proportion between the amount of the current I530l supplied by the PMOS transistor 530 and the amount of the large current I520l supplied by the first PMOS transistor 520. It is noted that when other types of field effect transistors are used in place of the first PMOS transistor 520 and the plurality of PMOS transistor 530, 532 the circuit designer can also select dimensions, layouts, and materials for fabricating the other types of field effect transistors to achieve the desired proportion between currents.

When the proportion between the amount of the current I530l supplied by the PMOS transistor 530 and the amount of the large current I520l supplied by the first PMOS transistor 520 is selected based on the width to length ratios of the PMOS transistor 530 and the first PMOS transistor 520, the amount of the current I530l can be approximated by the following equation, I530l=(IRL00b2+IRL10b2)((Channel Width of PMOS 530/Channel Length of PMOS 530)/(Channel Width of PMOS 520/Channel Length of PMOS 520)), where IRL00b2 is the amount of current flowing through the low resistive reference element RL00 and IRL10b2 is the amount of current flowing through the low resistive reference element RL10. For example, when the current IRL00b2 is ⅓ microamps, the current IRL10b2 is ⅓ microamps, and the width to length ratio of the PMOS transistor 530 is 0.5 the width to length ratio of the first PMOS transistor 520, the current I530l=(⅓ μA+⅓ μA)(0.5)=⅓ μA.

It is noted that the amount of the current I530l supplied by the PMOS transistor 530 can be an average of the currents flowing through the plurality of NMOS transistors 540, 542, 544, 546 by turning on at the same time a number of the NMOS transistors that matches the inverse of the proportion between the amount of the current I530l supplied by the PMOS transistor 530 and the amount of the large current I520l supplied by the first PMOS transistor 520. For example, when the proportion between the amount of the current I530l supplied by the PMOS transistor 530 and the amount of the large current I520l supplied by the first PMOS transistor 520 is 0.5, the inverse of the proportion is 2, and the amount of the current I530l can be an average of the current flowing through the plurality of NMOS transistors 540, 542, 544, 546 by turning on at the same time 2 of the NMOS transistors. For example, when the NMOS transistors 540, 542 are turned on at the same time, the NMOS transistors 544, 546 are turned off, the current I540=⅓ microamps, the current I542=⅓ microamps, and the proportion between the amount of the current I530l supplied by the PMOS transistor 530 and the large current I520l supplied by the first PMOS transistor 520 is 0.5, the current I530l is I530l=(I540+I542)/2=(⅓ μA+⅓ μA)/2=⅓ μA.

The current I530l supplied by the PMOS transistor 530 flows into the bit line BL(0) and a current ICELL00lb2 flows from the bit line BL(0) through CELL00. FIG. 6B shows the current I530l flowing through the PMOS transistor 530 and the current ICELL00lb2 flowing through CELL00. The current ICELL00lb2 flows through CELL00 because the first terminal of the resistive change element SW00 within CELL00 is at a voltage VBL(0) on the bit line BL(0) and the second terminal of the resistive change element SW00 is at the voltage VWL(0) on the word line WL(0), which as discussed above is ground or 0 volts. While, ignoring leakage currents, current does not flow through the other resistive change element cells CELL01-CELL0y on the bit line BL(0) because the first terminals of the resistive change elements SW01-SW0y within the other resistive change element cells CELL01-CELL0y are at the voltage VBL(0) on the bit line BL(0) and the second terminals of the resistive change elements SW01-SW0y are at the read voltage Vread or a high impedance state to prevent current flow. The amount of the current ICELL00lb2, ignoring leakage currents, is approximately equal to the amount of the current I530l supplied to the bit line BL(0) by the PMOS transistor 530 because the amount of current flowing into the bit line BL(0) is approximately equal to the amount of current flowing from the bit line BL(0). Further, the amount of the current ICELL00lb2 is approximately equal to the average of the amount of the current I540 flowing through the NMOS transistor 540 and the current I542 flowing through the NMOS transistor 542. It is noted that leakage currents do not prevent a SET VERIFY operation of CELL00 when the leakage currents are much less than the amount of the current ICELL00lb2.

The voltage VBL(0) on the bit line BL(0), ignoring leakage currents, can be approximated using Ohm's Law as VBL(0)=ICELL00lb2×RCELL00, where the current ICELL00lb2 is the current flowing through CELL00 and RCELL00 is the resistance of the resistive change element SW00 within CELL00. As shown by this equation, the voltage VBL(0) on the bit line BL(0) changes when the resistance of the resistive change element SW00 changes because the current flowing through CELL00 is generally constant. For example, when IRL00b2=⅓ μA, IRL10b2=⅓ μA, ICELL00lb2=⅓ μA, and RCELL00=3 MΩ, the voltage VBL(0)=⅓ μA×3 MΩ=1 V. For example, when IRL00b2=⅓ μA, IRL10b2=⅓ μA, ICELL00lb2=⅓ μA, and RCELL00=1 MΩ, the voltage VBL(0)=⅓ μA×1 MΩ=⅓ V. For example, when IRL00b2=⅓ μA, IRL10b2=⅓ μA, ICELL00lb2=⅓ μA, and RCELL00=10 MΩ, the voltage VBL(0)=⅓ μA×10 MΩ=10/3 V.

It is noted that when the voltage VBL(0) on the bit line BL(0) is less than the read voltage Vread and the word lines WL(1)-WL(y) electrically connected to the other resistive change element cells CELL01-CELL0y on the bit line BL(0) are driven to the read voltage Vread, leakage currents flow into the bit line BL(0) through the other resistive change element cells CELL01-CELL0y and pull up the voltage VBL(0) on the bit line BL(0). It is also noted that when the voltage VBL(0) on the bit line BL(0) is greater than the read voltage Vread and the word lines WL(1)-WL(y) electrically connected to the other resistive change element cells CELL01-CELL0y on the bit line BL(0) are driven to the read voltage Vread, leakage currents flow from the bit line BL(0) through the other resistive change element cells CELL01-CELL0y and pull down the voltage VBL(0) on the bit line BL(0). It is further noted that when the voltage VBL(0) on the bit line BL(0) is pulled up by leakage currents flowing into the bit line BL(0) from the word lines WL(1)-WL(y) and when the voltage VBL(0) on the bit line BL(0) is pulled down by leakage currents flowing from the bit line BL(0) into the word lines WL(1)-WL(y), the number of the word lines WL(1)-WL(y) should be small enough to allow a margin to determine a resistive state of the selected resistive change element SW00.

Determining a resistive state of the at least one resistive change element based on a resistance of the at least one resistive change element and the resistance for the operation, as similarly discussed above in step 408 of flow chart 400, during the SET VERIFY operation of CELL00 is carried out by determining the resistive state of the resistive change element SW00 by comparing the voltage VBL(0) on the bit line BL(0) with the read voltage Vread. As discussed above, the voltage VBL(0) on the bit line BL(0) is determined by the amount of the current ICELL00$lb2$ and the resistance of the resistive change element SW00. The voltage VBL(0) on the bit line BL(0) is indicative of the resistive state of the resistive change element SW00 because the amount of current ICELL00$lb2$ is approximately the same for both a low resistive state and a resistive state other than a low resistive state of the resistive change element SW00, while, the resistance of the resistive change element SW00 is different for a low resistive state and a resistive state other than a low resistive state. The read voltage Vread is indicative of the low resistance Rlow for the SET VERIFY operation of CELL00 because the read voltage Vread is equal to the amount of the current ICELL00$lb2$ multiplied by the low resistance Rlow. For example, when ICELL00$lb2$=⅓ μA, Rlow=3 MΩ, Vread=(⅓ μA)×3 MΩ=1 V. When the voltage VBL(0) on the bit line BL(0) is less than or equal to the read voltage Vread (i.e. the voltage VBL(0) on the bit line BL(0)≤Vread) the resistance of the resistive change element SW00 is less than or equal to the low resistance Rlow (i.e. RCELL00≤Rlow, where RCELL00 is the resistance of the resistive change element SW00 within CELL00) and the resistive state of the resistive change element SW00 is determined to be a low resistive state. When the voltage VBL(0) on the bit line BL(0) is greater than the read voltage Vread (i.e. the voltage VBL(0) on the bit line BL(0)>Vread) the resistance of the resistive change element SW00 is greater than the low resistance Rlow (i.e. RCELL00>Rlow, where RCELL00 is the resistance of the resistive change element SW00 within CELL00) and the resistive state of the resistive change element SW00 is determined to be a resistive state other than a low resistive state.

The sense device 560 receives the voltage VBL(0) on the bit line BL(0) on a first input terminal because the first input terminal is electrically connected to the bit line BL(0) and receives the read voltage Vread on a second input terminal because the second input terminal is electrically connected to a power supply, a voltage source, a driver circuit, a resistor divider, a test circuit, a control circuit such as a processor, a controller, a programmable logic device, and a FGPA, or other device that supplies the read voltage Vread. The sense device 560 determines the resistive state of the resistive change element SW00 by comparing the voltage VBL(0) on the bit line BL(0) with the read voltage Vread. The sense device 560 outputs a signal indicative of the resistive state of the resistive change element SW00 on an output terminal. When the voltage VBL(0) on the bit line BL(0) is less than or equal to the read voltage Vread, the sense device 560 outputs a signal indicating the resistive change element SW00 has a low resistive state. When the voltage VBL(0) on the bit line BL(0) is greater than the read voltage Vread, the sense device 560 outputs a signal indicating the resistive change element SW00 has a resistive state other than a low resistive state. For example, when ICELL00$lb2$=⅓ microamps, RCELL00=1 MΩ, VBL(0)=⅓ V, and Vread=1 V, the sense device 560 outputs a signal indicating that the resistive change element SW00 has a low resistive state (corresponding, typically, to a logic 1, a SET state). For example, when ICELL00$lb2$=⅓ microamps, RCELL00=3 MΩ, VBL(0)=1 V, and Vread=1 V, the sense device 560 outputs a signal indicating that the resistive change element SW00 has a low resistive state (corresponding, typically, to a logic 1, a SET state). For example, when ICELL00$lb2$=⅓ microamps, RCELL00=10 MΩ, VBL(0)=10/3 V, and Vread=1 V, the sense device 560 outputs a signal indicating that the resistive change element SW00 has a resistive state other than a low resistive state. It is noted that when the plurality of sense devices 560, 562 are electrically connected to the plurality of amplifiers 570, 572 as shown in FIGS. 5B and 5D, the plurality of sense device 560, 562 determine the resistive states of the resistive change elements SW00-SWxy by comparing amplified voltages with a selected voltage, such as the read voltage Vread.

Alternatively, the plurality of sense devices 560, 562 are omitted from the exemplary architecture shown in FIGS. 5A-5D and a test circuit, a logic circuit, or a control circuit such as a processor, a controller, a programmable logic device, and a FGPA, is electrically connected to the bit lines BL(0)-BL(x) to receive the voltages on the bit lines BL(0)-BL(x) or is electrically connected to the plurality of amplifiers 570, 572 to receive amplified voltages. When the test circuit, the logic circuit, or the control circuit is electrically connected to the bit lines BL(0)-BL(x), the test circuit, the logic circuit, or the control circuit determines the resistive states of the resistive change elements SW00-SWxy by comparing the voltages on the bit lines BL(0)-BL(x) with the read voltage Vread or a stored value corresponding to the read voltage Vread. For example, for a SET VERIFY operation of CELL00 when the test circuit, the logic circuit, or the control circuit is electrically connected to the bit lines BL(0)-BL(x), the test circuit, the logic circuit, or the control circuit determines the resistive state of the resistive change element SW00 by comparing the voltage VBL(0) on the bit line BL(0) with the read voltage Vread or a stored value corresponding to the read voltage Vread. When the test circuit, the logic circuit, or the control circuit is electrically connected to the plurality of amplifiers 570, 572, the test circuit, the logic circuit, or the control circuit determines the resistive states of the resistive change elements SW00-SWxy by comparing the amplified voltages with a selected voltage, such as the read voltage Vread, or a stored value corresponding to the selected voltage, such as the read voltage Vread. Additionally, the test circuit, the logic circuit, or the control circuit can output signals indicative of the resistive states of the resistive change elements SW00-SWxy.

Further, the circuit for sourcing an adjustable amount of current 502 compensates for the circuit conditions of the resistive change element array 500 by regulating the feedback voltage Vfeedback to be approximately equal to the read voltage Vread. The feedback voltage Vfeedback reflects the circuit conditions of the resistive change element array 500 because the feedback voltage Vfeedback is based on the amount of the large current I520*l* flowing through the first PMOS transistor 520 and the amount of the large current I520*l* is impacted by the circuit conditions of the resistive change element array 500. For example, changes in the resistances of the low resistive reference elements RL00-RL1*y* due to temperature, leakage currents, and parasitic impedances, can impact the amount of the large current I520*l*. The feedback voltage Vfeedback is supplied to the non-inverting input of the differential amplifier 510 and, as discussed above, the gate voltage VG of the first PMOS transistor 520 is the output voltage Vout of the differential amplifier 510 and the source voltage VS of the first PMOS transistor 520 is the system voltage Vdd. The gate to source voltage VGS of the first PMOS transistor 520 regulates the amount of the large current I520*l* flowing through the first PMOS transistor 520 and the differential amplifier 510 adjusts the gate to source voltage VGS of the first PMOS transistor 520 so that the amount of the large current I520l adjusts the feedback voltage Vfeedback to be approximately equal to the read voltage Vread. Also, as discussed above, the amount of the current I530l supplied by the PMOS transistor 530 is proportional to the amount of the large current I520l supplied by the first PMOS transistor 520. Thus, adjusting the amount of the large current I520l supplied by the first PMOS transistor 520 to compensate for circuit conditions of the resistive change element array 500 proportionally adjusts the amount of the current I530l supplied by the PMOS transistor 530 to compensate for circuit conditions of the resistive change element array 500.

Additionally, SET VERIFY operations of each resistive change element cell CELL00-CELLx0 on the word line WL(0) can be performed at the same time because each PMOS transistor in the plurality of PMOS transistors 530, 532 supplies approximately the same amount of current to a bit line BL(0)-BL(x) at the same time. Each PMOS transistor in the plurality of PMOS transistors 530, 532 supplies approximately the same amount of current for SET VERIFY operations because each PMOS transistor in the plurality of PMOS transistors 530, 532 has approximately the same features and approximately the same gate to source voltage VGS. FIG. 6B shows the PMOS transistor 530 supplying a current I530l to the bit line BL(0), the PMOS transistor 532 supplying a current I532l to the bit line BL(x), a current ICELL00lb2 flowing from the bit line BL(0) through CELL00, and a current ICELLx01b2 flowing from the bit line BL(x) through CELLx0. SET VERIFY operations of each resistive change element cell CELL00-CELLx0 on the word line WL(0) are performed in a similar manner to the SET VERIFY operation of CELL00, discussed above. Performing SET VERIFY operations of each cell on a word line at the same time can be highly desirable in certain application where rapid data SET VERIFY operations or page mode SET VERIFY operations are required.

Figure 6C:
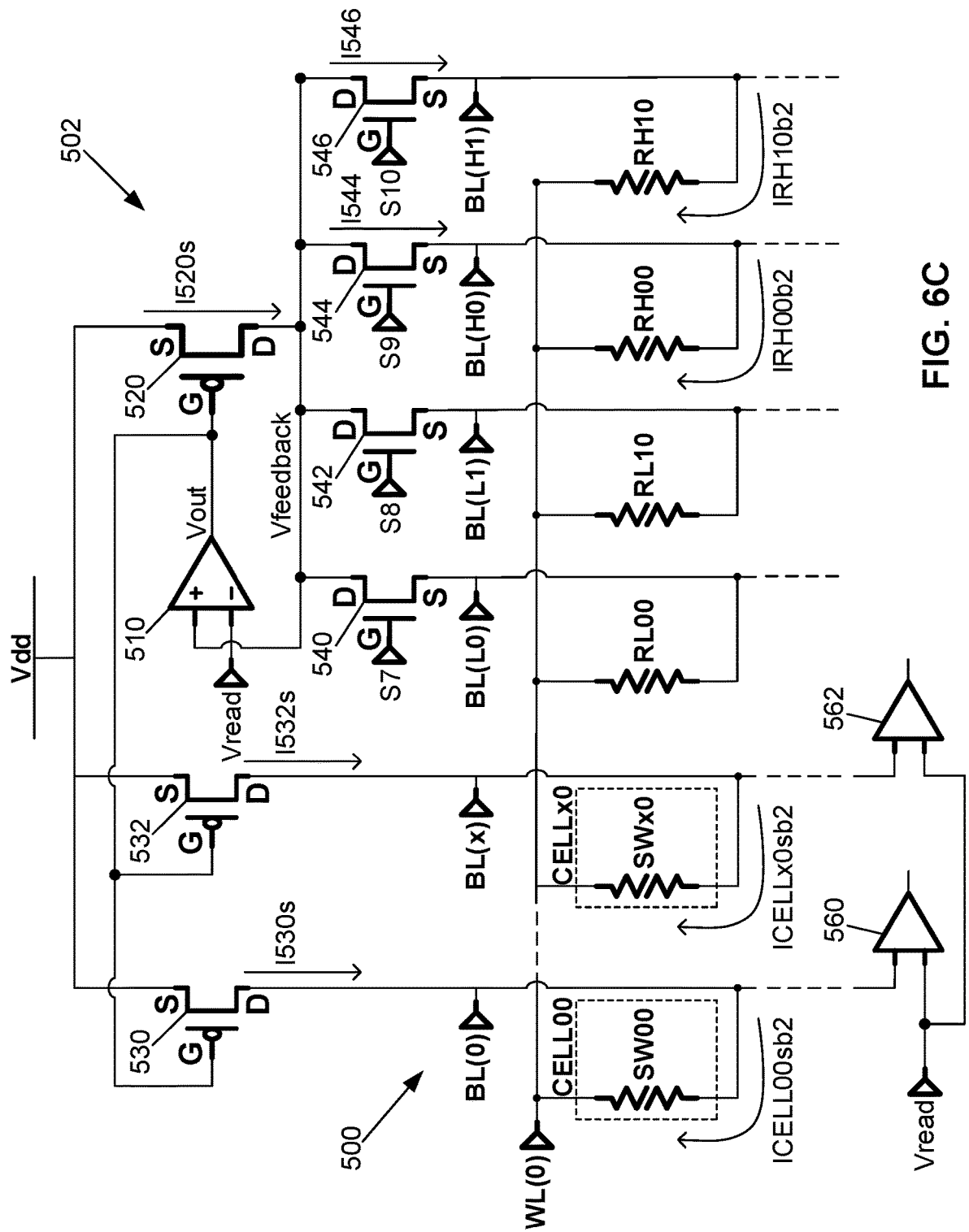
FIG. 6C illustrates a simplified schematic diagram showing current flow in the exemplary architecture of FIG. 5A during a RESET VERIFY operation, where a reduced version of the resistive change element array is shown so that current flow can be shown in greater detail.

A RESET VERIFY operation of CELL00 in the exemplary architecture of FIG. 5A will be explained in detail below, and RESET VERIFY operations of each cell in the exemplary architecture of FIG. 5A can be performed in a similar manner to the RESET VERIFY operation of CELL00. FIG. 6C illustrates a simplified schematic diagram showing current flow, ignoring leakage currents, during a RESET VERIFY operation of CELL00 in the exemplary architecture of FIG. 5A. FIG. 6C shows a reduced version of the resistive change element array 500, so that current flow can be shown in greater detail. It is noted that RESET VERIFY operations of CELL00 explained in further detail below generally describe current flowing through CELL00 as flowing from the bit line BL(0) to the word line WL(0), however, the devices and methods of the present disclosure are not limited to current flow through the cells as flowing from the bit line to the word line. It is also noted that FIG. 6C can be referred to for a RESET VERIFY operation of CELL00 and for RESET VERIFY operations of each cell on the word line WL(0) performed at the same time because current flows through each PMOS transistor in the plurality of PMOS transistors 530, 532 and through each cell on the word line WL(0) for a RESET VERIFY operation of CELL00 and for RESET VERIFY operations of each cell on the word line WL(0) performed at the same time.

A RESET VERIFY operation of CELL00 starts, as similarly discussed above in step 402 of flow chart 400, by selecting CELL00 from the plurality of resistive change element cells CELL00-CELLxy in the resistive change element array 500. CELL00 is selected from the plurality of resistive change element cells CELL00-CELLxy by driving a voltage VWL(0) on the word line WL(0) to 0 volts or ground and driving the other word lines WL(1)-WL(y) to a read voltage Vread or a high impedance state. The voltage VWL(0) on the word line WL(0) and the read voltage Vread are design variables selected by a circuit designer. It is noted that although the voltage VWL(0) on the word line WL(0) is discussed as being driven to 0 volts or ground, the voltage VWL(0) on the word line WL(0) is not limited to being driven to 0 volts or ground and that the circuit designer can select other voltage levels for the voltage VWL(0) on the word line WL(0), such as a voltage level less than 0 volts and a voltage level greater than 0 volts. It is also noted that although the read voltage Vread is discussed as having a voltage level of 1 volt, the read voltage Vread is not limited to having a voltage level of 1 volt and that the circuit designer can select other voltage levels for the read voltage Vread, such as a voltage level greater than 1 volt and a voltage level less than 1 volt. It is further noted that the system voltage Vdd is a design variable selected by a circuit designer.

Selecting a resistance for an operation of the at least one resistive change element, as similarly discussed above in step 404 of flow chart 400, during a RESET VERIFY operation of CELL00 is carried out by turning on the first PMOS transistor 520, the NMOS transistor 544, and the NMOS transistor 546 to select a high resistance Rhigh for the RESET VERIFY operation of CELL00. Alternatively, when the first PMOS transistor 520 is already turned on, selecting a resistance for an operation of the at least one resistive change element, as similarly discussed above in step 404 of flow chart 400, during a RESET VERIFY operation of CELL00 is carried out by turning on the NMOS transistor 544 and the NMOS transistor 546 to select a high resistance Rhigh for the RESET VERIFY operation of CELL00. When the first PMOS transistor 520, the NMOS transistor 544, and the NMOS transistor 546 are turned on, the circuit for sourcing an adjustable amount of current 502 is set to supply an amount of current Ihigh that would flow through a resistive reference element having a high resistance Rhigh, a first terminal electrically connected to the feedback voltage Vfeedback, and a second terminal electrically connected to the voltage VWL(0) on the word line WL(0), which as discussed above is 0 volts or ground. The high resistance Rhigh can be determined by the following equation, Rhigh=(Inverse of the proportion between the amount of the current I530s supplied by the PMOS transistor 530 and the amount of the small current I520s supplied by the first PMOS transistor 520)((RRH00×RRH10)/(RRH00+ RRH10)) where RRH00 is the resistance of the high resistive reference element RH00 and RRH10 is the resistance of the high resistive reference element RH10. It is noted that when the resistance of the high resistive reference element RH00 and the resistance of the high resistive reference element RH10 are approximately the same, the resistance of the high resistive reference element RH00, the resistance of the high resistive reference element RH10, and the high resistance Rhigh are approximately the same. For example, when the resistance of the high resistive reference element RH00=8 MΩ, the resistance of the high resistive reference element RH10=8 MΩ, the inverse of the proportion between the amount of the current I530s supplied by the PMOS transistor 530 and the small current I520s supplied by the first PMOS transistor 520 is 2, Rhigh=(2)((8 MΩ×8 MΩ)/(8 MΩ+8 MΩ))=8 MΩ.

The first PMOS transistor 520 is turned on when a gate to source voltage VGS of the first PMOS transistor 520 is less than a threshold voltage VT of the first PMOS transistor 520. The gate to source voltage of the first PMOS transistor 520 is determined by the difference between a gate voltage VG and a source voltage VS. The gate voltage VG of the first PMOS transistor 520 is the output voltage Vout of the differential amplifier 510 because the gate terminal of the first PMOS transistor 520 is electrically connected to the output terminal of the differential amplifier 510. The source voltage VS of the first PMOS transistor 520 is the system voltage Vdd because the source terminal of the first PMOS transistor 520 is electrically connected to a power supply, a voltage source, a driver circuit, or other device that supplies the system voltage Vdd. Thus, the gate to source voltage VGS of the first PMOS transistor 520 can be expressed by VGS=VG−VS, where the gate voltage VG is the output voltage Vout of the differential amplifier 510 and the source voltage VS is the system voltage Vdd.

The output voltage Vout of the differential amplifier 510 is determined by multiplying a gain of the differential amplifier 510 with the difference between a voltage of the non-inverting input and a voltage of the inverting input. The differential amplifier 510 has a gain of 1, however, the differential amplifier 510 is not limited to having a gain of 1. The gain of the differential amplifier 510 is a design variable selected by a circuit designer and the circuit designer can select other values for the gain of the differential amplifier 510, such as a gain of the differential amplifier 510 greater than 1 and a gain of the differential amplifier 510 less than 1. The voltage of the non-inverting input of the differential amplifier 510 is the feedback voltage Vfeedback because the non-inverting input terminal is electrically connected to the drain terminal of the first PMOS transistor 520 and the drain terminal of each NMOS transistor in the plurality of NMOS transistors 540, 542, 544, 546 through the feedback loop. The voltage of the inverting input of the differential amplifier 510 is the read voltage Vread because the inverting input terminal is electrically connected to a power supply, a voltage source, a driver circuit, a resistor divider, a test circuit, a control circuit such as a processor, a controller, a programmable logic device, and a FGPA, or other device that supplies the read voltage Vread. Thus, the output voltage Vout of the differential amplifier 510 can be expressed by Vout=Gain(Voltage of the Non-Inverting Input−Voltage of the Inverting Input), where the gain is 1, the voltage of the non-inverting input is the feedback voltage Vfeedback, and the voltage of inverting input is the read voltage Vread.

Substituting for the gain, the voltage of the non-inverting input, and the voltage of the inverting input, in the above equation for determining the output voltage Vout of the differential amplifier 510 provides Vout=Vfeedback−Vread and substituting Vfeedback−Vread for the gate voltage VG in the above equation for determining the gate to source voltage VGS of the first PMOS transistor 520 provides the equation VGS=Vfeedback−Vread−Vdd. As shown by this equation, the gate to source voltage VGS of the first PMOS transistor 520 changes when the feedback voltage Vfeedback changes because the voltage level of the read voltage Vread and the voltage level of the system voltage Vdd are generally constant. Thus, the first PMOS transistor 520 is turned on when the feedback voltage Vfeedback has a voltage level such that the gate to source voltage VGS of the first PMOS transistor 520 is less than a threshold voltage VT of the first PMOS transistor 520.

The NMOS transistors 544, 546 are turned on by control signals S9-S10 supplied by a test circuit or a control circuit such as a processor, a controller, a programmable logic device, and a FGPA, and the NMOS transistors, 540, 542 are turned off by control signals S7-S8 supplied by the test circuit or the control circuit. The test circuit or the control circuit supplies the control signal S7 having a voltage level such that a gate to source voltage VGS for the NMOS transistor 540 is less than a threshold voltage VT for the NMOS transistor 540, the control signal S8 having a voltage level such that a gate to source voltage VGS for the NMOS transistor 542 is less than a threshold voltage VT for the NMOS transistor 542, the control signal S9 having a voltage level such that a gate to source voltage VGS for the NMOS transistor 544 is greater than a threshold voltage VT for the NMOS transistor 544, and the control signal S10 having a voltage level such that a gate to source voltage VGS for the NMOS transistor 546 is greater than a threshold voltage VT for the NMOS transistor 546.

When the first PMOS transistor 520, the NMOS transistor 544, and the NMOS transistor 546 are turned on, a small current I520s flows through the first PMOS transistor 520, a current I544 flows into the bit line BL(H0) through the NMOS transistor 544, a current I546 flows into the bit line BL(H1) through the NMOS transistor 546, a current IRH00b2 flows from the bit line BL(H0) through the high resistive reference element RH00, a current IRH10b2 flows from the bit line BL(H1) through the high resistive reference element RH10, a voltage on the bit line BL(H0) is driven to the feedback voltage Vfeedback, and a voltage on the bit line BL(H1) is driven to the feedback voltage Vfeedback. FIG. 6C shows the small current I520s flowing through the first PMOS transistor 520, the current I544 flowing through the NMOS transistor 544, the current I546 flowing through the NMOS transistor 546, the current IRH00b2 flowing through the high resistive reference element RH00, and the current IRH10b2 flowing through the high resistive reference element RH10. The current IRH00b2 flows through the high resistive reference element RH00 because the first terminal of the high resistive reference element RH00 is at the voltage VBL(H0) on the bit line BL(H0), which as discussed above is the feedback voltage Vfeedback, and the second terminal of the high resistive reference element RH00 is at the voltage VWL(0) on the word line WL(0), which as discussed above is ground or 0 volts. While, ignoring leakage currents, current does not flow through the other high resistive reference elements RH01-RH0y electrically connected to the bit line BL(H0) because the first terminals of the other high resistive reference elements RH01-RH0y are at the feedback voltage Vfeedback and the second terminals of the other high resistive reference elements RH01-RH0y are at the read voltage Vread or a high impedance state to prevent current flow. The current IRH10b2 flows through the high resistive reference element RH10 because the first terminal of the high resistive reference element RH10 is at the voltage VBL(H1) on the bit line BL(H1), which as discussed above is the feedback voltage Vfeedback, and the second terminal of the high resistive reference element RH10 is at the voltage VWL(0) on the word line WL(0), which as discussed above is ground or 0 volts. While, ignoring leakage currents, current does not flow through the other high resistive reference elements RH11-RH1y electrically connected to the bit line BL(H1) because the first terminals of the other high resistive reference elements RH11-RH1y are at the feedback voltage Vfeedback and the second terminals of the other high resistive reference elements RH11-RH1y are at the read voltage Vread or a high impedance state to prevent current flow. It is noted that, as discussed below, the feedback voltage Vfeedback is regulated such that the voltage level of the feedback voltage Vfeedback is approximately equal to the voltage level of the read voltage Vread.

The amount of the current IRH00b2, ignoring leakage currents, can be approximated using Ohm's Law as IRH00b2=VBL(H0)/RRH00, where VBL(H0) is the voltage on the bit line BL(H0) and RRH00 is the resistance of the high resistive reference element RH00. For example, when the voltage VBL(H0) is the feedback voltage Vfeedback of 1 volt and the high resistive reference element RH00 has a resistance of 8 MΩ, the amount of the current IRH00b2 can be approximated using Ohm's Law as IRH00b2=1 V/8 MΩ=⅛ µA. The amount of the current IRH00b2, ignoring leakage currents, is approximately equal to the amount of the current I544 supplied to the bit line BL(H0) by the NMOS transistor 544 because the amount of current flowing into the bit line BL(H0) is approximately equal to the amount of current flowing from the bit line BL(H0). The amount of the current IRH10b2, ignoring leakage currents, can be approximated using Ohm's Law as IRH10b2=VBL(H1)/RRH10, where VBL(H1) is the voltage on the bit line BL(H1) and RRH10 is the resistance of the high resistive reference element RH10. For example, when the voltage VBL(H1) is the feedback voltage Vfeedback of 1 volt and the high resistive reference element RH10 has a resistance of 8 MΩ, the amount of the current IRH10b2 can be approximated using Ohm's Law as IRH10b2=1 V/8 MΩ=⅛ µA. The amount of the current IRH10b2, ignoring leakage currents, is approximately equal to the amount of the current I546 supplied to the bit line BL(H1) by the NMOS transistor 546 because the amount of current flowing into the bit line BL(H1) is approximately equal to the amount of current flowing from the bit line BL(H1). The sum of the amount of the current I544 and the amount of the current I546 is approximately equal to the amount of the small current I520s supplied by the first PMOS transistor 520 because the first PMOS transistor 520 is electrically connected in series with the plurality of NMOS transistors 540, 542, 544, 546. Thus, the sum of the amount of the current IRH00b2 and the amount of the current IRH10b2 is approximately equal to the amount of the small current I520s supplied by the first PMOS transistor 520. Referring to the above examples, where the amount of the current IRH00b2 is ⅛ microamps and the amount of the current IRH10b2 is ⅛ microamps, the amount of the small current I520s supplied by the first PMOS transistor 520 is ¼ microamps. It is noted that leakage currents do not prevent the RESET VERIFY operation of CELL00 when the leakage currents are much less than the sum of the currents IRH00b2 and IRH10b2.

Supplying an amount of current for the operation based on the resistance for the operation, as similarly discussed above in step 406 of flow chart 400, during the RESET VERIFY operation of CELL00 is carried out by the PMOS transistor 530 supplying a current I530s that generally corresponds with the amount of current Ihigh. Alternatively, when the circuit for sourcing an adjustable amount of current 502 additionally includes a plurality of FETs electrically connected in series with the plurality of PMOS transistors 530, 532, as discussed above, supplying an amount of current for the operation based on the resistance for the operation, as similarly discussed above in step 406 of flow chart 400, during the RESET VERIFY operation of CELL00 is carried out by turning on the FET electrically connected in series with the PMOS transistor 530 and the PMOS transistor 530 supplying a current I530s that generally corresponds with the amount of current Ihigh. As discussed above, the amount of current Ihigh is the amount of current that would flow through a resistive reference element having a high resistance Rhigh, a first terminal electrically connected to the feedback voltage Vfeedback, and a second terminal electrically connected to the voltage VWL(0) on the word line WL(0), which as discussed above is 0 volts or ground. The amount of current Ihigh can be determined using Ohm's Law as Ihigh=(Vfeedback−VWL(0))/Rhigh, where Vfeedback is the feedback voltage, VWL(0) is the voltage on the word line WL(0), and Rhigh is the high resistance. For example, when Vfeedback=1V, VWL(0)=0V, and Rhigh=8 MΩ, Ihigh=(1V−0V)/8MΩ=⅛ µA.

The PMOS transistor 530 is turned on when a gate to source voltage VGS of the PMOS transistor 530 is less than a threshold voltage VT for the PMOS transistor 530. The gate to source voltage VGS of the PMOS transistor 530 is determined by the difference between a gate voltage VG and a source voltage VS. The gate voltage VG of the PMOS transistor 530 is the output voltage Vout of the differential amplifier 510 because the gate terminal of the PMOS transistor 530 is electrically connected to the output terminal of the differential amplifier 510. The source voltage VS of the PMOS transistor 530 is the system voltage Vdd because the source terminal of the PMOS transistor 530 is electrically connected a power supply, a voltage source, a driver circuit, or other device that supplies the system voltage Vdd. Thus, the gate to source voltage VGS of the PMOS transistor 530 can be expressed by VGS=VG−VS, where the gate voltage VG is the output voltage Vout of the differential amplifier 510 and the source voltage VS is the system voltage Vdd. Further, the gate to source voltage VGS of the PMOS transistor 530 is approximately equal to the gate to source voltage VGS of the first PMOS transistor 520 because the gate voltages of the PMOS transistor 530 and the first PMOS transistor 520 are the output voltage Vout of the differential amplifier 510 and the source voltages of the PMOS transistor 530 and the first PMOS transistor 520 are the system voltage Vdd.

As discussed above, the output voltage Vout of the differential amplifier 510 can be expressed by Vout=Vfeedback−Vread and substituting Vfeedback−Vread for the gate voltage VG in the above equation for determining the gate to source voltage VGS of the PMOS transistor 530 provides the equation VGS=Vfeedback−Vread−Vdd. As shown by this equation, the gate to source voltage VGS of the PMOS transistor 530 changes when the feedback voltage Vfeedback changes because the voltage level of the read voltage Vread and the voltage level of the system voltage Vdd are generally constant. Thus, the PMOS transistor 530 is turned on when the feedback voltage Vfeedback has a voltage level such that the gate to source voltage VGS of the PMOS transistor 530 is less than a threshold voltage VT of the PMOS transistor 530.

The amount of the current I530s supplied by the PMOS transistor 530 is proportional to the amount of the small current I520s supplied by the first PMOS transistor 520. The proportion between the amount of the current I530s supplied by the PMOS transistor 530 and the amount of the small current I520s supplied by the first PMOS transistor 520 is a design variable selected by a circuit designer. The circuit designer can select the proportion between the amount of the current I530s supplied by the PMOS transistor 530 and the amount of the small current I520s supplied by the first PMOS transistor 520 by selecting the features of the PMOS transistor 530 and the features of the first PMOS transistor 520. The proportion between the amount of the current I530s supplied by the PMOS transistor 530 and the amount of the small current I520s supplied by the first PMOS transistor 520 is selected as 0.5 by selecting a width to length ratio of the PMOS transistor 530 that is approximately 0.5 a width to length ratio of the first PMOS transistor 520. However, the proportion is not limited to 0.5 and the circuit designer can select other values for the proportion, such as a proportion greater than 0.5 and a proportion less than 0.5. Further, the circuit designer can select other features of the PMOS transistor 530 and the first PMOS transistor 520 to achieve the desired proportion between the amount of the current I530s supplied by the PMOS transistor 530 and the amount of the small current I520s supplied by the first PMOS transistor 520. For example, the circuit designer can select other dimensions of the PMOS transistors, layouts of the PMOS transistors, and materials for fabricating the PMOS transistors to achieve the desired proportion between the amount of the current I530s supplied by the PMOS transistor 530 and the amount of the small current I520s supplied by the first PMOS transistor 520. It is noted that when other types of field effect transistors are used in place of the first PMOS transistor 520 and the plurality of PMOS transistor 530, 532 the circuit designer can also select dimensions, layouts, and materials for fabricating the other types of field effect transistors to achieve the desired proportion between currents.

When the proportion between the amount of the current I530s supplied by the PMOS transistor 530 and the amount of the small current I520s supplied by the first PMOS transistor 520 is selected based on the width to length ratios of the PMOS transistor 530 and the first PMOS transistor 520, the amount of the current I530s can be approximated by the following equation, I530s=(IRH00b2+IRH10b2)((Channel Width of PMOS 530/Channel Length of PMOS 530)/(Channel Width of PMOS 520/Channel Length of PMOS 520)), where IRH00b2 is the amount of current flowing through the high resistive reference element RH00 and IRH10b2 is the amount of current flowing through the high resistive reference element RH10. For example, when the current IRH00b2 is ⅛ microamps, the current IRH10b2 is ⅛ microamps, and the width to length ratio of the PMOS transistor 530 is 0.5 the width to length ratio of the first PMOS transistor 520, the current I530s=(⅛ μA+⅛ μA) (0.5)=⅛ μA.

It is noted that the amount of the current I530s supplied by the PMOS transistor 530 can be an average of the currents flowing through the plurality of NMOS transistors 540, 542, 544, 546 by turning on at the same time a number of the NMOS transistors that matches the inverse of the proportion between the amount of the current I530s supplied by the PMOS transistor 530 and the amount of the small current I520s supplied by the first PMOS transistor 520. For example, when the proportion between the amount of the current I530s supplied by the PMOS transistor 530 and the amount of the small current I520s supplied by the first PMOS transistor 520 is 0.5, the inverse of the proportion is 2, and the amount of the current I530s can be an average of the current flowing through the plurality of NMOS transistors 540, 542, 544, 546 by turning on at the same time 2 of the NMOS transistors. For example, when the NMOS transistors 544, 546 are turned on at the same time, the NMOS transistors 540, 542 are turned off, the current I544=⅛ microamps, the current I546=⅛ microamps, and the proportion between the amount of the current I530s supplied by the PMOS transistor 530 and the small current I520s supplied by the first PMOS transistor 520 is 0.5, the current I530s is I530s=(I544+I546)/2=(⅛ μA+⅛ μA)/2=⅛ μA.

The current I530s supplied by the PMOS transistor 530 flows into the bit line BL(0) and a current ICELL00sb2 flows from the bit line BL(0) through CELL00. FIG. 6C shows the current I530s flowing through the PMOS transistor 530 and the current ICELL00sb2 flowing through CELL00. The current ICELL00sb2 flows through CELL00 because the first terminal of the resistive change element SW00 within CELL00 is at a voltage VBL(0) on the bit line BL(0) and the second terminal of the resistive change element SW00 is at the voltage VWL(0) on the word line WL(0), which as discussed above is ground or 0 volts. While, ignoring leakage currents, current does not flow through the other resistive change element cells CELL01-CELL0y on the bit line BL(0) because the first terminals of the resistive change elements SW01-SW0y within the other resistive change element cells CELL01-CELL0y are at the voltage VBL(0) on the bit line BL(0) and the second terminals of the resistive change elements SW01-SW0y are at the read voltage Vread or a high impedance state to prevent current flow. The amount of the current ICELL00sb2, ignoring leakage currents, is approximately equal to the amount of the current I530s supplied to the bit line BL(0) by the PMOS transistor 530 because the amount of current flowing into the bit line BL(0) is approximately equal to the amount of current flowing from the bit line BL(0). Further, the amount of the current ICELL00sb2 is approximately equal to the average of the amount of the current I544 flowing through the NMOS transistor 544 and the current I546 flowing through the NMOS transistor 546. It is noted that leakage currents do not prevent a RESET VERIFY operation of CELL00 when the leakage currents are much less than the amount of the current ICELL00sb2.

The voltage VBL(0) on the bit line BL(0), ignoring leakage currents, can be approximated using Ohm's Law as VBL(0)=ICELL00sb2×RCELL00, where the current ICELL00sb2 is the current flowing through CELL00 and RCELL00 is the resistance of the resistive change element SW00 within CELL00. As shown by this equation, the voltage VBL(0) on the bit line BL(0) changes when the resistance of the resistive change element SW00 changes because the current flowing through CELL00 is generally constant. For example, when IRH00b2=⅛ μA, IRH10b2=⅛ μA, ICELL00sb2=⅛ μA, and RCELL00=8 MΩ, the voltage VBL(0)=⅛ μA×8 MΩ=1 V. For example, when IRH00b2=⅛ μA, IRH10b2=⅛ μA, ICELL00sb2=⅛ μA, and RCELL00=1 MΩ, the voltage VBL(0)=⅛ μA×1 MΩ=⅛ V. For example, when IRH00b2=⅛ μA, IRH10b2=⅛ μA, ICELL00sb2=⅛ μA, and RCELL00=10 MΩ, the voltage VBL(0)=⅛ μA×10 MΩ=10/8 V.

It is noted that when the voltage VBL(0) on the bit line BL(0) is less than the read voltage Vread and the word lines WL(1)-WL(y) electrically connected to the other resistive change element cells CELL01-CELL0y on the bit line BL(0) are driven to the read voltage Vread, leakage currents flow into the bit line BL(0) through the other resistive change element cells CELL01-CELL0y and pull up the voltage VBL(0) on the bit line BL(0). It is also noted that when the voltage VBL(0) on the bit line BL(0) is greater than the read voltage Vread and the word lines WL(1)-WL(y) electrically connected to the other resistive change element cells CELL01-CELL0y on the bit line BL(0) are driven to the read voltage Vread, leakage currents flow from the bit line BL(0) through the other resistive change element cells CELL01-CELL0y and pull down the voltage VBL(0) on the bit line BL(0). It is further noted that when the voltage VBL(0) on the bit line BL(0) is pulled up by leakage currents flowing into the bit line BL(0) from the word lines WL(1)-WL(y)

and when the voltage VBL(0) on the bit line BL(0) is pulled down by leakage currents flowing from the bit line BL(0) into the word lines WL(1)-WL(y), the number of the word lines WL(1)-WL(y) should be small enough to allow a margin to determine a resistive state of the selected resistive change element SW00.

Determining a resistive state of the at least one resistive change element based on a resistance of the at least one resistive change element and the resistance for the operation, as similarly discussed above in step 408 of flow chart 400, during the RESET VERIFY operation of CELL00 is carried out by determining the resistive state of the resistive change element SW00 by comparing the voltage VBL(0) on the bit line BL(0) with the read voltage Vread. As discussed above, the voltage VBL(0) on the bit line BL(0) is determined by the amount of the current ICELL00$sb2$ and the resistance of the resistive change element SW00. The voltage VBL(0) on the bit line BL(0) is indicative of the resistive state of the resistive change element SW00 because the amount of current ICELL00$sb2$ is approximately the same for both a high resistive state and a resistive state other than a high resistive state of the resistive change element SW00, while, the resistance of the resistive change element SW00 is different for a high resistive state and a resistive state other than a high resistive state. The read voltage Vread is indicative of the high resistance Rhigh for the RESET VERIFY operation of CELL00 because the read voltage Vread is equal to the amount of the current ICELL00$sb2$ multiplied by the high resistance Rhigh. For example, when ICELL00$sb2$=⅛ µA, Rhigh=8 MΩ, Vread=(⅛ µA)×8 MΩ=1 V. When the voltage VBL(0) on the bit line BL(0) is greater than the read voltage Vread (i.e. the voltage VBL(0) on the bit line BL(0)>Vread) the resistance of the resistive change element SW00 is greater than the high resistance Rhigh (i.e. RCELL00>Rhigh, where RCELL00 is the resistance of the resistive change element SW00 within CELL00) and the resistive state of the resistive change element SW00 is determined to be a high resistive state. When the voltage VBL(0) on the bit line BL(0) is less than or equal to the read voltage Vread (i.e. the voltage VBL(0) on the bit line BL(0)≤Vread) the resistance of the resistive change element SW00 is less than or equal the high resistance Rhigh (i.e. RCELL00≤Rhigh, where RCELL00 is the resistance of the resistive change element SW00 within CELL00) and the resistive state of resistive change element SW00 is determined to be a resistive state other than a high resistive state.

The sense device 560 receives the voltage VBL(0) on the bit line BL(0) on a first input terminal because the first input terminal is electrically connected to the bit line BL(0) and receives the read voltage Vread on a second input terminal because the second input terminal is electrically connected to a power supply, a voltage source, a driver circuit, a resistor divider, a test circuit, a control circuit such as a processor, a controller, a programmable logic device, and a FGPA, or other device that supplies the read voltage Vread. The sense device 560 determines the resistive state of the resistive change element SW00 by comparing the voltage VBL(0) on the bit line BL(0) with the read voltage Vread. The sense device 560 outputs a signal indicative of the resistive state of the resistive change element SW00 on an output terminal. When the voltage VBL(0) on the bit line BL(0) is greater than the read voltage Vread, the sense device 560 outputs a signal indicating the resistive change element SW00 has a high resistive state. When the voltage VBL(0) on the bit line BL(0) is less than or equal to the read voltage Vread, the sense device 560 outputs a signal indicating the resistive change element SW00 has a resistive state other than a high resistive state. For example, when ICELL00$sb2$=⅛ microamps, RCELL00=1 MΩ, VBL(0)=⅛ V, and Vread=1 V, the sense device 560 outputs a signal indicating that the resistive change element SW00 has a resistive state other than a high resistive state. For example, when ICELL00$sb2$=⅛ microamps, RCELL00=8 MΩ, VBL(0)=1 V, and Vread=1 V, the sense device 560 outputs a signal indicating that the resistive change element SW00 has a resistive state other than a high resistive state. For example, when ICELL00$sb2$=⅛ microamps, RCELL00=10 MΩ, VBL(0)=10/8 V, and Vread=1 V, the sense device 560 outputs a signal indicating that the resistive change element SW00 has high resistive state (corresponding, typically, to a logic 0, a RESET state). It is noted that when the plurality of sense devices 560, 562 are electrically connected to the plurality of amplifiers 570, 572 as shown in FIGS. 5B and 5D, the plurality of sense device 560, 562 determine the resistive states of the resistive change elements SW00-SWxy by comparing amplified voltages with a selected voltage, such as the read voltage Vread.

Alternatively, the plurality of sense devices 560, 562 are omitted from the exemplary architecture shown in FIGS. 5A-5D and a test circuit, a logic circuit, or a control circuit such as a processor, a controller, a programmable logic device, and a FGPA, is electrically connected to the bit lines BL(0)-BL(x) to receive the voltages on the bit lines BL(0)-BL(x) or is electrically connected to the plurality of amplifiers 570, 572 to receive amplified voltages. When the test circuit, the logic circuit, or the control circuit is electrically connected to the bit lines BL(0)-BL(x), the test circuit, the logic circuit, or the control circuit determines the resistive states of the resistive change elements SW00-SWxy by comparing the voltages on the bit lines BL(0)-BL(x) with the read voltage Vread or a stored value corresponding to the read voltage Vread. For example, for a RESET VERIFY operation of CELL00, when the test circuit, the logic circuit, or the control circuit is electrically connected to the bit lines BL(0)-BL(x), the test circuit, the logic circuit, or the control circuit determines the resistive state of the resistive change element SW00 by comparing the voltage VBL(0) on the bit line BL(0) with the read voltage Vread or a stored value corresponding to the read voltage Vread. When the test circuit, the logic circuit, or the control circuit is electrically connected to the plurality of amplifiers 570, 572, the test circuit, the logic circuit, or the control circuit determines the resistive states of the resistive change elements SW00-SWxy by comparing the amplified voltages with a selected voltage, such as the read voltage Vread, or a stored value corresponding to the selected voltage, such as the read voltage Vread. Additionally, the test circuit, the logic circuit, or the control circuit can output signals indicative of the resistive states of the resistive change elements SW00-SWxy.

Further, the circuit for sourcing an adjustable amount of current 502 compensates for the circuit conditions of the resistive change element array 500 by regulating the feedback voltage Vfeedback to be approximately equal to the read voltage Vread. The feedback voltage Vfeedback reflects the circuit conditions of the resistive change element array 500 because the feedback voltage Vfeedback is based on the amount of the small current I520$s$ flowing through the first PMOS transistor 520 and the amount of the small current I520$s$ is impacted by the circuit conditions of the resistive change element array 500. For example, changes in the resistances of the high resistive reference elements RH00-RH1$y$ due to temperature, leakage currents, and parasitic impedances, can impact the amount of the small current I520s. The feedback voltage Vfeedback is supplied to the non-inverting input of the differential amplifier 510 and, as discussed above, the gate voltage VG of the first PMOS transistor 520 is the output voltage Vout of the differential amplifier 510 and the source voltage VS of the first PMOS transistor 520 is the system voltage Vdd. The gate to source voltage VGS of the first PMOS transistor 520 regulates the amount of the small current I520s flowing through the first PMOS transistor 520 and the differential amplifier 510 adjusts the gate to source voltage VGS of the first PMOS transistor 520 so that the amount of the small current I520s adjusts the feedback voltage Vfeedback to be approximately equal to the read voltage Vread. Also, as discussed above, the amount of the current I530s supplied by the PMOS transistor 530 is proportional to the amount of the small current I520s supplied by the first PMOS transistor 520. Thus, adjusting the amount of the small current I520s supplied by the first PMOS transistor 520 to compensate for circuit conditions of the resistive change element array 500 proportionally adjusts the amount of the current I530s supplied by the PMOS transistor 530 to compensate for circuit conditions of the resistive change element array 500.

Additionally, RESET VERIFY operations of each resistive change element cell CELL00-CELLx0 on the word line WL(0) can be performed at the same time because each PMOS transistor in the plurality of PMOS transistors 530, 532 supplies approximately the same amount of current to a bit line BL(0)-BL(x) at the same time. Each PMOS transistor in the plurality of PMOS transistors 530, 532 supplies approximately the same amount of current for RESET VERIFY operations because each PMOS transistor in the plurality of PMOS transistors 530, 532 has approximately the same features and approximately the same gate to source voltage VGS. FIG. 6C shows the PMOS transistor 530 supplying a current I530s to the bit line BL(0), the PMOS transistor 532 supplying a current I532s to the bit line BL(x), a current ICELL00sb2 flowing from the bit line BL(0) through CELL00, and a current ICELLx0sb2 flowing from the bit line BL(x) through CELLx0. RESET VERIFY operations of each resistive change element cell CELL00-CELLx0 on the word line WL(0) are performed in a similar manner to the RESET VERIFY operation of CELL00, discussed above. Performing RESET VERIFY operations of each cell on a word line at the same time can be highly desirable in certain application where rapid data RESET VERIFY operations or page mode RESET VERIFY operations are required.

A circuit designer can adjust the range of amounts of current for accessing at least one resistive change element in the resistive change element array 500 as well as the increments between the amounts of current for accessing at least one resistive change element in the resistive change element array 500. In the above examples, for a READ operation of CELL00 the PMOS transistor 530 supplies the current I530i=11/48 microamps, for a SET VERIFY operation of CELL00 the PMOS transistor 530 supplies the current I530l=1/3 microamps, and for a RESET VERIFY operation of CELL00 the PMOS transistor 530 supplies the current I530s=1/8 microamps. Thus, in the above examples, the PMOS transistor 530 can supply three currents over a range of 1/8 microamps to 1/3 microamps, with each of the three currents separated by an increment of 0.104 microamps. For example, a circuit designer can adjust the range of amounts of current that can be supplied by the PMOS transistor 530 as well as the increments between the amounts of current that can be supplied by the PMOS transistor 530 by varying the number of NMOS transistors in the plurality of NMOS transistors 540, 542, 544, 546 that are turned on at the same time.

Figure 6D:
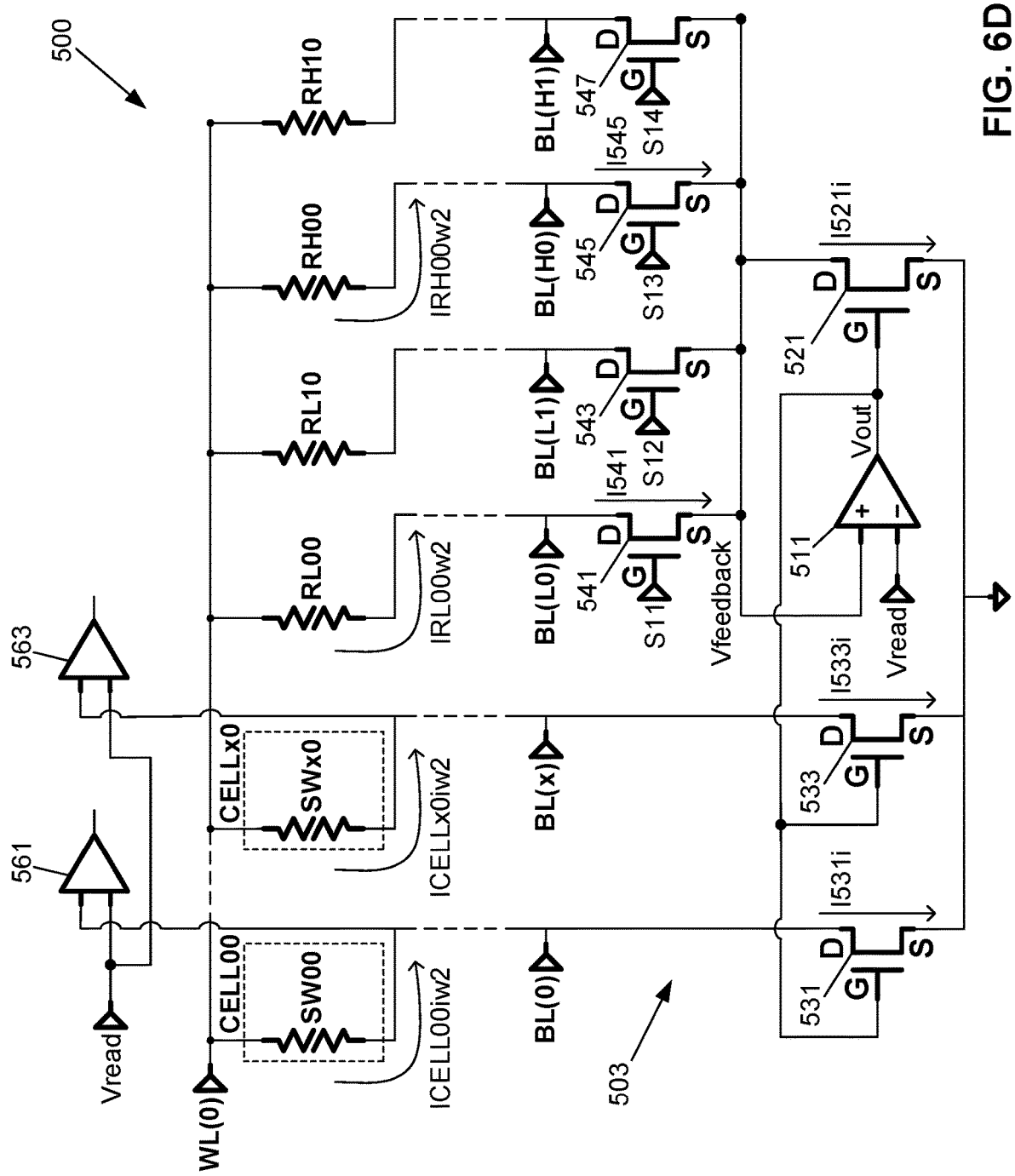
FIG. 6D illustrates a simplified schematic diagram showing current flow in the exemplary architecture of FIG. 5E during a READ operation, where a reduced version of the resistive change element array is shown so that current flow can be shown in greater detail.

The exemplary architecture for accessing at least one resistive change element in a resistive change element array using a resistance based on resistances of resistive reference elements to sink an amount of current accessing resistive change elements through READ operations, SET VERIFY operations, and RESET VERIFY operations will be explained in detail below starting with READ operations. A READ operation of CELL00 in the exemplary architecture of FIG. 5E will be explained in detail below, and READ operations of each cell in the exemplary architecture of FIG. 5E can be performed in a similar manner to the READ operation of CELL00. FIG. 6D illustrates a simplified schematic diagram showing current flow, ignoring leakage currents, during a READ operation of CELL00 in the exemplary architecture of FIG. 5E. FIG. 6D shows a reduced version of the resistive change element array 500, so that current flow can be shown in greater detail. It is noted that READ operations of CELL00 explained in further detail below generally describe current flowing through CELL00 as flowing from the word line WL(0) to the bit line BL(0), however, the devices and methods of the present disclosure are not limited to current flow through the cells as flowing from the word line to the bit line. It is also noted that FIG. 6D can be referred to for a READ operation of CELL00 and for READ operations of each cell on the word line WL(0) performed at the same time because current flows through each NMOS transistor in the first plurality of PMOS transistors 531, 533 and through each cell on the word line WL(0) for a READ operation of CELL00 and for READ operations of each cell on the word line WL(0) performed at the same time.

A READ operation of CELL00 starts, as similarly discussed above in step 402 of flow chart 400, by selecting CELL00 from the plurality of resistive change element cells CELL00-CELLxy in the resistive change element array 500. CELL00 is selected from the plurality of resistive change element cells CELL00-CELLxy by driving a voltage VWL (0) on the word line WL(0) to the system voltage Vdd and driving the other word lines WL(1)-WL(y) to a read voltage Vread or a high impedance state. The voltage VWL(0) on the word line WL(0), the system voltage Vdd, and the read voltage Vread are design variables selected by a circuit designer. It is noted that although the voltage VWL(0) on the word line WL(0) is discussed as being driven to the system voltage Vdd of 2 volts, the voltage VWL(0) on the word line WL(0) is not limited to being driven to the system voltage Vdd or being driven to 2 volts and that the circuit designer can select other voltage levels for the voltage VWL(0) on the word line WL(0), such as a voltage level greater than 2 volts and a voltage level less than 2 volts. It is also noted that although the system voltage Vdd is discussed as having a voltage level of 2 volts, the system voltage Vdd is not limited to having a voltage level of 2 volts and that the circuit designer can other voltage levels for the system voltage Vdd, such as a voltage level greater than 2 volts and a voltage level less than 2 volts. It is further noted that although the read voltage Vread is discussed as having a voltage level of 1 volt, the read voltage Vread is not limited to having a voltage level of 1 volt and that the circuit designer can select other voltage levels for the read voltage Vread, such as a voltage level greater than 1 volt and a voltage level less than 1 volt.

Selecting a resistance for an operation of the at least one resistive change element, as similarly discussed above in step 404 of flow chart 400, during a READ operation of CELL00 is carried out by turning on the first NMOS transistor 521, turning on one of the NMOS transistors 541, 543, and turning on one of the NMOS transistors 545, 547 to select an intermediate resistance Rinter for the READ operation of CELL00. Alternatively, when the first NMOS transistor 521 is already turned on, selecting a resistance for an operation of the at least one resistive change element, as similarly discussed above in step 404 of flow chart 400, during a READ operation of CELL00 is carried out by turning on one of the NMOS transistors 541, 543 and turning on one of the NMOS transistor 545, 547 to select an intermediate resistance Rinter for the READ operation of CELL00. FIG. 6D shows the first NMOS transistor 521, the NMOS transistor 541, and the NMOS transistor 545 turned on, however, the intermediate resistance Rinter also can be selected by turning on the first NMOS transistor 521, the NMOS transistor 543, and the NMOS transistor 547. When the first NMOS transistor 521, the NMOS transistor 541, and the NMOS transistor 545 are turned on, the circuit for sinking an adjustable amount of current 503 is set to sink an amount of current Iinter that would flow through a resistive reference element having an intermediate resistance Rinter, a second terminal electrically connected to the voltage VWL(0) on the word line WL(0), which as discussed above is the system voltage Vdd, and a first terminal electrically connected to the feedback voltage Vfeedback. The intermediate resistance Rinter can be determined by the following equation, Rinter=(Inverse of the proportion between the amount of the current I531$i$ supplied by the NMOS transistor 531 and the amount of the intermediate current I521$i$ supplied by the first NMOS transistor 521)((RRL00×RRH00)/(RRL00+RRH00)) where RRL00 is the resistance of the low resistive reference element RL00 and RRH00 is the resistance of the high resistive reference element RH00. For example, when the resistance of the low resistive reference element RL00=3 MΩ, the resistance of the high resistive reference element RH00=8 MΩ, the inverse of the proportion between the amount of the current I531$i$ supplied by the NMOS transistor 531 and the intermediate current I521$i$ supplied by the first NMOS transistor 521 is 2, Rinter=(2)((3 MΩ×8 MΩ)/(3 MΩ+8 MΩ))=48/11 MΩ (i.e. approximately 4.36 MΩ).

The first NMOS transistor 521 is turned on when a gate to source voltage VGS of the first NMOS transistor 521 is greater than a threshold voltage VT of the first NMOS transistor 521. The gate to source voltage of the first NMOS transistor 521 is determined by the difference between a gate voltage VG and a source voltage VS. The gate voltage VG of the first NMOS transistor 521 is the output voltage Vout of the differential amplifier 511 because the gate terminal of the first NMOS transistor 521 is electrically connected to the output terminal of the differential amplifier 511. The source voltage VS of the first NMOS transistor 521 is 0 volts or ground because the source terminal of the first NMOS transistor 521 is electrically connected to 0 volts or ground. Thus, the gate to source voltage VGS of the first NMOS transistor 521 can be expressed by VGS=VG−VS, where the gate voltage VG is the output voltage Vout of the differential amplifier 510 and the source voltage VS is 0 volts or ground.

The output voltage Vout of the differential amplifier 511 is determined by multiplying a gain of the differential amplifier 511 with the difference between a voltage of the non-inverting input and a voltage of the inverting input. The differential amplifier 511 has a gain of 1, however, the differential amplifier 511 is not limited to having a gain of 1. The gain of the differential amplifier 511 is a design variable selected by a circuit designer and the circuit designer can select other values for the gain of the differential amplifier 511, such as a gain of the differential amplifier 511 greater than 1 and a gain of the differential amplifier 511 less than 1. The voltage of the non-inverting input of the differential amplifier 511 is the feedback voltage Vfeedback because the non-inverting input terminal is electrically connected to the drain terminal of the first NMOS transistor 521 and the source terminal of each NMOS transistor in the second plurality of NMOS transistors 541, 543, 545, 547 through the feedback loop. The voltage of the inverting input of the differential amplifier 511 is the read voltage Vread because the inverting input terminal is electrically connected to a power supply, a voltage source, a driver circuit, a resistor divider, a test circuit, a control circuit such as a processor, a controller, a programmable logic device, and a FGPA, or other device that supplies the read voltage Vread. Thus, the output voltage Vout of the differential amplifier 511 can be expressed by Vout=Gain (Voltage of the Non-Inverting Input−Voltage of the Inverting Input), where the gain is 1, the voltage of the non-inverting input is the feedback voltage Vfeedback, and the voltage of non-inverting input is the read voltage Vread.

Substituting for the gain, the voltage of the non-inverting input, and the voltage of the inverting input, in the above equation for determining the output voltage Vout of the differential amplifier 511 provides Vout=Vfeedback−Vread and substituting Vfeedback−Vread for the gate voltage VG in the above equation for determining the gate to source voltage VGS of the first NMOS transistor 521 provides the equation VGS=Vfeedback−Vread−0 volts. As shown by this equation, the gate to source voltage VGS of the first NMOS transistor 521 changes when the feedback voltage Vfeedback changes because the voltage level of the read voltage Vread and 0 volts are generally constant. Thus, the first NMOS transistor 521 is turned on when the feedback voltage Vfeedback has a voltage level such that the gate to source voltage VGS of the first NMOS transistor 521 is greater than a threshold voltage VT of the first NMOS transistor 521.

One of the NMOS transistors 541, 543, is turned on by a control signal S11 or S12 supplied by a test circuit or a control circuit such as a processor, a controller, a programmable logic device, and a FGPA, and the other of the NMOS transistors 541, 543, is turned off by a control signal S11 or S12 supplied by the test circuit or the control circuit. One of the NMOS transistors 545, 547, is turned on by a control signal S13 or S14 supplied by the test circuit or the control circuit and the other of the NMOS transistors 545, 547, is turned off by a control signal S13 or S14 supplied by the test circuit or the control circuit. FIG. 6D shows the NMOS transistors 541 and 545 turned on by the control signals S11 and S13 and the NMOS transistors 543 and 547 turned off by the control signal S12 and S14. The test circuit or the control circuit supplies the control signal S11 having a voltage level such that a gate to source voltage VGS for the NMOS transistor 541 is greater than a threshold voltage VT for the NMOS transistor 541, the control signal S12 having a voltage level such that a gate to source voltage VGS for the NMOS transistor 543 is less than a threshold voltage VT for the NMOS transistor 543, the control signal S13 having a voltage level such that a gate to source voltage VGS for the NMOS transistor 545 is greater than a threshold voltage VT for the NMOS transistor 545, and the control signal S14 having a voltage level such that a gate to source voltage VGS for the NMOS transistor 547 is less than a threshold voltage VT for the NMOS transistor 547.

When the first NMOS transistor 521, the NMOS transistor 541, and the NMOS transistor 545 are turned on, a current IRL00w2 flows into the bit line BL(L0) through the low resistive reference element RL00, a current I541 flows from the bit line BL(L0) through the NMOS transistor 541, a current IRH00w2 flows into the bit line BL(H0) through the high resistive reference element RH00, a current I545 flows from the bit line BL(H0) through the NMOS transistor 545, an intermediate current I521i flows through the first NMOS transistor 521, a voltage VBL(L0) on the bit line BL(L0) is driven to the feedback voltage Vfeedback, and a voltage VBL(H0) on the bit line BL(H0) is driven to the feedback voltage Vfeedback. FIG. 6D shows the current IRL00w2 flowing through the low resistive reference element RL00, the current I541 flowing through the NMOS transistor 541, the current IRH00w2 flowing through the high resistive reference element RH00, the current I545 flowing through the NMOS transistor 545, and the intermediate current I521i flowing through the first NMOS transistor 521. The current IRL00w2 flows through the low resistive reference element RL00 because the second terminal of the low resistive reference element RL00 is at the voltage VWL(0) on the word line WL(0), which as discussed above the system voltage Vdd, and the first terminal of the low resistive reference element RL00 is at the voltage VBL(L0) on the bit line BL(L0), which as discussed above is the feedback voltage Vfeedback. While, ignoring leakage currents, current does not flow through the other low resistive reference elements RL01-RL0y electrically connected to the bit line BL(L0) because the second terminals of the other low resistive reference elements RL01-RL0y are at the read voltage Vread or a high impedance state to prevent current flow and the first terminals of the other low resistive reference elements RL01-RL0y are at the feedback voltage Vfeedback. The current IRH00w2 flows through the high resistive reference element RH00 because the second terminal of the high resistive reference element RH00 is at the voltage VWL(0) on the word line WL(0), which as discussed above is the system voltage Vdd, and the first terminal of the high resistive reference element RH00 is at the voltage VBL(H0) on the bit line BL(H0), which as discussed above is the feedback voltage Vfeedback. While, ignoring leakage currents, current does not flow through the other high resistive reference elements RH01-RH0y electrically connected to the bit line BL(H0) because the second terminals of the other high resistive reference elements RH01-RH0y are at the read voltage Vread or a high impedance state to prevent current flow and the first terminals of the other high resistive reference elements RH01-RH0y are at the feedback voltage Vfeedback. It is noted that, as discussed below, the feedback voltage Vfeedback is regulated such that the voltage level of the feedback voltage Vfeedback is approximately equal to the voltage level of the read voltage Vread.

The amount of the current IRL00w2, ignoring leakage currents, can be approximated using Ohm's Law as IRL00w2=(VWL(0)−VBL(L0))/RRL00, where VWL(0) is the voltage on the word line WL(0), VBL(L0) is the voltage on the bit line BL(L0), and RRL00 is the resistance of the low resistive reference element RL00. For example, when the voltage VWL(0) is the system voltage Vdd of 2 volts, the voltage VBL(L0) is the feedback voltage Vfeedback of 1 volt, and the low resistive reference element RL00 has a resistance of 3 MΩ, the amount of the current IRL00w2 can be approximated using Ohm's Law as IRL00w2=(2V−1V)/3 MΩ=⅓ µA. The amount of the current IRL00w2, ignoring leakage currents, is approximately equal to the amount of the current I541 flowing from the bit line BL(L0) through the NMOS transistor 541 because the amount of current flowing into the bit line BL(L0) is approximately equal to the amount of current flowing from the bit line BL(L0). The amount of the current IRH00w2, ignoring leakage currents, can be approximated using Ohm's Law as IRH00w2=(VWL(0)−VBL(H0))/RRH00, where VWL(0) is the voltage on the word line WL(0), VBL(H0) is the voltage on the bit line BL(H0), and RRH00 is the resistance of the high resistive reference element RH00. For example, when the voltage VWL(0) is the system voltage Vdd of 2 volts, the voltage VBL(H0) is the feedback voltage Vfeedback is 1 volt, and the high resistive reference element RH00 has a resistance of 8 MΩ, the amount of the current IRH00w2 can be approximated using Ohm's Law as IRH00w2=(2V−1V)/8 MΩ=⅛ µA. The amount of the current IRH00w2, ignoring leakage currents, is approximately equal to the amount of the current I545 flowing from the bit line BL(H0) through the NMOS transistor 545 because the amount of current flowing into the bit line BL(H0) is approximately equal to the amount of current flowing from the bit line BL(H0). The sum of the amount of the current I541 and the amount of the current I545 is approximately equal to the amount of the intermediate current I521i flowing through the first NMOS transistor 521 because the first NMOS transistor 521 is electrically connected in series with the second plurality of NMOS transistors 541, 543, 545, 547. Thus, the sum of the amount of the current IRL00w2 and the amount of the current IRH00w2 is approximately equal to the amount of the intermediate current I521i flowing through the first NMOS transistor 521. Referring to the above examples, where the amount of the current IRL00w2 is ⅓ microamps and the amount of the current IRH00w2 is ⅛ microamps, the amount of the intermediate current I521i flowing through the first NMOS transistor 521 is 11/24 microamps. It is noted that leakage currents do not prevent the READ operation of CELL00 when the leakage currents are much less than the sum of the currents IRL00w2 and IRH00w2.

It is noted that when the NMOS transistor 543 is turned on instead of the NMOS transistor 541, a current IRL10w2 flows into the bit line BL(L1) through the low resistive reference element RL10, a current I543 flows from the bit line BL(L1) through the NMOS transistor 543, and a voltage on the bit line BL(L1) is driven to the feedback voltage Vfeedback. The current IRL10w2 flows through the low resistive reference element RL10 because the second terminal of the low resistive reference element RL10 is at the voltage VWL(0) on the word line WL(0), which as discussed above is the system voltage Vdd, and the first terminal of the low resistive reference element RL10 is at the voltage VBL(L1) on the bit line BL(L1), which as discussed above is the feedback voltage Vfeedback. While, ignoring leakage currents, current does not flow through the other low resistive reference elements RL11-RL1y electrically connected to the bit line BL(L1) because the second terminals of the other low resistive reference elements RL11-RL1y are at the read voltage Vread or a high impedance state to prevent current flow and the first terminals of the other low resistive reference elements RL11-RL1y are at the feedback voltage Vfeedback. It is further noted that the current I543 flowing through the NMOS transistor 543 is approximately equal to the current I541 discussed above because the voltage level of the control signal S12 for turning on the NMOS transistor 543 is approximately equal to the voltage level of the control signal S11 for turning on the NMOS transistor 541 and the NMOS transistors 541, 543 have approximately the same features. It is even further noted that the current IRL10w2 flowing through the low resistive reference element RL10 is approximately equal to the current IRL00w2 discussed above because the low resistive reference elements RL00, RL10 have approximately the same resistances.

It is noted that when the NMOS transistor 547 is turned on instead of the NMOS transistor 545, a current IRH10w2 flows into the bit line BL(H1) through the high resistive reference element RH10, a current I547 flows from the bit line BL(H1) through the NMOS transistor 547, and a voltage on the bit line BL(H1) is driven to the feedback voltage Vfeedback. The current IRH10w2 flows through the high resistive reference element RH10 because the second terminal of the high resistive reference element RH10 is at the voltage VWL(0) on the word line WL(0), which as discussed above is the system voltage Vdd, and the first terminal of the high resistive reference element RH10 is at the voltage VBL(H1) on the bit line BL(H1), which as discussed above is the feedback voltage Vfeedback. While, ignoring leakage currents, current does not flow through the other high resistive reference elements RH11-RH1y electrically connected to the bit line BL(H1) because the second terminals of the other high resistive reference elements RH11-RH1y are at the read voltage Vread or a high impedance state to prevent current flow and the first terminals of the other high resistive reference elements RH11-RH1y are at the feedback voltage Vfeedback. It is further noted that the current I547 flowing through the NMOS transistor 547 is approximately equal to the current I545 discussed above because the voltage level of the control signal S14 for turning on the NMOS transistor 547 is approximately equal to the voltage level of the control signal S13 for turning on the NMOS transistor 545 and the NMOS transistors 545, 547 have approximately the same features. It is even further noted that the current IRH10w2 flowing through the high resistive reference element RH10 is approximately equal to the current IRH00w2 discussed above because the high resistive reference elements RH00, RH10 have approximately the same resistances.

Supplying an amount of current for the operation based on the resistance for the operation, as similarly discussed above in step 406 of flow chart 400, during the READ operation of CELL00 is carried out by the NMOS transistor 531 supplying a current I531i that generally corresponds with the amount of current Iinter. Alternatively, when the circuit for sinking an adjustable amount of current 503 additionally includes a plurality of FETs electrically connected in series with the first plurality of NMOS transistors 531, 533, as discussed above, supplying an amount of current for the operation based on the resistance for the operation, as similarly discussed above in step 406 of flow chart 400, during the READ operation of CELL00 is carried out by turning on the FET electrically connected in series with the NMOS transistor 531 and the NMOS transistor 531 supplying a current I531i that generally corresponds with the amount of current Iinter. As discussed above, the amount of current Iinter is the amount of current that would flow through a resistive reference element having an intermediate resistance Rinter, a second terminal electrically connected to the voltage VWL(0) on the word line WL(0), which as discussed above is the system voltage Vdd, and a first terminal electrically connected to the feedback voltage Vfeedback. The amount of current Iinter can be determined using Ohm's law as Iinter=(VWL(0)−Vfeedback)/Rinter, where VWL(0) is the voltage on the word line WL(0), Vfeedback is the feedback voltage, and Rinter is the intermediate resistance. For example, when VWL(0)=2 V, Vfeedback=1 V, and Rinter=48/11 MΩ, Iinter=(2V−1V)/(48/11 MΩ)=$^{11}\!/\!_{48}$ µA. It is noted that the current I531i causes current flow into the bit line BL(0) approximately equal to the amount of the current I531i because the current I531i flows from the bit line BL(0) and the amount of the current flowing from the bit line BL(0) is approximately equal to the amount of current flowing into the bit line BL(0).

The NMOS transistor 531 is turned on when a gate to source voltage VGS of the NMOS transistor 531 is greater than a threshold voltage VT for the NMOS transistor 531. The gate to source voltage VGS of the NMOS transistor 531 is determined by the difference between a gate voltage VG and a source voltage VS. The gate voltage VG of the NMOS transistor 531 is the output voltage Vout of the differential amplifier 511 because the gate terminal of the NMOS transistor 531 is electrically connected to the output terminal of the differential amplifier 511. The source voltage VS of the NMOS transistor 531 is the 0 volts or ground because the source terminal of the NMOS transistor 531 is electrically connected to 0 volts or ground. Thus, the gate to source voltage VGS of the NMOS transistor 531 can be expressed by VGS=VG−VS, where the gate voltage VG is the output voltage Vout of the differential amplifier 511 and the source voltage VS is 0 volts or ground. Further, the gate to source voltage VGS of the NMOS transistor 531 is approximately equal to the gate to source voltage VGS of the first NMOS transistor 521 because the gate voltages of the NMOS transistor 531 and the first NMOS transistor 521 are the output voltage Vout of the differential amplifier 511 and the source voltages of the NMOS transistor 531 and the first NMOS transistor 521 are the system voltage Vdd. It is noted that the source terminal of the first NMOS transistor 521 and the source terminals of NMOS transistors in the first plurality of NMOS transistors 531, 533 can be electrically connected to voltages other than 0 volts or ground, such a voltage greater than 0 volts or ground and a voltage less than 0 volts or ground.

As discussed above, the output voltage Vout of the differential amplifier 511 can be expressed by Vout=Vfeedback−Vread and substituting Vfeedback−Vread for the gate voltage VG in the above equation for determining the gate to source voltage VGS of the NMOS transistor 531 provides the equation VGS=Vfeedback−Vread−0 volts. As shown by this equation, the gate to source voltage VGS of the NMOS transistor 531 changes when the feedback voltage Vfeedback changes because the voltage level of the read voltage Vread and 0 volts are generally constant. Thus, the NMOS transistor 531 is turned on when the feedback voltage Vfeedback has a voltage level such that the gate to source voltage VGS of the NMOS transistor 531 is greater than a threshold voltage VT of the NMOS transistor 531.

The amount of the current I531i supplied by the NMOS transistor 531 is proportional to the amount of the intermediate current I521i supplied by the first NMOS transistor 521. The proportion between the amount of the current I531i supplied by the NMOS transistor 531 and the amount of the intermediate current I521i supplied by the first NMOS transistor 521 is a design variable selected by a circuit designer. The circuit designer can select the proportion between the amount of the current I531i supplied by the NMOS transistor 531 and the amount of the intermediate current I521i supplied by the first NMOS transistor 521 by selecting the features of the NMOS transistor 531 and the features of the first NMOS transistor 521. The proportion between the amount of the current I531i supplied by the NMOS transistor 531 and the amount of the intermediate current I521i supplied by the first NMOS transistor 521 is selected as 0.5 by selecting a width to length ratio of the NMOS transistor 531 that is approximately 0.5 a width to length ratio of the first NMOS transistor 521. However, the proportion is not limited to 0.5 and the circuit designer can select other values for the proportion, such as a proportion greater than 0.5 and a proportion less than 0.5. Further, the circuit designer can select other features of the NMOS transistor 531 and the first NMOS transistor 521 to achieve the desired proportion between the amount of the current I531i supplied by the NMOS transistor 531 and the amount of the intermediate current I521i supplied by the first NMOS transistor 521. For example, the circuit designer can select other dimensions of the NMOS transistors, layouts of the NMOS transistors, and materials for fabricating the NMOS transistors to achieve the desired proportion between the amount of the current I531i supplied by the NMOS transistor 531 and the amount of the intermediate current I521i supplied by the first NMOS transistor 521. It is noted that when other types of field effect transistors are used in place of the first NMOS transistor 521 and the first plurality of NMOS transistor 531, 533 the circuit designer can also select dimensions, layouts, and materials for fabricating the other types of field effect transistors to achieve the desired proportion between currents.

When the proportion between the amount of the current I531i supplied by the NMOS transistor 531 and the amount of the intermediate current I521i supplied by the first NMOS transistor 521 is selected based on the width to length ratios of the NMOS transistor 531 and the first NMOS transistor 521, the amount of the current I531i can be approximated by the following equation, I531i=(IRL00w2+IRH00w2) ((Channel Width of NMOS 531/Channel Length of NMOS 531)/(Channel Width of NMOS 521/Channel Length of NMOS 521)), where IRL00w2 is the amount of current flowing through the low resistive reference element RL00 and IRH00w2 is the amount of current flowing through the high resistive reference element RH00. For example, when the current IRL00w2 is ⅓ microamps, the current IRH00w2 is ⅛ microamps, and the width to length ratio of the NMOS transistor 531 is 0.5 the width to length ratio of the first NMOS transistor 521, the current I531i=(⅓ μA+⅛ μA) (0.5)=11/48 μA.

It is noted that the amount of the current I531i supplied by the NMOS transistor 531 can be an average of the currents flowing through the second plurality of NMOS transistors 541, 543, 545, 547 by turning on at the same time a number of the NMOS transistors that matches the inverse of the proportion between the amount of the current I531i supplied by the NMOS transistor 531 and the amount of the intermediate current I521i supplied by the first NMOS transistor 521. For example, when the proportion between the amount of the current I531i supplied by the NMOS transistor 531 and the amount of the intermediate current I521i supplied by the first NMOS transistor 521 is 0.5, the inverse of the proportion is 2, and the amount of the current I531i can be an average of the current flowing through the second plurality of NMOS transistors 541, 543, 545, 547 by turning on at the same time 2 of the NMOS transistors. For example, when the NMOS transistors 541, 545 are turned on at the same time, the NMOS transistors 543, 547 are turned off, the current I541=⅓ microamps, the current I545=⅛ microamps, and the proportion between the amount of the current I531i supplied by the NMOS transistor 531 and the intermediate current I521i supplied by the first NMOS transistor 521 is 0.5, the current I531i is I531i=(I541+I545)/2=(⅓ μA+⅛ μA)/2=11/48 μA.

A current ICELL00iw2 flows into the bit line BL(0) through CELL00 and the current I531i flows from the bit line BL(0) through the NMOS transistor 531. FIG. 6D shows the current ICELL00iw2 flowing through CELL00 and the current I531i flowing through the NMOS transistor 531. The current ICELL00iw2 flows through CELL00 because the second terminal of the resistive change element SW00 within CELL00 is at the voltage VWL(0) on the word line WL(0), which as discussed above is the system voltage Vdd, and the first terminal of the resistive change element SW00 is at a voltage VBL(0) on the bit line BL(0). While, ignoring leakage currents, current does not flow through the other resistive change element cells CELL01-CELL0y on the bit line BL(0) because the second terminals of the resistive change elements SW01-SW0y within the other resistive change element cells CELL01-CELL0y are at the read voltage Vread or a high impedance state to prevent current flow and the first terminals of the resistive change elements SW01-SW0y are at the voltage VBL(0) on the bit line BL(0). The amount of the current ICELL00iw2, ignoring leakage currents, is approximately equal to the amount of the current I531i flowing through the NMOS transistor 531 because the amount of current flowing into the bit line BL(0) is approximately equal to the amount of current flowing from the bit line BL(0). Further, the amount of the current ICELL00iw2 is approximately equal to the average of the amount of the current I541 flowing through the NMOS transistor 541 and the current I545 flowing through the NMOS transistor 545. It is noted that leakage currents do not prevent a READ operation of CELL00 when the leakage currents are much less than the amount of the current ICELL00iw2.

The voltage VBL(0) on the bit line BL(0), ignoring leakage currents, can be approximated by subtracting the voltage drop across CELL00 from the voltage VWL(0) on the word line WL(0) and the voltage drop across CELL00 can be approximated using Ohm's Law. Thus, the voltage VBL(0) on the bit line BL(0) can be approximated by VBL(0)=VWL(0)−(ICELL00iw2×RCELL00), where VWL(0) is the voltage on the word line WL(0), the current ICELL00iw2 is the current flowing through CELL00, and RCELL00 is the resistance of the resistive change element SW00 within CELL00. As shown by this equation, the voltage VBL(0) on the bit line BL(0) changes when the resistance of the resistive change element SW00 changes because the voltage VWL(0) on the word line WL(0) and the current flowing through CELL00 are generally constant. For example, when VWL(0)=2 volts, IRL00w2=⅓ μA, IRH00w2=⅛ μA, ICELL00iw2=11/48 μA, RCELL00=48/11 MΩ, the voltage VBL(0)=2 V−(11/48 μA×48/11 MΩ)=1 V. For example, VWL(0)=2 volts, when IRL00w2=⅓ μA, IRH00w2=⅛ μA, ICELL00iw2=11/48 μA, RCELL00=1 MΩ, the voltage VBL(0)=2 V−(11/48 μA×1 MΩ)=85/48 V. For example, when VWL(0)=2 volts, IRL00w2=⅓ μA, IRH00w2=⅛ μA, ICELL00iw2=11/48 μA, RCELL00=10 MΩ, the voltage VBL(0)=2 V−(11/48 μA×10 MΩ)=−14/48 V. It is noted that, although the above exemplary calculation provides an exemplary voltage VBL(0) on the bit line BL(0) as being −14/48 V, practical circuit limitations would prevent the exemplary voltage VBL(0) on the bit line BL(0) from being a negative voltage.

It is noted that when the voltage VBL(0) on the bit line BL(0) is less than the read voltage Vread and the word lines WL(1)-WL(y) electrically connected to the other resistive change element cells CELL01-CELL0y on the bit line BL(0) are driven to the read voltage Vread, leakage currents flow into the bit line BL(0) through the other resistive change element cells CELL01-CELL0y and pull up the voltage VBL(0) on the bit line BL(0). It is also noted that when the voltage VBL(0) on the bit line BL(0) is greater than the read voltage Vread and the word lines WL(1)-WL(y) electrically connected to the other resistive change element cells CELL01-CELL0y on the bit line BL(0) are driven to the read voltage Vread, leakage currents flow from the bit line BL(0) through the other resistive change element cells CELL01-CELL0y and pull down the voltage VBL(0) on the bit line BL(0). It is further noted that when the voltage VBL(0) on the bit line BL(0) is pulled up by leakage currents flowing into the bit line BL(0) and when the voltage VBL(0) on the bit line BL(0) is pulled down by leakage currents flowing from the bit line BL(0), the number of the word lines WL(1)-WL(y) should be small enough to allow a margin to determine a resistive state of the selected resistive change element SW00.

Determining a resistive state of the at least one resistive change element based on a resistance of the at least one resistive change element and the resistance for the operation, as similarly discussed above in step 408 of flow chart 400, during the READ operation of CELL00 is carried out by determining the resistive state of the resistive change element SW00 by comparing the voltage VBL(0) on the bit line BL(0) with the read voltage Vread. As discussed above, the voltage VBL(0) on the bit line BL(0) is determined by the voltage VWL(0) on the word line WL(0), the amount of the current ICELL00$iw2$, and the resistance of the resistive change element SW00. The voltage VBL(0) on the bit line BL(0) is indicative of the resistive state of the resistive change element SW00 because the voltage VWL(0) on the word line WL(0) and the amount of current ICELL00$iw2$ are approximately the same for both a low resistive state and a high resistive state of the resistive change element SW00, while, the resistance of the resistive change element SW00 is different for a low resistive state and a high resistive state. The read voltage Vread is indicative of the intermediate resistance Rinter for the READ operation of CELL00 because the read voltage Vread is equal to the voltage VWL(0) on the word line WL(0) subtracted by a voltage calculated by the amount of current ICELL00$iw2$ multiplied by the intermediate resistance Rinter. For example, when VWL(0)=2V, ICELL00$iw2$=11/48 µA, Rinter=48/11 MΩ, Vread=2V−(11/48 µA×48/11 MΩ)=1V. When the voltage VBL(0) on the bit line BL(0) is greater than the read voltage Vread (i.e. the voltage VBL(0) on the bit line BL(0)>Vread) the resistance of the resistive change element SW00 is less than the intermediate resistance Rinter (i.e. RCELL00<Rinter, where RCELL00 is the resistance of the resistive change element SW00 within CELL00) and the resistive state of the resistive change element SW00 is determined to be a low resistive state. When the voltage VBL(0) on the bit line BL(0) is less than or equal to the read voltage Vread (i.e. the voltage VBL(0) on the bit line BL(0)≤Vread) the resistance of the resistive change element SW00 is greater than or equal to the intermediate resistance Rinter (i.e. RCELL00>Rinter, where RCELL00 is the resistance of the resistive change element SW00 within CELL00) and the resistive state of resistive change element SW00 is determined to be a high resistive state.

The sense device 561 receives the voltage VBL(0) on the bit line BL(0) on a first input terminal because the first input terminal is electrically connected to the bit line BL(0) and receives the read voltage Vread on a second input terminal because the second input terminal is electrically connected to a power supply, a voltage source, a driver circuit, a resistor divider, a test circuit, a control circuit such as a processor, a controller, a programmable logic device, and a FGPA, or other device that supplies the read voltage Vread. The sense device 561 determines the resistive state of the resistive change element SW00 by comparing the voltage VBL(0) on the bit line BL(0) with the read voltage Vread. The sense device 561 outputs a signal indicative of the resistive state of the resistive change element SW00 on an output terminal. When the voltage VBL(0) on the bit line BL(0) is greater than the read voltage Vread, the sense device 561 outputs a signal indicating the resistive change element SW00 has a low resistive state. When the voltage VBL(0) on the bit line BL(0) is less than or equal to the read voltage Vread, the sense device 561 outputs a signal indicating the resistive change element SW00 has a high resistive state. For example, when ICELL00$iw2$=11/48 microamps, RCELL00=1 MΩ, VBL(0)=85/48 V, and Vread=1 V, the sense device 561 outputs a signal indicating that the resistive change element SW00 has a low resistive state (corresponding, typically, to a logic 1, a SET state). For example, when ICELL00$iw2$=11/48 microamps, RCELL00=48/11 MΩ, VBL(0)=1 V, and Vread=1 V, the sense device 561 outputs a signal indicating that the resistive change element SW00 has a high resistive state (corresponding, typically, to a logic 0, a RESET state). For example, when ICELL00$iw2$=11/48 microamps, RCELL00=10 MΩ, VBL(0)=−14/48 V, and Vread=1 V, the sense device 561 outputs a signal indicating that the resistive change element SW00 has a high resistive state (corresponding, typically, to a logic 0, a RESET state). It is noted that, although the above example provides an exemplary voltage VBL(0) on the bit line BL(0) as being −14/48 V, practical circuit limitations would prevent the exemplary voltage VBL(0) on the bit line BL(0) from being a negative voltage. It is also noted that when the plurality of sense devices 561, 563 are electrically connected to the plurality of amplifier 571, 573 as shown in FIGS. 5F and 5H, the plurality of sense devices 561, 563 determine the resistive states of the resistive change elements SW00-SWxy by comparing amplified voltages with a selected voltage, such as the read voltage Vread. It is further noted that when the plurality of sense devices 561, 563 are electrically connected to the plurality of inverters 581, 583 as shown in FIG. 5I, the plurality of inverters 581, 583 invert signals output by the plurality of sense devices 561, 563.

Alternatively, the plurality of sense devices 561, 563 are omitted from the exemplary architecture shown in FIGS. 5E-5H and a test circuit, a logic circuit, or a control circuit such as a processor, a controller, a programmable logic device, and a FGPA, is electrically connected to the bit lines BL(0)-BL(x) to receive the voltages on the bit lines BL(0)-BL(x) or is electrically connected to the plurality of amplifiers 571, 573 to receive amplified voltages. When the test circuit, the logic circuit, or the control circuit is electrically connected to the bit lines BL(0)-BL(x), the test circuit, the logic circuit, or the control circuit determines the resistive states of the resistive change elements SW00-SWxy by comparing the voltages on the bit lines BL(0)-BL(x) with the read voltage Vread or a stored value corresponding to the read voltage Vread. For example, for a READ operation of CELL00 when the test circuit, the logic circuit, or the control circuit is electrically connected to the bit lines BL(0)-BL(x), the test circuit, the logic circuit, or the control circuit determines the resistive state of the resistive change element SW00 by comparing the voltage VBL(0) on the bit line BL(0) with the read voltage Vread or a stored value corresponding to the read voltage Vread. When the test circuit, the logic circuit, or the control circuit is electrically connected to the plurality of amplifiers 571, 573, the test circuit, the logic circuit, or the control circuit determines the resistive states of the resistive change elements SW00-SWxy by comparing the amplified voltages with a selected voltage, such as the read voltage Vread, or a stored value corresponding to the selected voltage, such as the read voltage Vread. Additionally, the test circuit, the logic circuit, or the control circuit can output signals indicative of the resistive states of the resistive change elements SW00-SWxy.

Further, the circuit for sinking an adjustable amount of current 503 compensates for the circuit conditions of the resistive change element array 500 by regulating the feedback voltage Vfeedback to be approximately equal to the read voltage Vread. The feedback voltage Vfeedback reflects the circuit conditions of the resistive change element array 500 because the feedback voltage Vfeedback is based on the amount of the intermediate current I521$i$ flowing through the first NMOS transistor 521 and the amount of the intermediate current I521$i$ is impacted by the circuit conditions of the resistive change element array 500. For example, changes in the resistances of the low resistive reference elements RL00-RL1$y$ and changes in the resistances of the high resistive reference elements RH00-RH1$y$ due to temperature, leakage currents, and parasitic impedances, can impact the amount of the intermediate current I521$i$. The feedback voltage Vfeedback is supplied to the non-inverting input of the differential amplifier 511 and, as discussed above, the gate voltage VG of the first NMOS transistor 521 is the output voltage Vout of the differential amplifier 511 and the source voltage VS of the first NMOS transistor 521 is 0 volts or ground. The gate to source voltage VGS of the first NMOS transistor 521 regulates the amount of the intermediate current I521$i$ flowing through the first NMOS transistor 521 and the differential amplifier 511 adjusts the gate to source voltage VGS of the first NMOS transistor 521 so that the amount of the intermediate current I521$i$ adjusts the feedback voltage Vfeedback to be approximately equal to the read voltage Vread. Also, as discussed above, the amount of the current I531$i$ supplied by the NMOS transistor 531 is proportional to the amount of the intermediate current I521$i$ supplied by the first NMOS transistor 521. Thus, adjusting the amount of the intermediate current I521$i$ supplied by the first NMOS transistor 521 to compensate for circuit conditions of the resistive change element array 500 proportionally adjusts the amount of the current I531$i$ supplied by the NMOS transistor 531 to compensate for circuit conditions of the resistive change element array 500.

Additionally, READ operations of each resistive change element cell CELL00-CELLx0 on the word line WL(0) can be performed at the same time because each NMOS transistor in the first plurality of NMOS transistors 531, 533 supplies approximately the same amount of current. Each NMOS transistor in the first plurality of NMOS transistors 531, 533 supplies approximately the same amount of current for READ operations because each NMOS transistor in the first plurality of NMOS transistors 531, 533 has approximately the same features and approximately the same gate to source voltage VGS. FIG. 6D shows a current ICELL00$iw$2 flowing into the bit line BL(0) through CELL00, a current ICELLx0$iw$2 flowing into the bit line BL(x) through CELLx0, a current I531$i$ flowing from the bit line BL(0) through the NMOS transistor 531, and a current I533$i$ flowing from the bit line BL(x) through the NMOS transistor 533. The current I531$i$ causes current flow into the bit line BL(0) approximately equal to the amount of the current I531$i$ because the current I531$i$ flows from the bit line BL(0) and the amount of current flowing from the bit line BL(0) is approximately equal to the amount of current flowing into the bit line BL(0). The current I533$i$ causes current flow into the bit line BL(x) approximately equal to the amount of the current I533$i$ because the current I533$i$ flows from the bit line BL(x) and the amount of current flowing from the bit line BL(x) is approximately equal to the amount of current flowing into the bit line BL(x). READ operations of each resistive change element cell CELL00-CELLx0 on the word line WL(0) are performed in a similar manner to the READ operation of CELL00, discussed above. Performing READ operations of each cell on a word line at the same time can be highly desirable in certain application where rapid data READ operations or page mode READ operations are required.

Figure 6E:
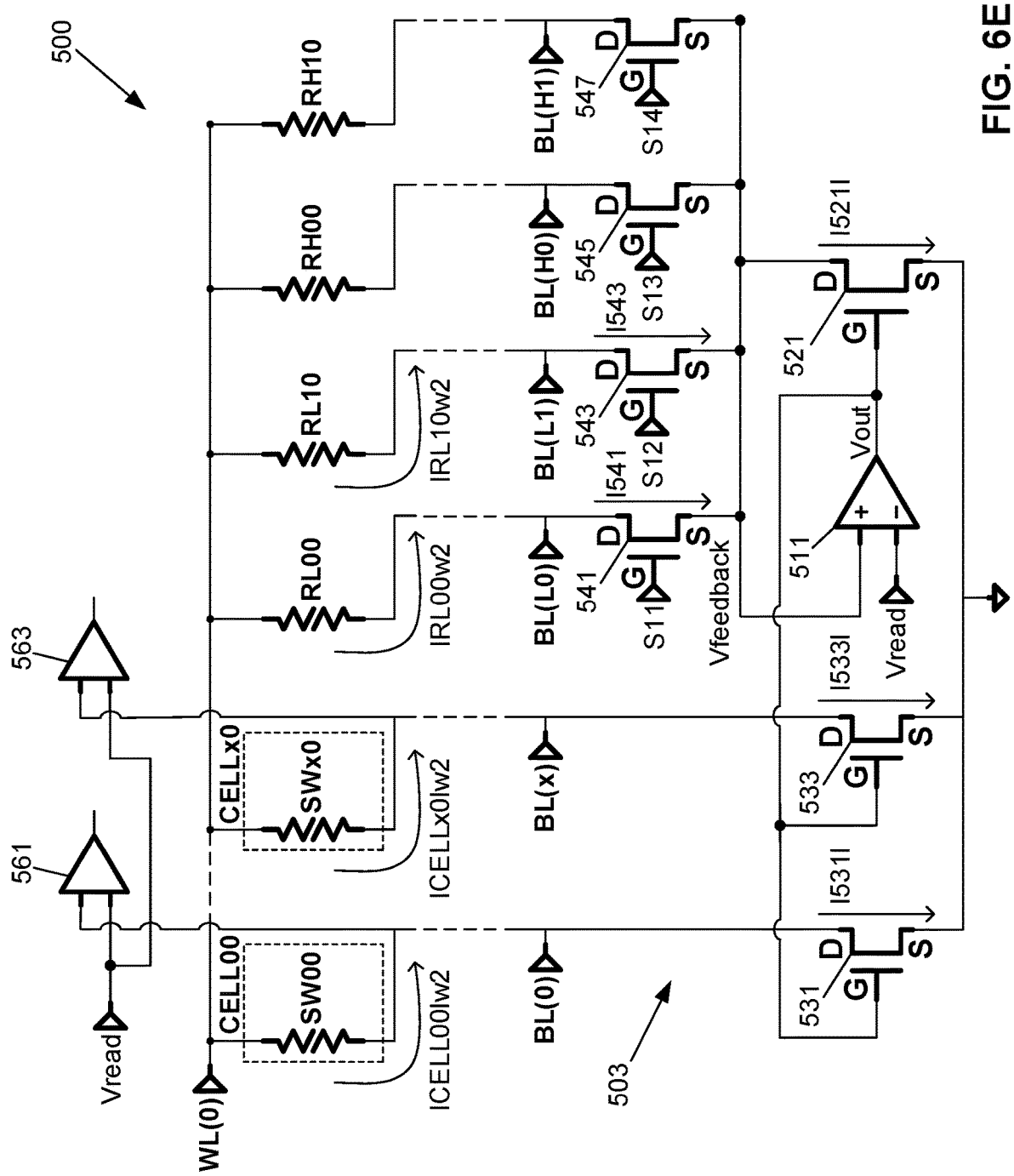
FIG. 6E illustrates a simplified schematic diagram showing current flow in the exemplary architecture of FIG. 5E during a SET VERIFY operation, where a reduced version of the resistive change element array is shown so that current flow can be shown in greater detail.

A SET VERIFY operation of CELL00 in the exemplary architecture of FIG. 5E will be explained in detail below, and SET VERIFY operations of each cell in the exemplary architecture of FIG. 5E can be performed in a similar manner to the SET VERIFY operation of CELL00. FIG. 6E illustrates a simplified schematic diagram showing current flow, ignoring leakage currents, during a SET VERIFY operation of CELL00 in the exemplary architecture FIG. 5E. FIG. 6E shows a reduced version of the resistive change element array 500, so that current flow can be shown in greater detail. It is noted that SET VERIFY operations of CELL00 explained in further detail below generally describe current flowing through CELL00 as flowing from the word line WL(0) to the bit line BL(0), however, the devices and methods of the present disclosure are not limited to current flow through the cells as flowing from the word line to the bit line. It is also noted that FIG. 6E can be referred to for a SET VERIFY operation of CELL00 and for SET VERIFY operations of each cell on the word line WL(0) performed at the same time because current flows through each NMOS transistor in the first plurality of NMOS transistors 531, 533 and through each cell on the word line WL(0) for a SET VERIFY operation of CELL00 and for SET VERIFY operations of each cell on the word line WL(0) performed at the same time.

A SET VERIFY operation of CELL00 starts, as similarly discussed above in step 402 of flow chart 400, by selecting CELL00 from the plurality of resistive change element cells CELL00-CELLxy in the resistive change element array 500. CELL00 is selected from the plurality of resistive change element cells CELL00-CELLxy by driving a voltage VWL(0) on the word line WL(0) to the system voltage Vdd and driving the other word lines WL(1)-WL(y) to a read voltage Vread or a high impedance state. The voltage VWL(0) on the word line WL(0), the system voltage Vdd, and the read voltage Vread are design variables selected by a circuit designer. It is noted that although the voltage VWL(0) on the word line WL(0) is discussed as being driven to the system voltage Vdd of 2 volts, the voltage VWL(0) on the word line WL(0) is not limited to being driven to the system voltage Vdd or being driven to 2 volts and that the circuit designer can select other voltage levels for the voltage VWL(0) on the word line WL(0), such as a voltage level greater than 2 volts and a voltage level less than 2 volts. It is also noted that although the system voltage Vdd is discussed as having a voltage level of 2 volts, the system voltage Vdd is not limited to having a voltage level of 2 volts and that the circuit designer can other voltage levels for the system voltage Vdd, such as a voltage level greater than 2 volts and a voltage level less than 2 volts. It is further noted that although the read voltage Vread is discussed as having a voltage level of 1 volt, the read voltage Vread is not limited to having a voltage level of 1 volt and that the circuit designer can select other voltage levels for the read voltage Vread, such as a voltage level greater than 1 volt and a voltage level less than 1 volt.

Selecting a resistance for an operation of the at least one resistive change element, as similarly discussed above in step 404 of flow chart 400, during a SET VERIFY operation of CELL00 is carried out by turning on the first NMOS transistor 521, the NMOS transistor 541, and the NMOS transistor 543 to select a low resistance Rlow for the SET VERIFY operation of CELL00. Alternatively, when the first NMOS transistor 521 is already turned on, selecting a resistance for an operation of the at least one resistive change element, as similarly discussed above in step 404 of flow chart 400, during a SET VERIFY operation of CELL00 is carried out by turning on the NMOS transistor 541 and the NMOS transistor 543 to select a low resistance Rlow for the SET VERIFY operation of CELL00. When the first NMOS transistor 521, the NMOS transistor 541, and the NMOS transistor 543 are turned on, the circuit for sinking an adjustable amount of current 503 is set to sink an amount of current Ilow that would flow through a resistive reference element having a low resistance Rlow, a second terminal electrically connected to the voltage VWL(0) on the word line WL(0), which as discussed above is the system voltage Vdd, and a first terminal electrically connected to the feedback voltage Vfeedback. The low resistance Rlow can be determined by the following equation, Rlow=(Inverse of the proportion between the amount of the current I531$l$ supplied by the NMOS transistor 531 and the amount of the large current I521$l$ supplied by the first NMOS transistor 521)((RRL00×RRL10)/(RRL00+RRL10)) where RRL00 is the resistance of the low resistive reference element RL00 and RRL10 is the resistance of the low resistive reference element RL10. It is noted that when the resistance of the low resistive reference element RL00 and the resistance of the low resistive reference element RL10 are approximately the same, the resistance of the low resistive reference element RL00, the resistance of the low resistive reference element RL10, and the low resistance Rlow are approximately the same. For example, when the resistance of the low resistive reference element RL00=3 MΩ, the resistance of the low resistive reference element RL10=3 MΩ, the inverse of the proportion between the amount of the current I531$l$ supplied by the NMOS transistor 531 and the large current I521$l$ supplied by the first NMOS transistor 521 is 2, Rlow=(2)((3 MΩ×3 MΩ)/(3 MΩ+3 MΩ))=3 MΩ.

The first NMOS transistor 521 is turned on when a gate to source voltage VGS of the first NMOS transistor 521 is greater than a threshold voltage VT of the first NMOS transistor 521. The gate to source voltage of the first NMOS transistor 521 is determined by the difference between a gate voltage VG and a source voltage VS. The gate voltage VG of the first NMOS transistor 521 is the output voltage Vout of the differential amplifier 511 because the gate terminal of the first NMOS transistor 521 is electrically connected to the output terminal of the differential amplifier 511. The source voltage VS of the first NMOS transistor 521 is 0 volts or ground because the source terminal of the first NMOS transistor 521 is electrically connected to 0 volts or ground. Thus, the gate to source voltage VGS of the first NMOS transistor 521 can be expressed by VGS=VG−VS, where the gate voltage VG is the output voltage Vout of the differential amplifier 511 and the source voltage VS is 0 volts or ground.

The output voltage Vout of the differential amplifier 511 is determined by multiplying a gain of the differential amplifier 511 with the difference between a voltage of the non-inverting input and a voltage of the inverting input. The differential amplifier 511 has a gain of 1, however, the differential amplifier 511 is not limited to having a gain of 1. The gain of the differential amplifier 511 is a design variable selected by a circuit designer and the circuit designer can select other values for the gain of the differential amplifier 511, such as a gain of the differential amplifier 511 greater than 1 and a gain of the differential amplifier 511 less than 1. The voltage of the non-inverting input of the differential amplifier 511 is the feedback voltage Vfeedback because the non-inverting input terminal is electrically connected to the drain terminal of the first NMOS transistor 521 and the source terminal of each NMOS transistor in the second plurality of NMOS transistors 541, 543, 545, 547 through the feedback loop. The voltage of the inverting input of the differential amplifier 511 is the read voltage Vread because the inverting input terminal is electrically connected to a power supply, a voltage source, a driver circuit, a resistor divider, a test circuit, a control circuit such as a processor, a controller, a programmable logic device, and a FGPA, or other device that supplies the read voltage Vread. Thus, the output voltage Vout of the differential amplifier 511 can be expressed by Vout=Gain (Voltage of the Non-Inverting Input−Voltage of the Inverting Input), where the gain is 1, the voltage of the non-inverting input is the feedback voltage Vfeedback, and the voltage of inverting input is the read voltage Vread.

Substituting for the gain, the voltage of the non-inverting input, and the voltage of the inverting input, in the above equation for determining the output voltage Vout of the differential amplifier 511 provides Vout=Vfeedback−Vread and substituting Vfeedback−Vread for the gate voltage VG in the above equation for determining the gate to source voltage VGS of the first NMOS transistor 521 provides the equation VGS=Vfeedback−Vread−0 volts. As shown by this equation, the gate to source voltage VGS of the first NMOS transistor 521 changes when the feedback voltage Vfeedback changes because the voltage level of the read voltage Vread and 0 volts are generally constant. Thus, the first NMOS transistor 521 is turned on when the feedback voltage Vfeedback has a voltage level such that the gate to source voltage VGS of the first NMOS transistor 521 is greater than a threshold voltage VT of the first NMOS transistor 521.

The NMOS transistors 541, 543 are turned on by control signals S11-S12 supplied by a test circuit or a control circuit such as a processor, a controller, a programmable logic device, and a FGPA, and the NMOS transistors 545, 547 are turned off by control signals S13-S14 supplied by the test circuit or the control circuit. The test circuit or the control circuit supplies the control signal S11 having a voltage level such that a gate to source voltage VGS for the NMOS transistor 541 is greater than a threshold voltage VT for the NMOS transistor 541, the control signal S12 having a voltage level such that a gate to source voltage VGS for the NMOS transistor 543 is greater than a threshold voltage VT for the NMOS transistor 543, the control signal S13 having a voltage level such that a gate to source voltage VGS for the NMOS transistor 545 is less than a threshold voltage VT for the NMOS transistor 545, and the control signal S14 having a voltage level such that a gate to source voltage VGS for the NMOS transistor 547 is less than a threshold voltage VT for the NMOS transistor 547.

When the first NMOS transistor 521, the NMOS transistor 541, and the NMOS transistor 543 are turned on, a current IRL00$w$2 flows into the bit line BL(L0) through the low resistive reference element RL00, a current I541 flows from the bit line BL(L0) through the NMOS transistor 541, a current IRL10$w$2 flows into the bit line BL(L1) through the low resistive reference element RL10, a current I543 flows from the bit line BL(L1) through the NMOS transistor 543, a large current I521*l* flows through the first NMOS transistor 521, a voltage on the bit line BL(L0) is driven to the feedback voltage Vfeedback, and a voltage on the bit line BL(L1) is driven to the feedback voltage Vfeedback. FIG. 6E shows the current IRL00*w*2 flowing through the low resistive reference element RL00, the current I541 flowing through the NMOS transistor 541, the current IRL10*w*2 flowing through the low resistive reference element RL10, the current I543 flowing through the NMOS transistor 543, and the large current I521*l* flowing through the first NMOS transistor 521. The current IRL00*w*2 flows through the low resistive reference element RL00 because the second terminal of the low resistive reference element RL00 is at the voltage VWL(0) on the word line WL(0), which as discussed above is the system voltage Vdd, and the first terminal of the low resistive reference element RL00 is at the voltage VBL(L0) on the bit line BL(L0), which as discussed above is the feedback voltage Vfeedback. While, ignoring leakage currents, current does not flow through the other low resistive reference elements RL01-RL0*y* electrically connected to the bit line BL(L0) because the second terminals of the other low resistive reference elements RL01-RL0*y* are at the read voltage Vread or a high impedance state to prevent current flow and the first terminals of the other low resistive reference elements RL01-RL0*y* are at the feedback voltage Vfeedback. The current IRL10*w*2 flows through the low resistive reference element RL10 because the second terminal of the low resistive reference element RL10 is at the voltage VWL(0) on the word line WL(0), which as discussed above is the system voltage Vdd, and the first terminal of the low resistive reference element RL10 is at the voltage VBL(L1) on the bit line BL(L1), which as discussed above is the feedback voltage Vfeedback. While, ignoring leakage currents, current does not flow through the other low resistive reference elements RL11-RH1*y* electrically connected to the bit line BL(L1) because the second terminals of the other low resistive reference elements RL11-RL1*y* are at the read voltage Vread or a high impedance state to prevent current flow and the first terminals of the other low resistive reference elements RL11-RL1*y* are at the feedback voltage Vfeedback. It is noted that, as discussed below, the feedback voltage Vfeedback is regulated such that the voltage level of the feedback voltage Vfeedback is approximately equal to the voltage level of the read voltage Vread.

The amount of the current IRL00*w*2, ignoring leakage currents, can be approximated using Ohm's Law as IRL00*w*2=(VWL(0)−VBL(L0))/RRL00, where VWL(0) is the voltage on the word line WL(0), VBL(L0) is the voltage on bit line BL(L0), and RRL00 is the resistance of the low resistive reference element RL00. For example, when the voltage VWL(0) is the system voltage Vdd of 2 volts, the voltage VBL(L0) is the feedback voltage Vfeedback of 1 volt, and the low resistive reference element RL00 has a resistance of 3 MΩ, the amount of the current IRL00*w*2 can be approximated using Ohm's Law as IRL00*w*2=(2V−1V)/3 MΩ=⅓ µA. The amount of the current IRL00*w*2, ignoring leakage currents, is approximately equal to the amount of the current I541 flowing from the bit line BL(L0) through the NMOS transistor 541 because the amount of current flowing into the bit line BL(L0) is approximately equal to the amount of current flowing from the bit line BL(L0). The amount of the current IRL10*w*2, ignoring leakage currents, can be approximated using Ohm's Law as IRL10*w*2=(VWL(0)−VBL(L1))/RRL10, where VWL(0) is the voltage on the word line WL(0), VBL(L1) is the voltage on the bit line BL(L1), and RRL10 is the resistance of the low resistive reference element RL10. For example, when the voltage VWL(0) is the system voltage Vdd of 2 volts, the voltage VBL(L1) is the feedback voltage Vfeedback of 1 volt, and the low resistive reference element RL10 has a resistance of 3 MΩ, the amount of the current IRL10*w*2 can be approximated using Ohm's Law as IRL10*w*2=(2V−1V)/3 MΩ=⅓ µA. The amount of the current IRL10*w*2, ignoring leakage currents, is approximately equal to the amount of the current I543 flowing from the bit line BL(L1) through the NMOS transistor 543 because the amount of current flowing into the bit line BL(L1) is approximately equal to the amount of current flowing from the bit line BL(L1). The sum of the amount of the current I541 and the amount of the current I543 is approximately equal to the amount of the large current I521*l* supplied by the first NMOS transistor 521 because the first NMOS transistor 521 is electrically connected in series with the second plurality of NMOS transistors 541, 543, 545, 547. Thus, the sum of the amount of the current IRL00*w*2 and the amount of the current IRL10*w*2 is approximately equal to the amount of the large current I521*l* supplied by the first NMOS transistor 521. Referring to the above examples, where the amount of the current IRL00*w*2 is ⅓ microamps and the amount of the current IRL10*w*2 is ⅓ microamps, the amount of the large current I521*l* supplied by the first NMOS transistor 521 is ⅔ microamps. It is noted that leakage currents do not prevent the SET VERIFY operation of CELL00 when the leakage currents are much less than the sum of the currents IRL00*w*2 and IRL10*w*2.

Supplying an amount of current for the operation based on the resistance for the operation, as similarly discussed above in step 406 of flow chart 400, during the SET VERIFY operation of CELL00 is carried out by the NMOS transistor 531 supplying a current I531*l* that generally corresponds with the amount of current Ilow. Alternatively, when the circuit for sinking an adjustable amount of current 503 additionally includes a plurality of FETs electrically connected in series with the first plurality of NMOS transistors 531, 533, as discussed above, supplying an amount of current for the operation based on the resistance for the operation, as similarly discussed above in step 406 of flow chart 400, during the SET VERIFY operation of CELL00 is carried out by turning on the FET electrically connected in series with the NMOS transistor 531 and the NMOS transistor 531 supplying a current I531*l* that generally corresponds with the amount of current Ilow. As discussed above, the amount of current Ilow is the amount of current that would flow through a resistive reference element having a low resistance Rlow, a second terminal electrically connected to the voltage VWL(0) on the word line WL(0), which as discussed above is the system voltage Vdd, and a first terminal electrically connected to the feedback voltage Vfeedback. The amount of current Ilow can be determined using Ohm's Law as Ilow=(VWL(0)−Vfeedback)/Rlow, where VWL(0) is the voltage on the word line WL(0), Vfeedback is the feedback voltage, and Rlow is the low resistance. For example, when VWL(0)=2 V, Vfeedback=1 V, Rlow=3 MΩ, Ilow=(2V−1V)/3 MΩ=⅓ µA. It is noted that the current I531*l* causes current flow into the bit line BL(0) approximately equal to the amount of the current I531*l* because the current I531*l* flows from the bit line BL(0) and the amount of current flowing from the bit line BL(0) is approximately equal to the amount of current flowing into the bit line BL(0).

The NMOS transistor 531 is turned on when a gate to source voltage VGS of the NMOS transistor 531 is greater than a threshold voltage VT for the NMOS transistor 531. The gate to source voltage VGS of the NMOS transistor 531 is determined by the difference between a gate voltage VG and a source voltage VS. The gate voltage VG of the NMOS transistor 531 is the output voltage Vout of the differential amplifier 511 because the gate terminal of the NMOS transistor 531 is electrically connected to the output terminal of the differential amplifier 511. The source voltage VS of the NMOS transistor 531 is 0 volts or ground because the source terminal of the NMOS transistor 531 is electrically connected to 0 volts or ground. Thus, the gate to source voltage VGS of the NMOS transistor 531 can be expressed by VGS=VG−VS, where the gate voltage VG is the output voltage Vout of the differential amplifier 511 and the source voltage VS is 0 volts or ground. Further, the gate to source voltage VGS of the NMOS transistor 531 is approximately equal to the gate to source voltage VGS of the first NMOS transistor 521 because the gate voltages of the NMOS transistor 531 and the first NMOS transistor 521 are the output voltage Vout of the differential amplifier 511 and the source voltages of the NMOS transistor 531 and the first NMOS transistor 521 are 0 volts or ground. It is noted that the source terminal of the first NMOS transistor 521 and the source terminals of NMOS transistors in the first plurality of NMOS transistors 531, 533 can be electrically connected to voltages other than 0 volts or ground, such a voltage greater than 0 volts or ground and a voltage less than 0 volts or ground.

As discussed above, the output voltage Vout of the differential amplifier 511 can be expressed by Vout=Vfeedback−Vread and substituting Vfeedback−Vread for the gate voltage VG in the above equation for determining the gate to source voltage VGS of the NMOS transistor 531 provides the equation VGS=Vfeedback−Vread−0 volts. As shown by this equation, the gate to source voltage VGS of the NMOS transistor 531 changes when the feedback voltage Vfeedback changes because the voltage level of the read voltage Vread and 0 volts or ground are generally constant. Thus, the NMOS transistor 531 is turned on when the feedback voltage Vfeedback has a voltage level such that the gate to source voltage VGS of the NMOS transistor 531 is greater than a threshold voltage VT of the NMOS transistor 531.

The amount of the current I531*l* supplied by the NMOS transistor 531 is proportional to the amount of the large current I521*l* supplied by the first NMOS transistor 521. The proportion between the amount of the current I531*l* supplied by the NMOS transistor 531 and the amount of the large current I521*l* supplied by the first NMOS transistor 521 is a design variable selected by a circuit designer. The circuit designer can select the proportion between the amount of the current I531*l* supplied by the NMOS transistor 531 and the amount of the large current I521*l* supplied by the first NMOS transistor 521 by selecting the features of the NMOS transistor 531 and the features of the first NMOS transistor 521. The proportion between the amount of the current I531*l* supplied by the NMOS transistor 531 and the amount of the large current I521*l* supplied by the first NMOS transistor 521 is selected as 0.5 by selecting a width to length ratio of the NMOS transistor 531 that is approximately 0.5 a width to length ratio of the first NMOS transistor 521. However, the proportion is not limited to 0.5 and the circuit designer can select other values for the proportion, such as a proportion greater than 0.5 and a proportion less than 0.5. Further, the circuit designer can select other features of the NMOS transistor 531 and the first NMOS transistor 521 to achieve the desired proportion between the amount of the current I531*l* supplied by the NMOS transistor 531 and the amount of the large current I521*l* supplied by the first NMOS transistor 521. For example, the circuit designer can select other dimensions of the NMOS transistors, layouts of the NMOS transistors, and materials for fabricating the NMOS transistors to achieve the desired proportion between the amount of the current I531*l* supplied by the NMOS transistor 531 and the amount of the large current I521*l* supplied by the first NMOS transistor 521. It is noted that when other types of field effect transistors are used in place of the first NMOS transistor 521 and the first plurality of NMOS transistor 531, 533 the circuit designer can also select dimensions, layouts, and materials for fabricating the other types of field effect transistors to achieve the desired proportion between currents.

When the proportion between the amount of the current I531*l* supplied by the NMOS transistor 531 and the amount of the large current I521*l* supplied by the first NMOS transistor 521 is selected based on the width to length ratios of the NMOS transistor 531 and the first NMOS transistor 521, the amount of the current I531*l* can be approximated by the following equation, I531*l*=(IRL00*w*2+IRL10*w*2)((Channel Width of NMOS 531/Channel Length of NMOS 531)/(Channel Width of NMOS 521/Channel Length of NMOS 521)), where IRL00*w*2 is the amount of current flowing through the low resistive reference element RL00 and IRL10*w*2 is the amount of current flowing through the low resistive reference element RL10. For example, when the current IRL00*w*2 is ⅓ microamps, the current IRL10*w*2 is ⅓ microamps, and the width to length ratio of the NMOS transistor 531 is 0.5 the width to length ratio of the first NMOS transistor 521, the current I531*l*=(⅓ μA+⅓ μA)(0.5)=⅓ μA.

It is noted that the amount of the current I531*l* supplied by the NMOS transistor 531 can be an average of the currents flowing through the second plurality of NMOS transistors 541, 543, 545, 547 by turning on at the same time a number of the NMOS transistors that matches the inverse of the proportion between the amount of the current I531*l* supplied by the NMOS transistor 531 and the amount of the large current I521*l* supplied by the first NMOS transistor 521. For example, when the proportion between the amount of the current I531*l* supplied by the NMOS transistor 531 and the amount of the large current I521*l* supplied by the first NMOS transistor 521 is 0.5, the inverse of the proportion is 2, and the amount of the current I531*l* can be an average of the current flowing through the second plurality of NMOS transistors 541, 543, 545, 547 by turning on at the same time 2 of the NMOS transistors. For example, when the NMOS transistors 541, 543 are turned on at the same time, the NMOS transistors 545, 547 are turned off, the current I541=⅓ microamps, the current I543=⅓ microamps, and the proportion between the amount of the current I531*l* supplied by the NMOS transistor 531 and the large current I521*l* supplied by the first NMOS transistor 521 is 0.5, the current I531*l* is I531*l*=(I541+I543)/2=(⅓ μA+⅓ μA)/2=⅓ μA.

A current ICELL00/*w*2 flows into the bit line BL(0) through CELL00 and the current I531*l* flows from the bit line BL(0) through the NMOS transistor 531. FIG. 6E shows the current ICELL00/*w*2 flowing through CELL00 and the current I531*l* flowing through the NMOS transistor 531. The current ICELL00/*w*2 flows through CELL00 because the second terminal of the resistive change element SW00 within CELL00 is at the voltage VWL(0) on the word line WL(0), which as discussed above is the system voltage Vdd, and the first terminal of the resistive change element SW00 is at the voltage VBL(0) on the bit line BL(0). While, ignoring leakage currents, current does not flow through the other resistive change element cells CELL01-CELL0*y* on the bit line BL(0) because the second terminals of the resistive change elements SW01-SW0y within the other resistive change element cells CELL01-CELL0y are at the read voltage Vread or a high impedance state to prevent current flow and the first terminals of the resistive change elements SW01-SW0y are at the voltage VBL(0) on the bit line BL(0). The amount of the current ICELL00*lw*2, ignoring leakage currents, is approximately equal to the amount of the current I531*l* flowing through the NMOS transistor 531 because the amount of current flowing into the bit line BL(0) is approximately equal to the amount of current flowing from the bit line BL(0). Further, the amount of the current ICELL00*lw*2 is approximately equal to the average of the amount of the current I541 flowing through the NMOS transistor 541 and the current I543 flowing through the NMOS transistor 541. It is noted that leakage currents do not prevent a SET VERIFY operation of CELL00 when the leakage currents are much less than the amount of the current ICELL00*lw*2.

The voltage VBL(0) on the bit line BL(0), ignoring leakage currents, can be approximated by subtracting the voltage drop across CELL00 from the voltage VWL(0) on the word line WL(0) and the voltage drop across CELL00 can be approximated using Ohm's Law. Thus, the voltage VBL(0) on the bit line BL(0) can be approximated by VBL(0)=VWL(0)−(ICELL00*lw*2×RCELL00), where VWL(0) is the voltage on the word line WL(0), the current ICELL00*lw*2 is the current flowing through CELL00, and RCELL00 is the resistance of the resistive change element SW00 within CELL00. As shown by this equation, the voltage VBL(0) on the bit line BL(0) changes when the resistance of the resistive change element SW00 changes because the voltage VWL(0) on the word line WL(0) and the current flowing through CELL00 are generally constant. For example, when VWL(0)=2 volts, IRL00*w*2=⅓ μA, IRL10*w*2=⅓ μA, ICELL00*lw*2=⅓ μA, and RCELL00=3 MΩ, the voltage VBL(0)=2 V−(⅓ μA×3 MΩ)=1 V. For example, when VWL(0)=2 volts, IRL00*w*2=⅓ μA, IRL10*w*2=⅓ μA, ICELL00*lw*2=⅓ μA, and RCELL00=1 MΩ, the voltage VBL(0)=2 V−(⅓ μA×1 MΩ)=⅔ V. For example, when VWL(0)=2 volts, IRL00*w*2=⅓ μA, IRL10*w*2=⅓ μA, ICELL00*lw*2=⅓ μA, and RCELL00=10 MΩ, the voltage VBL(0)=2 V−(⅓ μA×10 MΩ)=−4/3 V. It is noted that, although the above exemplary calculation provides an exemplary voltage VBL(0) on the bit line BL(0) as being −4/3 V, practical circuit limitations would prevent the exemplary voltage VBL(0) on the bit line BL(0) from being a negative voltage.

It is noted that when the voltage VBL(0) on the bit line BL(0) is less than the read voltage Vread and the word lines WL(1)-WL(y) electrically connected to the other resistive change element cells CELL01-CELL0y on the bit line BL(0) are driven to the read voltage Vread, leakage currents flow into the bit line BL(0) through the other resistive change element cells CELL01-CELL0y and pull up the voltage VBL(0) on the bit line BL(0). It is also noted that when the voltage VBL(0) on the bit line BL(0) is greater than the read voltage Vread and the word lines WL(1)-WL(y) electrically connected to the other resistive change element cells CELL01-CELL0y on the bit line BL(0) are driven to the read voltage Vread, leakage currents flow from the bit line BL(0) through the other resistive change element cells CELL01-CELL0y and pull down the voltage VBL(0) on the bit line BL(0). It is further noted that when the voltage VBL(0) on the bit line BL(0) is pulled up by leakage currents flowing into the bit line BL(0) and when the voltage VBL(0) on the bit line BL(0) is pulled down by leakage currents flowing from the bit line BL(0), the number of the word lines WL(1)-WL(y) should be small enough to allow a margin to determine a resistive state of the selected resistive change element SW00.

Determining a resistive state of the at least one resistive change element based on a resistance of the at least one resistive change element and the resistance for the operation, as similarly discussed above in step 408 of flow chart 400, during the SET VERIFY operation of CELL00 is carried out by determining the resistive state of the resistive change element SW00 by comparing the voltage VBL(0) on the bit line BL(0) with the read voltage Vread. As discussed above, the voltage VBL(0) on the bit line BL(0) is determined by the voltage VWL(0) on the word line WL(0), the amount of the current ICELL00*lw*2, and the resistance of the resistive change element SW00. The voltage VBL(0) on the bit line BL(0) is indicative of the resistive state of the resistive change element SW00 because the voltage VWL(0) on the word line WL(0) and the amount of current ICELL00*lw*2 are approximately the same for both a low resistive state and a resistive state other than a low resistive state of the resistive change element SW00, while, the resistance of the resistive change element SW00 is different for a low resistive state and a resistive state other than a low resistive state. The read voltage Vread is indicative of the low resistance Rlow for the SET VERIFY operation of CELL00 because the read voltage Vread is equal to the voltage VWL(0) on the word line WL(0) subtracted by a voltage calculated by the amount of current ICELL00*lw*2 multiplied by the low resistance Rlow. For example, when VWL(0)=2V, ICELL00*lw*2=⅓ μA, Rlow=3 MΩ, Vread=2V−(⅓ μA×3 MΩ)=1V. When the voltage VBL(0) on the bit line BL(0) is greater than the read voltage Vread (i.e. the voltage VBL(0) on the bit line BL(0)>Vread) the resistance of the resistive change element SW00 is less than the low resistance Rlow (i.e. RCELL00<Rlow, where RCELL00 is the resistance of the resistive change element SW00 within CELL00) and the resistive state of the resistive change element SW00 is determined to be a low resistive state. When the voltage VBL(0) on the bit line BL(0) is less than or equal to the read voltage Vread (i.e. the voltage VBL(0) on the bit line BL(0)≤Vread) the resistance of the resistive change element SW00 is greater than or equal to the low resistance Rlow (i.e. RCELL00>Rlow, where RCELL00 is the resistance of the resistive change element SW00 within CELL00) and the resistive state of resistive change element SW00 is determined to be a resistive state other than a low resistive state.

The sense device 561 receives the voltage VBL(0) on the bit line BL(0) on a first input terminal because the first input terminal is electrically connected to the bit line BL(0) and receives the read voltage Vread on a second input terminal because the second input terminal is electrically connected to a power supply, a voltage source, a driver circuit, a resistor divider, a test circuit, a control circuit such as a processor, a controller, a programmable logic device, and a FGPA, or other device that supplies the read voltage Vread. The sense device 561 determines the resistive state of the resistive change element SW00 by comparing the voltage VBL(0) on the bit line BL(0) with the read voltage Vread. The sense device 561 outputs a signal indicative of the resistive state of the resistive change element SW00 on an output terminal. When the voltage VBL(0) on the bit line BL(0) is greater than the read voltage Vread, the sense device 561 outputs a signal indicating the resistive change element SW00 has a low resistive state. When the voltage VBL(0) on the bit line BL(0) is less than or equal to the read voltage Vread, the sense device 561 outputs a signal indicating the resistive change element SW00 has a resistive state other than a low resistive state. For example, when ICELL00/w2=⅓ microamps, RCELL00=1 MΩ, VBL(0)=5/3 V, and Vread=1 V, the sense device 561 outputs a signal indicating that the resistive change element SW00 has a low resistive state (corresponding, typically, to a logic 1, a SET state). For example, when ICELL00/w2=⅓ microamps, RCELL00=3 MΩ, VBL(0)=1 V, and Vread=1 V, the sense device 561 outputs a signal indicating that the resistive change element SW00 has a resistive state other than a low resistive state. For example, when ICELL00/w2=⅓ microamps, RCELL00=10 MΩ, VBL(0)=-4/3 V, and Vread=1 V, the sense device 561 outputs a signal indicating that the resistive change element SW00 has a resistive state other than a low resistive state. It is noted that, although the above example provides an exemplary voltage VBL(0) on the bit line BL(0) as being -4/3 V, practical circuit limitations would prevent the exemplary voltage VBL(0) on the bit line BL(0) from being a negative voltage. It is also noted that when the plurality of sense devices 561, 563 are electrically connected to the plurality of amplifiers 571, 573 as shown in FIGS. 5F and 5H, the plurality of sense device 561, 563 determine the resistive states of the resistive change elements SW00-SWxy by comparing amplified voltages with a selected voltage, such as the read voltage Vread. It is further noted that when the plurality of sense devices 561, 563 are electrically connected to the plurality of inverters 581, 583 as shown in FIG. 5I, the plurality of inverters 581, 583 invert signals output by the plurality of sense devices 561, 563.

Alternatively, the plurality of sense devices 561, 563 are omitted from the exemplary architecture shown in FIGS. 5E-5H and a test circuit, a logic circuit, or a control circuit such as a processor, a controller, a programmable logic device, and a FGPA, is electrically connected to the bit lines BL(0)-BL(x) to receive the voltages on the bit lines BL(0)-BL(x) or is electrically connected to the plurality of amplifiers 571, 573 to receive amplified voltages. When the test circuit, the logic circuit, or the control circuit is electrically connected to the bit lines BL(0)-BL(x), the test circuit, the logic circuit, or the control circuit determines the resistive states of the resistive change elements SW00-SWxy by comparing the voltages on the bit lines BL(0)-BL(x) with the read voltage Vread or a stored value corresponding to the read voltage Vread. For example, for a SET VERIFY operation of CELL00 when the test circuit, the logic circuit, or the control circuit is electrically connected to the bit lines BL(0)-BL(x), the test circuit, the logic circuit, or the control circuit determines the resistive state of the resistive change element SW00 by comparing the voltage VBL(0) on the bit line BL(0) with the read voltage Vread or a stored value corresponding to the read voltage Vread. When the test circuit, the logic circuit, or the control circuit is electrically connected to the plurality of amplifiers 571, 573, the test circuit, the logic circuit, or the control circuit determine the resistive states of the resistive change elements SW00-SWxy by comparing the amplified voltages with a selected voltage, such as the read voltage Vread, or a stored value corresponding to the selected voltage, such as the read voltage Vread. Additionally, the test circuit, the logic circuit, or the control circuit can output signals indicative of the resistive states of the resistive change elements SW00-SWxy.

Further, the circuit for sinking an adjustable amount of current 503 compensates for the circuit conditions of the resistive change element array 500 by regulating the feedback voltage Vfeedback to be approximately equal to the read voltage Vread. The feedback voltage Vfeedback reflects the circuit conditions of the resistive change element array 500 because the feedback voltage Vfeedback is based on the amount of the large current I521l flowing through the first NMOS transistor 521 and the amount of the large current I521l is impacted by the circuit conditions of the resistive change element array 500. For example, changes in the resistances of the low resistive reference elements RL00-RL1y due to temperature, leakage currents, and parasitic impedances, can impact the amount of the large current I521l. The feedback voltage Vfeedback is supplied to the non-inverting input of the differential amplifier 511 and, as discussed above, the gate voltage VG of the first NMOS transistor 521 is the output voltage Vout of the differential amplifier 511 and the source voltage VS of the first NMOS transistor 521 is 0 volts or ground. The gate to source voltage VGS of the first NMOS transistor 521 regulates the amount of the large current I521l flowing through the first NMOS transistor 521 and the differential amplifier 511 adjusts the gate to source voltage VGS of the first NMOS transistor 521 so that the amount of the large current I521l adjusts the feedback voltage Vfeedback to be approximately equal to the read voltage Vread. Also, as discussed above, the amount of the current I531l supplied by the NMOS transistor 531 is proportional to the amount of the large current I521l supplied by the first NMOS transistor 521. Thus, adjusting the amount of the large current I521l supplied by the first NMOS transistor 521 to compensate for circuit conditions of the resistive change element array 500 proportionally adjusts the amount of the current I531l supplied by the NMOS transistor 531 to compensate for circuit conditions of the resistive change element array 500.

Additionally, SET VERIFY operations of each resistive change element cell CELL00-CELLx0 on the word line WL(0) can be performed at the same time because each NMOS transistor in the first plurality of NMOS transistors 531, 533 supplies approximately the same amount of current. Each NMOS transistor in the first plurality of NMOS transistors 531, 533 supplies approximately the same amount of current for SET VERIFY operations because each NMOS transistor in the first plurality of NMOS transistors 531, 533 has approximately the same features and approximately the same gate to source voltage VGS. FIG. 6E shows a current ICELL00/w2 flowing into the bit line BL(0) through CELL00, a current ICELLx01w2 flowing into the bit line BL(x) through CELLx0, a current I531l flowing from the bit line BL(0) through the NMOS transistor 531, and a current I533l flowing from the bit line BL(x) through the NMOS transistor 533. The current I531l causes current flow into the bit line BL(0) approximately equal to the amount of the current I531l because the current I531l flows from the bit line BL(0) and the amount of current flowing from the bit line BL(0) is approximately equal to the amount of current flowing into the bit line BL(0). The current I533l causes current flow into the bit line BL(x) approximately equal to the amount of the current I533l because the current I533l flows from the bit line BL(x) and the amount of current flowing from the bit line BL(x) is approximately equal to the amount of current flowing into the bit line BL(x). SET VERIFY operations of each resistive change element cell CELL00-CELLx0 on the word line WL(0) are performed in a similar manner to the SET VERIFY operation of CELL00, discussed above. Performing SET VERIFY operations of each cell on a word line at the same time can be highly desirable in certain application where rapid data SET VERIFY operations or page mode SET VERIFY operations are required.

Figure 6F:
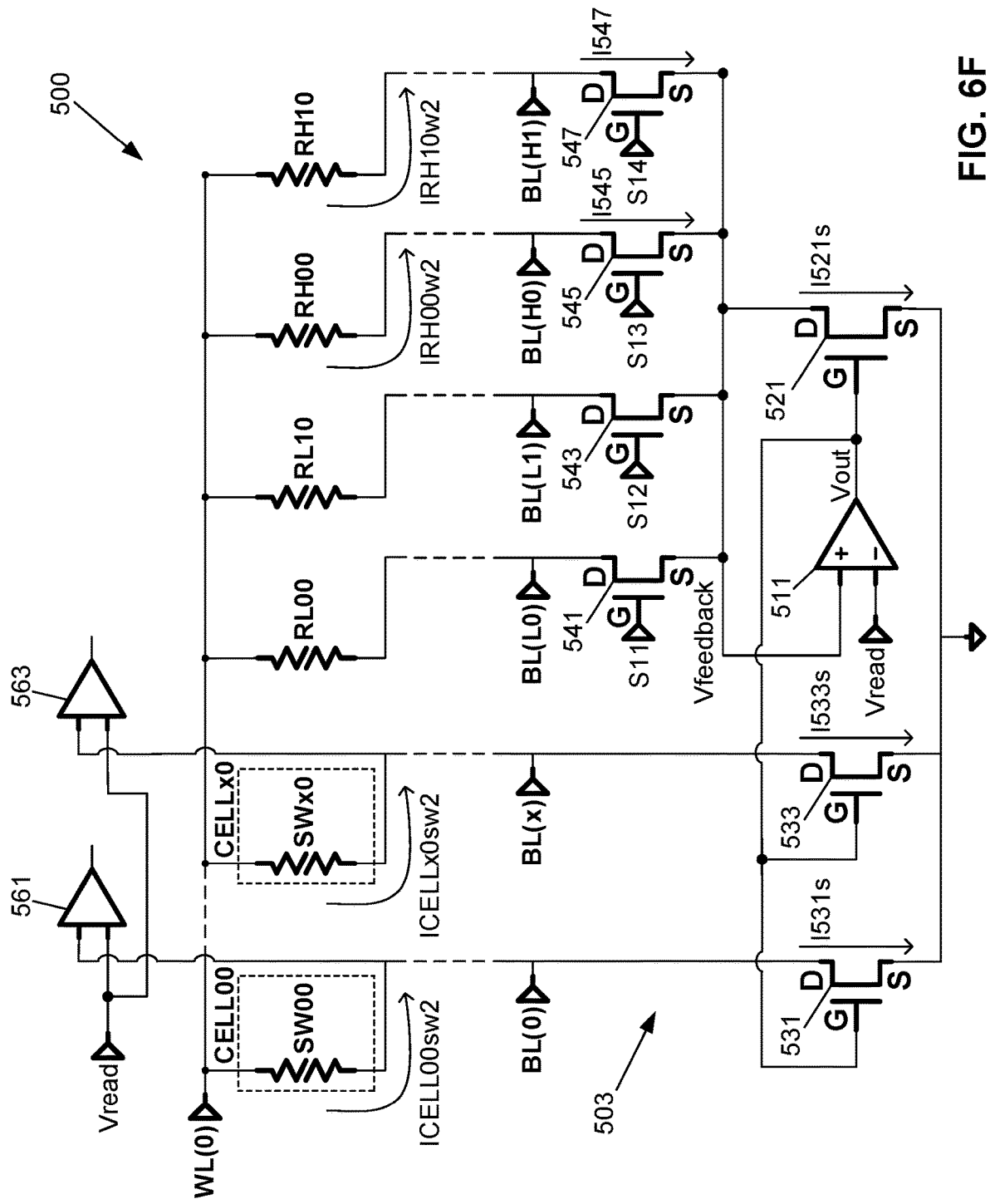
FIG. 6F illustrates a simplified schematic diagram showing current flow in the exemplary architecture of FIG. 5E during a RESET VERIFY operation, where a reduced version of the resistive change element array is shown so that current flow can be shown in greater detail.

A RESET VERIFY operation of CELL00 in the exemplary architecture of FIG. 5E will be explained in detail below, and RESET VERIFY operations of each cell in the exemplary architecture of FIG. 5E can be performed in a similar manner to the RESET VERIFY operation of CELL00. FIG. 6F illustrates a simplified schematic diagram showing current flow, ignoring leakage currents, during a RESET VERIFY operation of CELL00 in the exemplary architecture of FIG. 5E. FIG. 6F shows a reduced version of the resistive change element array 500, so that current flow can be shown in greater detail. It is noted that RESET VERIFY operations of CELL00 explained in further detail below generally describe current flowing through CELL00 as flowing from the word line WL(0) to the bit line BL(0), however, the devices and methods of the present disclosure are not limited to current flow through the cells as flowing from the word line to the bit line. It is also noted that FIG. 6F can be referred to for a RESET VERIFY operation of CELL00 and for RESET VERIFY operations of each cell on the word line WL(0) performed at the same time because current flows through each NMOS transistor in the first plurality of NMOS transistors 531, 533 and through each cell on the word line WL(0) for a RESET VERIFY operation of CELL00 and for RESET VERIFY operations of each cell on the word line WL(0) performed at the same time.

A RESET VERIFY operation of CELL00 starts, as similarly discussed above in step 402 of flow chart 400, by selecting CELL00 from the plurality of resistive change element cells CELL00-CELLxy in the resistive change element array 500. CELL00 is selected from the plurality of resistive change element cells CELL00-CELLxy by driving a voltage VWL(0) on the word line WL(0) to system voltage Vdd and driving the other word lines WL(1)-WL(y) to a read voltage Vread or a high impedance state. The voltage VWL(0) on the word line WL(0), the system voltage Vdd, and the read voltage Vread are design variables selected by a circuit designer. It is noted that although the voltage VWL(0) on the word line WL(0) is discussed as being driven to the system voltage Vdd of 2 volts, the voltage VWL(0) on the word line WL(0) is not limited to being driven to the system voltage Vdd or being driven to 2 volts and that the circuit designer can select other voltage levels for the voltage VWL(0) on the word line WL(0), such as a voltage level greater than 2 volts and a voltage level less than 2 volts. It is also noted that although the system voltage Vdd is discussed as having a voltage level of 2 volts, the system voltage Vdd is not limited to having a voltage level of 2 volts and that the circuit designer can other voltage levels for the system voltage Vdd, such as a voltage level greater than 2 volts and a voltage level less than 2 volts. It is further noted that although the read voltage Vread is discussed as having a voltage level of 1 volt, the read voltage Vread is not limited to having a voltage level of 1 volt and that the circuit designer can select other voltage levels for the read voltage Vread, such as a voltage level greater than 1 volt and a voltage level less than 1 volt.

Selecting a resistance for an operation of the at least one resistive change element, as similarly discussed above in step 404 of flow chart 400, during a RESET VERIFY operation of CELL00 is carried out by turning on the first NMOS transistor 521, the NMOS transistor 545, and the NMOS transistor 547 to select a high resistance Rhigh for the RESET VERIFY operation of CELL00. Alternatively, when the first NMOS transistor 521 is already turned on, selecting a resistance for an operation of the at least one resistive change element, as similarly discussed above in step 404 of flow chart 400, during a RESET VERIFY operation of CELL00 is carried out by turning the NMOS transistor 545 and the NMOS transistor 547 to select a high resistance Rhigh for the REST VERIFY operation of CELL00. When the first NMOS transistor 521, the NMOS transistor 545, and the NMOS transistor 547 are turned on, the circuit for sinking an adjustable amount of current 503 is set to sink an amount of current Thigh that would flow through a resistive reference element having a high resistance Rhigh, a second terminal electrically connected to the voltage VWL(0) on the word line WL(0), and a first terminal electrically connected to the feedback voltage Vfeedback. The high resistance Rhigh can be determined by the following equation, Rhigh=(Inverse of the proportion between the amount of the current I531s supplied by the NMOS transistor 531 and the amount of the small current I521s supplied by the first NMOS transistor 521)((RRH00×RRH10)/(RRH00+RRH10)) where RRH00 is the resistance of the high resistive reference element RH00 and RRH10 is the resistance of the high resistive reference element RH10. It is noted that when the resistance of the high resistive reference element RH00 and the resistance of the high resistive reference element RH10 are approximately the same, the resistance of the high resistive reference element RH00, the resistance of the high resistive reference element RH10, and the high resistance Rhigh are approximately the same. For example, when the resistance of the high resistive reference element RH00=8 MΩ, the resistance of the high resistive reference element RH10=8 MΩ, the inverse of the proportion between the amount of the current I531s supplied by the NMOS transistor 531 and the small current I521s supplied by the first NMOS transistor 521 is 2, Rhigh=(2)((8×8 MΩ)/(8 MΩ+8 MΩ))=8 MΩ.

The first NMOS transistor 521 is turned on when a gate to source voltage VGS of the first NMOS transistor 521 is greater than a threshold voltage VT of the first NMOS transistor 521. The gate to source voltage of the first NMOS transistor 521 is determined by the difference between a gate voltage VG and a source voltage VS. The gate voltage VG of the first NMOS transistor 521 is the output voltage Vout of the differential amplifier 511 because the gate terminal of the first NMOS transistor 521 is electrically connected to the output terminal of the differential amplifier 511. The source voltage VS of the first NMOS transistor 521 is 0 volts or ground because the source terminal of the first NMOS transistor 521 is electrically connected to 0 volts or ground. Thus, the gate to source voltage VGS of the first NMOS transistor 521 can be expressed by VGS=VG−VS, where the gate voltage VG is the output voltage Vout of the differential amplifier 511 and the source voltage VS is 0 volts or ground.

The output voltage Vout of the differential amplifier 511 is determined by multiplying a gain of the differential amplifier 511 with the difference between a voltage of the non-inverting input and a voltage of the inverting input. The differential amplifier 511 has a gain of 1, however, the differential amplifier 511 is not limited to having a gain of 1. The gain of the differential amplifier 511 is a design variable selected by a circuit designer and the circuit designer can select other values for the gain of the differential amplifier 511, such as a gain of the differential amplifier 511 greater than 1 and a gain of the differential amplifier 511 less than 1. The voltage of the non-inverting input of the differential amplifier 511 is the feedback voltage Vfeedback because the non-inverting input terminal is electrically connected to the drain terminal of the first NMOS transistor 521 and the source terminal of each NMOS transistor in the second plurality of NMOS transistors 541, 543, 545, 547 through the feedback loop. The voltage of the inverting input of the differential amplifier 511 is the read voltage Vread because the inverting input terminal is electrically connected to a power supply, a voltage source, a driver circuit, a resistor divider, a test circuit, a control circuit such as a processor, a controller, a programmable logic device, and a FGPA, or other device that supplies the read voltage Vread. Thus, the output voltage Vout of the differential amplifier 511 can be expressed by Vout=Gain (Voltage of the Non-Inverting Input−Voltage of the Inverting Input), where the gain is 1, the voltage of the non-inverting input is the feedback voltage Vfeedback, and the voltage of inverting input is the read voltage Vread.

Substituting for the gain, the voltage of the non-inverting input, and the voltage of the inverting input, in the above equation for determining the output voltage Vout of the differential amplifier 511 provides Vout=Vfeedback−Vread and substituting Vfeedback−Vread for the gate voltage VG in the above equation for determining the gate to source voltage VGS of the first NMOS transistor 521 provides the equation VGS=Vfeedback−Vread−0 volts. As shown by this equation, the gate to source voltage VGS of the first NMOS transistor 521 changes when the feedback voltage Vfeedback changes because the voltage level of the read voltage Vread and 0 volts are generally constant. Thus, the first NMOS transistor 521 is turned on when the feedback voltage Vfeedback has a voltage level such that the gate to source voltage VGS of the first NMOS transistor 521 is greater than a threshold voltage VT of the first NMOS transistor 521.

The NMOS transistors 545, 547 are turned on by control signals S13-S14 supplied by a test circuit or a control circuit such as a processor, a controller, a programmable logic device, and a FGPA, and the NMOS transistors, 541, 543 are turned off by control signals S11-S12 supplied by the test circuit or the control circuit. The test circuit or the control circuit supplies the control signal S11 having a voltage level such that a gate to source voltage VGS for the NMOS transistor 541 is less than a threshold voltage VT for the NMOS transistor 541, the control signal S12 having a voltage level such that a gate to source voltage VGS for the NMOS transistor 543 is less than a threshold voltage VT for the NMOS transistor 543, the control signal S13 having a voltage level such that a gate to source voltage VGS for the NMOS transistor 545 is greater than a threshold voltage VT for the NMOS transistor 545, and the control signal S14 having a voltage level such that a gate to source voltage VGS for the NMOS transistor 547 is greater than a threshold voltage VT for the NMOS transistor 547.

When the first NMOS transistor 521, the NMOS transistor 545, and the NMOS transistor 547 are turned on, a current IRH00$w2$ flows into the bit line BL(H0) through the high resistive reference element RH00, a current I545 flows from the bit line BL(H0) through the NMOS transistor 545, a current IRH10$w2$ flows into the bit line BL(H1) through the high resistive reference element RH10, a current I547 flows from the bit line BL(H1) through the NMOS transistor 547, a small current I521$s$ flows through the first NMOS transistor 521, a voltage VBL(H0) on the bit line BL(H0) is driven to the feedback voltage Vfeedback, and a voltage VBL(H1) on the bit line BL(H1) is driven to the feedback voltage Vfeedback. FIG. 6F shows the current IRH00$w2$ flowing through the high resistive reference element RH00, the current I545 flowing through the NMOS transistor 545, the current IRH10$w2$ flowing through the high resistive reference element RH10, the current I547 flowing through the NMOS transistor 547, and the small current I521$s$ flowing through the first NMOS transistor 521. The current IRH00$w2$ flows through the high resistive reference element RH00 because the second terminal of the high resistive reference element RH00 is at the voltage VWL(0) on the word line WL(0), which as discussed above is the system voltage Vdd, and the first terminal of the high resistive reference element RH00 is at the voltage VBL(H0) on the bit line BL(H0), which as discussed above is the feedback voltage Vfeedback. While, ignoring leakage currents, current does not flow through the other high resistive reference elements RH01-RH0$y$ electrically connected to the bit line BL(H0) because the second terminals of the other high resistive reference elements RH01-RH0$y$ are at the read voltage Vread or a high impedance state to prevent current flow and the first terminals of the other high resistive reference elements RH01-RH0$y$ are at the feedback voltage Vfeedback. The current IRH10$w2$ flows through the high resistive reference element RH10 because the second terminal of the high resistive reference element RH10 is at the voltage VWL(0) on the word line WL(0), which as discussed above is the system voltage Vdd, and the first terminal of the high resistive reference element RH10 is at the voltage VBL(H1) on the bit line BL(H1), which as discussed above is the feedback voltage Vfeedback. While, ignoring leakage currents, current does not flow through the other high resistive reference elements RH11-RH1$y$ electrically connected to the bit line BL(H1) because the second terminals of the other high resistive reference elements RH11-RH1$y$ are at the read voltage Vread or a high impedance state to prevent current flow and the first terminals of the other high resistive reference elements RH11-RH1$y$ are at the feedback voltage Vfeedback. It is noted that, as discussed below, the feedback voltage Vfeedback is regulated such that the voltage level of the feedback voltage Vfeedback is approximately equal to the voltage level of the read voltage Vread.

The amount of the current IRH00$w2$, ignoring leakage currents, can be approximated using Ohm's Law as IRH00$w2$=(VWL(0)−VBL(H0))/RRH00, where VWL(0) is the voltage on the word line WL(0), VBL(H0) is the voltage on the bit line BL(H0), and RH00 is the resistance of the high resistive reference element RRH00. For example, when the voltage VWL(0) is the system voltage Vdd of 2 volts, the voltage VBL(H0) is the feedback voltage Vfeedback of 1 volt, and the high resistive reference element RH00 has a resistance of 8 MΩ, the amount of the current IRH00$w2$ can be approximated using Ohm's Law as IRH00$w2$=(2V−1V)/8 MΩ=⅛ μA. The amount of the current IRH00$w2$, ignoring leakage currents, is approximately equal to the amount of the current I545 flowing from the bit line BL(H0) through the NMOS transistor 545 because the amount of current flowing into the bit line BL(H0) is approximately equal to the amount of current flowing from the bit line BL(H0). The amount of the current IRH10$w2$, ignoring leakage currents, can be approximated using Ohm's Law as IRH10$w2$=(VWL(0)−VBL(H1))/RRH10, where VWL(0) is the voltage on the word line WL(0), VBL(H1) is the voltage on the bit line BL(H1), and RRH10 is the resistance of the high resistive reference element RH10. For example, when the voltage VWL(0) is the system voltage Vdd of 2 volts, the voltage VBL(H1) is the feedback voltage Vfeedback of 1 volt, and the high resistive reference element RH10 has a resistance of 8 MΩ, the amount of the current IRH10$w2$ can be approximated using Ohm's Law as IRH10$w2$=(2V−1V)/8 MΩ=⅛ μA. The amount of the current IRH10$w2$, ignoring leakage currents, is approximately equal to the amount of the current I547 flowing from the bit line BL(H1) through the NMOS transistor 547 because the amount of current flowing into the bit line BL(H1) is approximately equal to the amount of current flowing from the bit line BL(H1). The sum of the amount of the current I545 and the amount of the current I547 is approximately equal to the amount of the small current I521s supplied by the first NMOS transistor 521 because the first NMOS transistor 521 is electrically connected in series with the second plurality of NMOS transistors 541, 543, 545, 547. Thus, the sum of the amount of the current IRH00w2 and the amount of the current IRH10w2 is approximately equal to the amount of the small current I521s supplied by the first NMOS transistor 521. Referring to the above examples, where the amount of the current IRH00w2 is ⅛ microamps and the amount of the current IRH10w2 is ⅛ microamps, the amount of the small current I521s supplied by the first NMOS transistor 521 is ¼ microamps. It is noted that leakage currents do not prevent the RESET VERIFY operation of CELL00 when the leakage currents are much less than the sum of the currents IRH00w2 and IRH10w2.

Supplying an amount of current for the operation based on the resistance for the operation, as similarly discussed above in step 406 of flow chart 400, during the RESET VERIFY operation of CELL00 is carried out by the NMOS transistor 531 supplying a current I531s that generally corresponds with the amount of current Ihigh. Alternatively, when the circuit for sinking an adjustable amount of current 503 additionally includes a plurality of FETs electrically connected in series with the first plurality of NMOS transistors 531, 533, as discussed above, supplying an amount of current for the operation based on the resistance for the operation, as similarly discussed above in step 406 of flow chart 400, during the RESET VERIFY operation of CELL00 is carried out by turning on the FET electrically connected in series with the NMOS transistor 531 and the NMOS transistor 531 supplying a current I531s that generally corresponds with the amount of current Ihigh. As discussed above, the amount of current Ihigh is the amount of current that would flow through a resistive reference element having a high resistance Rhigh, a second terminal electrically connected to the voltage VWL(0) on the word line WL(0), and a first terminal electrically connected to the feedback voltage Vfeedback. The amount of current Ihigh can be determined using Ohm's Law as Ihigh=(VWL(0)−Vfeedback)/Rhigh, where VWL(0) is the voltage on the word line WL(0), Vfeedback is the feedback voltage, and Rhigh is the high resistance. For example, when VWL(0)=2 V, Vfeedback=1V, Rhigh=8 MΩ, Ihigh=(2V−1V)/8 MΩ=⅛ µA. It is noted that the current I531s causes current flow into the bit line BL(0) approximately equal to the amount of the current I531s because the current I531s flows from the bit line BL(0) and the amount of current flowing from the bit line BL(0) is approximately equal to the amount of current flowing into the bit line BL(0).

The NMOS transistor 531 is turned on when a gate to source voltage VGS of the NMOS transistor 531 is greater than a threshold voltage VT for the NMOS transistor 531. The gate to source voltage VGS of the NMOS transistor 531 is determined by the difference between a gate voltage VG and a source voltage VS. The gate voltage VG of the NMOS transistor 531 is the output voltage Vout of the differential amplifier 511 because the gate terminal of the NMOS transistor 531 is electrically connected to the output terminal of the differential amplifier 511. The source voltage VS of the NMOS transistor 531 is 0 volts or ground because the source terminal of the NMOS transistor 531 is electrically connected to 0 volts or ground. Thus, the gate to source voltage VGS of the NMOS transistor 531 can be expressed by VGS=VG−VS, where the gate voltage VG is the output voltage Vout of the differential amplifier 511 and the source voltage VS is 0 volts or ground. Further, the gate to source voltage VGS of the NMOS transistor 531 is approximately equal to the gate to source voltage VGS of the first NMOS transistor 521 because the gate voltages of the NMOS transistor 531 and the first NMOS transistor 521 are the output voltage Vout of the differential amplifier 511 and the source voltages of the NMOS transistor 531 and the first NMOS transistor 521 is 0 volts or ground. It is noted that the source terminal of the first NMOS transistor 521 and the source terminals of NMOS transistors in the first plurality of NMOS transistors 531, 533 can be electrically connected to voltages other than 0 volts or ground, such a voltage greater than 0 volts or ground and a voltage less than 0 volts or ground.

As discussed above, the output voltage Vout of the differential amplifier 511 can be expressed by Vout=Vfeedback−Vread and substituting Vfeedback−Vread for the gate voltage VG in the above equation for determining the gate to source voltage VGS of the NMOS transistor 531 provides the equation VGS=Vfeedback−Vread−0 volts. As shown by this equation, the gate to source voltage VGS of the NMOS transistor 531 changes when the feedback voltage Vfeedback changes because the voltage level of the read voltage Vread and 0 volts are generally constant. Thus, the NMOS transistor 531 is turned on when the feedback voltage Vfeedback has a voltage level such that the gate to source voltage VGS of the NMOS transistor 531 is greater than a threshold voltage VT of the NMOS transistor 531.

The amount of the current I531s supplied by the NMOS transistor 531 is proportional to the amount of the small current I521s supplied by the first NMOS transistor 521. The proportion between the amount of the current I531s supplied by the NMOS transistor 531 and the amount of the small current I521s supplied by the first NMOS transistor 521 is a design variable selected by a circuit designer. The circuit designer can select the proportion between the amount of the current I531s supplied by the NMOS transistor 531 and the amount of the small current I521s supplied by the first NMOS transistor 521 by selecting the features of the NMOS transistor 531 and the features of the first NMOS transistor 521. The proportion between the amount of the current I531s supplied by the NMOS transistor 531 and the amount of the small current I521s supplied by the first NMOS transistor 521 is selected as 0.5 by selecting a width to length ratio of the NMOS transistor 531 that is approximately 0.5 a width to length ratio of the first NMOS transistor 521. However, the proportion is not limited to 0.5 and the circuit designer can select other values for the proportion, such as a proportion greater than 0.5 and a proportion less than 0.5. Further, the circuit designer can select other features of the NMOS transistor 531 and the first NMOS transistor 521 to achieve the desired proportion between the amount of the current I531s supplied by the NMOS transistor 531 and the amount of the small current I521s supplied by the first NMOS transistor 521. For example, the circuit designer can select other dimensions of the NMOS transistors, layouts of the NMOS transistors, and materials for fabricating the NMOS transistors to achieve the desired proportion between the amount of the current I531s supplied by the NMOS transistor 531 and the amount of the small current I521s supplied by the first NMOS transistor 521. It is noted that when other types of field effect transistors are used in place of the first NMOS transistor 521 and the first plurality of NMOS transistor 531, 533 the circuit designer can also select dimensions, layouts, and materials for fabricating the other types of field effect transistors to achieve the desired proportion between currents.

When the proportion between the amount of the current I531s supplied by the NMOS transistor 531 and the amount of the small current I521s supplied by the first NMOS transistor 521 is selected based on the width to length ratios of the NMOS transistor 531 and the first NMOS transistor 521, the amount of the current I531s can be approximated by the following equation, I531s=(IRH00w2+IRH10w2) ((Channel Width of NMOS 531/Channel Length of NMOS 531)/(Channel Width of NMOS 521/Channel Length of NMOS 521)), where IRH00w2 is the amount of current flowing through the high resistive reference element RH00 and IRH10w2 is the amount of current flowing through the high resistive reference element RH10. For example, when the current IRH00w2 is ⅛ microamps, the current IRH10w2 is ⅛ microamps, and the width to length ratio of the NMOS transistor 531 is 0.5 the width to length ratio of the first NMOS transistor 521, the current I531s=(⅛ μA+⅛ μA)(0.5) =⅛ μA.

It is noted that the amount of the current I531s supplied by the NMOS transistor 531 can be an average of the currents flowing through the second plurality of NMOS transistors 541, 543, 545, 547 by turning on at the same time a number of the NMOS transistors that matches the inverse of the proportion between the amount of the current I531s supplied by the NMOS transistor 531 and the amount of the small current I521s supplied by the first NMOS transistor 521. For example, when the proportion between the amount of the current I531s supplied by the NMOS transistor 531 and the amount of the small current I521s supplied by the first NMOS transistor 521 is 0.5, the inverse of the proportion is 2, and the amount of the current I531s can be an average of the current flowing through the second plurality of NMOS transistors 541, 543, 545, 547 by turning on at the same time 2 of the NMOS transistors. For example, when the NMOS transistors 545, 547 are turned on at the same time, the NMOS transistors 541, 543 are turned off, the current I545=⅛ microamps, the current I547=⅛ microamps, and the proportion between the amount of the current I531s supplied by the NMOS transistor 531 and the small current I521s supplied by the first NMOS transistor 521 is 0.5, the current I531s is I531s=(I545+I547)/2=(⅛ μA+⅛ μA)/2=⅛ μA.

A current ICELL00sw2 flows into the bit line BL(0) through CELL00 and the current I531s flows from the bit line BL(0) through the NMOS transistor 531. FIG. 6F shows the current ICELL00sw2 flowing through CELL00 and the current I531s flowing through the NMOS transistor 531. The current ICELL00sw2 flows through CELL00 because the second terminal of the resistive change element SW00 within CELL00 is at the voltage VWL(0) on the word line WL(0), which as discussed above is the system voltage Vdd, and the first terminal of the resistive change element SW00 within CELL00 is at a voltage VBL(0) on the bit line BL(0). While, ignoring leakage currents, current does not flow through the other resistive change element cells CELL01-CELL0y on the bit line BL(0) because the second terminals of the resistive change elements SW01-SW0y within the other resistive change element cells CELL01-CELL0y are at the read voltage Vread or a high impedance state to prevent current flow and the first terminals of the resistive change elements SW01-SW0y are at the voltage VBL(0) on the bit line BL(0). The amount of the current ICELL00sw2, ignoring leakage currents, is approximately equal to the amount of the current I531s flowing through the NMOS transistor 531 because the amount of current flowing into the bit line BL(0) is approximately equal to the amount of current flowing from the bit line BL(0). Further, the amount of the current ICELL00sw2 is approximately equal to the average of the amount of the current I545 flowing through the NMOS transistor 545 and the current I547 flowing through the NMOS transistor 547. It is noted that leakage currents do not prevent a RESET VERIFY operation of CELL00 when the leakage currents are much less than the amount of the current ICELL00sw2.

The voltage VBL(0) on the bit line BL(0), ignoring leakage currents, can be approximated by subtracting the voltage drop across CELL00 from the voltage VWL(0) on the word line WL(0) and the voltage drop across CELL00 can be approximated using Ohm's Law. Thus, the voltage on the bit line BL(0) can be approximated by VBL(0)=VWL(0)−(ICELL00sw2×RCELL00), where VWL(0) is the voltage on word line WL(0), the current ICELL00sw2 is the current flowing through CELL00, and RCELL00 is the resistance of the resistive change element SW00 within CELL00. As shown by this equation, the voltage VBL(0) on the bit line BL(0) changes when the resistance of the resistive change element SW00 changes because the voltage VWL(0) on the word line WL(0) and the current flowing through CELL00 are generally constant. For example, when VWL(0)=2 volts, IRH00w2=⅛ μA, IRH10w2=⅛ μA, ICELL00sw2=⅛ μA, and RCELL00=8 MΩ, the voltage VBL(0)=2 V−(⅛ μA×8 MΩ)=1 V. For example, when VWL(0)=2 volts, IRH00w2=⅛ μA, IRH10w2=⅛ μA, ICELL00sw2=⅛ μA, and RCELL00=1 MΩ, the voltage VBL(0)=2 V−(⅛ μA×1 MΩ)=15/8 V. For example, when VWL(0)=2 volts, IRH00w2=⅛ μA, IRH10w2=⅛ μA, ICELL00sw2=⅛ μA, and RCELL00=10 MΩ, the voltage VBL(0)=2 V−(⅛ μA×10 MΩ)=¾ V.

It is noted that when the voltage VBL(0) on the bit line BL(0) is less than the read voltage Vread and the word lines WL(1)-WL(y) electrically connected to the other resistive change element cells CELL01-CELL0y on the bit line BL(0) are driven to the read voltage Vread, leakage currents flow into the bit line BL(0) through the other resistive change element cells CELL01-CELL0y and pull up the voltage VBL(0) on the bit line BL(0). It is also noted that when the voltage VBL(0) on the bit line BL(0) is greater than the read voltage Vread and the word lines WL(1)-WL(y) electrically connected to the other resistive change element cells CELL01-CELL0y on the bit line BL(0) are driven to the read voltage Vread, leakage currents flow from the bit line BL(0) through the other resistive change element cells CELL01-CELL0y and pull down the voltage VBL(0) on the bit line BL(0). It is further noted that when the voltage VBL(0) on the bit line BL(0) is pulled up by leakage currents flowing into the bit line BL(0) and when the voltage VBL(0) on the bit line BL(0) is pulled down by leakage currents flowing from the bit line BL(0), the number of the word lines WL(1)-WL(y) should be small enough to allow a margin to determine a resistive state of the selected resistive change element SW00.

Determining a resistive state of the at least one resistive change element based on a resistance of the at least one resistive change element and the resistance for the operation, as similarly discussed above in step 408 of flow chart 400, during the RESET VERIFY operation of CELL00 is carried out by determining the resistive state of the resistive change element SW00 by comparing the voltage VBL(0) on the bit line BL(0) with the read voltage Vread. As discussed above, the voltage VBL(0) on the bit line BL(0) is determined by the voltage VWL(0) on the word line WL(0), the amount of the current ICELL00$sw2$, and the resistance of the resistive change element SW00. The voltage VBL(0) on the bit line BL(0) is indicative of the resistive state of the resistive change element SW00 because the voltage VWL(0) on the word line WL(0) and the amount of current ICELL00$sw2$ are approximately the same for both a high resistive state and a resistive state other than a high resistive state of the resistive change element SW00, while, the resistance of the resistive change element SW00 is different for a high resistive state and a resistive state other than a high resistive state. The read voltage Vread is indicative of the high resistance Rhigh for the RESET VERIFY operation of CELL00 because the read voltage Vread is equal to the voltage VWL(0) on the word line WL(0) subtracted by a voltage calculated by the amount of current ICELL00$sw2$ multiplied by the high resistance Rhigh. For example, when VWL(0)=2V, ICELL00$sw2$=⅛ μA, Rhigh=8 MΩ, Vread=2V−(⅛ μA×8 MΩ)=1V. When the voltage VBL(0) on the bit line BL(0) is less than or equal to the read voltage Vread (i.e. the voltage VBL(0) on the bit line BL(0)≤Vread) the resistance of the resistive change element SW00 is greater than or equal to the high resistance Rhigh (i.e. RCELL00>Rhigh, where RCELL00 is the resistance of the resistive change element SW00 within CELL00) and the resistive state of resistive change element SW00 is determined to be a high resistive state. When the voltage VBL(0) on the bit line BL(0) is greater than the read voltage Vread (i.e. the voltage VBL(0) on the bit line BL(0)>Vread) the resistance of the resistive change element SW00 is less than the high resistance Rhigh (i.e. RCELL00<Rhigh, where RCELL00 is the resistance of the resistive change element SW00 within CELL00) and the resistive state of the resistive change element SW00 is determined to be a resistive state other than a high resistive state.

The sense device 561 receives the voltage VBL(0) on the bit line BL(0) on a first input terminal because the first input terminal is electrically connected to the bit line BL(0) and receives the read voltage Vread on a second input terminal because the second input terminal is electrically connected to a power supply, a voltage source, a driver circuit, a resistor divider, a test circuit, a control circuit such as a processor, a controller, a programmable logic device, and a FGPA, or other device that supplies the read voltage Vread. The sense device 561 determines the resistive state of the resistive change element SW00 by comparing the voltage VBL(0) on the bit line BL(0) with the read voltage Vread. The sense device 561 outputs a signal indicative of the resistive state of the resistive change element SW00 on an output terminal. When the voltage VBL(0) on the bit line BL(0) is less than or equal the read voltage Vread, the sense device 561 outputs a signal indicating the resistive change element SW00 has a high resistive state. When the voltage VBL(0) on the bit line BL(0) is greater than the read voltage Vread, the sense device 561 outputs a signal indicating the resistive change element SW00 has a resistive state other than a high resistive state. For example, when ICELL00$sw2$=⅛ microamps, RCELL00=10 MΩ, VBL(0)=¾ V, and Vread=1 V, the sense device 561 outputs a signal indicating that the resistive change element SW00 has high resistive state (corresponding, typically, to a logic 0, a RESET state). For example, when ICELL00$sw2$=⅛ microamps, RCELL00=8 MΩ, VBL(0)=1 V, and Vread=1 V, the sense device 561 outputs a signal indicating that the resistive change element SW00 has a high resistive state. For example, when ICELL00$sw2$=⅛ microamps, RCELL00=1 MΩ, VBL(0)=15/8 V, and Vread=1 V, the sense device 561 outputs a signal indicating that the resistive change element SW00 has a resistive state other than a high resistive state.

It is noted that when the plurality of sense devices 561, 563 are electrically connected to the plurality of amplifiers 571, 573 as shown in FIGS. 5F and 5H, the plurality of sense device 561, 563 determine the resistive states of the resistive change elements SW00-SWxy by comparing amplified voltages with a selected voltage, such as the read voltage Vread. It is further noted that when the plurality of sense device 561, 563 are electrically connected to the plurality of inverters 281, 283 as shown in FIG. 5I, the plurality of inverters 281, 283 invert signals output by the plurality of sense devices 561, 563.

Alternatively, the plurality of sense devices 561, 563 are omitted from the exemplary architecture shown in FIGS. 5E-5H and a test circuit, a logic circuit, or a control circuit such as a processor, a controller, a programmable logic device, and a FGPA, is electrically connected to the bit lines BL(0)-BL(x) to receive the voltages on the bit lines BL(0)-BL(x) or is electrically connected to the plurality of amplifiers 571, 573 to receive amplified voltages. When the test circuit, the logic circuit, or the control circuit is electrically connected to the bit lines BL(0)-BL(x), the test circuit, the logic circuit, or the control circuit determines the resistive states of the resistive change elements SW00-SWxy by comparing the voltages on the bit lines BL(0)-BL(x) with the read voltage Vread or a stored value corresponding to the read voltage Vread. For example, for a RESET VERIFY operation of CELL00, when the test circuit, the logic circuit, or the control circuit is electrically connected to the bit lines BL(0)-BL(x), the test circuit, the logic circuit, or the control circuit determines the resistive state of the resistive change element SW00 by comparing the voltage VBL(0) on the bit line BL(0) with the read voltage Vread or a stored value corresponding to the read voltage Vread. When the test circuit, the logic circuit, or the control circuit is electrically connected to the plurality of amplifiers 571, 573, the test circuit, the logic circuit, or the control circuit determines the resistive states of the resistive change elements SW00-SWxy by comparing the amplified voltages with a selected voltage, such as the read voltage Vread, or a stored value corresponding to the selected voltage, such as the read voltage Vread. Additionally, the test circuit, the logic circuit, or the control circuit can output signals indicative of the resistive states of the resistive change elements SW00-SWxy.

Further, the circuit for sinking an adjustable amount of current 503 compensates for the circuit conditions of the resistive change element array 500 by regulating the feedback voltage Vfeedback to be approximately equal to the read voltage Vread. The feedback voltage Vfeedback reflects the circuit conditions of the resistive change element array 500 because the feedback voltage Vfeedback is based on the amount of the small current I521$s$ flowing through the first NMOS transistor 521 and the amount of the small current I521$s$ is impacted by the circuit conditions of the resistive change element array 500. For example, changes in the resistances of the high resistive reference elements RH00-RH1$y$ due to temperature, leakage currents, and parasitic impedances, can impact the amount of the small current I521$s$. The feedback voltage Vfeedback is supplied to the non-inverting input of the differential amplifier 511 and, as discussed above, the gate voltage VG of the first NMOS transistor 521 is the output voltage Vout of the differential amplifier 511 and the source voltage VS of the first NMOS transistor 521 is 0 volts or ground. The gate to source voltage VGS of the first NMOS transistor 521 regulates the amount of the small current I521$s$ flowing through the first NMOS transistor 521 and the differential amplifier 511 adjusts the gate to source voltage VGS of the first NMOS transistor 521 so that the amount of the small current I521s adjusts the feedback voltage Vfeedback to be approximately equal to the read voltage Vread. Also, as discussed above, the amount of the current I531s supplied by the NMOS transistor 531 is proportional to the amount of the small current I521s supplied by the first NMOS transistor 521. Thus, adjusting the amount of the small current I521s supplied by the first NMOS transistor 521 to compensate for circuit conditions of the resistive change element array 500 proportionally adjusts the amount of the current I531s supplied by the NMOS transistor 531 to compensate for circuit conditions of the resistive change element array 500.

Additionally, RESET VERIFY operations of each resistive change element cell CELL00-CELLx0 on the word line WL(0) can be performed at the same time because each NMOS transistor in the first plurality of NMOS transistors 531, 533 supplies approximately the same amount of current. Each NMOS transistor in the first plurality of NMOS transistors 531, 533 supplies approximately the same amount of current for RESET VERIFY operations because each NMOS transistor in the first plurality of NMOS transistors 531, 533 has approximately the same features and approximately the same gate to source voltage VGS. FIG. 6F shows a current ICELL00sw2 flowing into the bit line BL(0) through CELL00, a current ICELLx0sw2 flowing into the bit line BL(x) through CELLx0, a current I531s flowing from the bit line BL(0) through the NMOS transistor 531, and a current I533s flowing from the bit line BL(x) through the NMOS transistor 533. The current I531s causes current flow into the bit line BL(0) approximately equal to the amount of the current I531s because the current I531s flows from the bit line BL(0) and the amount of current flowing from the bit line BL(0) is approximately equal to the amount of current flowing into the bit line BL(0). The current I533s causes current flow into the bit line BL(x) approximately equal to the amount of the current I533s because the current I533s flows from the bit line BL(x) and the amount of current flowing from the bit line BL(x) is approximately equal to the amount of current flowing into the bit line BL(x). RESET VERIFY operations of each resistive change element cell CELL00-CELLx0 on the word line WL(0) are performed in a similar manner to the RESET VERIFY operation of CELL00, discussed above. Performing RESET VERIFY operations of each cell on a word line at the same time can be highly desirable in certain application where rapid data RESET VERIFY operations or page mode RESET VERIFY operations are required.

A circuit designer can adjust the range of amounts of current for accessing at least one resistive change element in the resistive change element array 500 as well as the increments between the amounts of current for accessing at least one resistive change element in the resistive change element array 500. In the above examples, for a READ operation of CELL00 the NMOS transistor 531 supplies the current I531i=1¹/₄₈ microamps, for a SET VERIFY operation of CELL00 the NMOS transistor 531 supplies the current I531l=⅓ microamps, and for a RESET VERIFY operation of CELL00 the NMOS transistor 531 supplies the current I531s=⅛ microamps. Thus, in the above examples, the NMOS transistor 531 can supply three currents over a range of ⅛ microamps to ⅓ microamps, with each of the three currents separated by an increment of 0.104 microamps. For example, a circuit designer can adjust the range of amounts of current that can be supplied by the NMOS transistor 531 as well as the increments between the amounts of current that can be supplied by the NMOS transistor 531 by varying the number of NMOS transistors in the second plurality of NMOS transistors 541, 543, 545, 547 that are turned on at the same time.

Although the present disclosure has been described in relation to particular embodiments thereof, many other variations and modification and other uses will become apparent to those skilled in the art. It is preferred, therefore, that the present disclosure not be limited by the specific disclosure herein.

What is claimed is:

1. A method for accessing at least one resistive change element operable as an antifuse, said method comprising:
    selecting at least one resistive change element from a plurality of resistive change elements, wherein each resistive change element in said plurality of resistive change elements is operable as an antifuse that remains in a high resistive state until adjusted to a low resistive state, and wherein a resistance of said low resistive state is less than a resistance of said high resistive state;
    selecting an amount of current, wherein said amount of current is selected from a plurality of amounts of current, and wherein each amount of current in said plurality of amounts of current is based on operating said at least one resistive change element as an antifuse;
    supplying said amount of current; and
    determining a resistive state of each of said at least one resistive change element based on a resistance of that resistive change element and said amount of current.

2. The method of claim 1, wherein each resistive change element in said plurality of resistive change elements has a nanotube fabric.

3. The method of claim 2, wherein each resistive change element in said plurality of resistive change elements further has a first terminal, a second terminal, and said nanotube fabric between said first terminal and said second terminal.

4. The method of claim 1, wherein said plurality of amounts of current are separated by a same sized increment of current.

5. The method of claim 1, wherein said supplying said amount of current is responsive to said selecting an amount of current.

6. The method of claim 1, wherein said amount of current is supplied to each of said at least one resistive change element.

7. The method of claim 1, further comprising adjusting said amount of current to compensate for circuit conditions.

8. A method for accessing at least one resistive change element operable as an antifuse, said method comprising:
    selecting at least one resistive change element from a plurality of resistive change elements, wherein each resistive change element in said plurality of resistive change elements is operable as an antifuse that remains in a high resistive state until adjusted to a low resistive state, and wherein a resistance of said low resistive state is less than a resistance of said high resistive state;
    selecting a resistance, wherein said resistance is based on operating said at least one resistive change element as an antifuse;
    supplying an amount of current based on said resistance; and
    determining a resistive state of each of said at least one resistive change element based on a resistance of that resistive change element and said resistance.

9. The method of claim 8, wherein each resistive change element in said plurality of resistive change elements has a nanotube fabric.

10. The method of claim 9, wherein each resistive change element in said plurality of resistive change elements further has a first terminal, a second terminal, and said nanotube fabric between said first terminal and said second terminal.

11. The method of claim 8, wherein said resistance is selected from a plurality of resistances and wherein each resistance in said plurality of resistances is based on operating said resistive change element as an antifuse.

12. The method of claim 8, wherein said supplying an amount of current based on said resistance is responsive to said selecting a resistance.

13. The method of claim 8, wherein said amount of current is supplied to each of said at least one resistive change element.

14. The method of claim 8, further comprising adjusting said amount of current to compensate for circuit conditions.

15. The method of claim 11, wherein said plurality of resistances are separated by a same amount of resistance.

\* \* \* \* \*